United States Patent
Iijima et al.

(10) Patent No.: US 6,720,603 B2
(45) Date of Patent: Apr. 13, 2004

(54) CAPACITOR STRUCTURE AND A SEMICONDUCTOR DEVICE WITH A FIRST METAL LAYER, A SECOND METAL SILICIDE LAYER FORMED OVER THE FIRST METAL LAYER AND A SECOND METAL LAYER FORMED OVER THE SECOND METAL SILICIDE LAYER

(75) Inventors: Shinpei Iijima, Akishima (JP); Yuzuru Ohji, Hinode (JP); Masato Kunitomo, Ome (JP); Masahiko Hiratani, Akishima (JP); Yuichi Matsui, Kokubunji (JP); Hiroyuki Ohta, Tsuchiura (JP); Yukihiro Kumagai, Chiyoda (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/321,614

(22) Filed: Dec. 18, 2002

(65) Prior Publication Data

US 2003/0107073 A1 Jun. 12, 2003

Related U.S. Application Data

(62) Division of application No. 09/923,406, filed on Aug. 8, 2001, now Pat. No. 6,534,375.

(30) Foreign Application Priority Data

Aug. 21, 2000 (JP) .......................................... 2000-249675

(51) Int. Cl.⁷ ............................................. H01L 27/108
(52) U.S. Cl. ........................ 257/303; 257/306; 257/310; 257/532
(58) Field of Search ................................. 257/295, 303, 257/304, 306, 310, 532, 535

(56) References Cited

U.S. PATENT DOCUMENTS

| 5,452,178 | A   |   | 9/1995  | Emesh et al. ................ 361/303 |
| 6,177,351 | B1  | * | 1/2001  | Beratan et al. ............. 438/694 |
| 6,278,150 | B1  |   | 8/2001  | Okudaira et al. ........... 257/306 |
| 6,284,589 | B1  | * | 9/2001  | Lim et al. ................... 438/240 |
| 6,319,765 | B1  |   | 11/2001 | Cho et al. ................... 438/240 |
| 6,339,007 | B1  |   | 1/2002  | Wang et al. ................ 438/393 |
| 6,391,801 | B1  | * | 5/2002  | Yang ........................... 438/785 |
| 2001/0001589 | A1 | * | 5/2001 | Marsh ..................... 361/306.3 |
| 2002/0011615 | A1 |   | 1/2002 | Nagata et al. ................. 31/119 |

FOREIGN PATENT DOCUMENTS

| JP | 10-79481   |   | 3/1998  |         |            |
| JP | 10-209394  |   | 8/1998  |         |            |
| JP | 11-307736  |   | 11/1999 |         |            |
| JP | 2000040800 | A | * | 2/2000  | .......... H01L/27/10 |
| JP | 2000156483 | A | * | 6/2000  | ......... H01L/27/108 |

* cited by examiner

Primary Examiner—Erik J. Kielin
Assistant Examiner—Stephen W. Smoot
(74) Attorney, Agent, or Firm—Miles & Stockbridge P.C.

(57) ABSTRACT

A disadvantage upon heat treatment in an oxygen atmosphere of a dielectric film formed on a lower electrode of capacitance device of DRAM that oxygen permeating the lower electrode oxidizes a barrier layer to form an oxide layer of high resistance and low dielectric constant is prevented. An Ru silicide layer is formed on the surface of a plug in a through hole formed below a lower electrode for an information storage capacitance device C and an Ru silicon nitride layer is formed further on the surface of the Ru silicide layer. Upon high temperature heat treatment in an oxygen atmosphere conducted in the step of forming a dielectric film on the lower electrode, the Ru silicon nitride layer is oxidized sacrificially into an Ru silicon oxynitride to prevent progress of oxidation in the Ru silicide layer.

16 Claims, 127 Drawing Sheets

CAPACITOR STRUCTURE AND A SEMICONDUCTOR DEVICE WITH A FIRST METAL LAYER, A SECOND METAL SILICIDE LAYER FORMED OVER THE FIRST METAL LAYER AND A SECOND METAL LAYER FORMED OVER THE SECOND METAL SILICIDE LAYER

CROSS-REFERENCE TO RELATED APPLICATION

This application is a division of application Ser. No. 09/923,406 filed Aug. 8, 2001, now U.S. Pat. No. 6,534,375.

BACKGROUND OF THE INVENTION

This invention concerns a semiconductor integrated circuit device and a manufacturing technique therefor and, more in particular, it relates a technique effective to application to a semiconductor integrated circuit device having a DRAM (Dynamic Random Access Memory).

Memory cells of DRAM are generally located at intersection between each of a plurality of word lines and each of a plurality of bit lines arranged in a matrix on a main surface of a semiconductor substrate. One memory cell is constituted with one MISFET (Metal Insulator Semiconductor Field Effect Transistor) for selecting the cell and one information storage capacitance device (capacitor) connected in series with the MISFET.

The memory cell selecting MISFET is formed in a active region surrounded at the periphery thereof with a device isolation region and mainly comprises a gate insulating film, a gate electrode constituted integrally with a word line and a pair of semiconductor regions constituting the source and drain. Memory cell selecting MISFETs are usually formed by two in one active region and one of the source and drain (semiconductor region) of the two MISFET is made in common at the central portion of the active region.

The bit lines are disposed over the memory cell selecting MISFET and connected electrically through a contact hole in which a plug is buried with one of the source and drain (semiconductor region) (a semiconductor region in common with two MISFETs) Further, the information storage capacitance device is disposed over the bit line and electrically connected in the same manner through a contact hole in which a plug comprising polycrystal silicon or the like is buried with the other of the source and drain (semiconductor region) of the memory cell selecting MISFET.

As described above, DRAM in recent years adopts a sterical structure in which the information storage capacitance device is disposed over the bit line as a countermeasure for coping with reduction in the stored charge amount in accordance with the refinement of the memory cell. However, in the case of larger capacity DRAM of 256 Mbits or more in which the memory cell is to be refined further, it is considered difficult to cope with the reduction of the stored charge amount by merely making the information storage capacitance device sterical.

Then, it has been studied to adopt high dielectric (ferroelectric) materials such as tantalum oxide ($Ta_2O_5$), strontium titanate (STO) and barium strontium titanate (BST) as the dielectric film for the information storage capacitance device. This is because the relative dielectric constant is as high as about 40 in tantalum oxide and about 200 to 500 in STO and BST, so that remarkable increase in the stored charge amount can be expected in the case of using the high (ferro) dielectric material as the dielectric film compared with the case of using silicon nitride (relative dielectric constant=7 to 8) as the dielectric film.

However, since such high (ferro) dielectric materials can not provide high relative dielectric constant by merely being formed as films and show large leak current in the films, it is necessary to improve crystallization and film quality by applying a heat treatment in an oxygen atmosphere at 750° C. or higher after film deposition. Accordingly, in the case of using the high (ferro) dielectric material for the dielectric film of the information storage capacitance device, the heat treatment at high temperature results in a problem of fluctuation in the characteristics of MISFET.

In view of the above, when the high (ferro) dielectric material is used for the dielectric film, a platinum group metal such as Ru (ruthenium), Pt (platinum) or Ir (iridium) is used for the lower electrode as the underlayer. When the high (ferro) dielectric film is deposited on the surface of the metal described above, since crystallization of film and improvement of the film quality can be obtained by a heat treatment at a low temperature such as 650° C. to 600° C. which is lower by 100° C. or more than the usual heat treatment, the amount of heat treatment in the entire manufacturing steps can be decreased to prevent fluctuation in the characteristics of MISFET.

On the other hand, when the platinum group metal as described above is used for the lower electrode material, since this is an easily oxygen permeable material, when a heat treatment is conducted in an oxygen atmosphere after deposition of a high (ferro) dielectric film on the surface of the lower electrode, oxygen permeates through the high (ferro) dielectric film and the lower electrode and the silicon plug therebelow to bring about a problem that the platinum metal and the silicon are reacted to form an undesired metal silicide layer at the boundary between both of them. As a countermeasure, it has been proposed to form a barrier layer for preventing reaction between them between the lower electrode comprising the platinum group metal and the silicon plug.

Japanese Published Unexamined Patent Application Hei 10(1998)-79481 proposes a conductive layer containing a high melting metal such as Ti (titanium), W (tungsten), Ta (tantalum), Co (cobalt) or Mo (molybdenum), silicon and nitrogen (metal silicon nitride layer) as a barrier layer for preventing a disadvantage that the platinum group metal and silicon diffuse to each other to form a metal silicide layer or, further, the metal silicide layer is oxidized to form a silicon oxide layer of low dielectric constant by a heat treatment at 700 to 800° C. upon reflow and flattening of a silicon oxide film. It is described that the barrier layer is preferably formed by lamination of a first layer containing columnar crystal or amorphous and a second layer containing granular crystals. Further, it is also described that a layer containing Ti is preferably formed between the barrier layer and the silicon plug for improving adhesion between them.

Japanese Published Unexamined Patent Application Hei 10(1998)-209394 points out a problem upon forming a lower electrode over a contact hole in which a silicon plug is buried that when mask misalignment is caused between them, the dielectric film formed over the lower electrode and the silicon plug below the lower electrode are in contact with each other to result in reaction between oxygen in the dielectric film and silicon to form a silicon oxide layer at high resistance, or the dielectric film lacks in oxygen to increase leak current. Then, this publication discloses a technique of providing a barrier film comprising silicon nitride between the dielectric film and the silicon plug as a countermeasure.

Japanese Published Unexamined Patent Application Hei 11(1999)-307736 concerns a ferroelectric memory and discloses a technique of forming a tantalum silicon nitride (TaSiN) film as a diffusion barrier layer over the silicon plug and forming an Ir film as an oxygen inhibition film over the diffusion barrier layer upon forming a capacitance device comprising a lower electrode comprising an iridium oxide ($IrO_x$), a dielectric film comprising a dielectric material such as PZT (lead zirconate titanate) and an upper electrode comprising a platinum group metal such as Pt.

SUMMARY OF THE INVENTION

As described above, in the prior art, when a lower electrode comprising a platinum group metal is formed over a contact hole in which a silicon plug is buried and then a high (ferro) dielectric film is formed over the lower electrode and a heat treatment is conducted, undesired reaction between the platinum group metal and the silicon plug is prevented by previously forming a barrier layer over the silicon plug.

However, as the size of the memory cell is further refined, misalignment occurs inevitably between the lower electrode and the contact hole therebelow and the barrier layer in the contact hole may sometimes be etched upon patterning the lower electrode to expose the surface of the silicon plug. In this case, since a portion of the high (ferro) dielectric film formed over the lower electrode is in direct contact with the silicon plug, it results in a problem that the insulation break down voltage of the dielectric film is lowered to increase the leak current.

Further, as a result of the study made by the present inventors, it has been found a problem that when a barrier layer is formed over the silicon plug, and a heat treatment is conducted to the high (ferro) dielectric film in a high temperature oxygen atmosphere, oxygen permeating through the lower electrode oxidizes the barrier layer itself to form an oxide layer of high resistance and low dielectric constant.

Further, the present inventors have studied a process of depositing a thick silicon oxide film over a contact hole in which a silicon plug is buried, then etching the silicon oxide film to form a deep groove reaching the surface of the silicon plug and depositing a platinum group metal film on the inner wall of the groove to form a lower electrode, and have found a problem that peeling may sometimes be caused between the lower electrode and the silicon oxide film in the course of the production steps because of less adhesion between the platinum group metal film and the silicon oxide film.

This invention intends to provide a technique capable of preventing disadvantage that a barrier layer in the contact hole is etched to expose the surface of a silicon plug upon patterning a lower electrode, in a case where the size of the memory cell is further refined and misalignment occur inevitably between the lower electrode of a capacitance device and a contact hole therebelow.

This invention further intends to provide a technique capable of preventing disadvantage that an oxide layer of high resistance and low dielectric constant is formed upon heat treatment of a dielectric film formed over the lower electrode of a capacitance device in an oxygen atmosphere by the oxidation of the barrier layer itself with oxygen that permeates the lower electrode.

This invention further intends to provide a technique capable of improving adhesion between a platinum group metal film constituting the lower electrode for a capacitance device and a silicon oxide film.

This invention further provides a technique capable of ensuring a desired stored charge amount value even in a case of reducing the size of a memory cell, by increasing the surface area of a capacitance device and making the dielectric constant of the dielectric film higher.

The foregoing and other objects as well as novel features of this invention will become apparent by reading the descriptions of the present specification and appended drawings.

Among the inventions disclosed in this application, outlines of typical inventions are to be briefly explained as below.

In a semiconductor integrated circuit device according to this invention, a capacitance device constituted with a first electrode comprising a first metal, a dielectric film and a second electrode comprising a second metal is formed on a main surface of a semiconductor substrate, in which a first semiconductor region formed in the semiconductor substrate and the first electrode of the capacitance device are electrically connected by way of a silicon plug inside a first contact hole formed in a first insulating film over the first semiconductor region, and in which a metal silicide layer is formed on the surface of the silicon plug, and at least one of a metal silicon nitride layer or a metal silicon oxynitride layer is formed on the surface of the metal silicide layer.

In a semiconductor integrated circuit device according to this invention, a capacitance device constituted with a first electrode comprising a first metal, a dielectric film and a second electrode comprising a second metal is formed on a main surface of a semiconductor substrate, in which a first semiconductor region formed in the semiconductor substrate and the first electrode of the capacitance device are electrically connected by way of a silicon plug inside a second contact hole formed in a second insulating film over the first semiconductor region, and a metal plug inside a first contact hole formed in a first insulating film over the second insulating film and in which a metal silicide layer is formed on the surface of the silicon plug, and at least one of a metal silicon nitride layer or a metal silicon oxynitride layer is formed on the surface of the metal silicide layer.

A method of manufacturing a semiconductor integrated circuit device according to this invention include the following steps of:

(a) forming a first insulating film on a main surface of a semiconductor substrate formed with a first semiconductor region and then forming a first contact hole to the first insulating film over the first semiconductor region, (b) forming a silicon plug inside the first contact hole, (c) forming a third insulating film over the first insulating film, and then etching the third insulating film over the first contact hole, thereby forming a groove in which the surface of the silicon plug is exposed at the bottom thereof, (d) forming a metal silicide layer on the surface of the silicon plug and then forming a metal silicon nitride layer on the surface of the metal silicide layer, (e) forming a first electrode for the capacitance device comprising a first metal inside the groove, and electrically connecting the first electrode and the first semiconductor region through the first contact hole, (f) forming a dielectric film for the capacitance device over the first electrode and then applying a heat treatment to the dielectric film in an oxygen-containing atmosphere, and (g) forming a second electrode comprising a second metal for the capacitance device over the dielectric film.

A method of manufacturing a semiconductor integrated circuit device according to this invention include the following steps of:
(a) forming a second insulating film on a main surface of a semiconductor substrate formed with a first semiconductor region and then forming a second contact hole to the second insulating film over the first semiconductor region,
(b) forming a silicon plug in the second contact hole,
(c) forming a first insulating film over the second insulating film, and then etching the first insulating film over the second contact hole thereby forming a first contact hole in which the surface of the silicon plug is exposed at the bottom thereof,
(d) forming a metal silicide layer on the surface of the silicon plug and then forming a metal silicon nitride layer on the surface of the metal silicide layer,
(e) forming a metal plug inside the first contact hole,
(f) forming a third insulating film over the first insulating film and then etching the third insulating film over the first contact hole thereby forming a groove in which the surface of the metal plug is exposed at the bottom thereof,
(g) forming a first electrode comprising a first metal for a capacitance device inside the groove, and electrically connecting the first electrode and the first semiconductor region through the first contact hole and the second contact hole,
(h) forming a dielectric film for the capacitance device over the first electrode and then applying a heat treatment to the dielectric film in an oxygen-containing atmosphere, and
(i) forming a second electrode comprising a second metal for the capacitance device over the dielectric film.

A method of manufacturing a semiconductor integrated circuit device according to this invention include the following steps of:
(a) forming a first insulating film on a main surface of a semiconductor substrate formed with a first semiconductor region and then forming a first contact hole to the first insulating film over the first semiconductor region,
(b) forming a silicon plug in the first contact hole,
(c) forming a third insulating film over the first insulating film, and then etching the third insulating film over the first contact hole thereby forming a groove in which the surface of the silicon plug is exposed at the bottom thereof,
(d) forming a metal silicide layer on the surface of the silicon plug and then forming a metal silicon nitride layer on the surface of the metal silicide layer,
(e) a step forming a first metal film on the third insulating film including the inside of the groove thereby burying the first metal film inside the groove and then removing the first metal film outside of the groove,
(f) removing the third insulating film by etching to form a columnar first electrode comprising the columnar first metal for the capacitance device over the first contact hole and electrically connecting the first electrode and the first semiconductor region by way of the first contact hole,
(g) forming a dielectric film for the capacitance device over the first electrode and then applying a heat treatment to the dielectric film in an oxygen-containing atmosphere, and
(h) forming a second electrode comprising a second metal for the capacitance device over the dielectric film.

A method of manufacturing a semiconductor integrated circuit device according to this invention include the following steps of:
(a) forming a second insulating film on a main surface of a semiconductor substrate formed with a first semiconductor region and then forming a second contact hole to the second insulating film over the first semiconductor region,
(b) forming a silicon plug in the second contact hole,
(c) forming a first insulating film over the second insulating film, and then etching the first insulating film over the second contact hole thereby forming a first contact hole in which the surface of the silicon plug is exposed at the bottom of thereof,
(d) forming a metal silicide layer on the surface of the silicon plug and then forming a metal silicon nitride layer on the surface of the metal silicide layer,
(e) forming a metal plug inside the first contact hole,
(f) forming a third insulating film over the first insulating film and then etching the third insulating film over the first contact hole thereby forming a groove in which the surface of the metal plug is exposed at the bottom thereof,
(g) forming a first metal film on the third insulating film including the inside of the groove thereby burying the first metal film inside the groove and then removing the first metal film outside of the groove,
(h) etching to remove the third insulating film to form a columnar first electrode comprising the first metal film for capacitance device over the first contact hole, and electrically connecting the fist electrode and the first semiconductor region through the first contact hole and the second contact hole,
(i) forming a dielectric film for the capacitance device over the first electrode and then applying a heat treatment to the dielectric film in an oxygen-containing atmosphere, and
(j) forming a second electrode comprising a second metal for the capacitance device over the dielectric film.

BRIEF DESCRIPTION OF THE DRAWINGS

FIG. 120 is an enlarged cross sectional view for a main portion of a semiconductor substrate illustrating a process for manufacturing a DRAM as other embodiment according to this invention;

FIG. 121 is an enlarged cross sectional view for a main portion of a semiconductor substrate illustrating a process for manufacturing a DRAM as other embodiment according to this invention;

FIG. 122 is an enlarged cross sectional view for a main portion of a semiconductor substrate illustrating a process for manufacturing a DRAM as other embodiment according to this invention;

FIG. 123 is an enlarged cross sectional view for a main portion of a semiconductor substrate illustrating a process for manufacturing a DRAM as other embodiment according to this invention;

FIG. 124 is an enlarged cross sectional view for a main portion of a semiconductor substrate illustrating a process for manufacturing a DRAM as other embodiment according to this invention;

FIG. 125 is an enlarged cross sectional view for a main portion of a semiconductor substrate illustrating a process for manufacturing a DRAM as other embodiment according to this invention;

FIG. 126 is an enlarged cross sectional view for a main portion of a semiconductor substrate illustrating a process for manufacturing a DRAM as other embodiment according to this invention;

FIG. 127 is an enlarged cross sectional view for a main portion of a semiconductor substrate illustrating a process for manufacturing a DRAM as other embodiment according to this invention;

FIG. 128 is an enlarged cross sectional view for a main portion of a semiconductor substrate illustrating a process for manufacturing a DRAM as other embodiment according to this invention;

FIG. 129 is an enlarged cross sectional view for a main portion of a semiconductor substrate illustrating a process for manufacturing a DRAM as other embodiment according to this invention;

FIG. 130 is an enlarged cross sectional view for a main portion of a semiconductor substrate illustrating a process for manufacturing a DRAM as other embodiment according to this invention;

FIG. 131 is an enlarged cross sectional view for a main portion of a semiconductor substrate illustrating a process for manufacturing a DRAM as other embodiment according to this invention;

Figure 132:
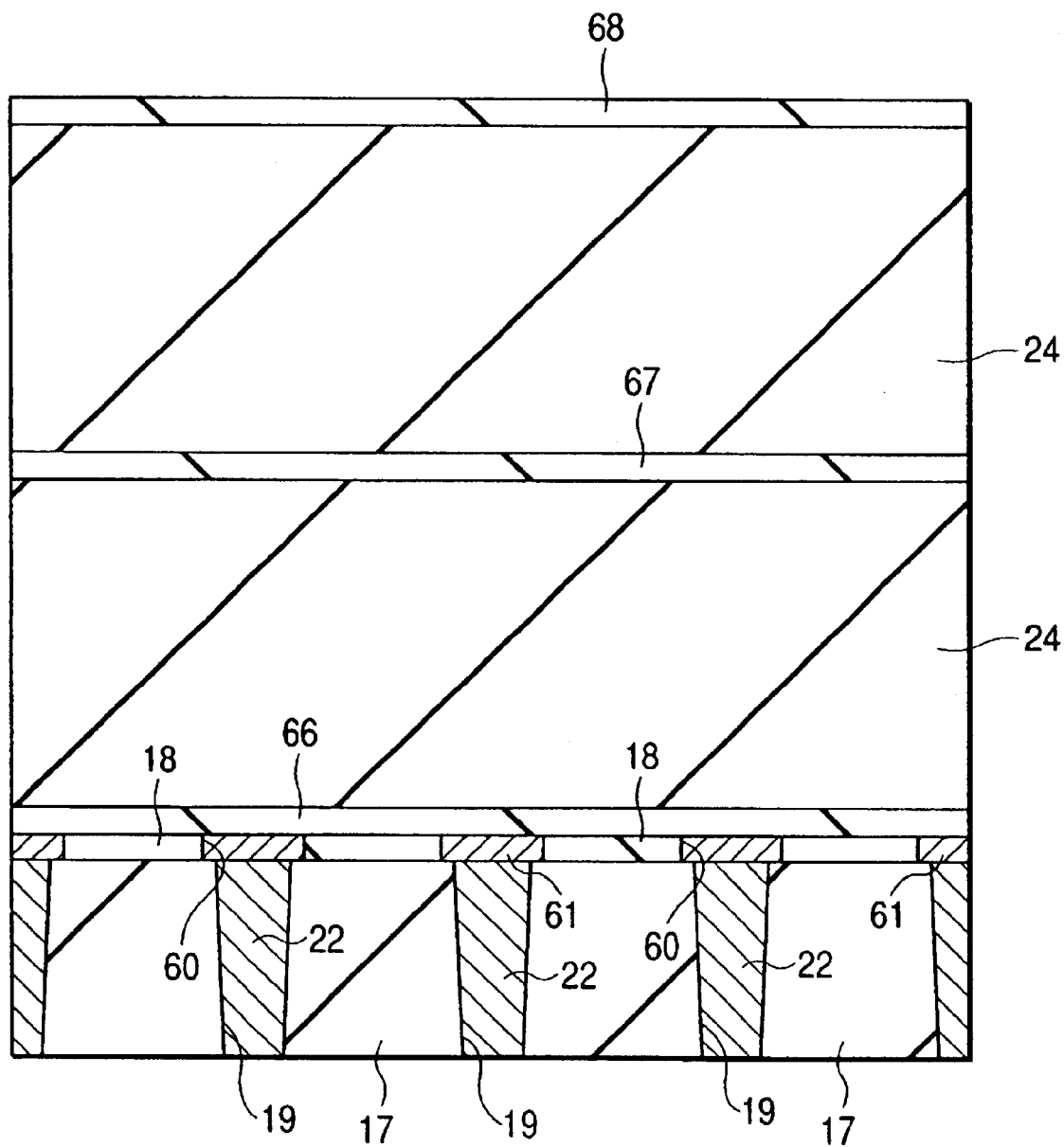
Figure 133:
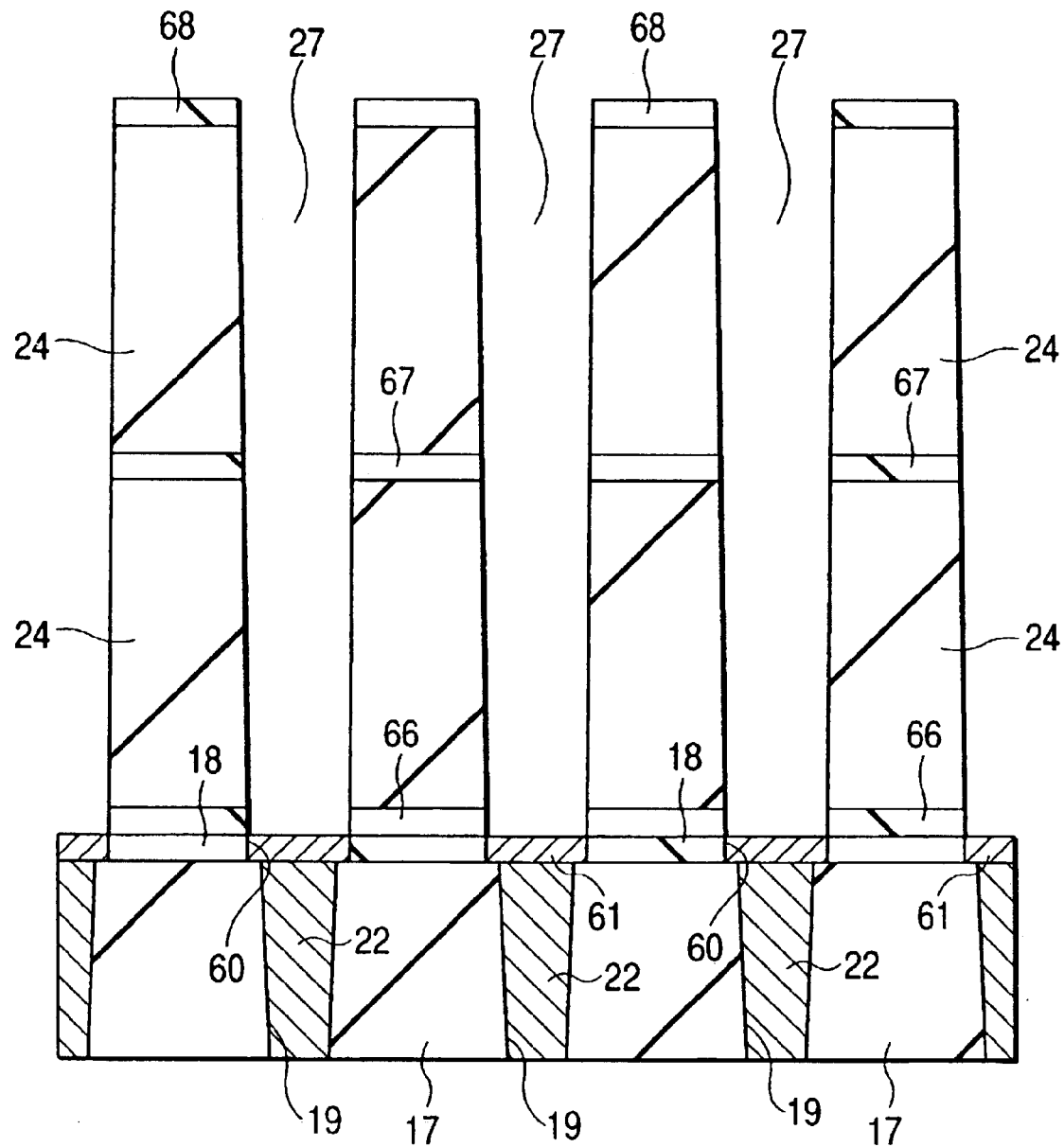
Figure 134:
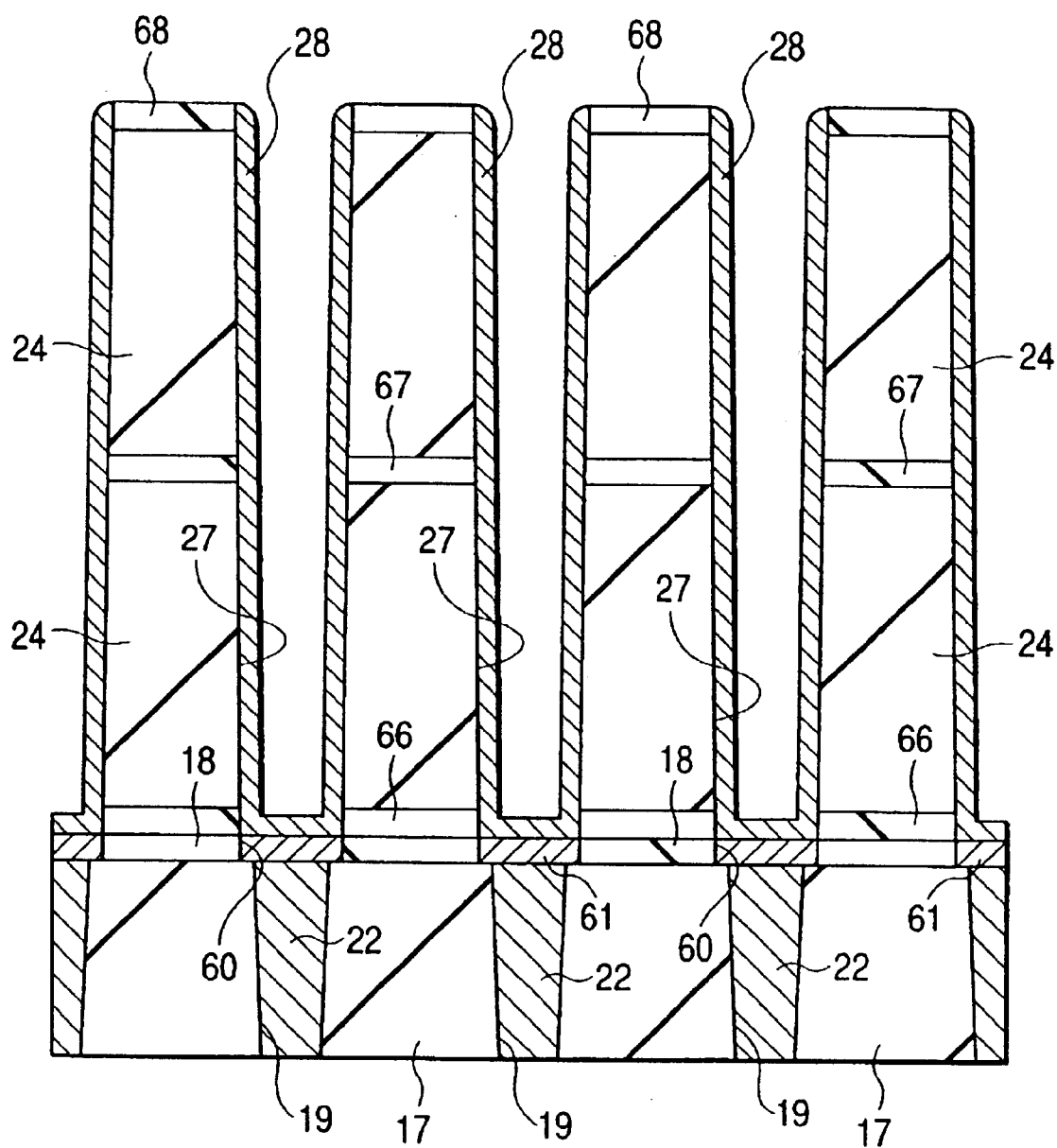
Figure 135:
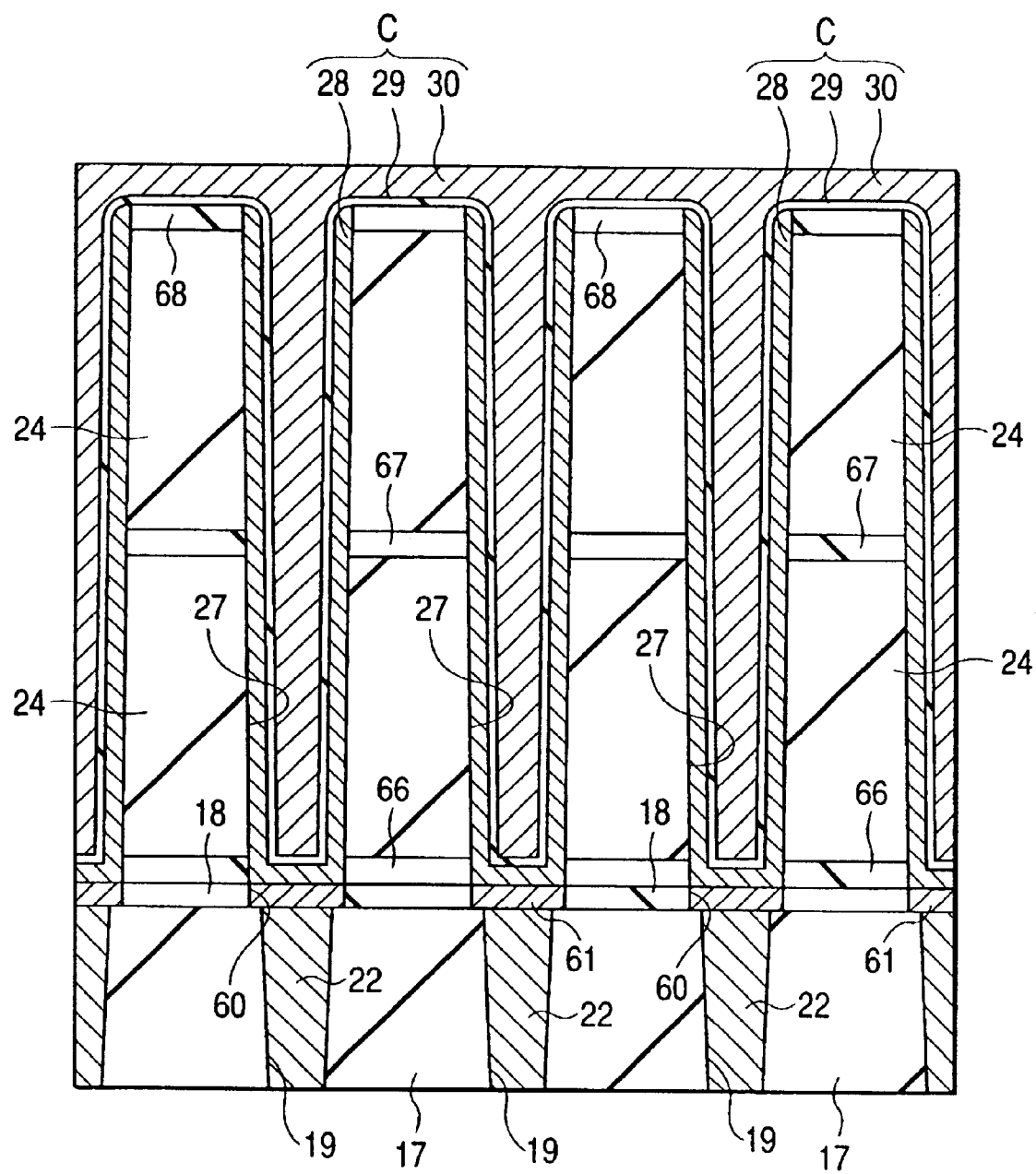
Figure 136:
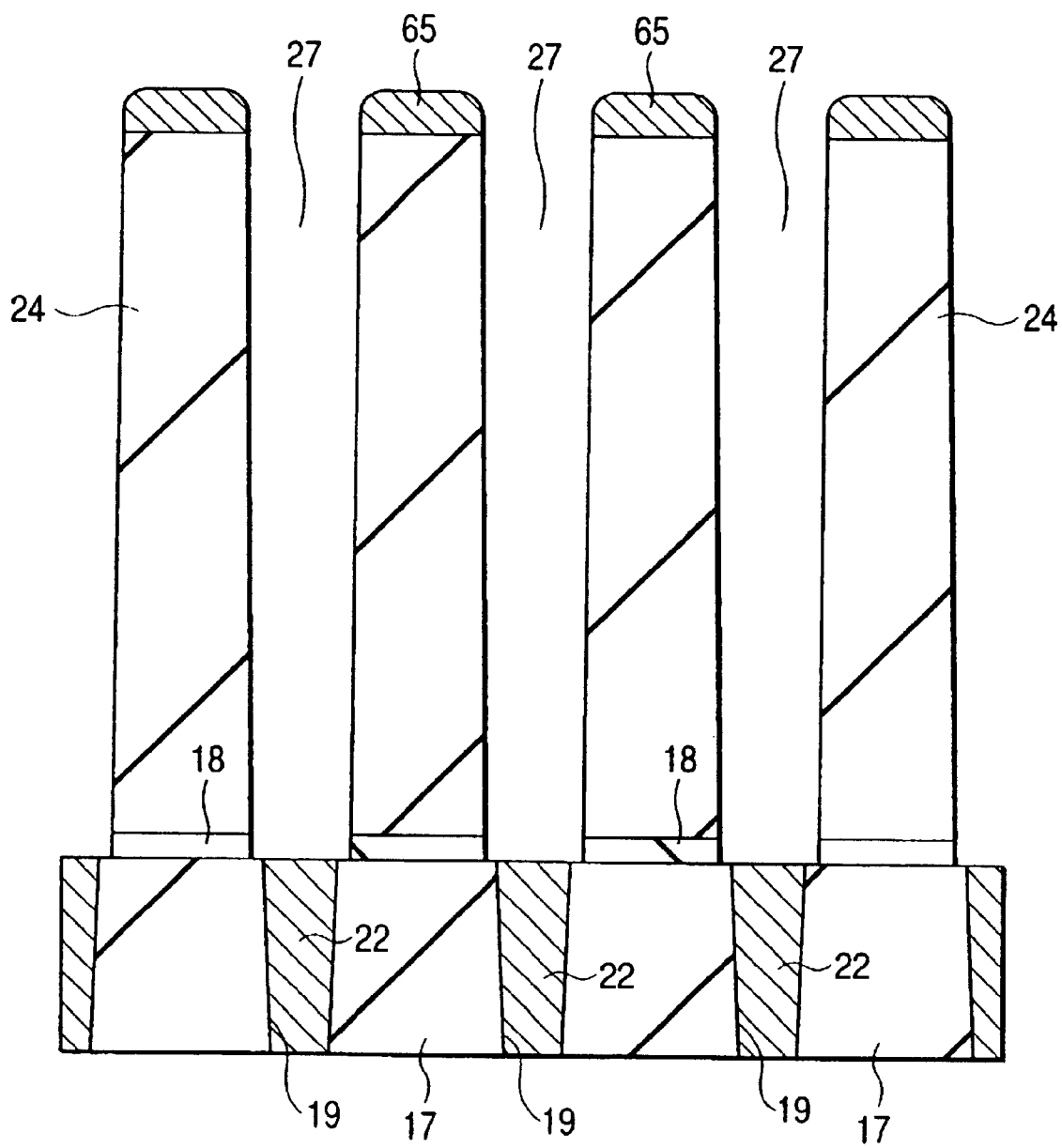
Figure 137:
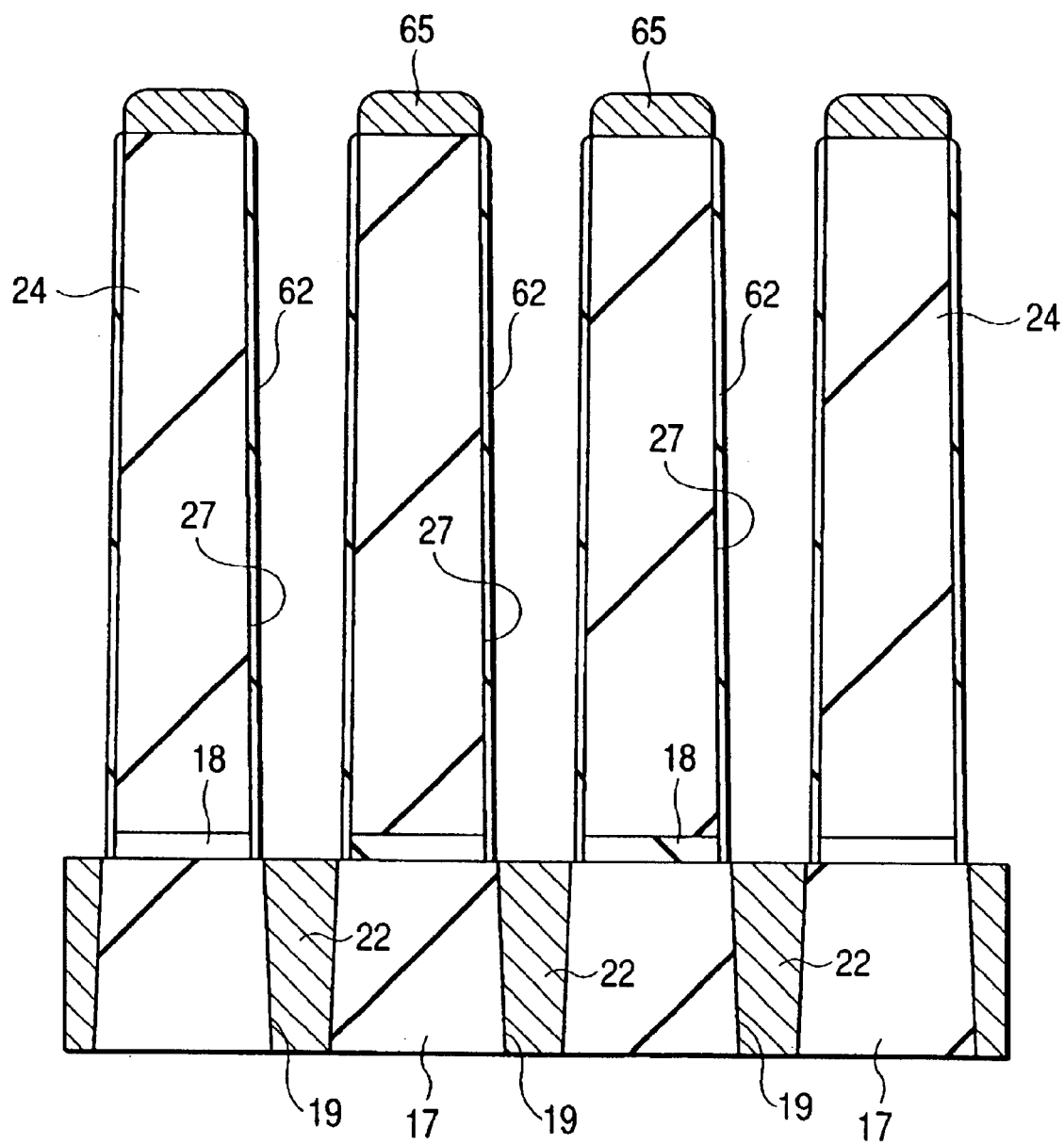
Figure 138:
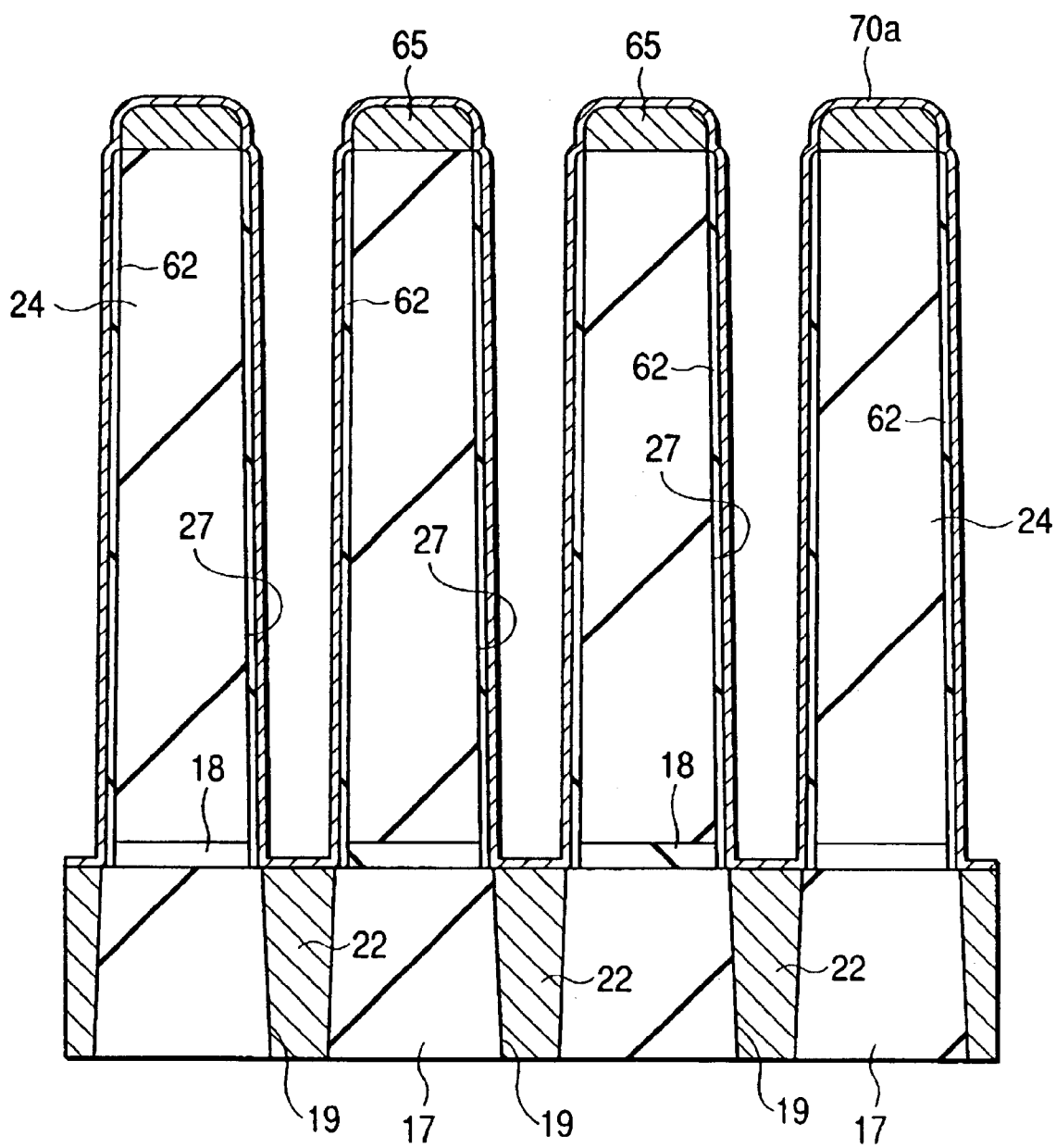
Figure 139:
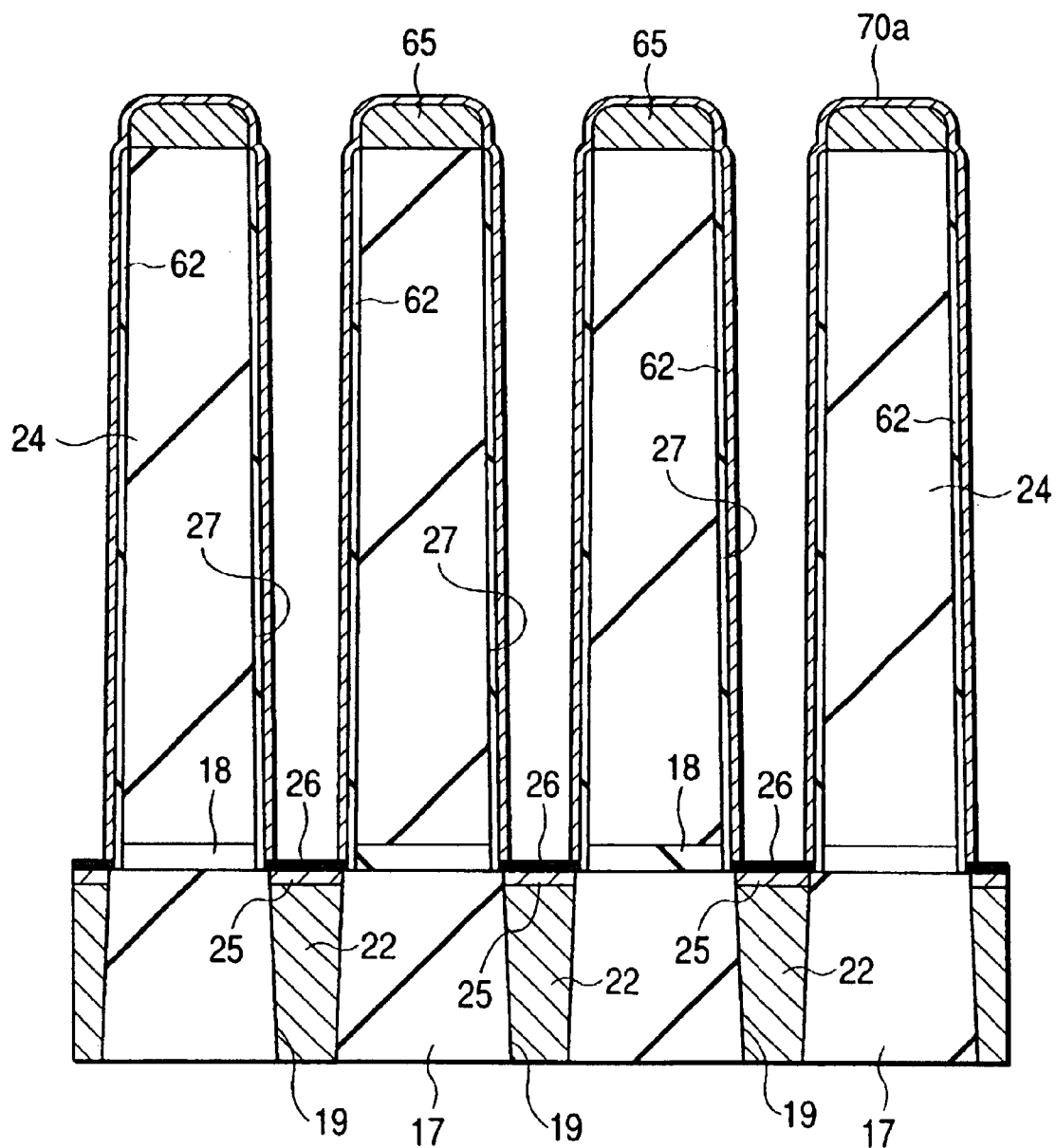
Figure 140:
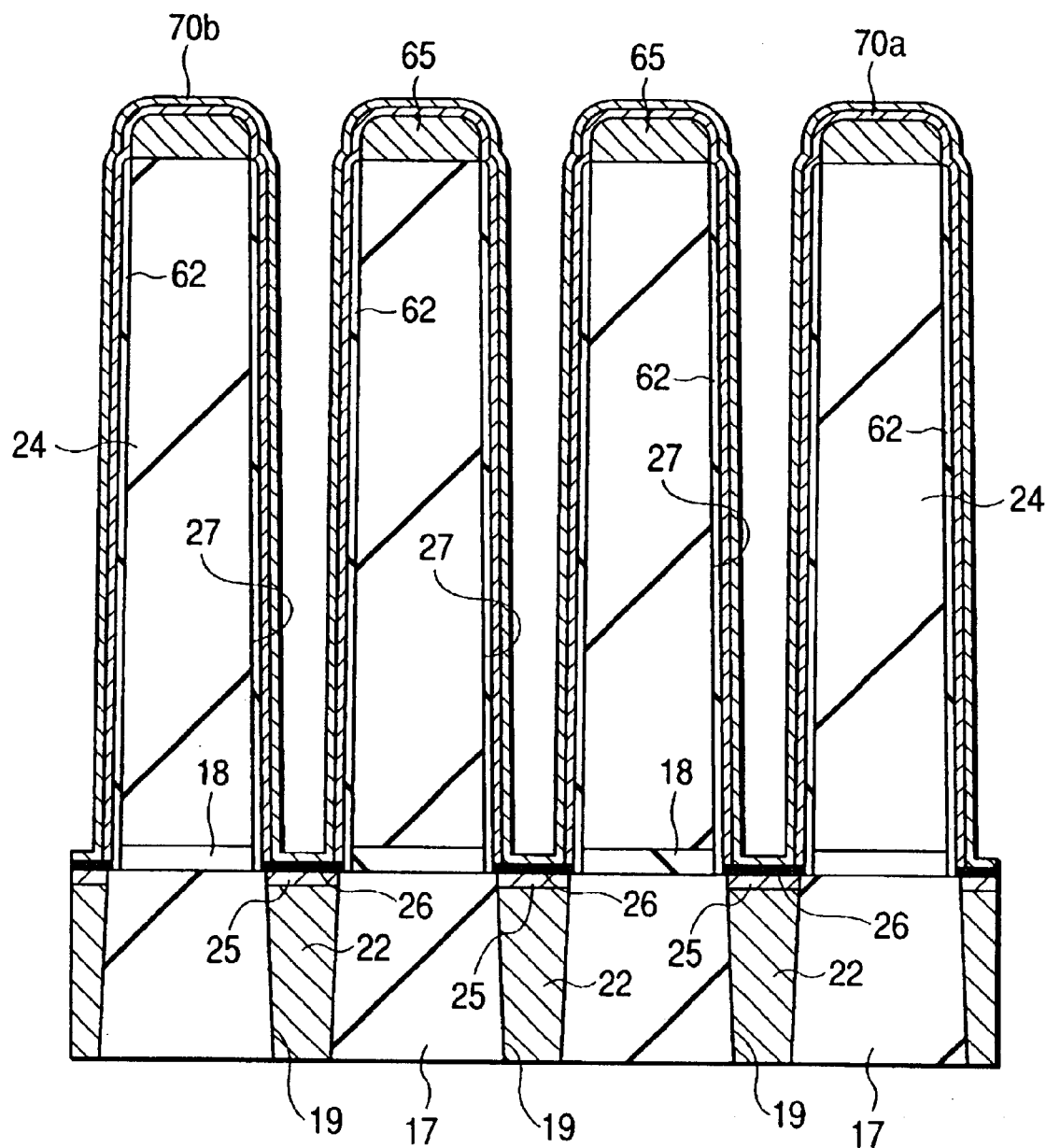
Figure 141:
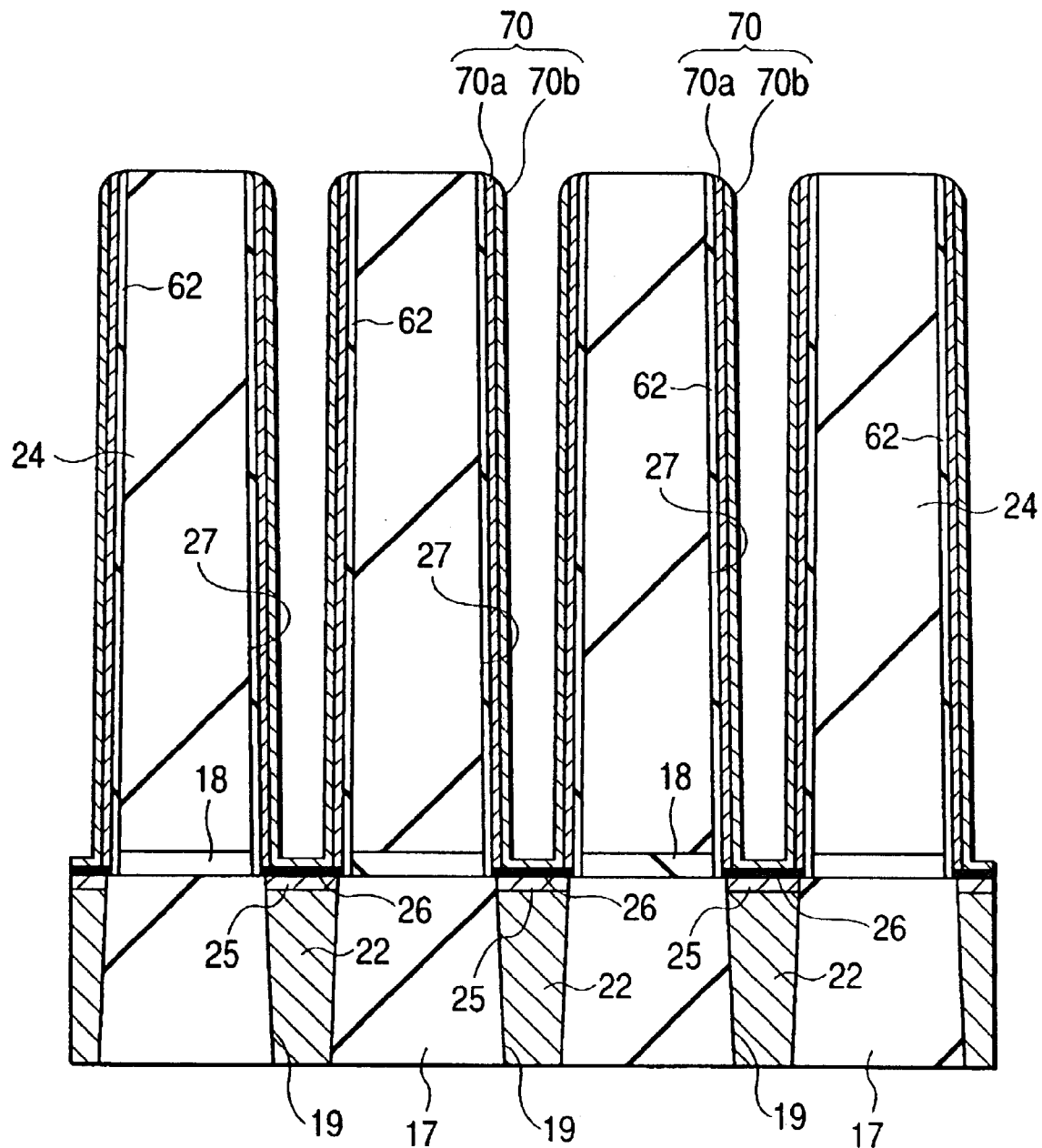
Figure 142:
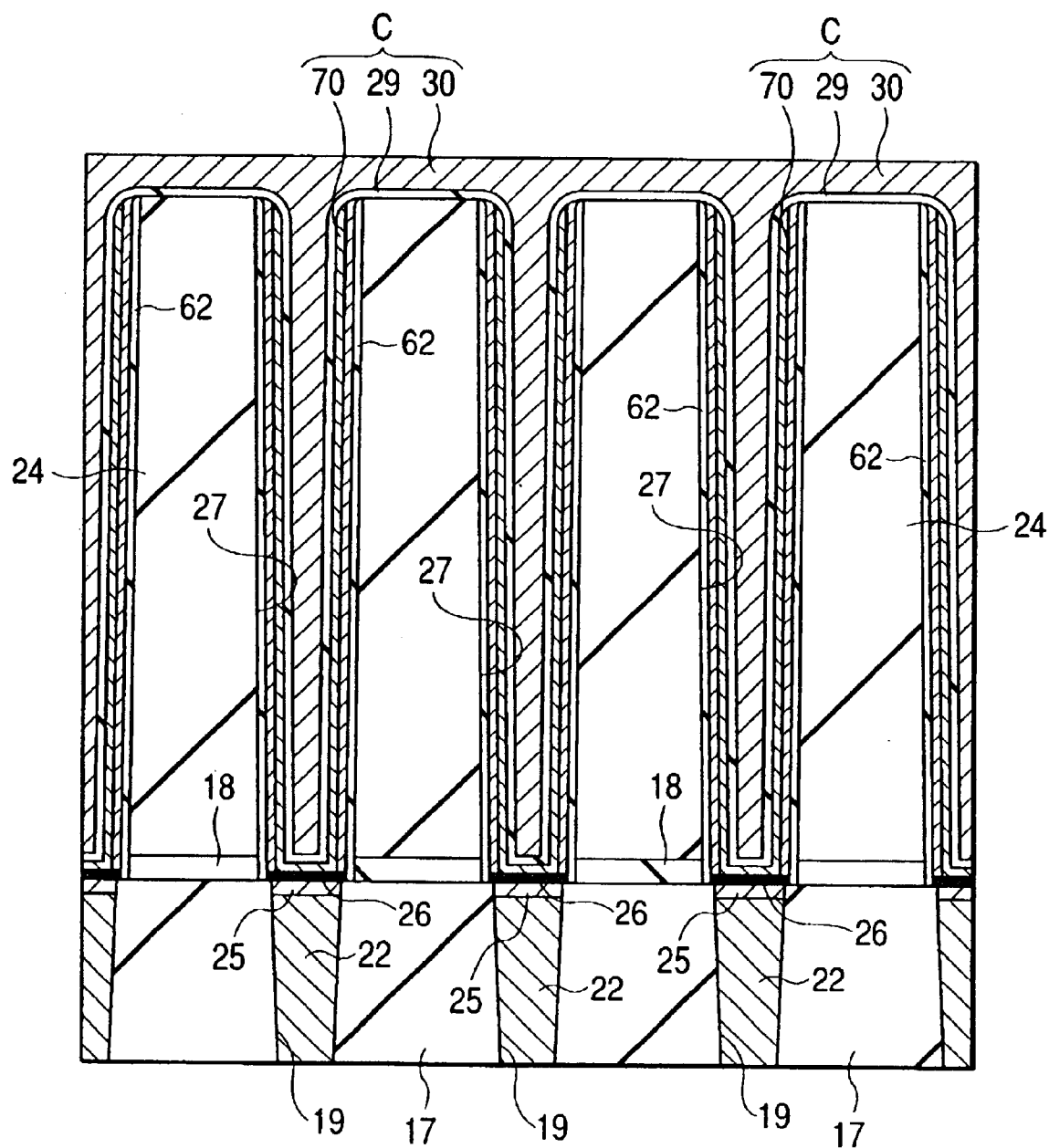
Figure 143:
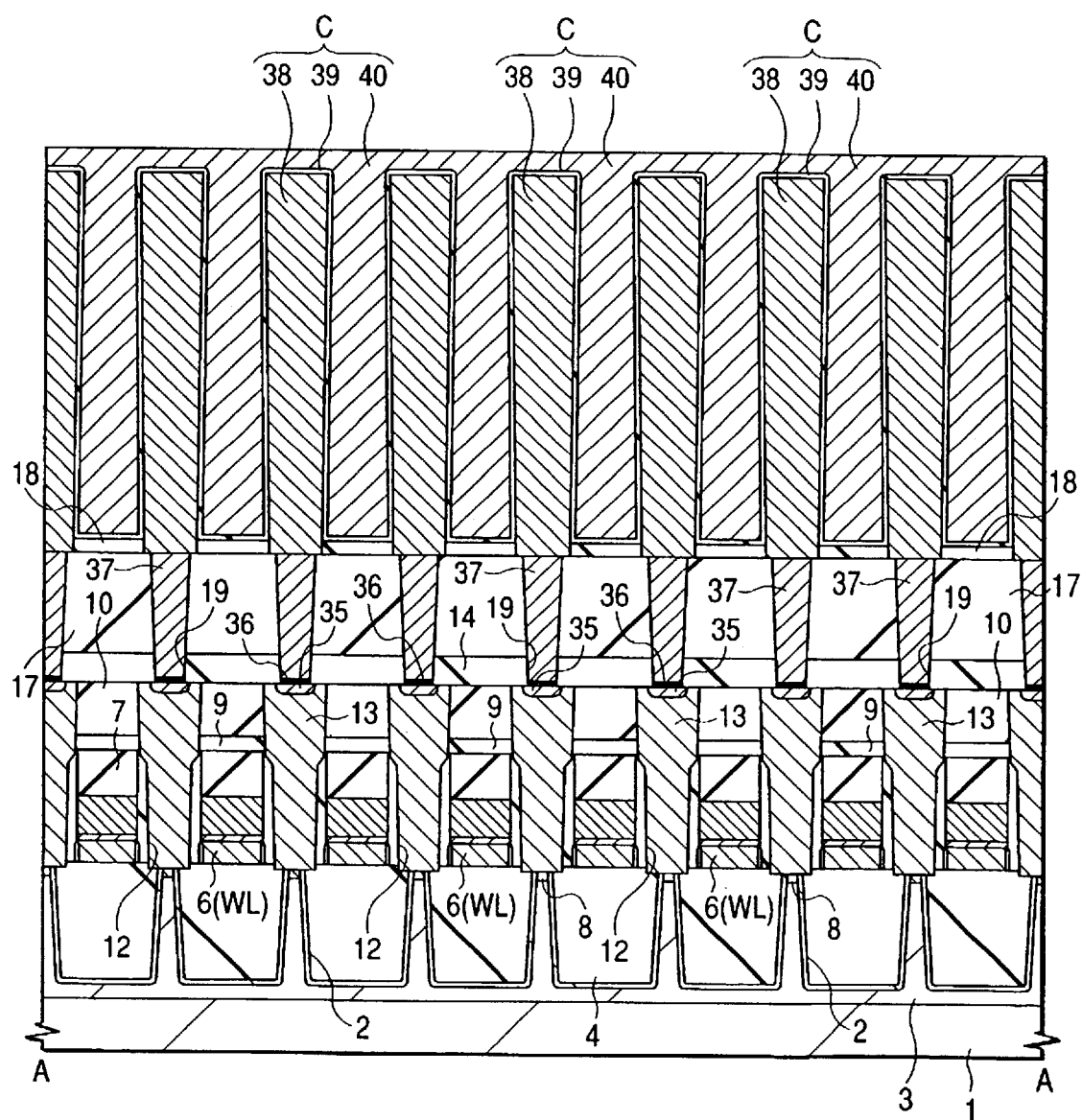
Figure 144:
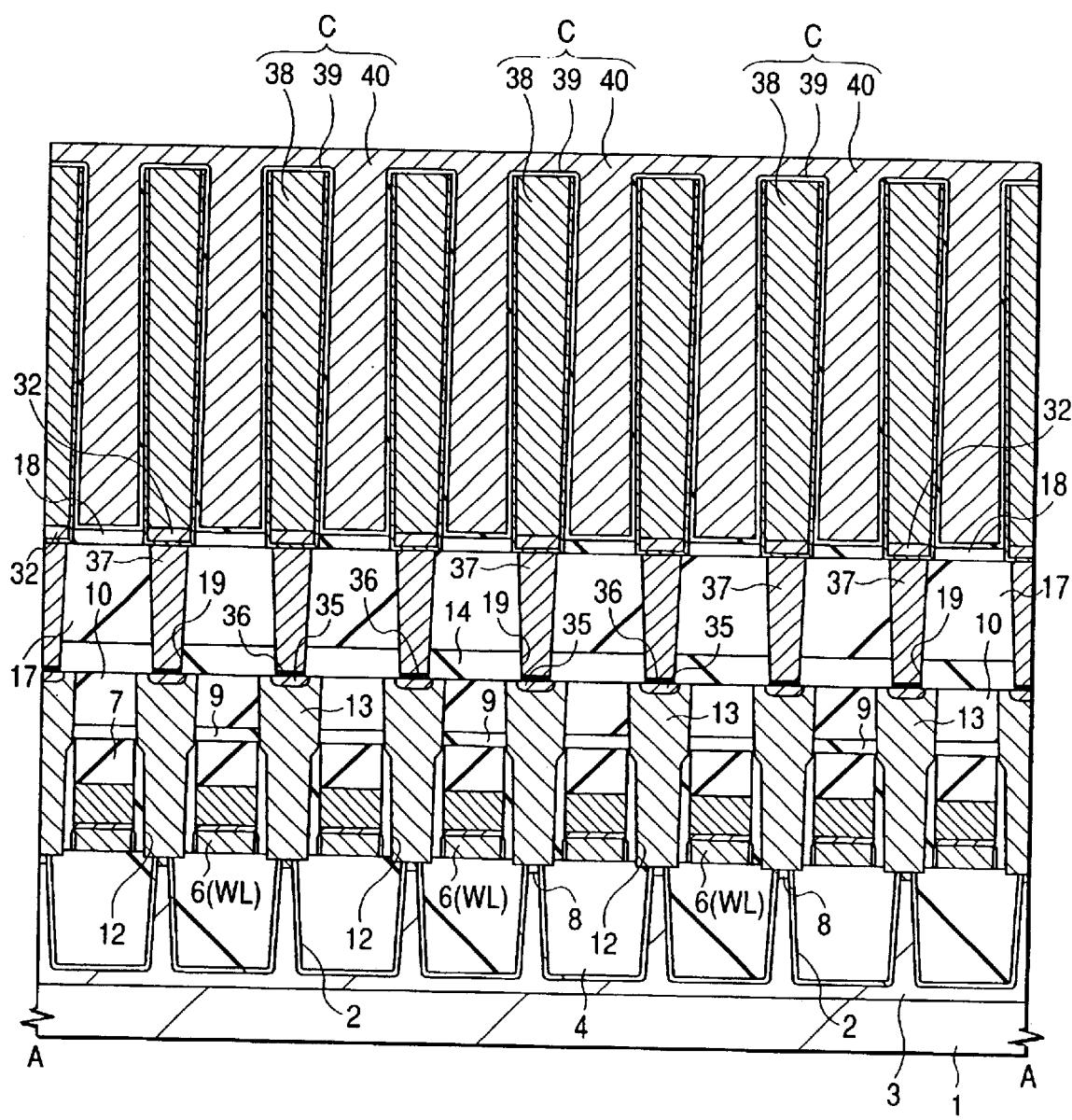

FIG. 132 is an enlarged cross sectional view for a main portion of a semiconductor substrate illustrating a process for manufacturing a DRAM as other embodiment according to this invention;

FIG. 133 is an enlarged cross sectional view for a main portion of a semiconductor substrate illustrating a process for manufacturing a DRAM as other embodiment according to this invention;

FIG. 134 is an enlarged cross sectional view for a main portion of a semiconductor substrate illustrating a process for manufacturing a DRAM as other embodiment according to this invention;

FIG. 135 is an enlarged cross sectional view for a main portion of a semiconductor substrate illustrating a process for manufacturing a DRAM as other embodiment according to this invention;

FIG. 136 is an enlarged cross sectional view for a main portion of a semiconductor substrate illustrating a process for manufacturing a DRAM as other embodiment according to this invention;

FIG. 137 is an enlarged cross sectional view for a main portion of a semiconductor substrate illustrating a process for manufacturing a DRAM as other embodiment according to this invention;

FIG. 138 is an enlarged cross sectional view for a main portion of a semiconductor substrate illustrating a process for manufacturing a DRAM as other embodiment according to this invention;

FIG. 139 is an enlarged cross sectional view for a main portion of a semiconductor substrate illustrating a process for manufacturing a DRAM as other embodiment according to this invention;

FIG. 140 is an enlarged cross sectional view for a main portion of a semiconductor substrate illustrating a process for manufacturing a DRAM as other embodiment according to this invention;

FIG. 141 is an enlarged cross sectional view for a main portion of a semiconductor substrate illustrating a process for manufacturing a DRAM as other embodiment according to this invention;

FIG. 142 is an enlarged cross sectional view for a main portion of a semiconductor substrate illustrating a process for manufacturing a DRAM as other embodiment according to this invention;

FIG. 143 is a cross sectional view for a main portion of a semiconductor substrate illustrating a process for manufacturing a DRAM as other embodiment according to this invention; and FIG. 144 is a cross sectional view for a main portion of a semiconductor substrate illustrating a process for manufacturing a DRAM as other embodiment according to this invention.

DESCRIPTION OF THE PREFERRED EMBODIMENTS

This invention is to be described by way of preferred embodiments with reference to the drawings. In all of the drawings for explaining preferred embodiments, those members having identical functions carry identical reference numerals, for which duplicate explanations will be omitted.

Figure 1:
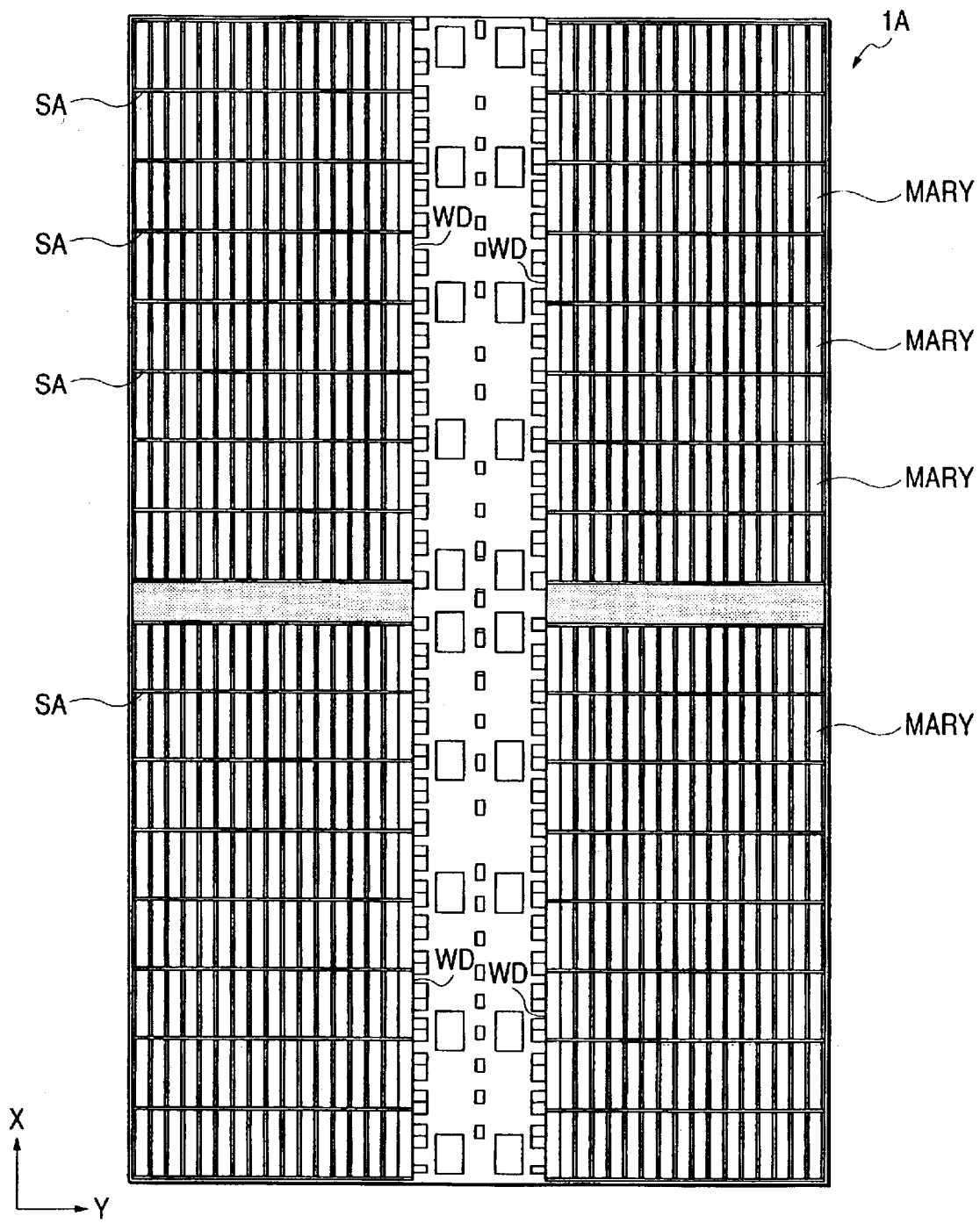
FIG. 1 is an entire plan view of a silicon chip formed with a DRAM as one embodiment according to this invention.

FIG. 1 is an entire plan view of a silicon chip 1A formed with a DRAM of this embodiment (Embodiment 1). On a main surface of a rectangular silicon chip 1A, a DRAM having a memory capacity, for example, of 256 Mbit (megabit) to 1 Gbit (gigabit) is formed. The DRAM comprises a memory area divided into a plurality of memory arrays (MARY) and peripheral circuits arranged at the periphery of them. In a central area of the main surface of the silicon chip 1A are disposed word drivers WD, control circuits such as data line selection circuits, input/output circuits and bonding pads. Further, a sense amplifier SA is disposed between each of memory arrays (MARY).

Figure 2:
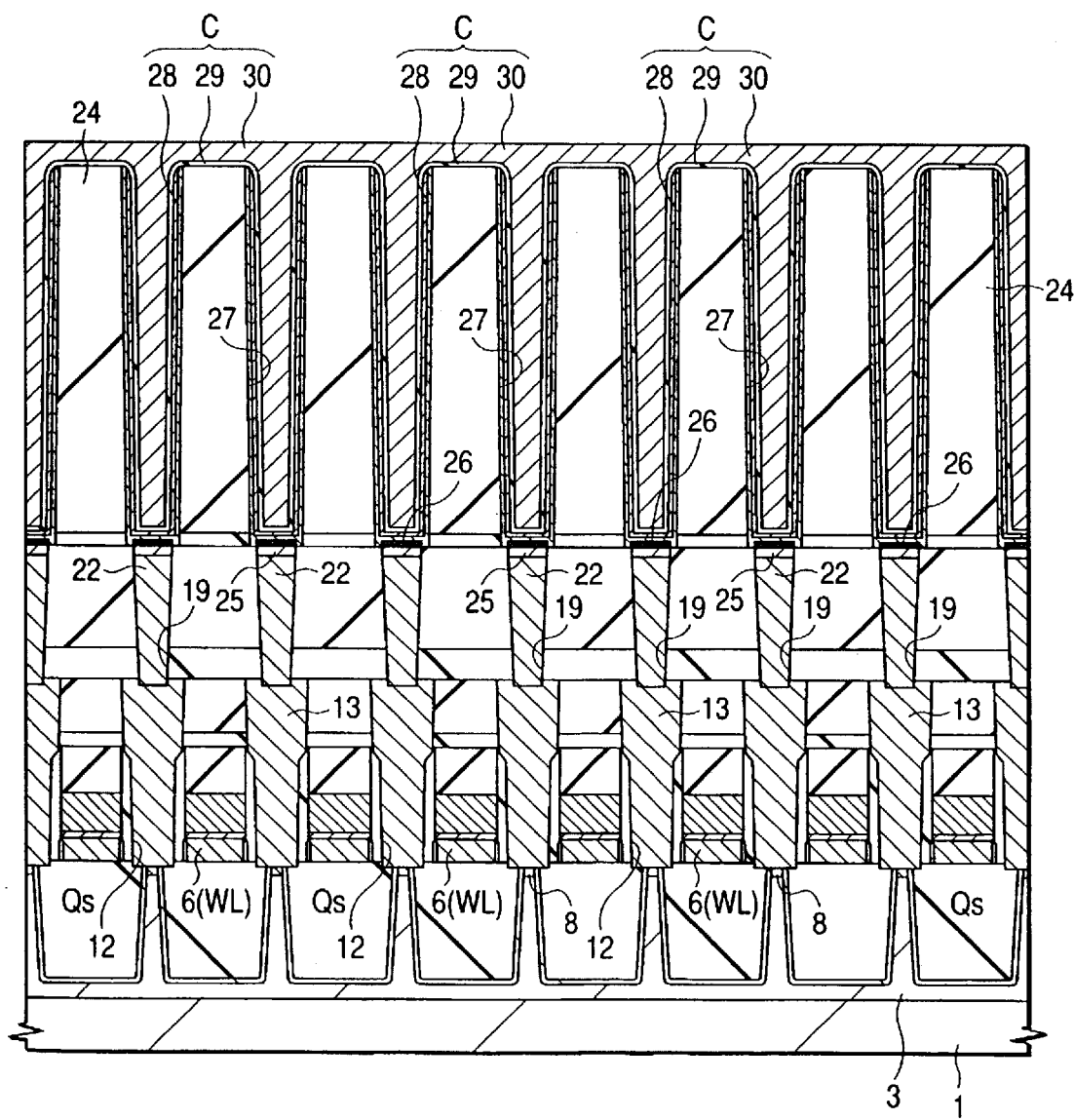
FIG. 2 is a cross sectional view for a main portion of a semiconductor substrate formed with a DRAM as one embodiment according to this invention.
Figure 3:
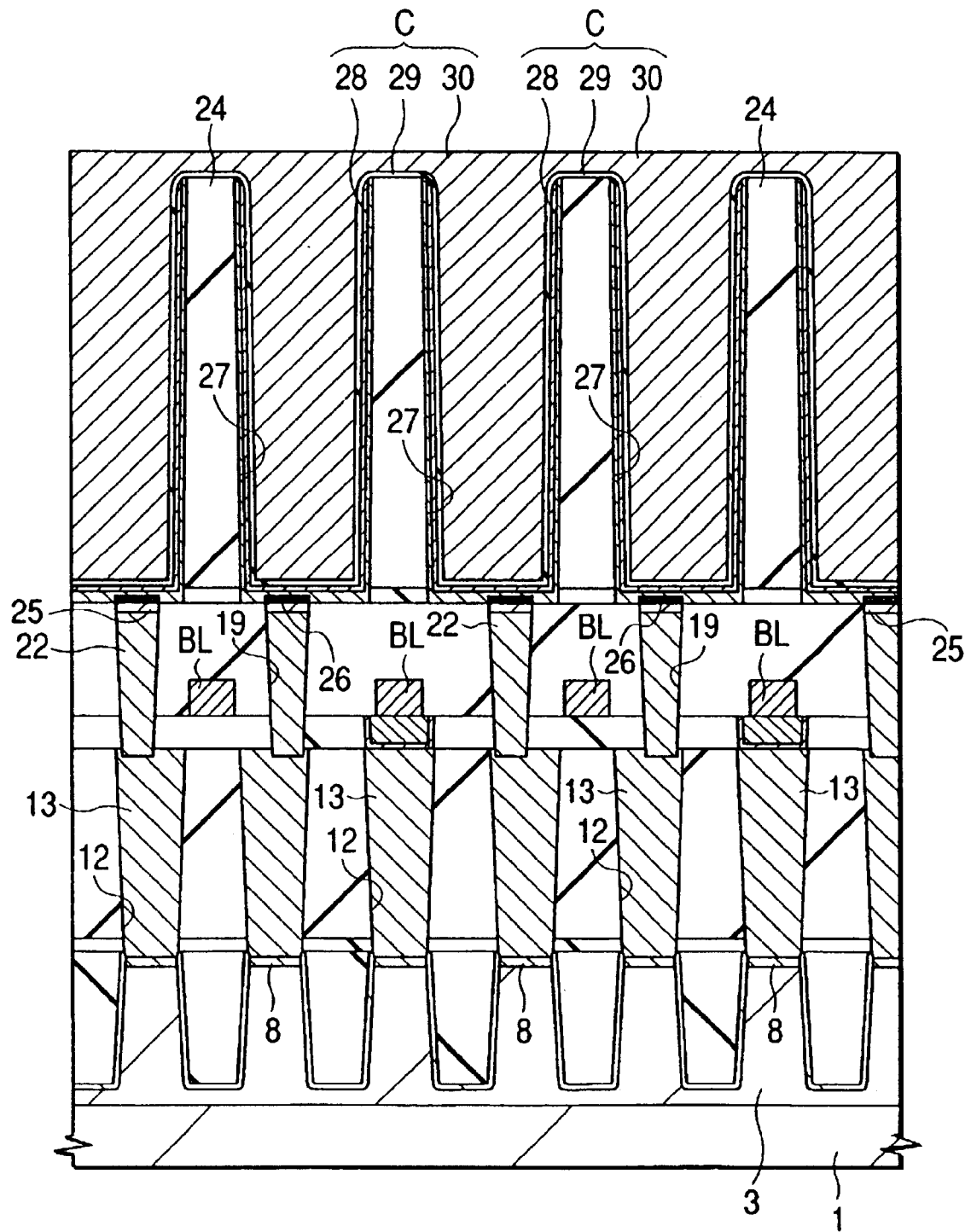
FIG. 3 is a cross sectional view for a main portion of a semiconductor substrate formed with a DRAM as one embodiment according to this invention.

The memory array (MARY) is constituted with a plurality of word lines and bit lines arranged in a matrix and a plurality of memory cells located at intersections of them. FIG. 2 and FIG. 3 are cross sectional views of a silicon substrate (hereinafter simply referred to as a substrate) 1 showing a portion of a DRAM memory array (MARY).

One memory cell for storing 1 bit information comprises one memory cell selecting MISFETQs formed in a p-well 2 of a substrate 1 and one information storage capacitance device (capacitor) C connected in series therewith. The memory cell selecting MISFETQs mainly comprises a gate electrode 6 (word line WL), source and drain (n-semiconductor region 8) and a gate insulating film 5 not illustrated in the drawings. One of the source and drain (n-semiconductor region 8) of the memory cell selecting MISFETQs is electrically connected with the information storage capacitance device C and the other of them is electrically connected with a bit line BL.

As shown in the drawings, the memory cell adopts a stacked capacitor structure of locating the information storage capacitance device C as a information storage capacitance section above the memory cell selecting MISFETQs. The information storage capacitance device C comprises a lower electrode (storage node) 28 comprising a metal containing Ru (ruthenium) as a main ingredient, a dielectric film 29 formed over the lower electrode 28 and containing $Ta_2O_5$ (tantalum oxide) as a main ingredient and an upper electrode (plate electrode) 30 comprising a metal containing TiN (titanium nitride) as a main ingredient. The information storage capacitance device C is formed in a groove 27 of a high aspect ratio formed in a silicon oxide film 24 of a large thickness over the memory cell selecting MISFETQs.

The lower electrode 28 of the information storage capacitance device C and one of the source and drain (n-semiconductor region 8) of the memory cell selecting MISFETQs are connected electrically by way of a contact hole 12 and a through hole 19 thereabove. Plugs 13 and 22 each comprising a polycrystal silicon film are buried, respectively, in the contact hole 12 and the through hole 19.

An Ru silicide layer 25 and an Ru silicon nitride layer 26 are formed at the boundary between the lower electrode 28 of the information storage capacitance device C and a plug 22 buried in the through hole 19 therebelow as a barrier layer for preventing the Ru constituting the lower electrode 28 and polycrystal silicon constituting the plug 22 from taking place a undesired silicide reaction by a heat treatment conducted in the course of a manufacturing step. The Ru silicon nitride layer 26 as a upper barrier layer is oxidized by the heat treatment applied in the course of the manufacturing step and at least a portion thereof is sometimes formed into silicon oxynitride.

Figure 4:
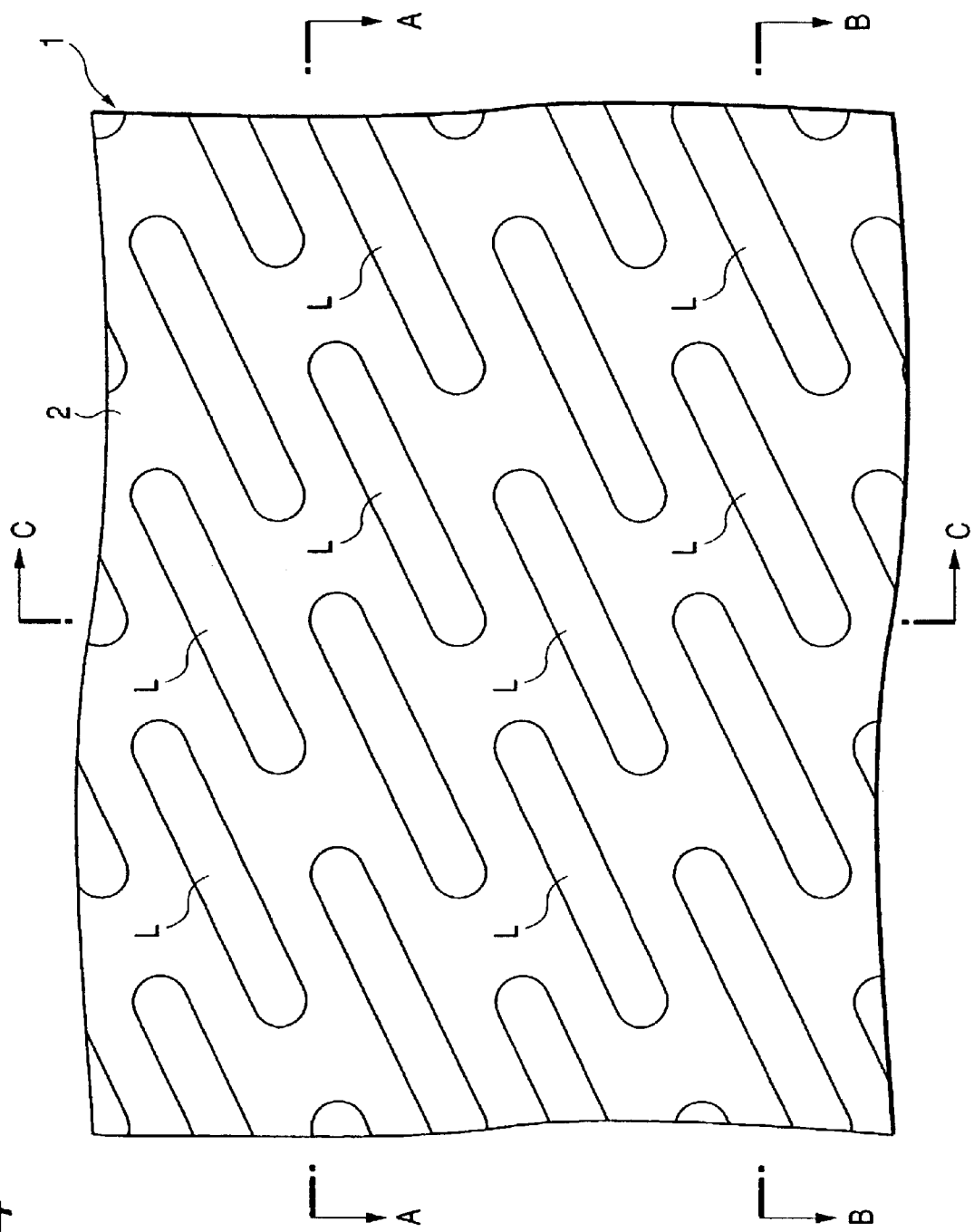
FIG. 4 is a plan view for a main portion of a semiconductor substrate formed with a DRAM as one embodiment according to this invention.
Figure 58:
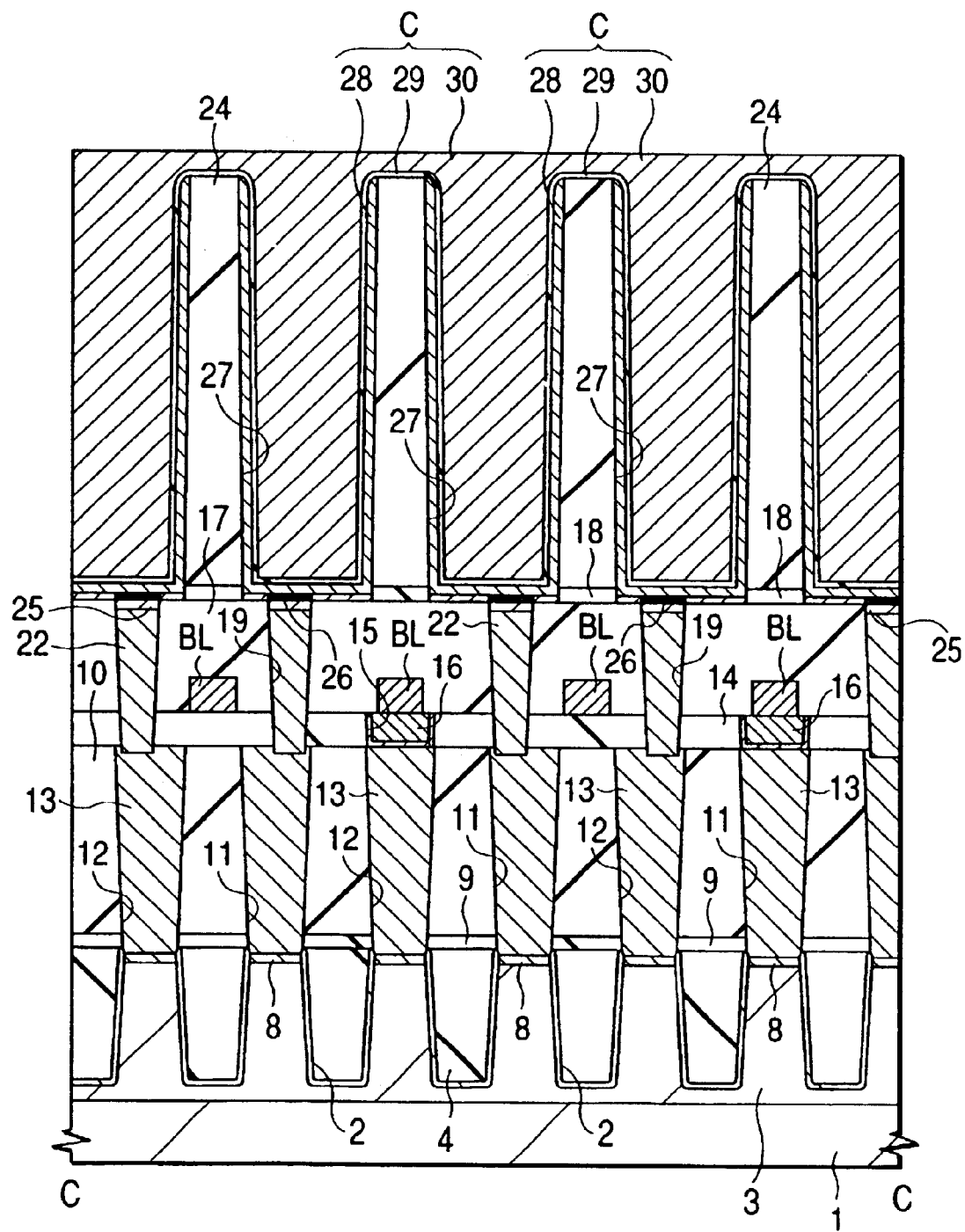
FIG. 58 is a cross sectional view for a main portion of a semiconductor substrate illustrating a process for manufacturing a DRAM as one embodiment according to this invention.

Then, a process for manufacturing the DRAM in this embodiment is to be explained along the sequence of steps with reference to FIG. 4 to FIG. 58. In the manufacturing steps for the DRAM to be explained below, from the step of forming the memory cell selecting MISFETQs on the main surface of the substrate 1 to the step of successively forming bit lines BL on the memory cell selecting MISFETQs are described specifically, for example, in Japanese Published Unexamined Patent Application Hei 11(1999)-166320 (Matsuoka, et al). Accordingly, in this embodiment, only the outline is described for the steps up to the formation of the bit line BL and description is to be made in details for the manufacturing steps of the information storage capacitance device C as a main constituent portion. Further, the steps up to the formation of the bit line BL is not restricted to the steps to be described below.

Figure 5:
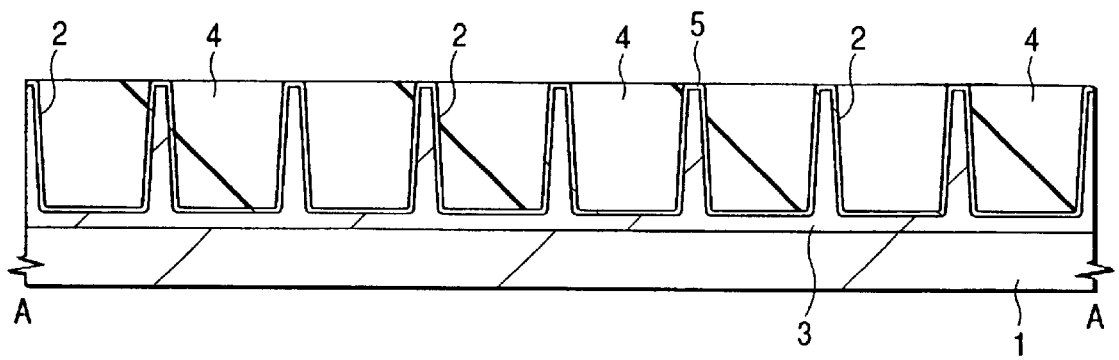
FIG. 5 is a cross sectional view for a main portion of a semiconductor substrate formed with a DRAM as one embodiment according to this invention.
Figure 6:
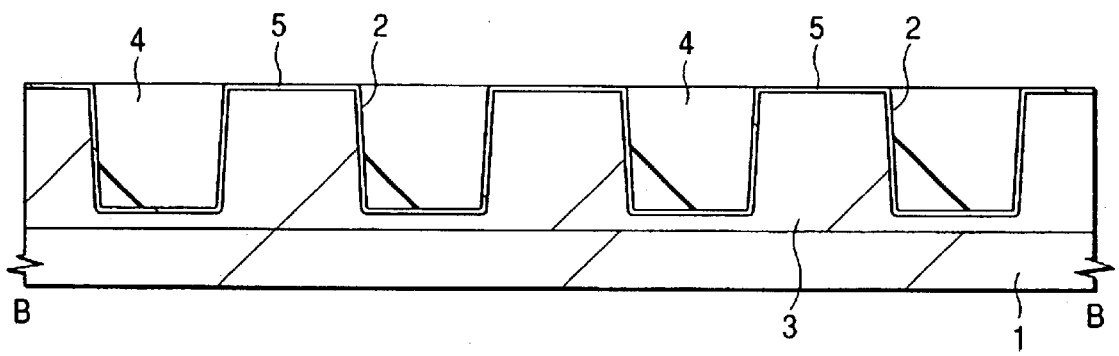
FIG. 6 is a cross sectional view for a main portion of a semiconductor substrate illustrating a process for manufacturing a DRAM as one embodiment according to this invention.
Figure 7:
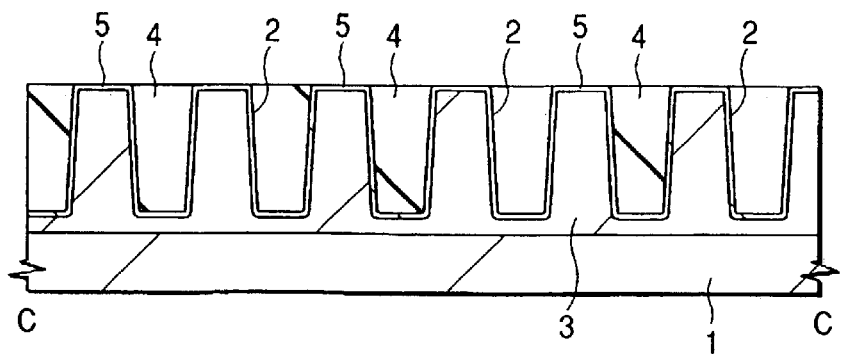
FIG. 7 is a cross sectional view for a main portion of a semiconductor substrate illustrating a process for manufacturing a DRAM as one embodiment according to this invention.

At first, as shown in FIG. 4 (plan view for a main portion of a memory array), FIG. 5 (cross sectional view taken along line A—A in FIG. 4), FIG. 6 (cross sectional view taken along line B—B in FIG. 4) and FIG. 7 (cross sectional view taken along line C—C in FIG. 4), a device isolation groove 2 is formed in a device isolation region of the main surface of a substrate 1 comprising, for example, p-type single crystal silicon. The device isolation groove 2 is formed by etching the surface of the substrate 1 to form a groove of about 300 to 400 nm depth, successively depositing a silicon oxide film 4 (about 600 nm thickness) on the substrate 1 including the inside of the groove by a CVD (Chemical Vapor Deposition) method and then polishing and flattening the silicon oxide film 4 by a chemical mechanical polishing (CMP) method. The silicon oxide film 4 is deposited, for example, by a plasma CVD method using oxygen (or ozone) and tetraethoxy silane (TEOS) as a source gas and then dry-oxidized at about 1000° C. to densify the film.

As shown in FIG. 4, when the device isolation grooves 2 are formed, a number of elongate island-shape active regions (L) being surrounded at the periphery with the device isolation groove 2 are formed simultaneously. As will be described later, two memory cell selecting MISFETQs having one of source and drain in common are formed in each of the active regions (L).

Then, a p-well 3 is formed by ion implanting B (boron) to the substrate 1, successively, the surface of the p-well 3 is cleaned by an HF (hydrofluoric acid) type cleaning solution and then the substrate 1 is thermally oxidized to form a silicon oxide type clean gate insulating film 5 (about 6 nm thickness) on the surface of the active region (L) in the p-well 3. The gate insulating film 5 may be a silicon oxide insulating film formed by the thermal oxidation of the substrate 1, as well as a silicon nitride insulating film or a metal oxide insulating film (for example, tantalum oxide film or titanium oxide film) of a higher dielectric constant than the silicon oxide insulating film. The highly dielectric insulating film is formed by deposition on the substrate 1 by the CVD method or sputtering method.

Figure 8:
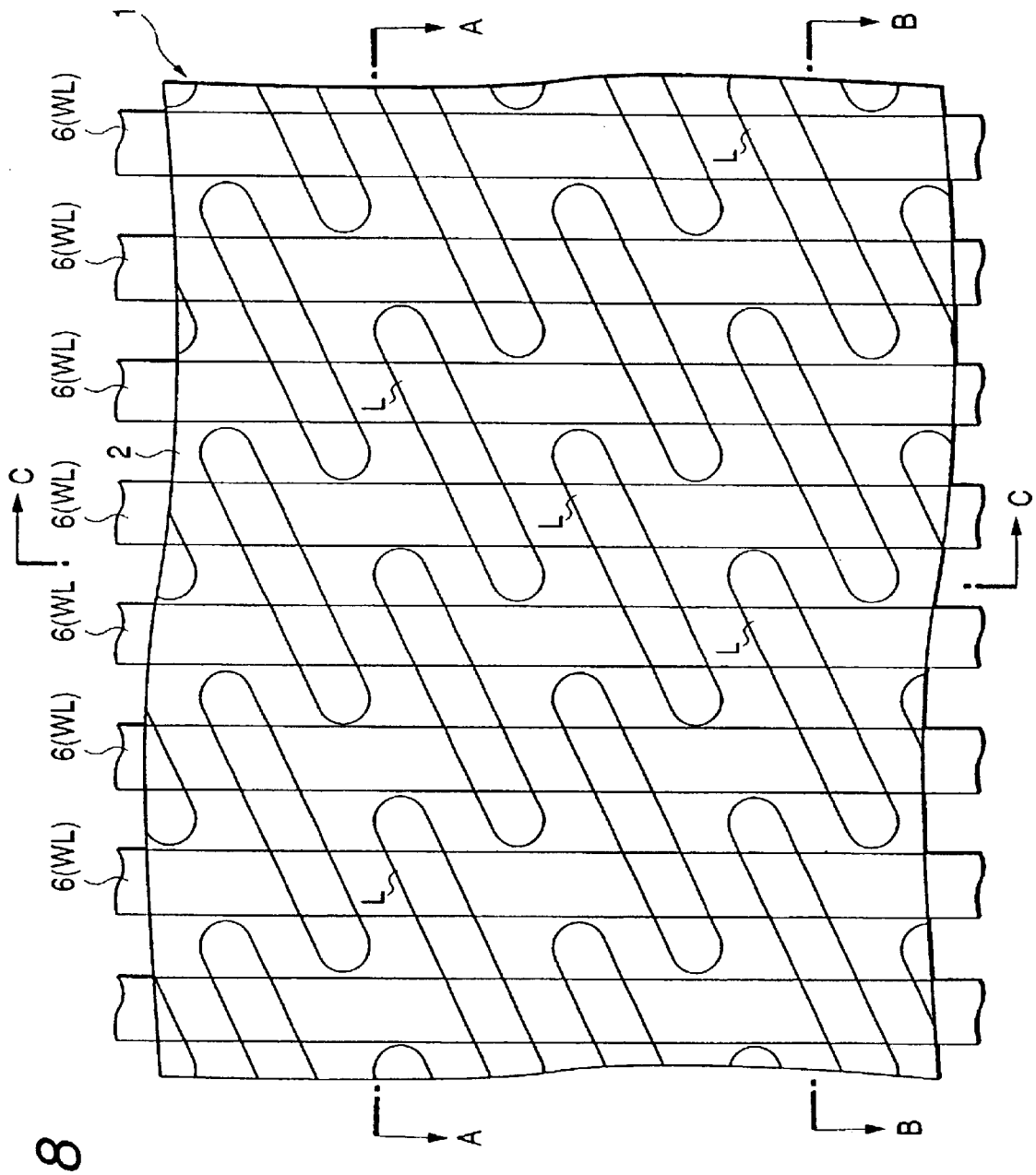
FIG. 8 is a plan view for a main portion of a semiconductor substrate illustrating a process for manufacturing a DRAM as one embodiment according to this invention.
Figure 9:
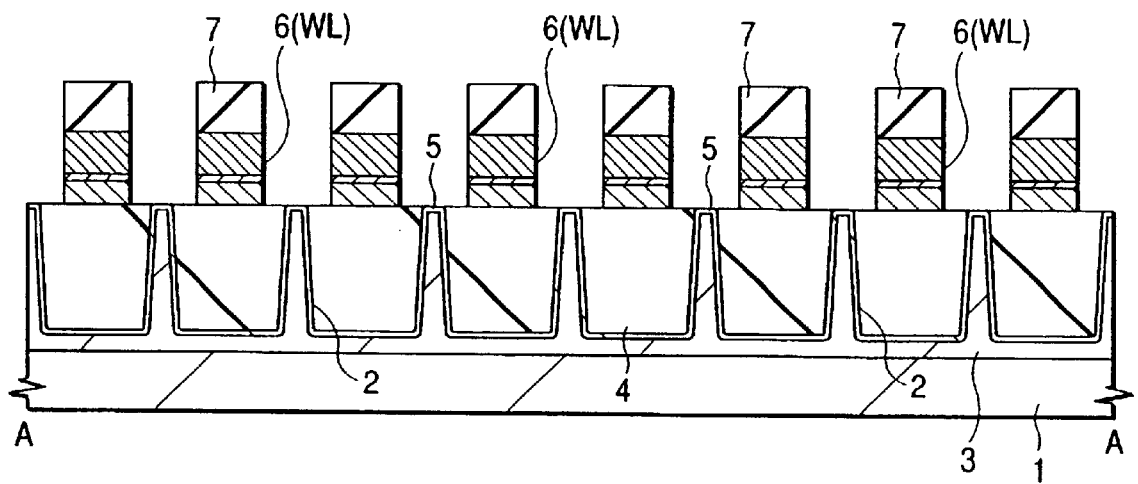
FIG. 9 is a cross sectional view for a main portion of a semiconductor substrate illustrating a process for manufacturing a DRAM as one embodiment according to this invention.
Figure 10:
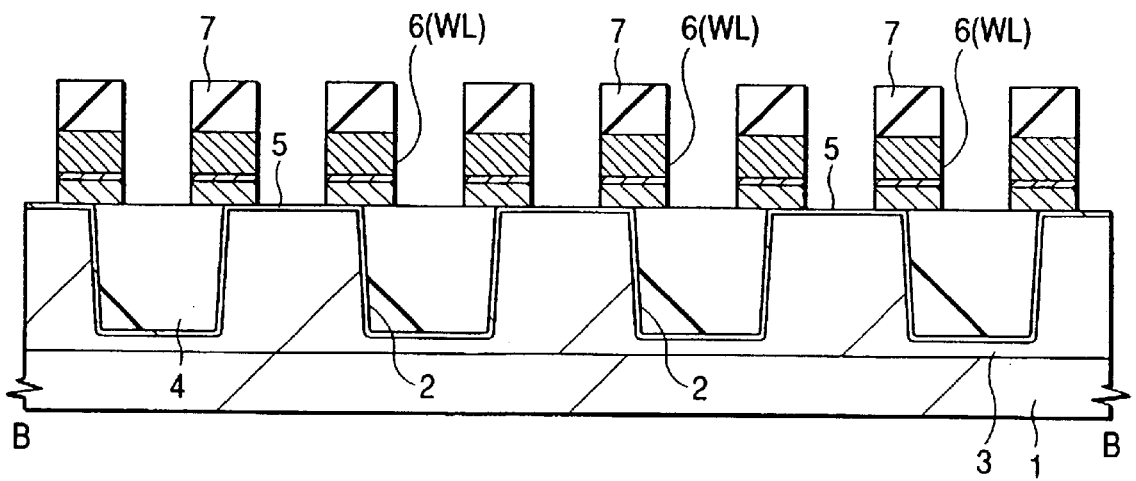
FIG. 10 is a cross sectional view for a main portion of a semiconductor substrate illustrating a process for manufacturing a DRAM as one embodiment according to this invention.

Then, as shown in FIG. 8 to FIG. 10, a gate electrode 6 is formed over the gate insulating film 5. The gate electrode 6 functions as a word line (WL) in the region other than the active region (L). The gate electrode 6 (word line WL) is formed, for example, by depositing, an n-polycrystal silicon film (about 70 nm thickness) doped with P (phosphorus), a barrier metal film (about 5 nm to 10 nm thickness) comprising WN (tungsten nitride) or TiN (titanium nitride), a W (tungsten) film (about 100 nm thickness) and a silicon nitride film 7 (about 150 nm thickness) successively over the gate insulating film 5 and then dry etching the films using a photoresist film as a mask. The polycrystal silicon film and the silicon nitride film 7 are deposited by a CVD method and the barrier metal film and the W film are deposited by a sputtering method.

Figure 11:
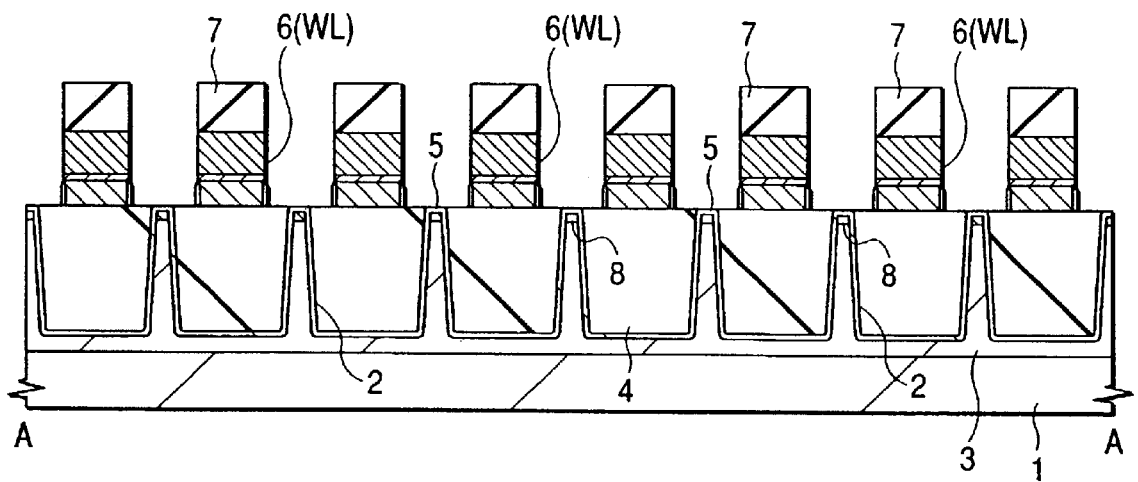
FIG. 11 is a cross sectional view for a main portion of a semiconductor substrate illustrating a process for manufacturing a DRAM as one embodiment according to this invention.
Figure 12:
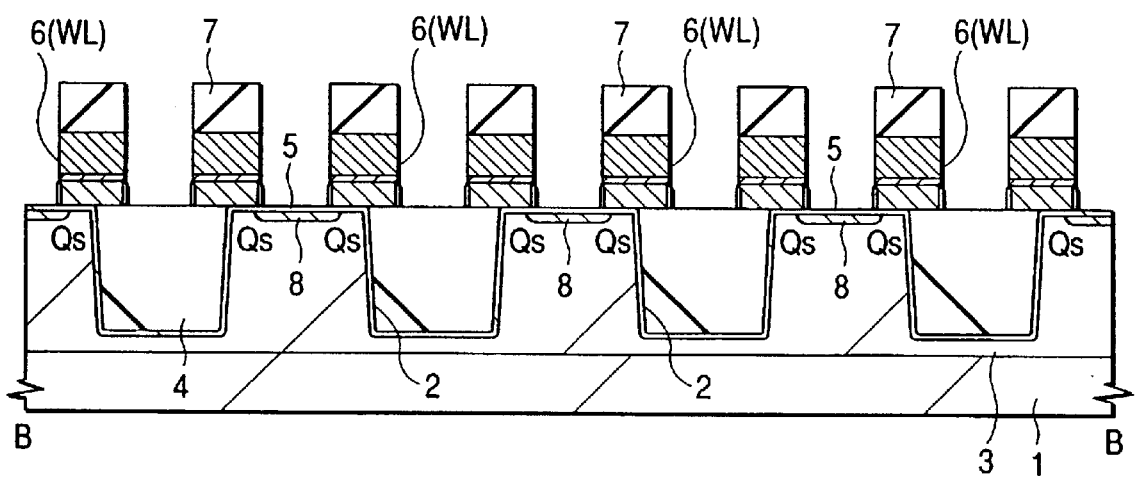
FIG. 12 is a cross sectional view for a main portion of a semiconductor substrate illustrating a process for manufacturing a DRAM as one embodiment according to this invention.
Figure 13:
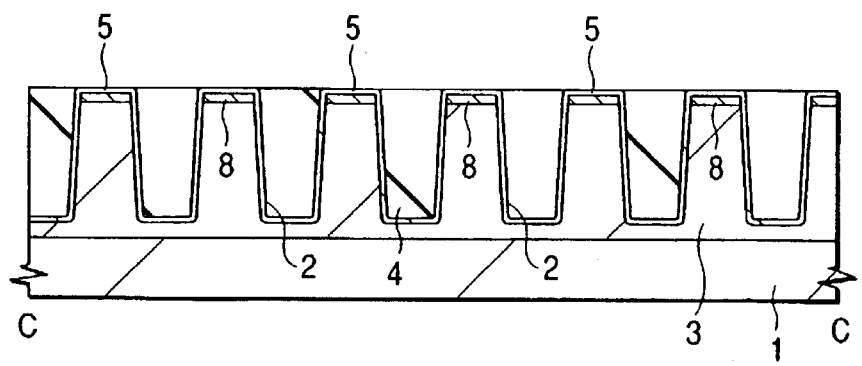
FIG. 13 is a cross sectional view for a main portion of a semiconductor substrate illustrating a process for manufacturing a DRAM as one embodiment according to this invention.
Figure 14:
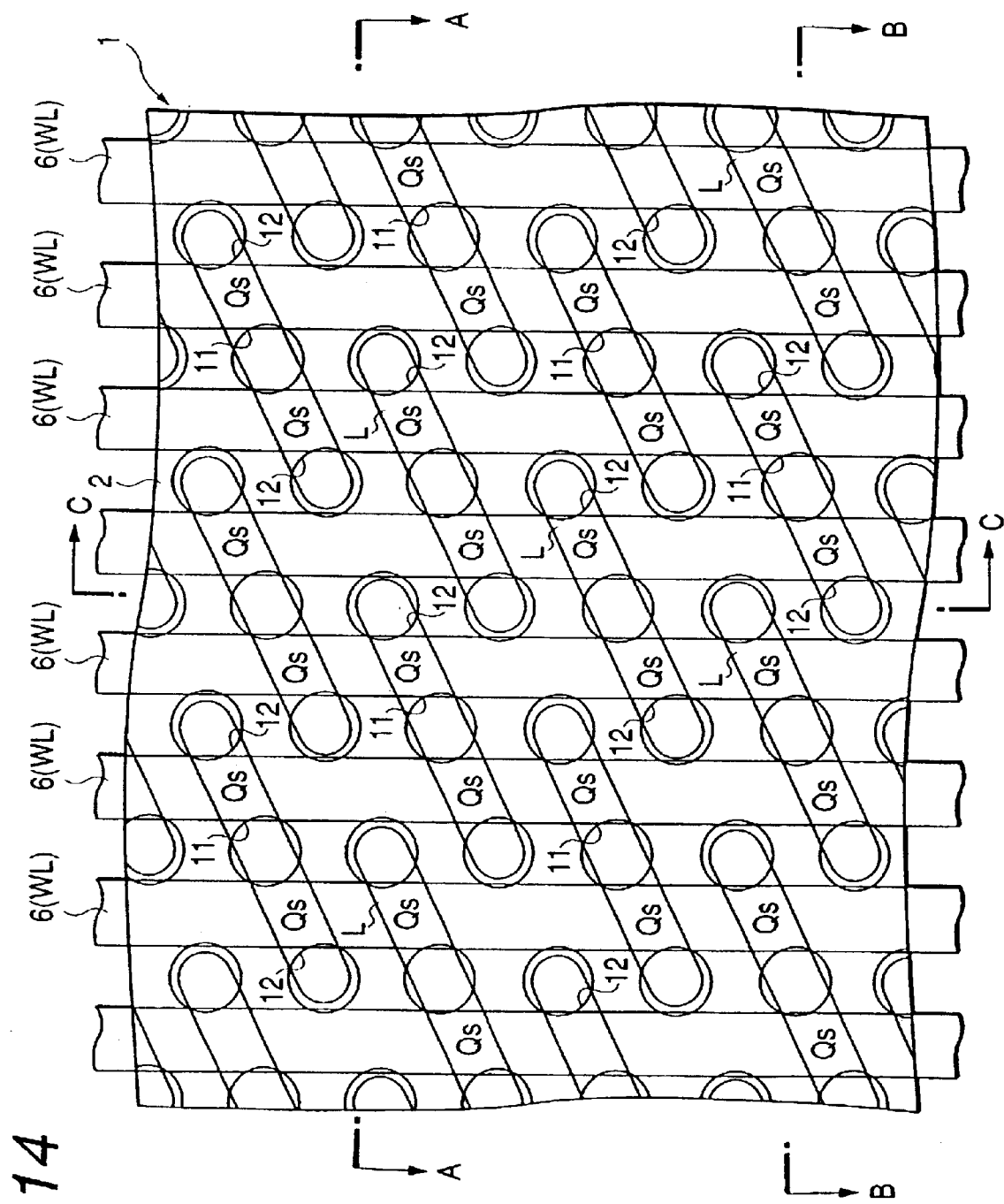
FIG. 14 is a plan view for a main portion of a semiconductor substrate illustrating a process for manufacturing a DRAM as one embodiment according to this invention.
Figure 15:
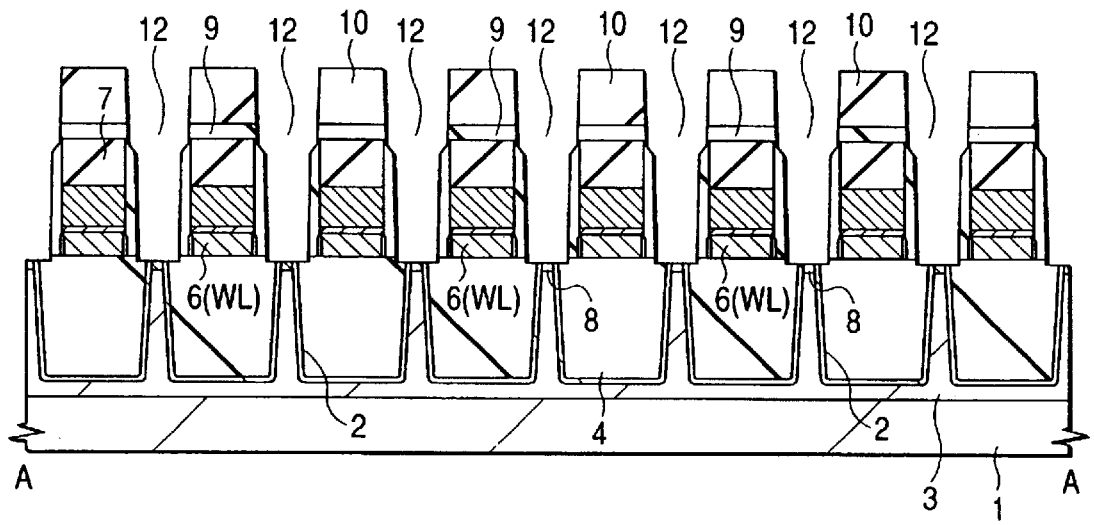
FIG. 15 is a cross sectional view for a main portion of a semiconductor substrate illustrating a process for manufacturing a DRAM as one embodiment according to this invention.
Figure 16:
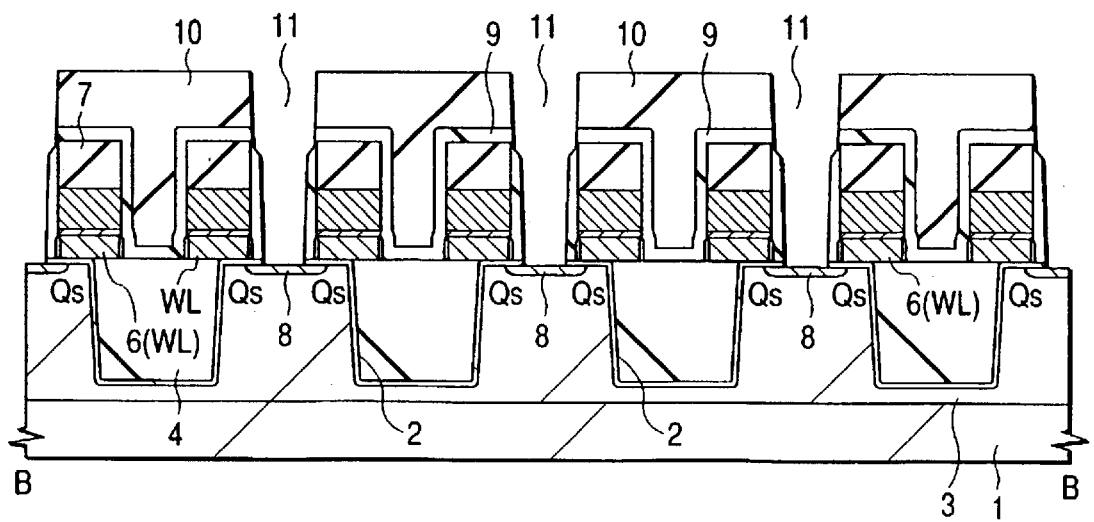
FIG. 16 is a cross sectional view for a main portion of a semiconductor substrate illustrating a process for manufacturing a DRAM as one embodiment according to this invention.
Figure 17:
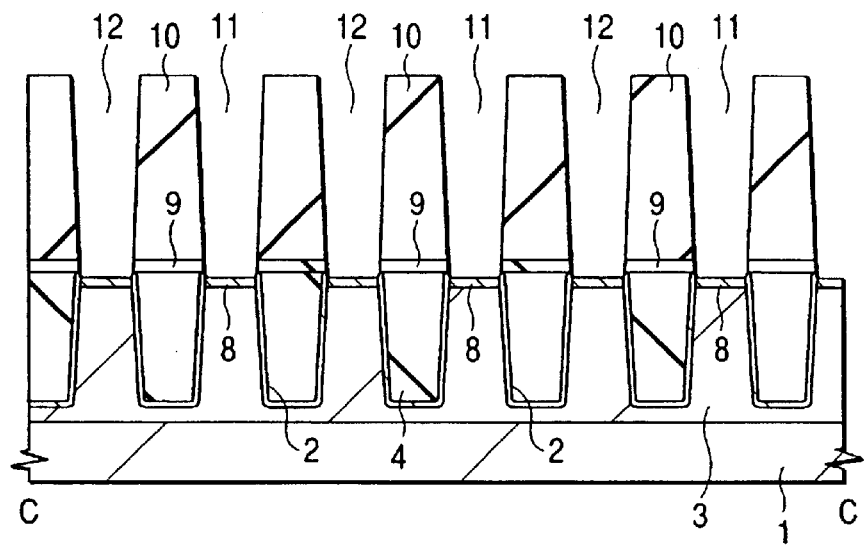
FIG. 17 is a cross sectional view for a main portion of a semiconductor substrate illustrating a process for manufacturing a DRAM as one embodiment according to this invention.

Then, as shown in FIG. 11 to FIG. 13, As (arsenic) or P (phosphorus) is ion implanted into the p-well 3 to form an n-semiconductor region 8 (source and drain) in the p-well 3 on both sides of the gate electrode 6. The memory cell selecting MISFETQs is substantially completed by the steps so far.

Then as shown in FIG. 14 to FIG. 17, after depositing a silicon nitride film 9 (50 nm thickness) and a silicon oxide film (about 600 nm thickness) by a CVD method on the substrate 1 and, successively, flattening the surface of the silicon oxide film 10 by a chemical mechanical polishing method, the silicon oxide film 10 and the silicon nitride film 9 are dry etched using a photoresist film (not illustrated) as a mask to form contact holes 11, 12 over the source and drain (n-semiconductor region 8) of the memory cell selecting MISFETQs. Etching for the silicon oxide film 10 is conducted under the condition with higher selectivity to silicon nitride while etching for the silicon nitride film 9 is conducted under the condition with higher selectivity to silicon or silicon oxide. Thus, the contact holes 11, 12 can be formed in self-alignment with the gate electrode 6 (word line WL).

Figure 18:
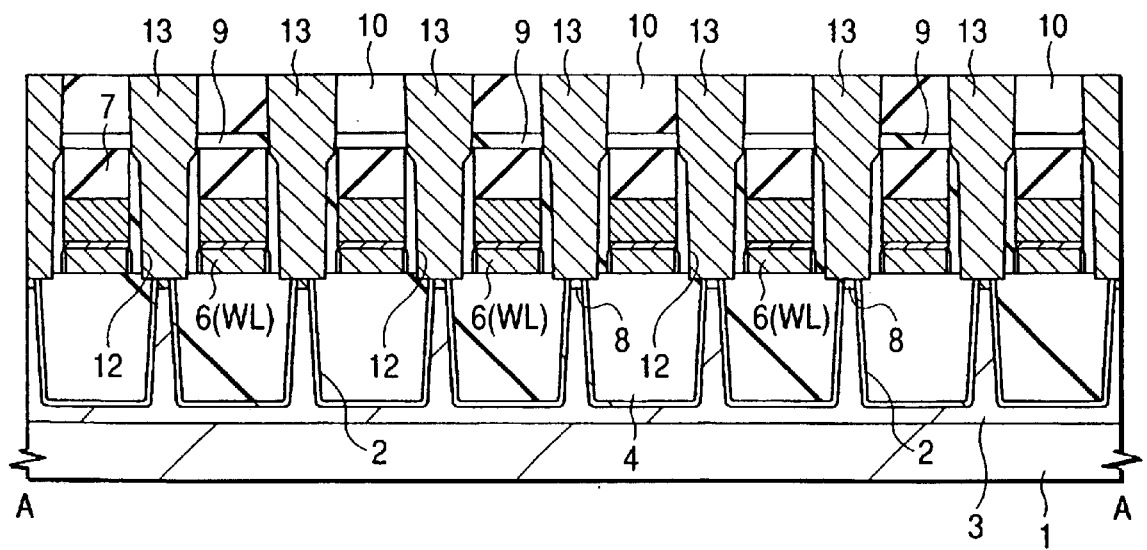
FIG. 18 is a cross sectional view for a main portion of a semiconductor substrate illustrating a process for manufacturing a DRAM as one embodiment according to this invention.
Figure 19:
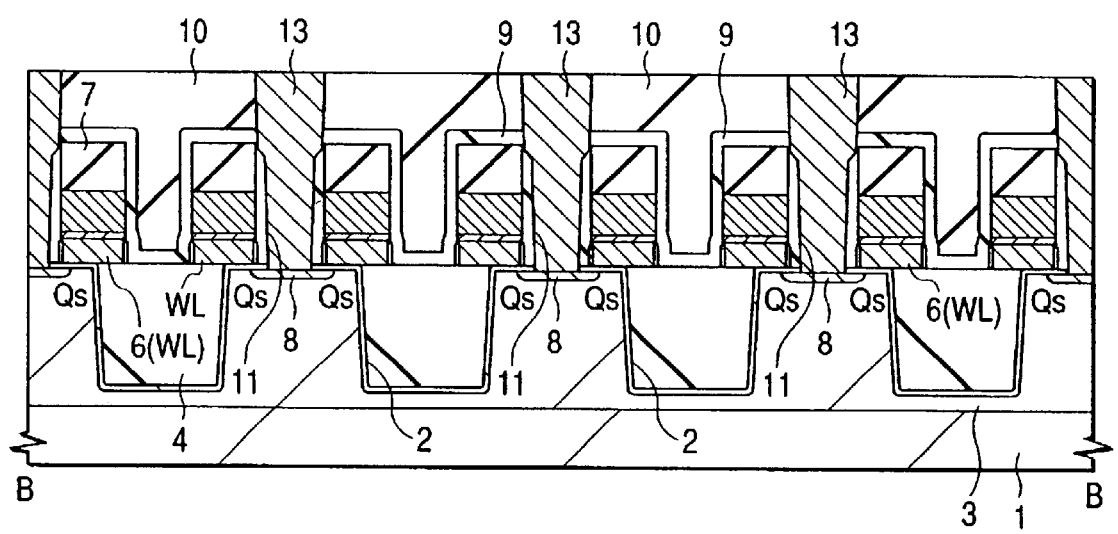
FIG. 19 is a cross sectional view for a main portion of a semiconductor substrate illustrating a process for manufacturing a DRAM as one embodiment according to this invention.

Then, as shown in FIG. 18 and FIG. 19, plugs 13 are formed inside the contact holes 11 and 12. The plug 13 is formed by depositing a P-doped n-polycrystal silicon film over the silicon oxide film 10 by a CVD method to bury the n-polycrystal silicon film inside the contact holes 11 and 12 and then removing the n-polycrystal silicon film outside the contact holes 11 and 12 by the chemical mechanical polishing method (or dry etching).

Figure 20:
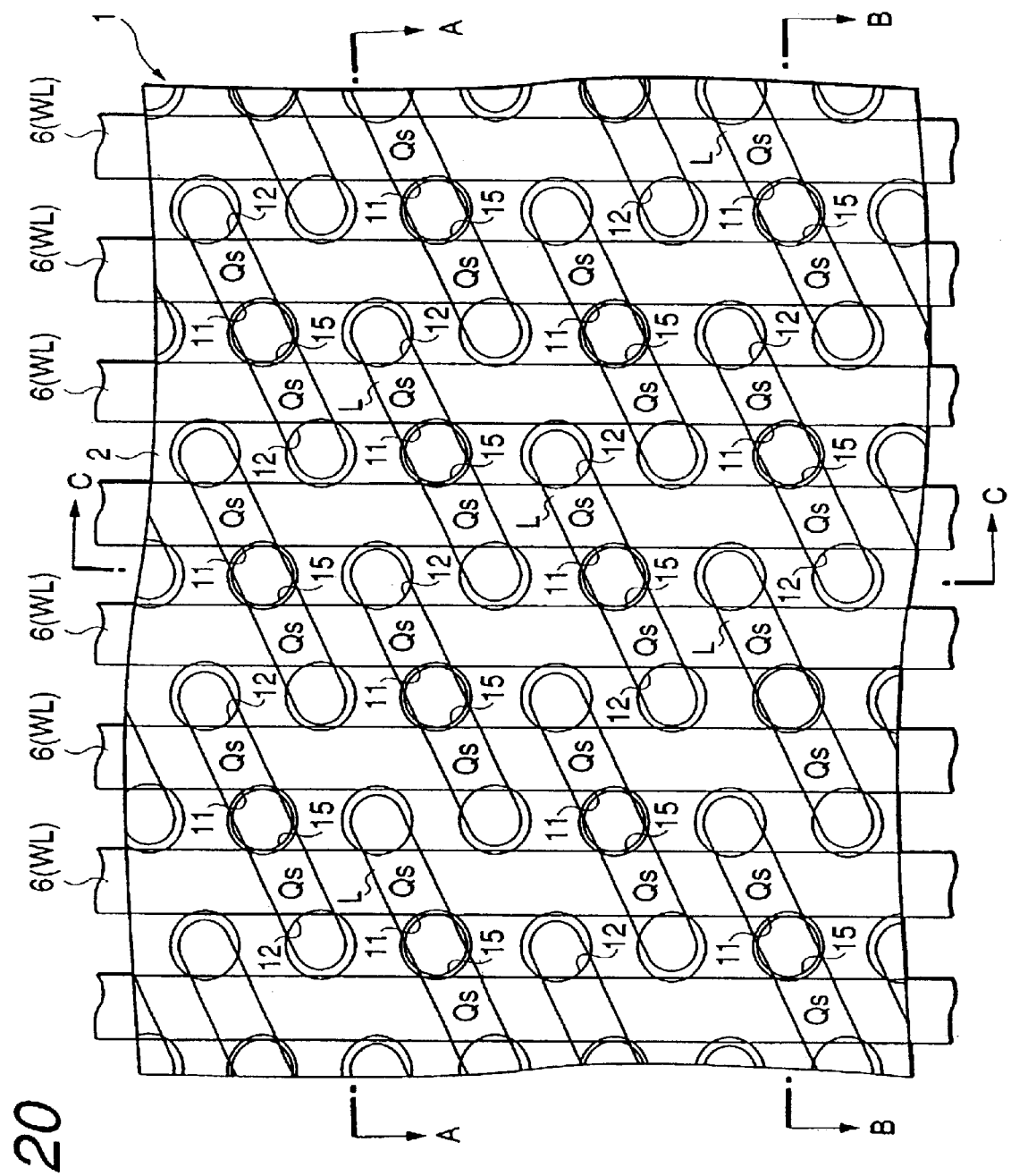
FIG. 20 is a cross sectional view for a main portion of a semiconductor substrate illustrating a process for manufacturing a DRAM as one embodiment according to this invention.
Figure 21:
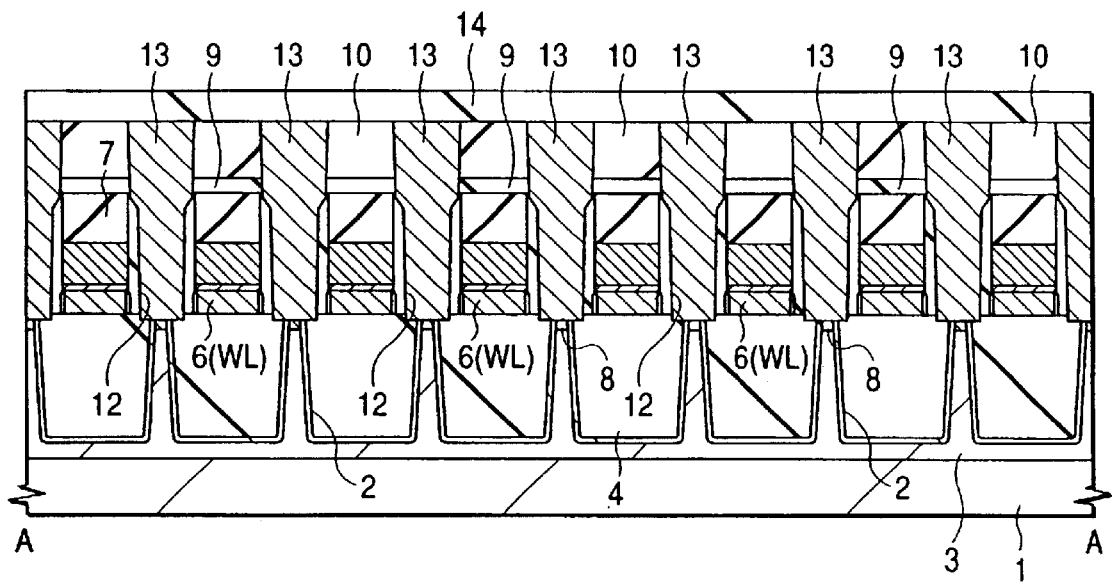
FIG. 21 is a cross sectional view for a main portion of a semiconductor substrate illustrating a process for manufacturing a DRAM as one embodiment according to this invention.
Figure 22:
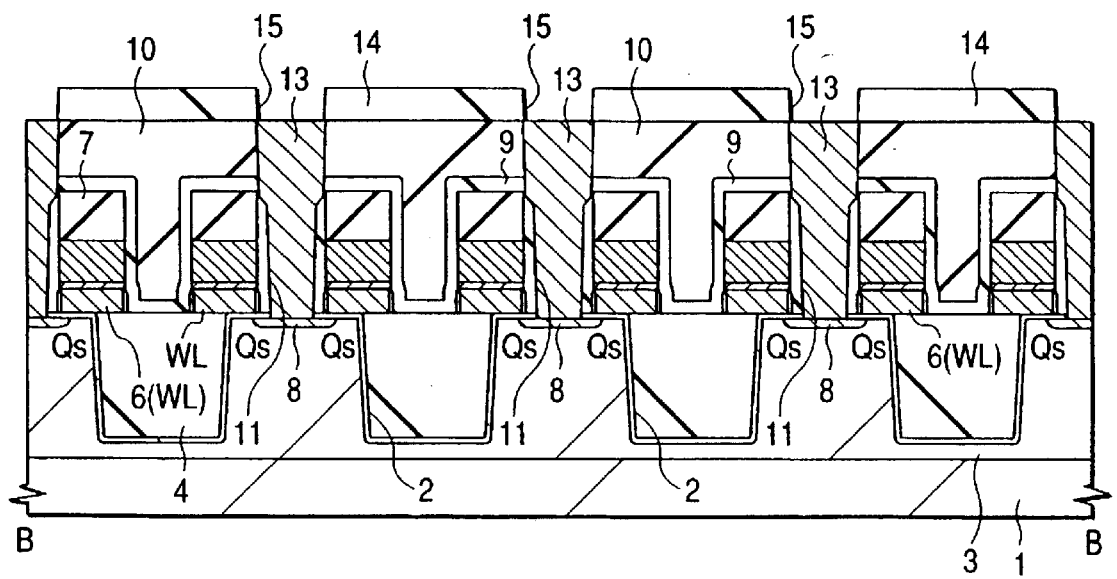
FIG. 22 is a cross sectional view for a main portion of a semiconductor substrate illustrating a process for manufacturing a DRAM as one embodiment according to this invention.

Then, after depositing a silicon oxide film 14 (about 150 nm thickness) on the silicon oxide film 10 by a CVD method, as shown in FIG. 20 to FIG. 22, the silicon oxide film 14 over the contact hole 11 is dry etched using a photoresist film (not illustrated) as a mask to form a through hole 15 for connecting a bit line (BL) formed in the succeeding step and the contact hole 11.

Figure 23:
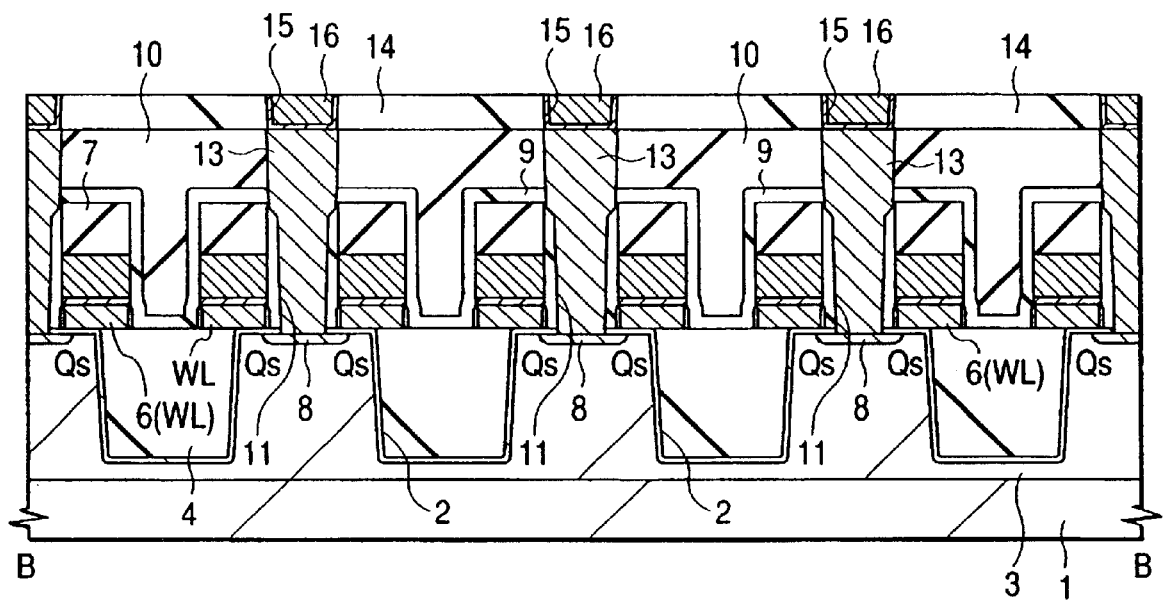
FIG. 23 is a cross sectional view for a main portion of a semiconductor substrate illustrating a process for manufacturing a DRAM as one embodiment according to this invention.
Figure 24:
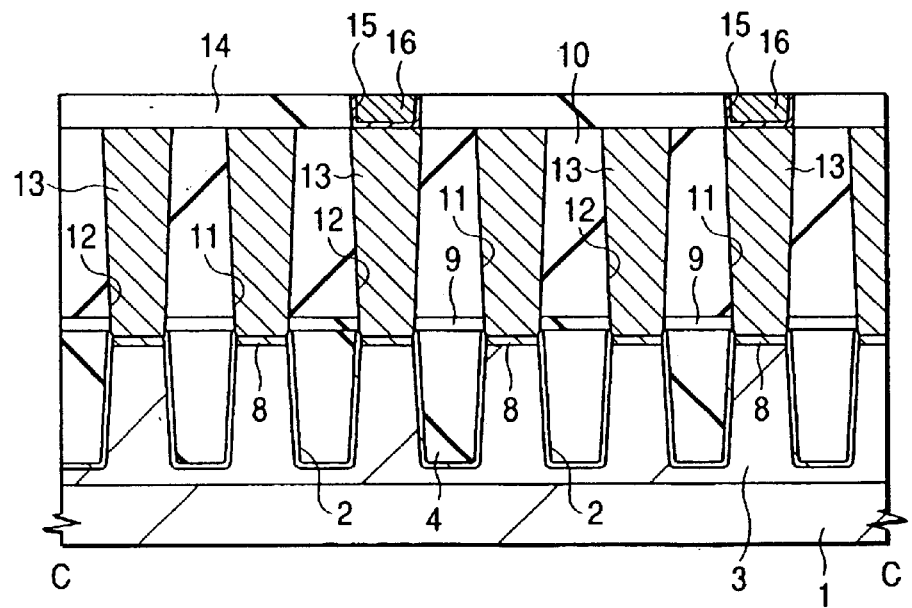
FIG. 24 is a cross sectional view for a main portion of a semiconductor substrate illustrating a process for manufacturing a DRAM as one embodiment according to this invention.
Figure 25:
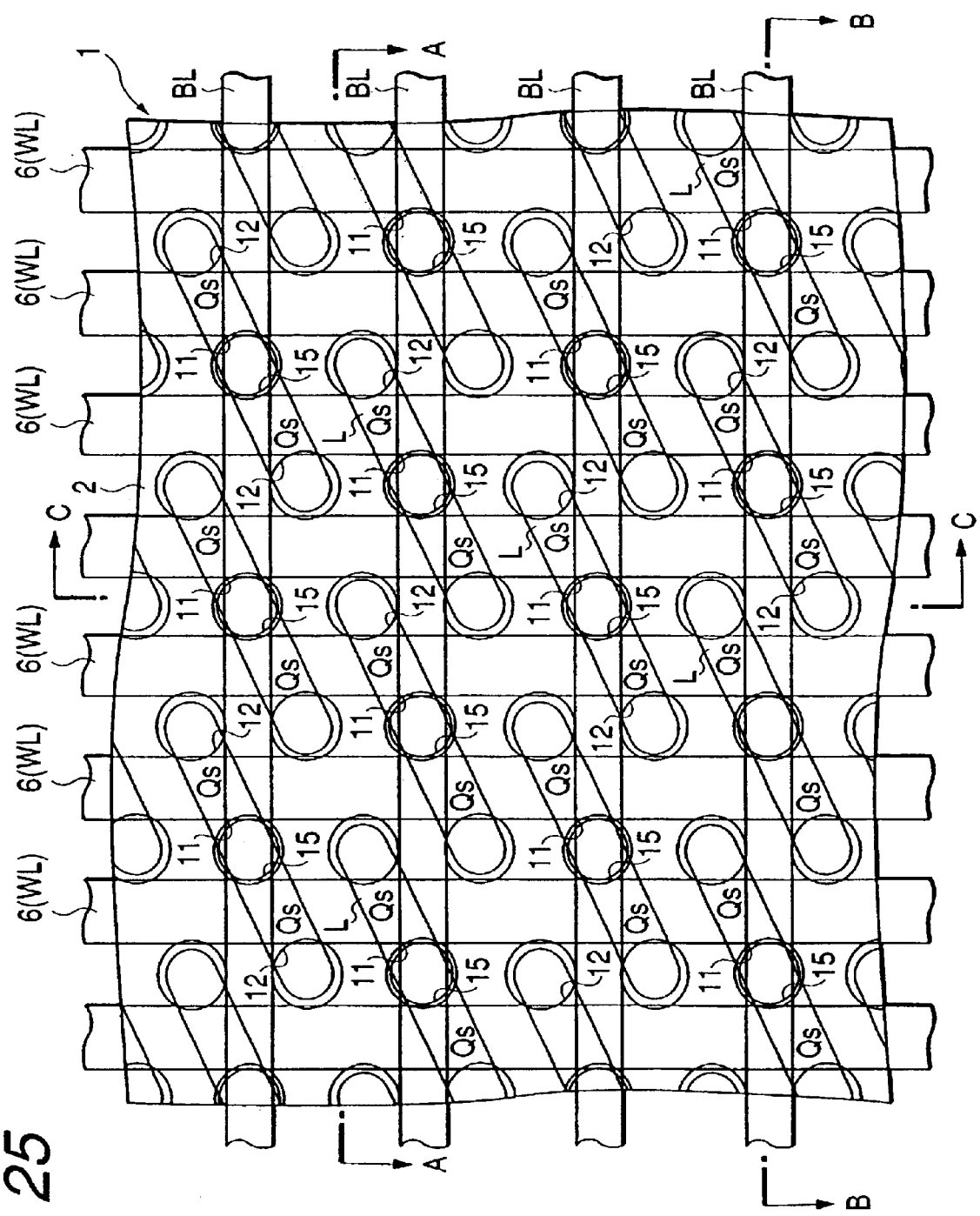
FIG. 25 is a plan view for a main portion of a semiconductor substrate illustrating a process for manufacturing a DRAM as one embodiment according to this invention.
Figure 26:
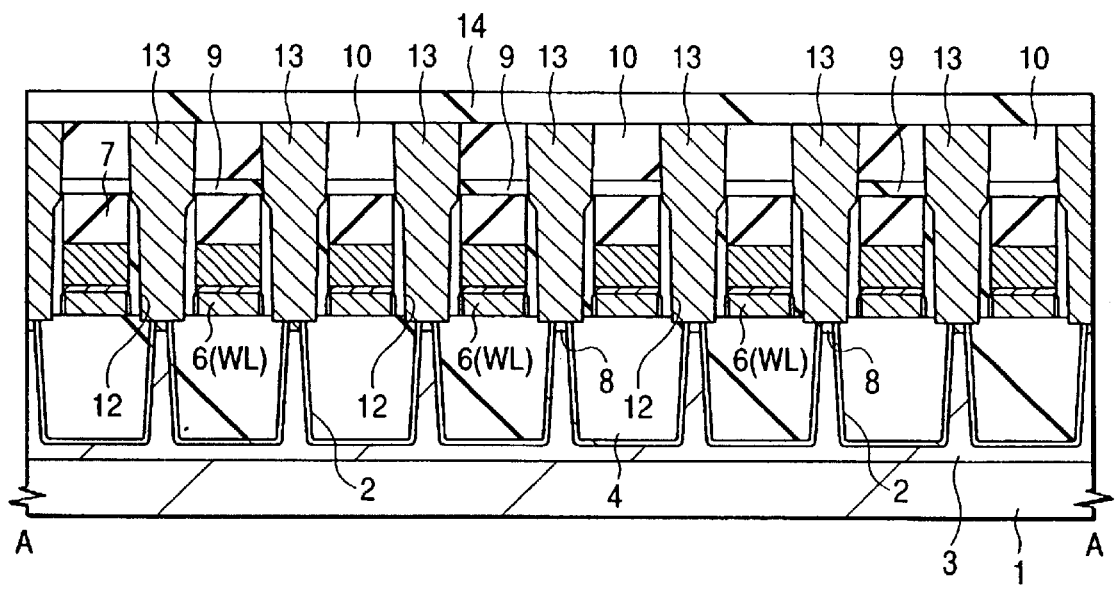
FIG. 26 is a cross sectional view for a main portion of a semiconductor substrate illustrating a process for manufacturing a DRAM as one embodiment according to this invention.
Figure 27:
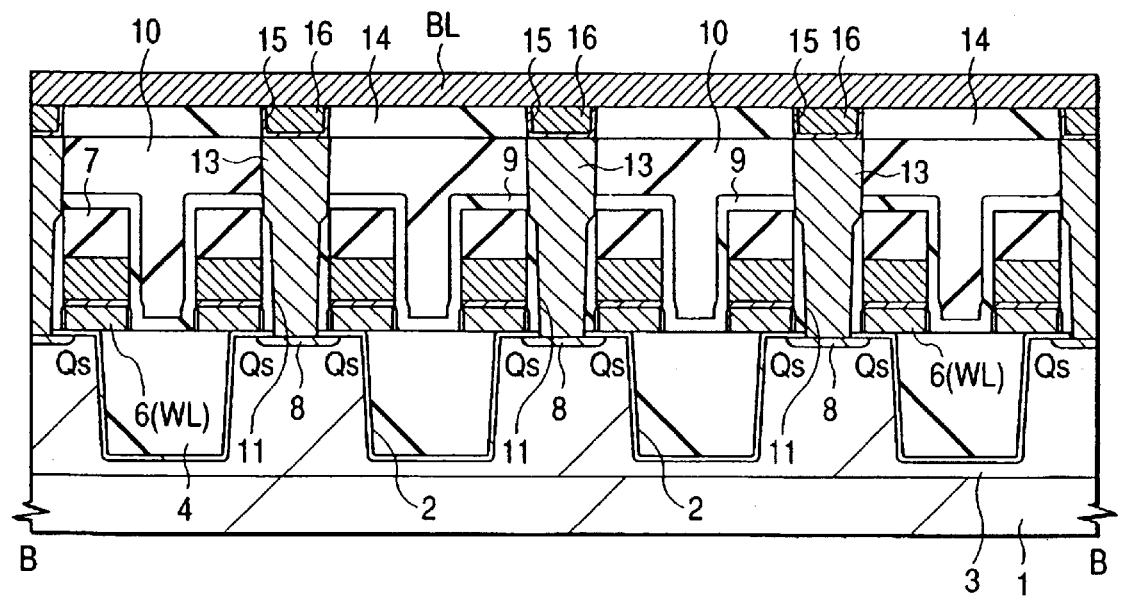
FIG. 27 is a cross sectional view for a main portion of a semiconductor substrate illustrating a process for manufacturing a DRAM as one embodiment according to this invention.
Figure 28:
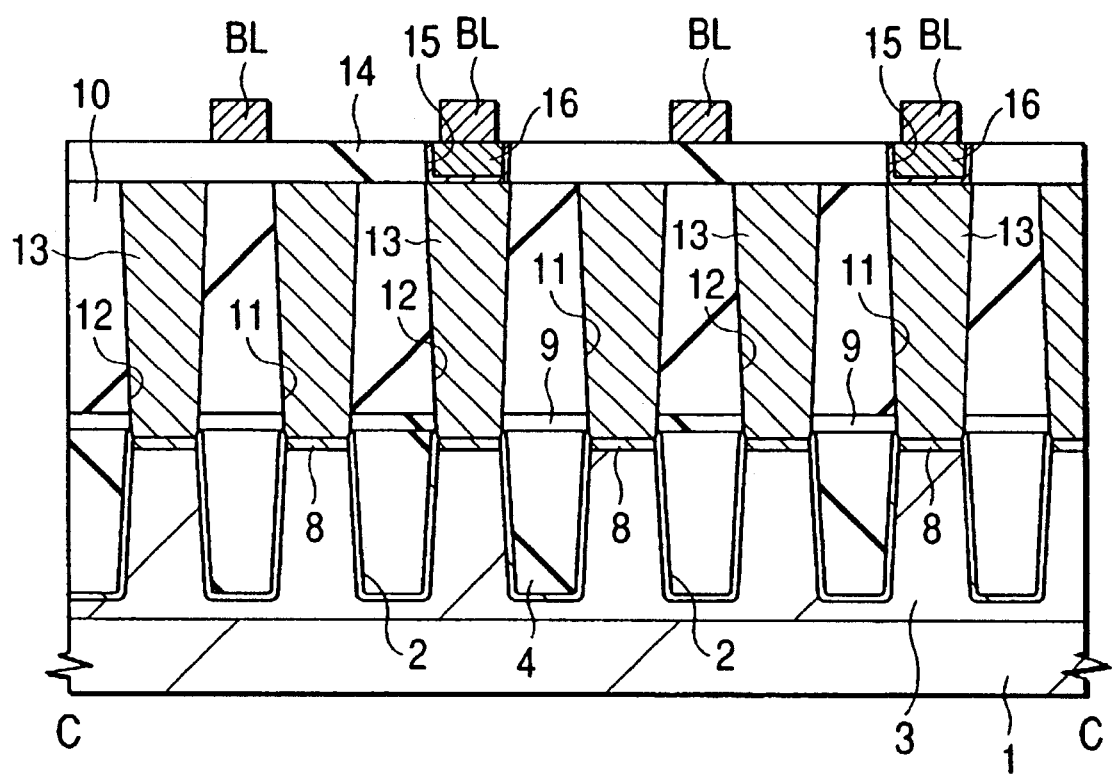
FIG. 28 is a cross sectional view for a main portion of a semiconductor substrate illustrating a process for manufacturing a DRAM as one embodiment according to this invention.

Then, as shown in FIG. 23 and FIG. 24, a plug 16 is formed inside the through hole 15. The plug 16 is formed by depositing a barrier metal film comprising TiN over the silicon oxide film 14, for example, by a sputtering method, successively, depositing a W film over the barrier metal film by a CVD method to bury the films inside the through hole 15 and then removing the films outside the through hole 15 by a chemical mechanical polishing method.

Then, as shown in FIG. 25 to FIG. 28, a bit line BL is formed over the silicon oxide film 14. The bit line BL is formed, for example, by depositing a TiN film (about 10 nm thickness) over the silicon oxide film 14 by a sputtering method, successively, depositing a W film (about 50 nm thickness) over the TiN film by a CVD method and then dry etching the films using a photoresist film as a mask. The bit line BL is electrically connected with one of the source and drain (n-semiconductor region 8) of the memory cell selecting MISFETQs by way of the plug 16 buried in the through hole 15 therebelow and the plug 13 buried in the contact hole 11 further therebelow.

Then, as shown in FIG. 29 to FIG. 32, after depositing a silicon oxide film 17 of about 300 nm thickness over the bit line BL by a CVD method and, successively, flattening the surface by a chemical mechanical polishing method, the silicon oxide film 17 is dry etched using a photoresist film (not illustrated) as a mask to form a through hole 19 over the contact hole 11 in which the plug 13 is buried.

The through hole 19 is formed such that the diameter is smaller than the diameter of the contact hole 11 therebelow. Specifically, after depositing a polycrystal silicon film 20 by a CVD method over the silicon oxide film 17 and, successively, dry etching the polycrystal silicon film 20 in the region forming the through hole 19 to form a hole, a polycrystal silicon film (not illustrated) is further deposited on the polycrystal silicon film 20. Then, the polycrystal silicon film over the polycrystal silicon film 20 is anisotropically etched to form a side wall spacer 21 on the side wall of the hole and, successively, the silicon oxide film 17 at the bottom of the hole is dry etched by using the polycrystal silicon film 20 and the side wall spacer 21 as a mask.

Figure 29:
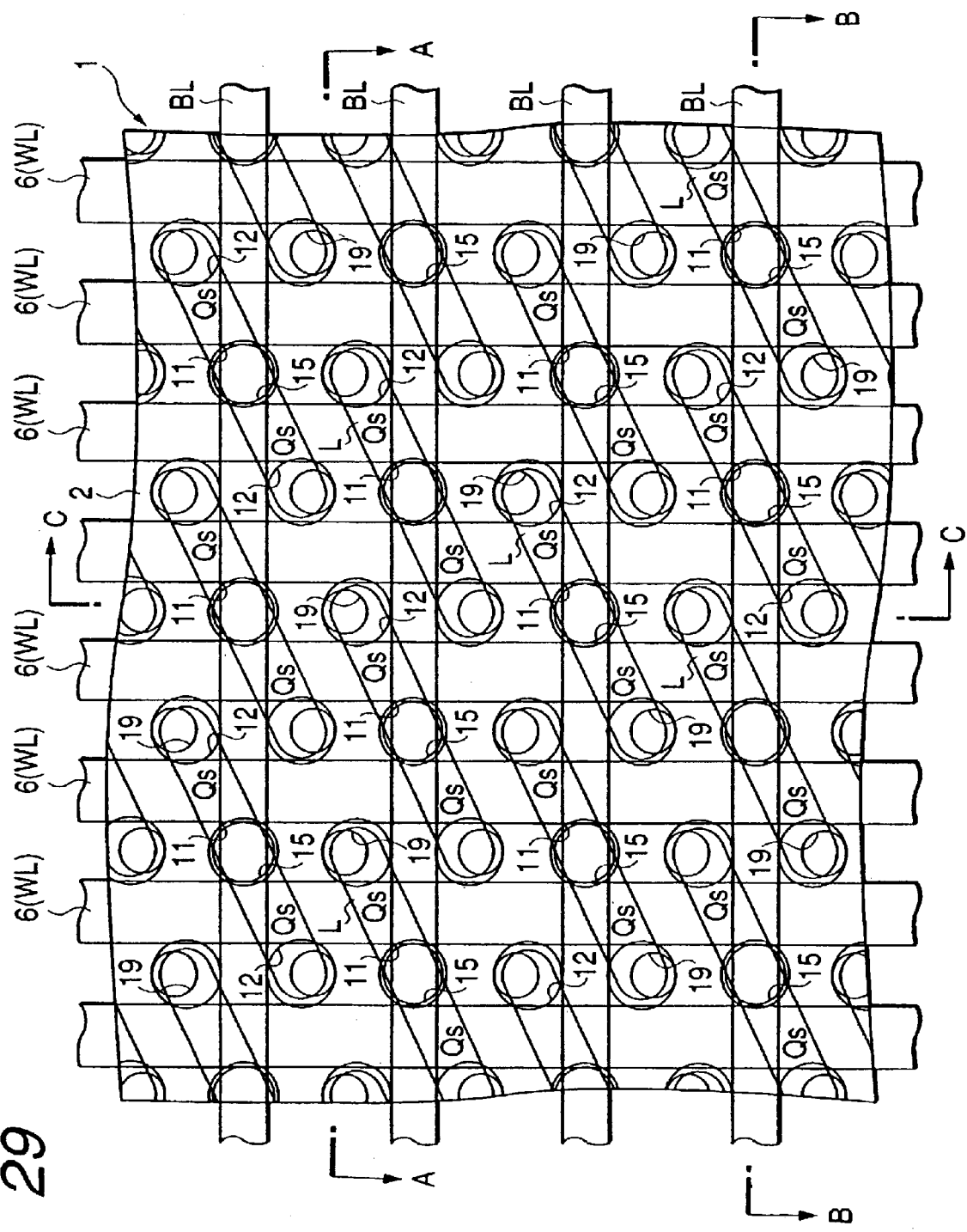
FIG. 29 is a plan view for a main portion of a semiconductor substrate illustrating a process for manufacturing a DRAM as one embodiment according to this invention.
Figure 30:
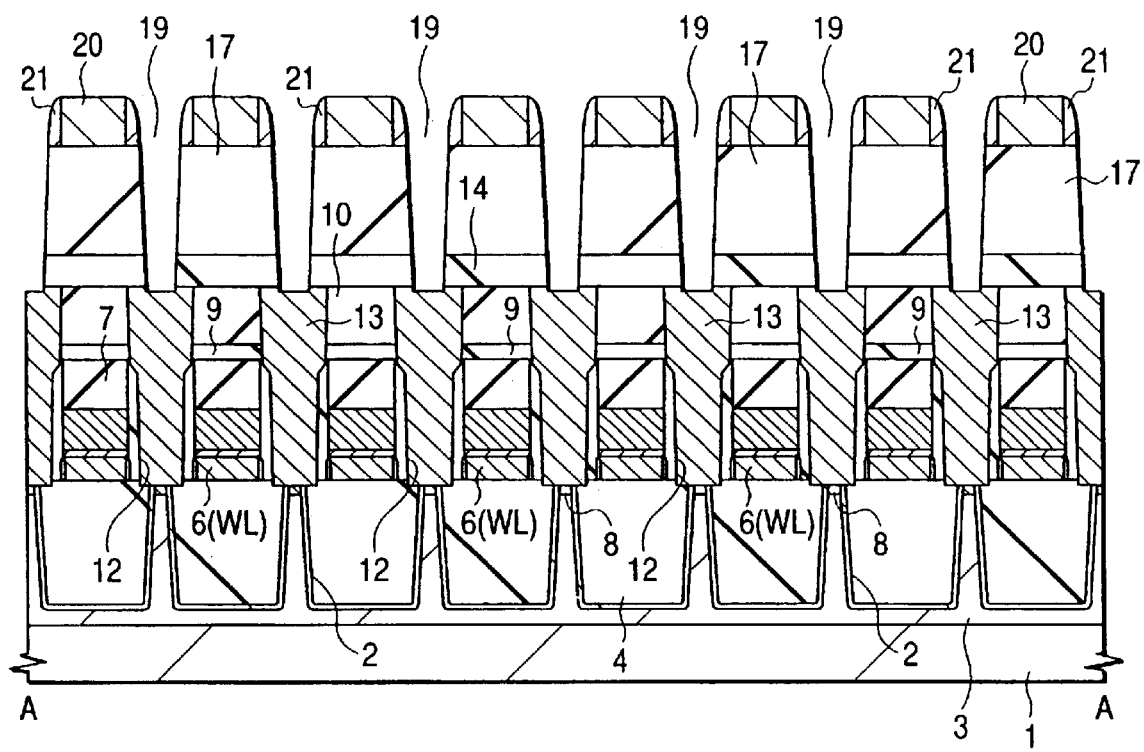
FIG. 30 is a cross sectional view for a main portion of a semiconductor substrate illustrating a process for manufacturing a DRAM as one embodiment according to this invention.
Figure 31:
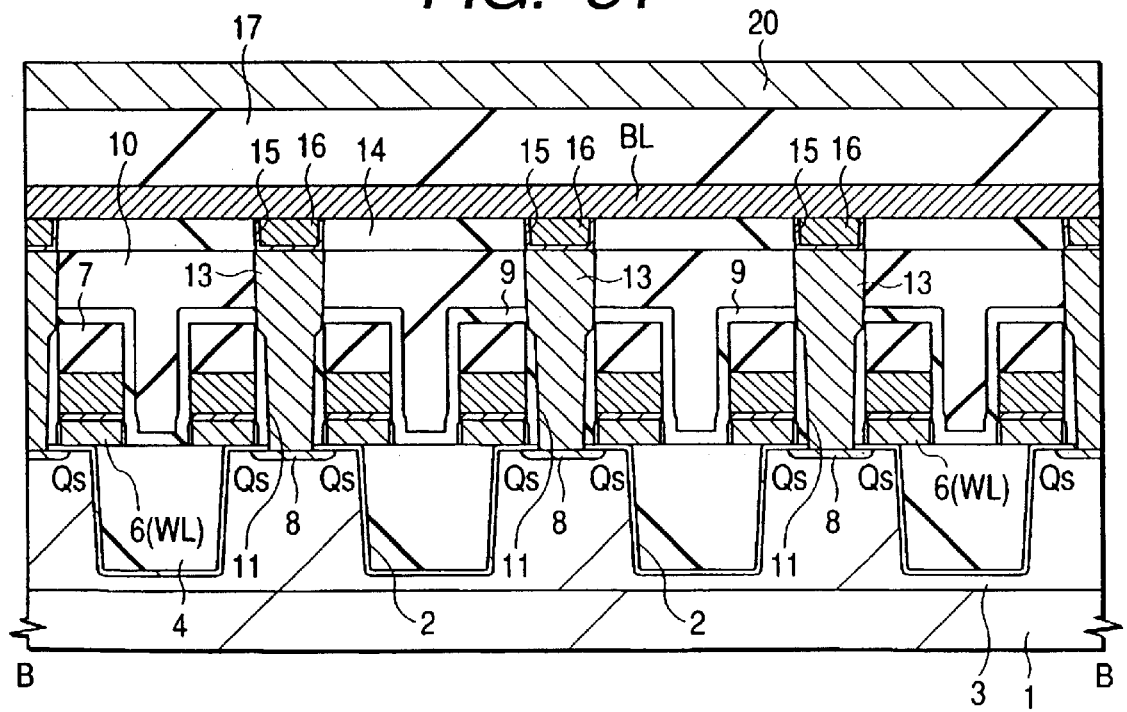
FIG. 31 is a cross sectional view for a main portion of a semiconductor substrate illustrating a process for manufacturing a DRAM as one embodiment according to this invention.
Figure 32:
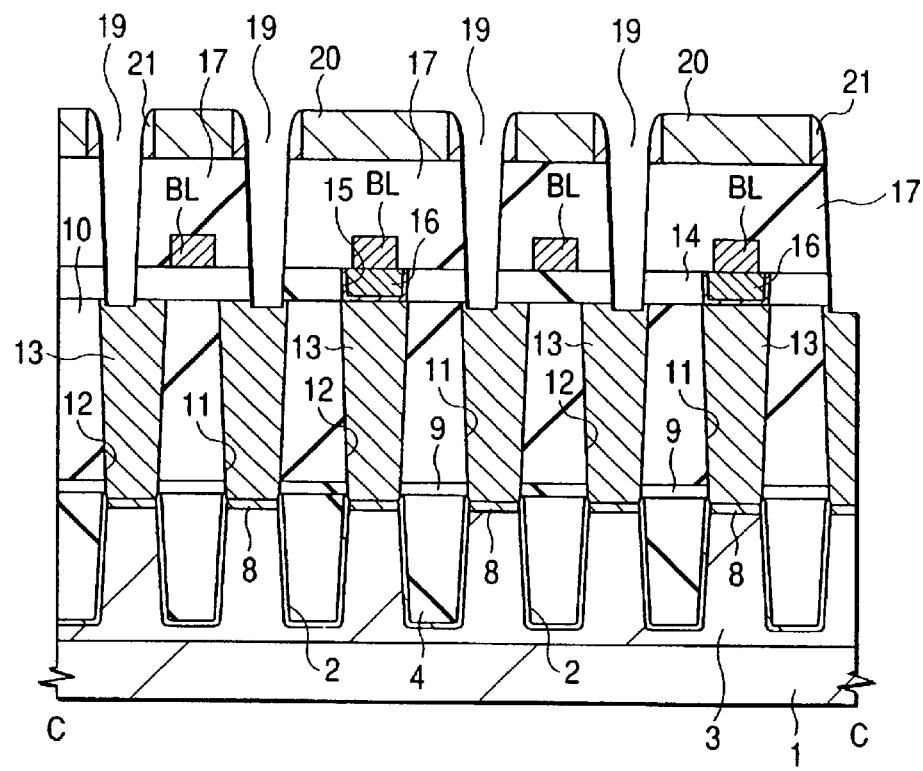
FIG. 32 is a cross sectional view for a main portion of a semiconductor substrate illustrating a process for manufacturing a DRAM as one embodiment according to this invention.

Further, as shown in FIG. 29 and FIG. 32, the through hole 19 is offset such that the center thereof is deviated from the center for the contact hole 11 in the direction away from the bit line BL. Since the diameter for the through hole 19 is made smaller than the diameter for the contact hole therebelow, and the center of the through hole is offset in the direction away aparting from the bit line BL, short circuit between the through hole 19 (plug 22 buried in the inside thereof) and the bit line BL can be prevented without using the technique of the self-aligned contact (SAC) also in a case of reducing the memory cell size. Further, since the diameter for the through hole 19 is made smaller than the diameter for the contact hole 11, contact area between both of them can be ensured even when the centers thereof are displaced from each other.

Figure 33:
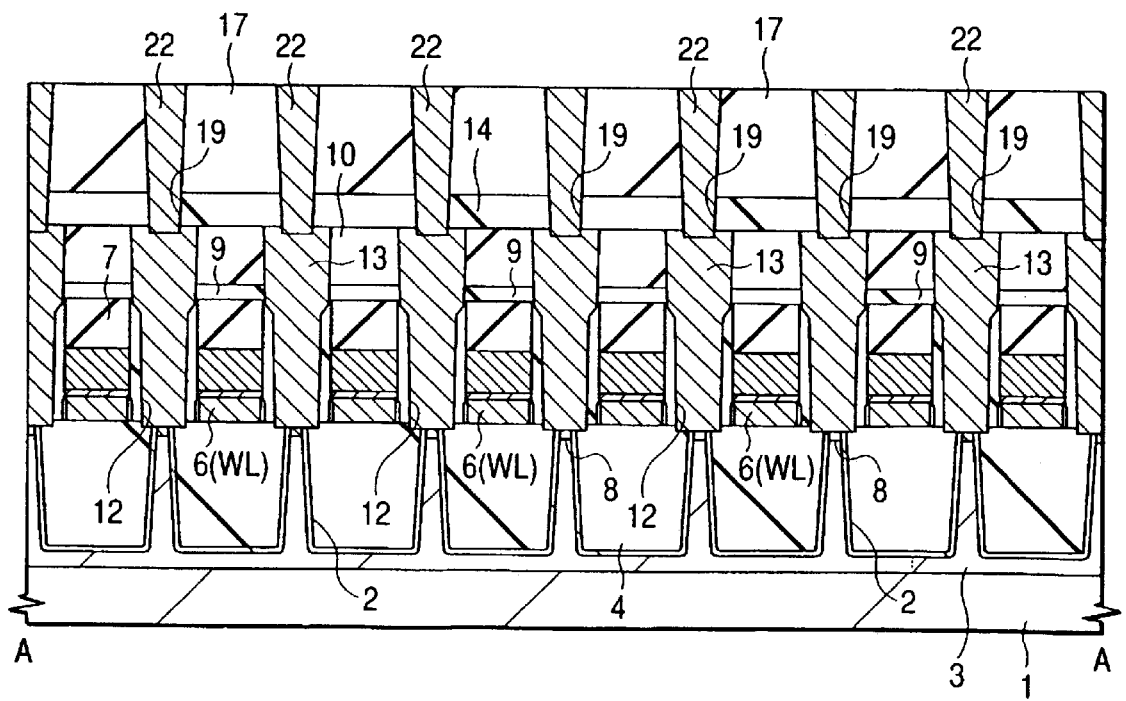
FIG. 33 is a cross sectional view for a main portion of a semiconductor substrate illustrating a process for manufacturing a DRAM as one embodiment according to this invention.
Figure 34:
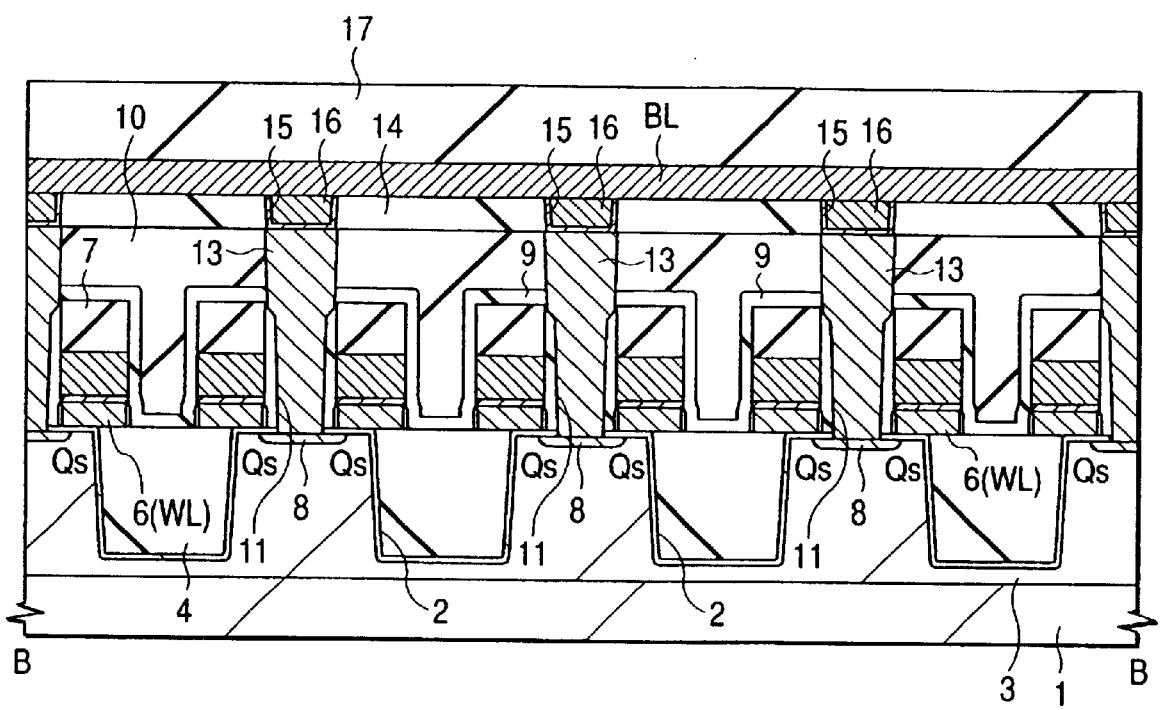
FIG. 34 is a cross sectional view for a main portion of a semiconductor substrate illustrating a process for manufacturing a DRAM as one embodiment according to this invention.
Figure 35:
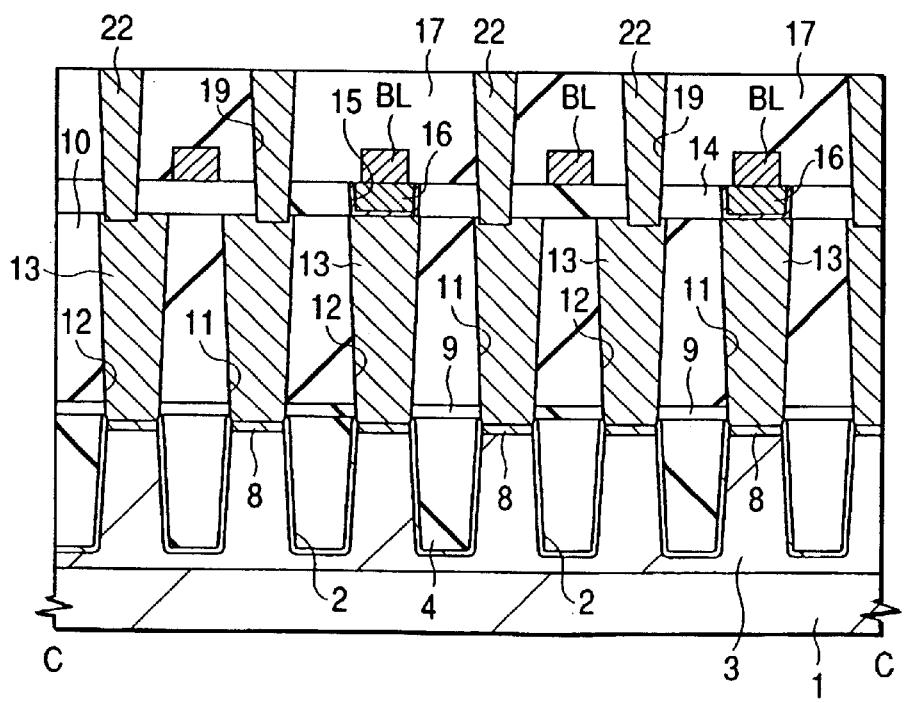
FIG. 35 is a cross sectional view for a main portion of a semiconductor substrate illustrating a process for manufacturing a DRAM as one embodiment according to this invention.

Then, after removing the mask used for forming the through hole 19 (polycrystal silicon film 20 and the side wall spacer 21) by dry etching, as shown in FIG. 33 to FIG. 35, a plug 22 is formed inside the through hole 19. The plug 22 is formed by at first depositing a P-doped n-polycrystal silicon film over the silicon oxide film 17 by a CVD method to bury the n-polycrystal silicon film inside the through hole 19 and, successively, removing the n-polycrystal silicon film outside the through hole 19 by a chemical mechanical polishing method (or dry etching).

Figure 36:
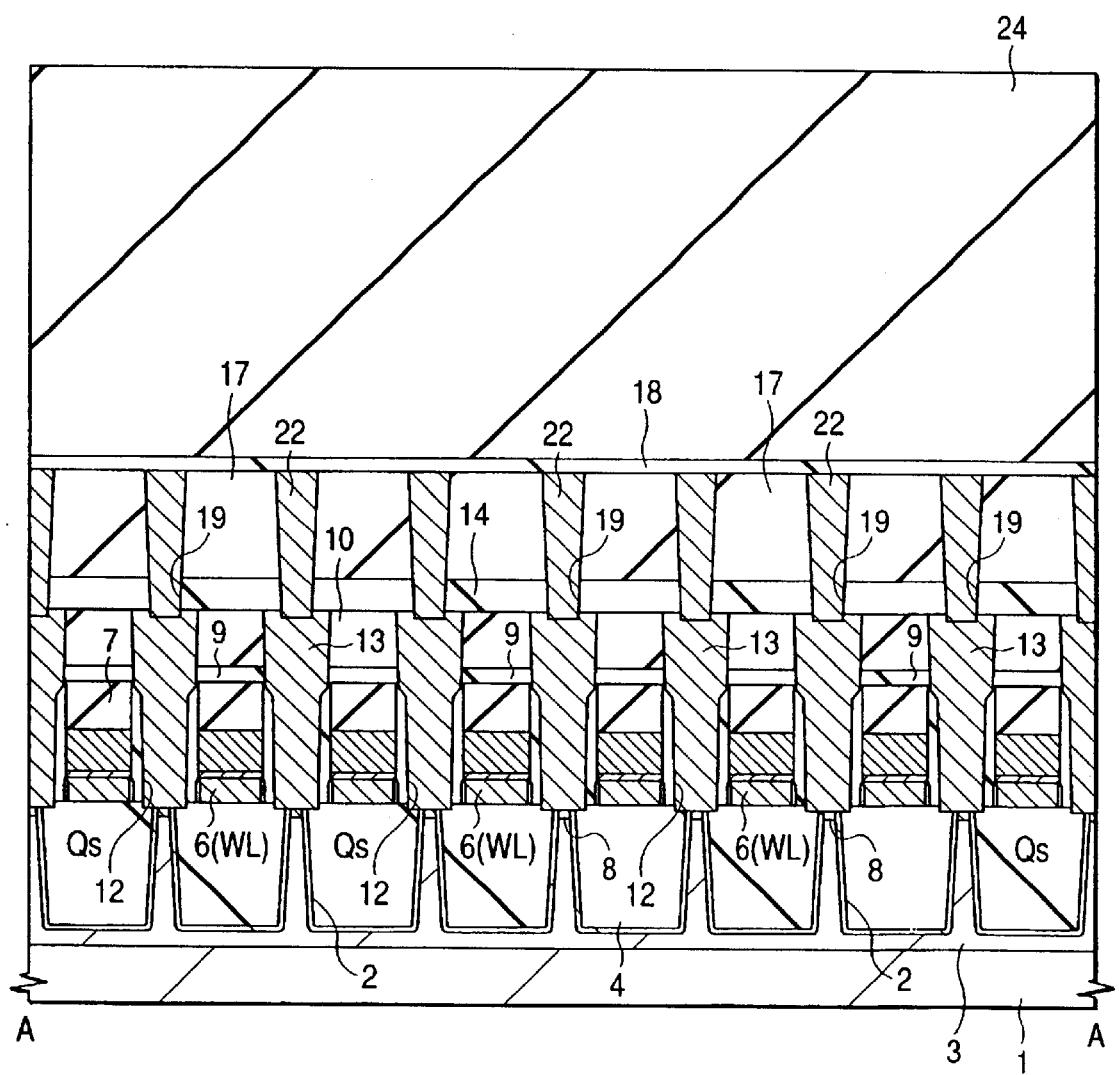
FIG. 36 is a cross sectional view for a main portion of a semiconductor substrate illustrating a process for manufacturing a DRAM as one embodiment according to this invention.
Figure 37:
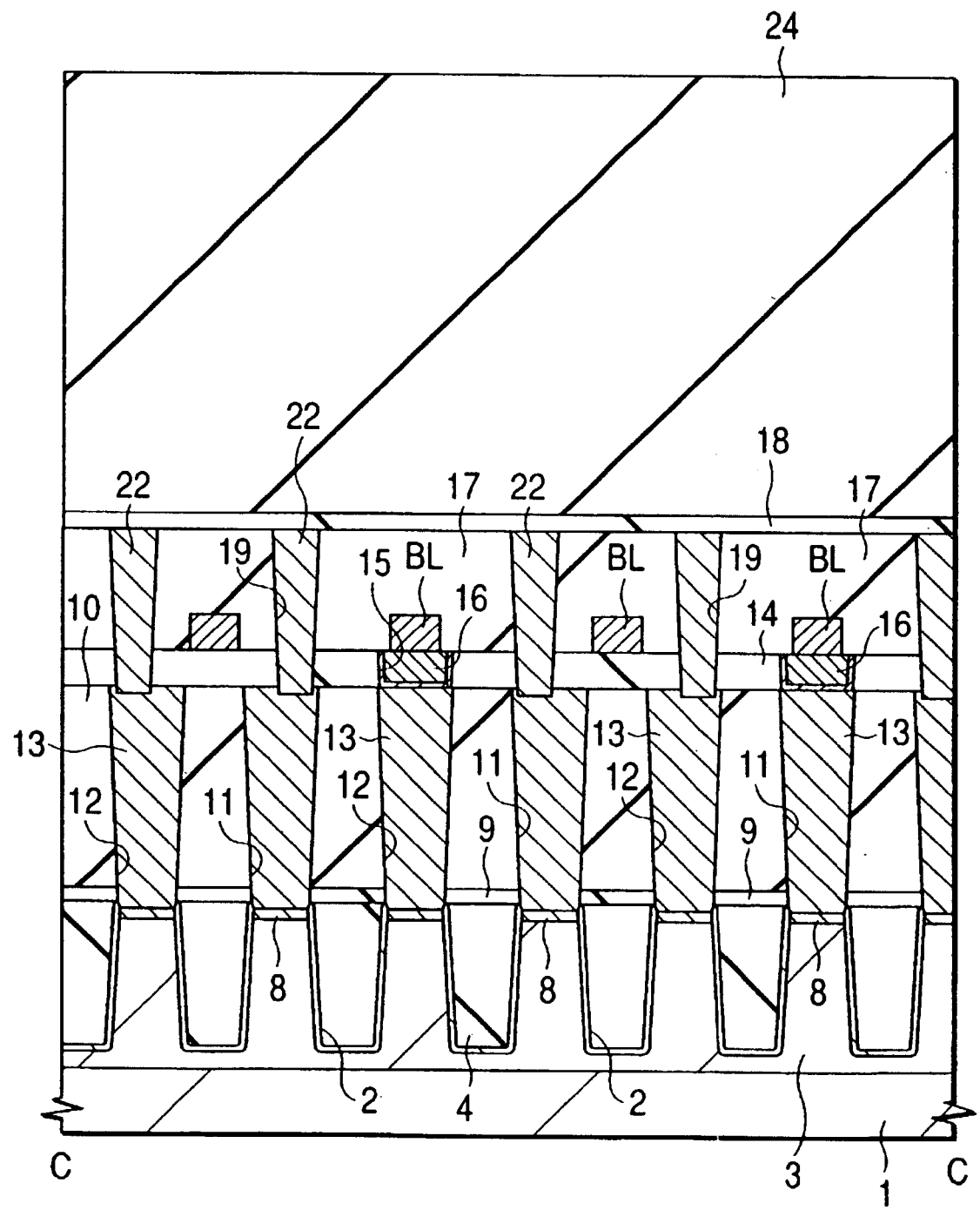
FIG. 37 is a cross sectional view for a main portion of a semiconductor substrate illustrating a process for manufacturing a DRAM as one embodiment according to this invention.

Then, as shown in FIG. 36 and FIG. 37, after depositing a silicon nitride film 18 over the silicon oxide film 17 by a CVD method, a silicon oxide film 24 is deposited over the silicon nitride film 18 by a CVD method. A lower electrode 28 of the information storage capacitance device C is formed inside the groove 27 formed in the silicon oxide film 24 in the succeeding step. Accordingly, since the thickness of the silicon oxide film 24 defines the height for the lower electrode 28, the silicon oxide film 24 is deposited at a large thickness (about 0.8 μm or more) for increasing the stored static charge quantity by increasing the surface area of the lower electrode 28. The silicon oxide film 24 is deposited, for example, by a plasma CVD method using oxygen and tetraethoxy silane (TEOS) as a source gas and then the surface thereof is flattened optionally by a chemical mechanical polishing method.

Figure 38:
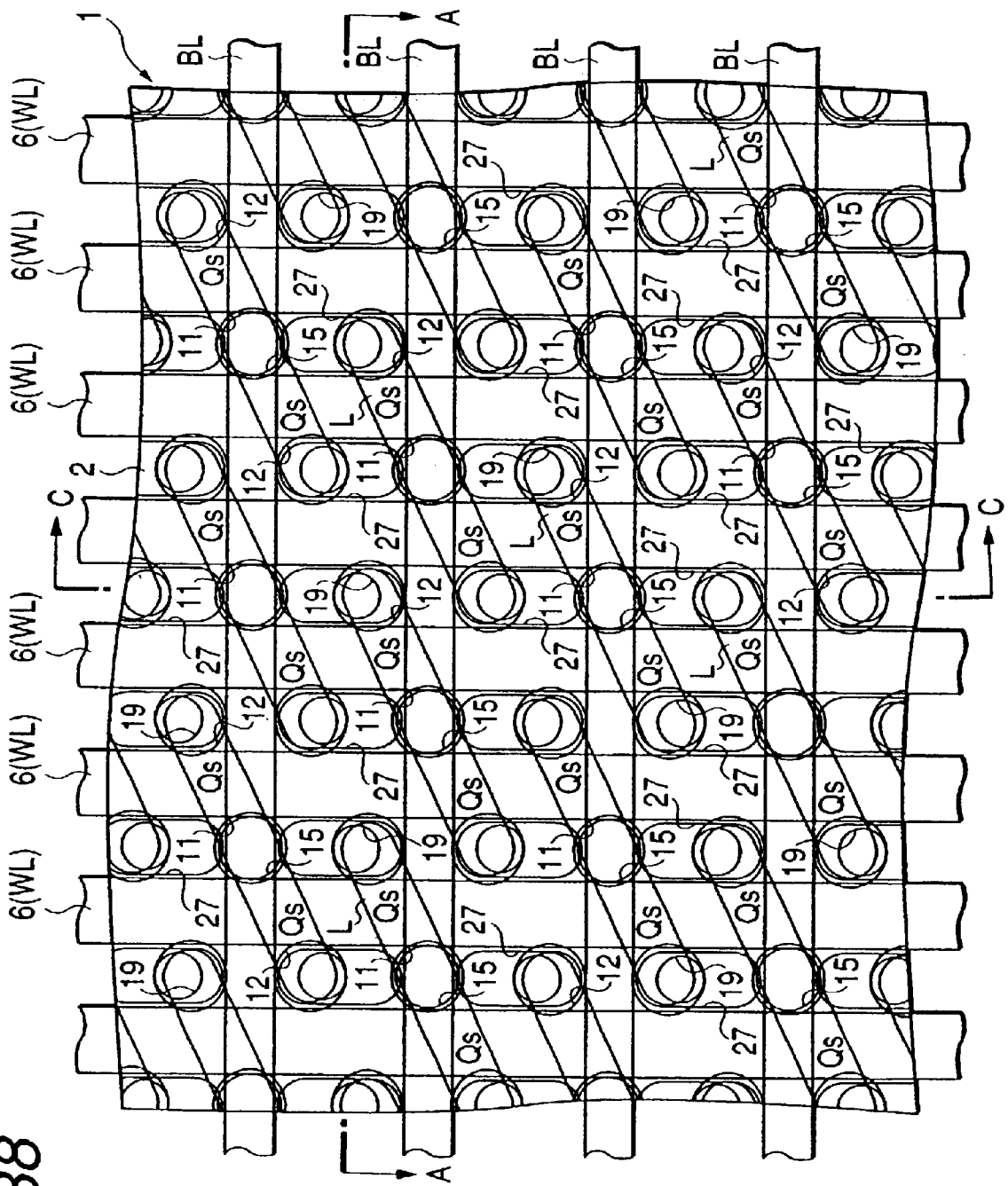
FIG. 38 is a plan view for a main portion of a semiconductor substrate illustrating a process for manufacturing a DRAM as one embodiment according to this invention.
Figure 39:
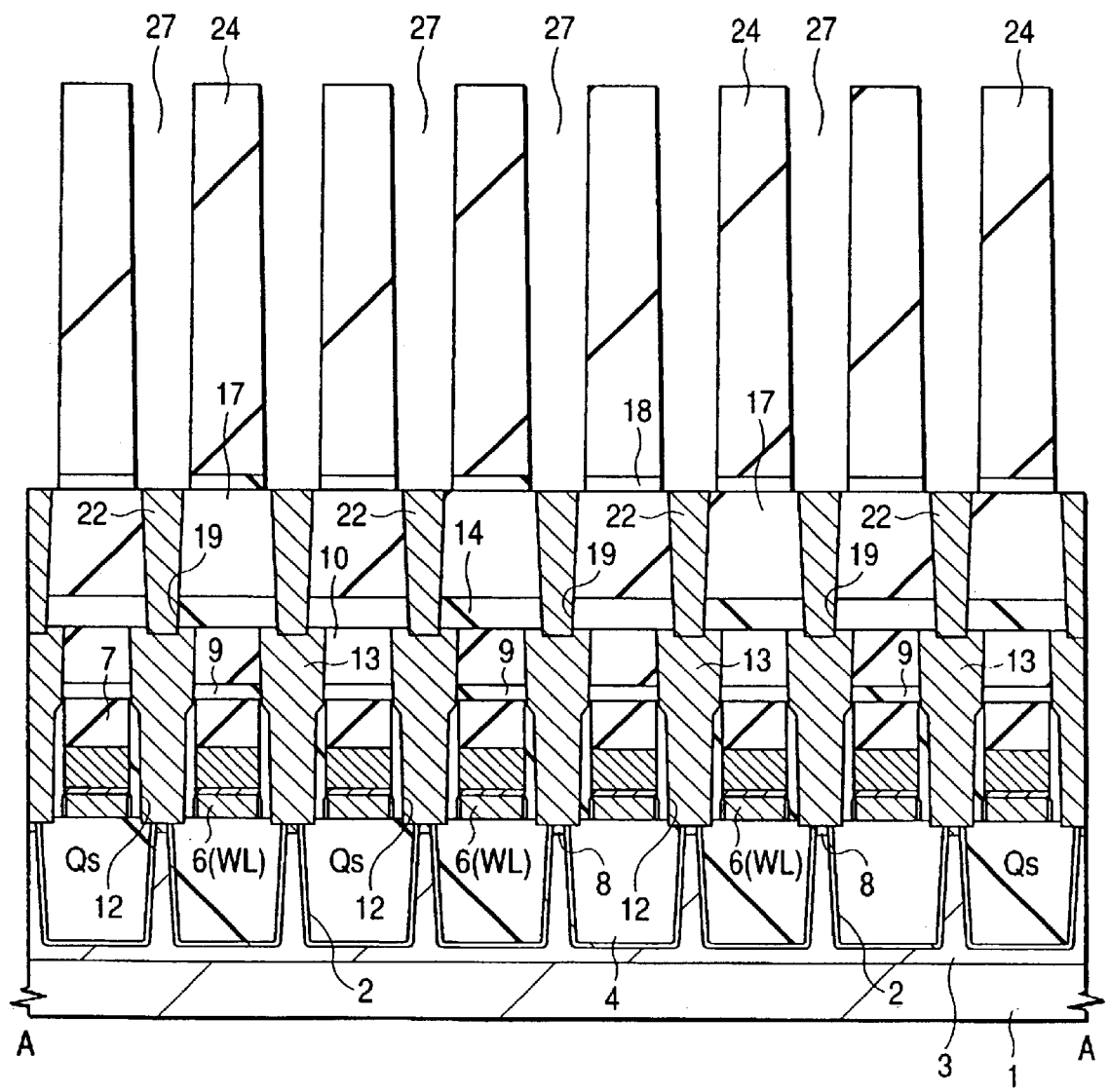
FIG. 39 is a cross sectional view for a main portion of a semiconductor substrate illustrating a process for manufacturing a DRAM as one embodiment according to this invention.
Figure 40:
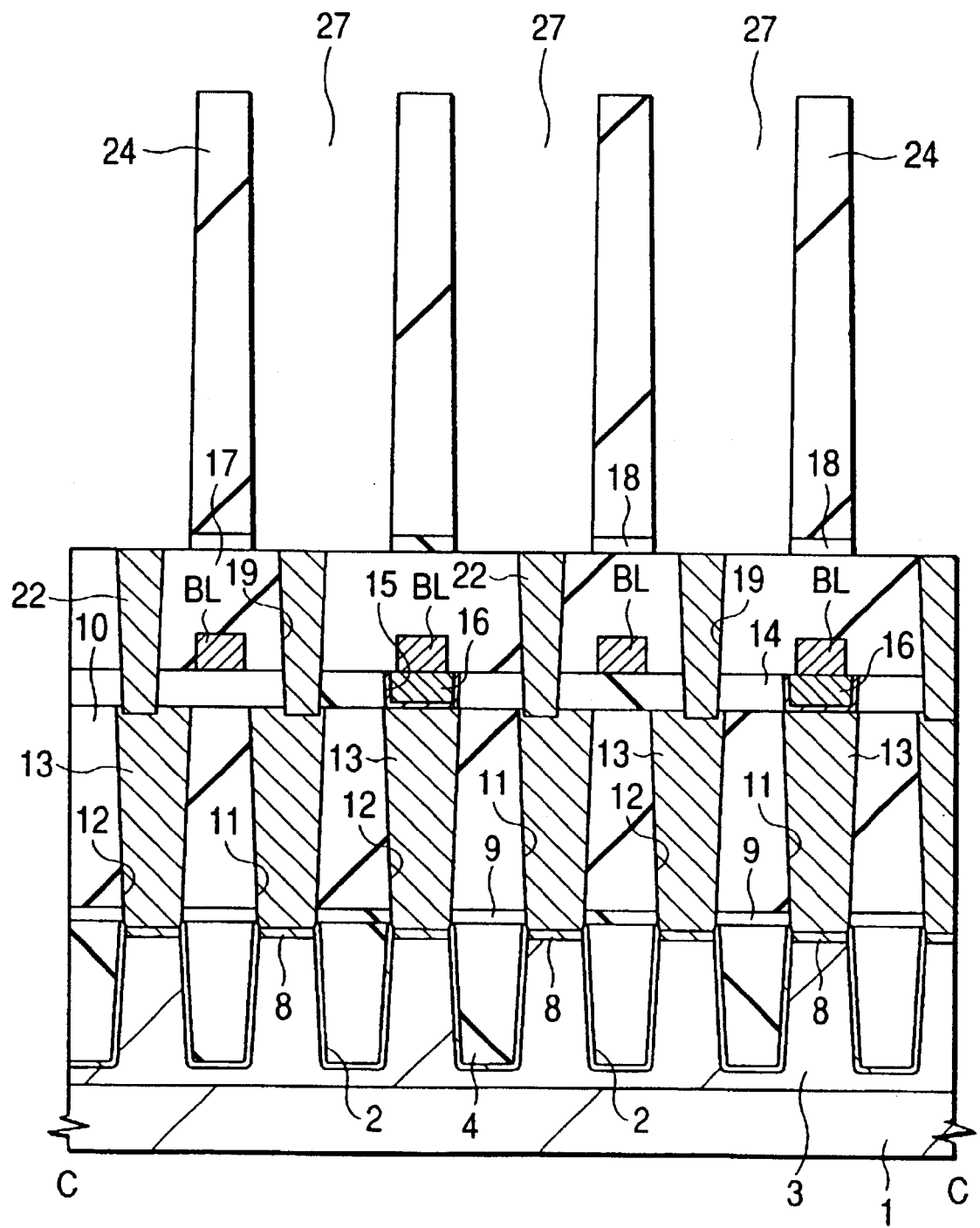
FIG. 40 is a cross sectional view for a main portion of a semiconductor substrate illustrating a process for manufacturing a DRAM as one embodiment according to this invention.

Then, as shown in FIG. 38 to FIG. 40, the silicon oxide film 24 is dry etched using a photoresist film (not illustrated) as a mask and then, successively, the silicon nitride film 18 under the silicon oxide film 24 is dry etched to form a groove 27 in which the surface of the plug 22 in the through hole 19 is exposed at the bottom. As shown in FIG. 38, the groove 27 is constituted as a rectangular planer pattern having a longer side in the extending direction of the word line WL and a shorter side in the extending direction of the bit line BL.

The groove 27 can be formed also by the following method. At first, after depositing the silicon nitride film 18 and the silicon nitride film 24 of a large thickness successively over the silicon oxide film 17 and then depositing a silicon nitride film (not illustrated) over the silicon oxide film 24 by a CVD method, the silicon nitride film is dry etched by using a photoresist film as a mask. Then, after removing the photoresist film, the silicon oxide film 24 is dry etched by using the silicon nitride film as a mask and, further, the silicon nitride film 18 is dry etched to form a groove 27.

Figure 41:
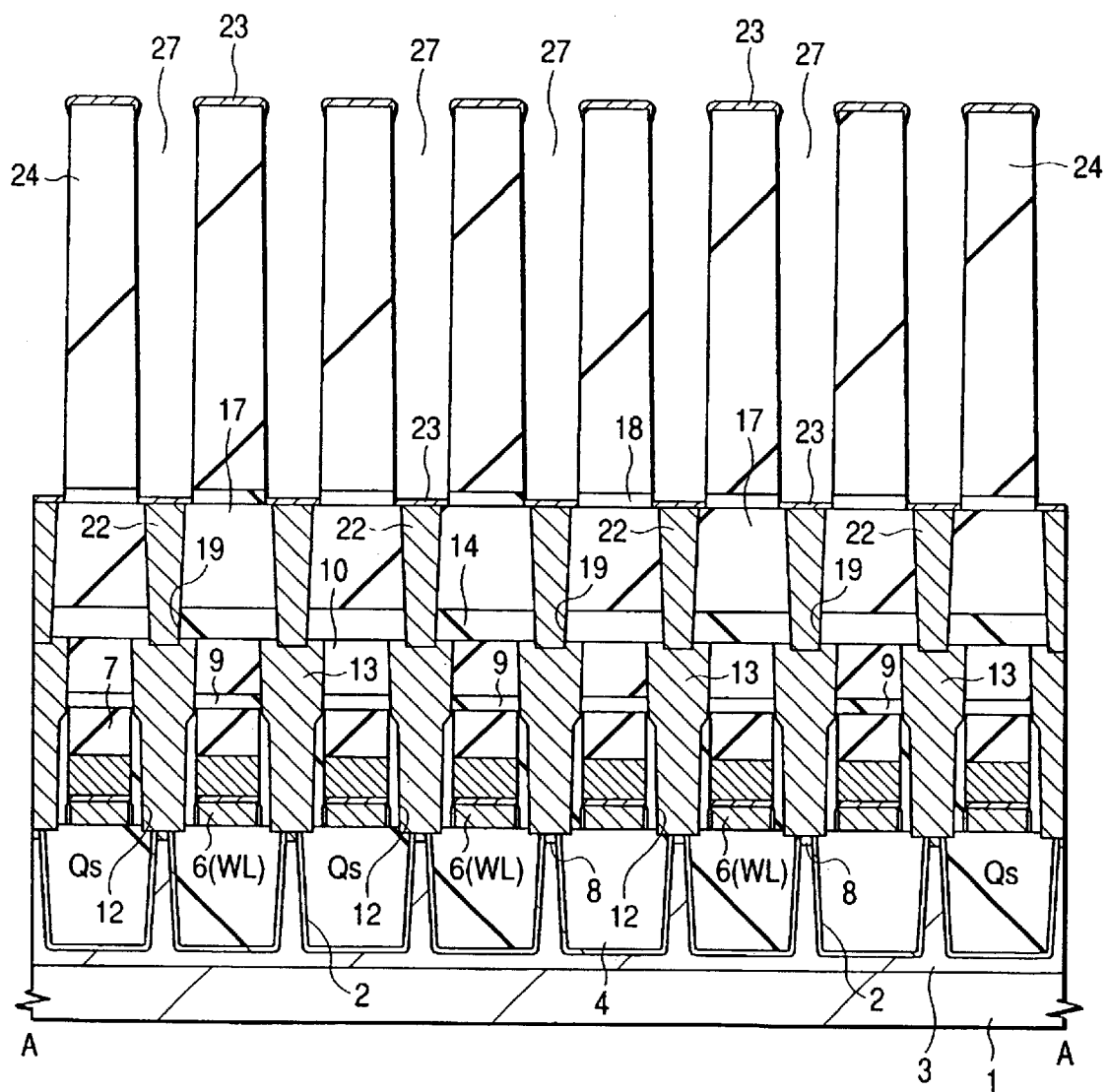
FIG. 41 is a cross sectional view for a main portion of a semiconductor substrate illustrating a process for manufacturing a DRAM as one embodiment according to this invention.
Figure 42:
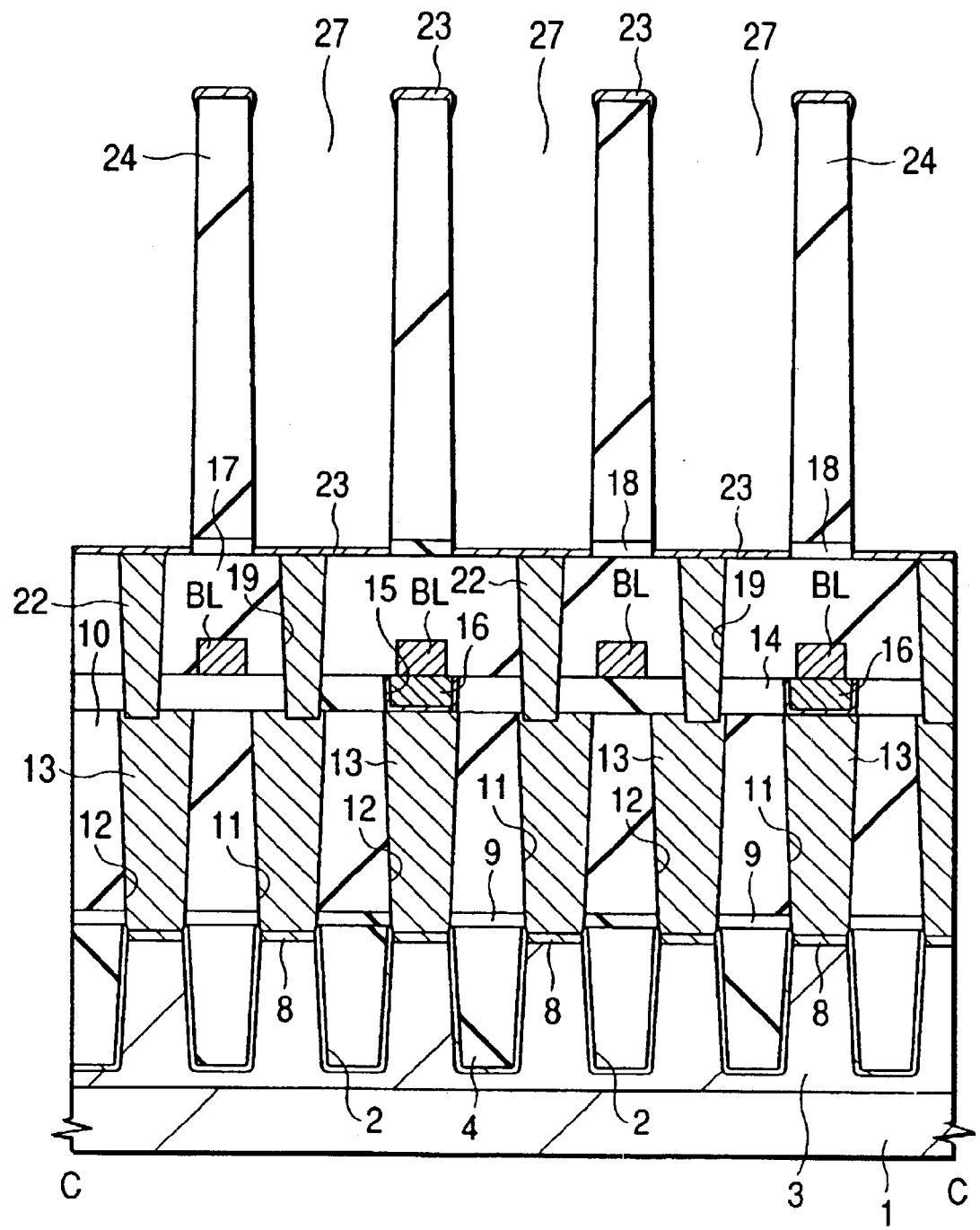
FIG. 42 is a cross sectional view for a main portion of a semiconductor substrate illustrating a process for manufacturing a DRAM as one embodiment according to this invention.

Then, as shown in FIG. 41 and FIG. 42, an Ru film 23 is deposited by a sputtering method over the silicon oxide film 24 in which the deep groove 27 is formed. The Ru film 23 is deposited at such a thin thickness that the thickness is about 50 nm at the bottom of the groove 27. Generally, since the film deposited by a sputtering method has lower step coverage compared with the film deposited by a CVD method, the Ru film 23 is less deposited on the side wall of the deep groove 27. FIG. 41 and FIG. 42 show a state where the Ru film 23 is deposited over the silicon oxide film 24 and at the bottom of the groove 27, but an extremely thin film (not illustrated) is deposited actually also on the side wall of the groove 27. The thin film deposited on the side wall of the groove 27 has an effect of improving the adhesion of a CVD-Ru film (Ru film 28a) deposited inside the groove 27 in the subsequent step.

Figure 43:
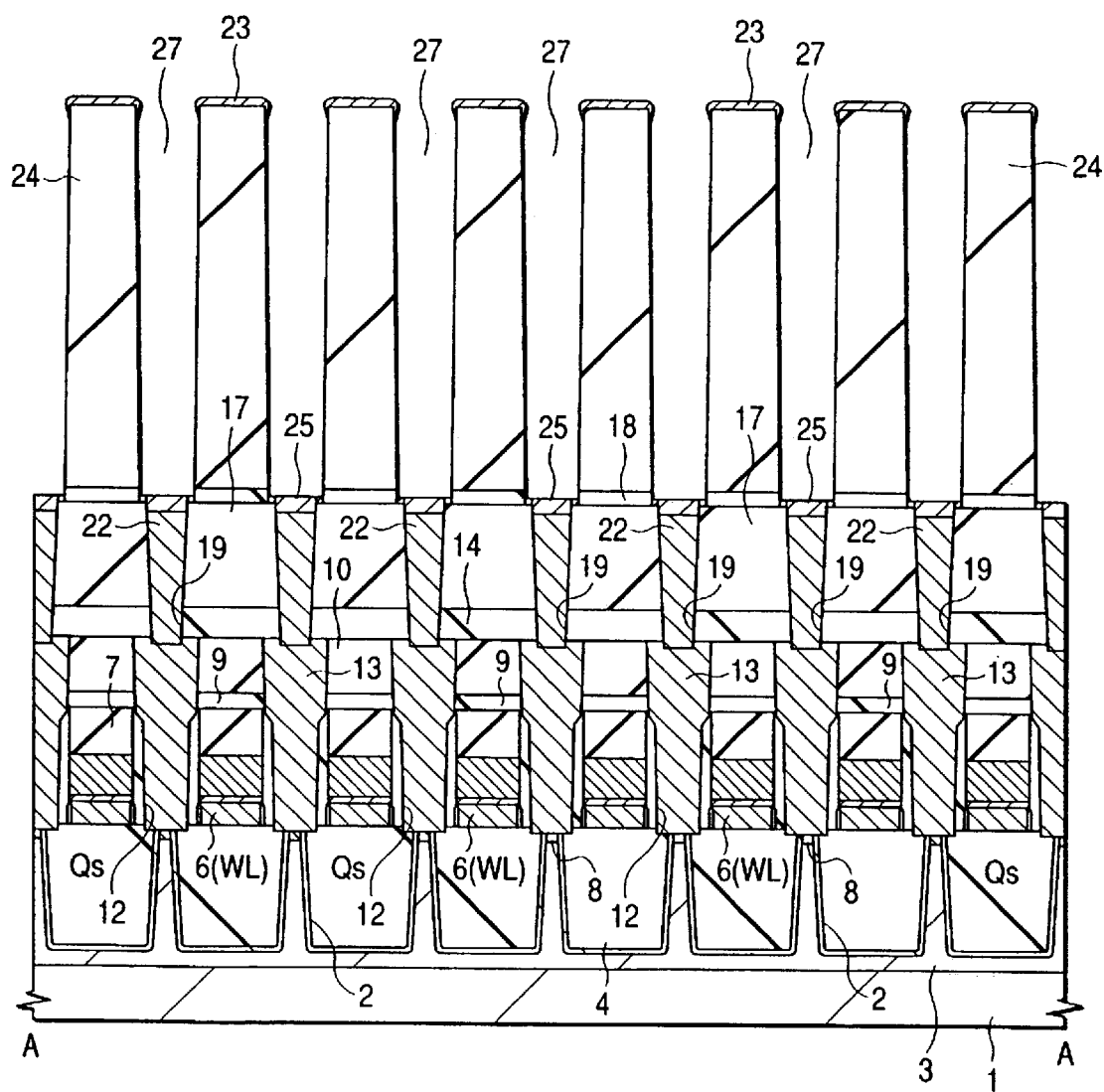
FIG. 43 is a cross sectional view for a main portion of a semiconductor substrate illustrating a process for manufacturing a DRAM as one embodiment according to this invention.
Figure 44:
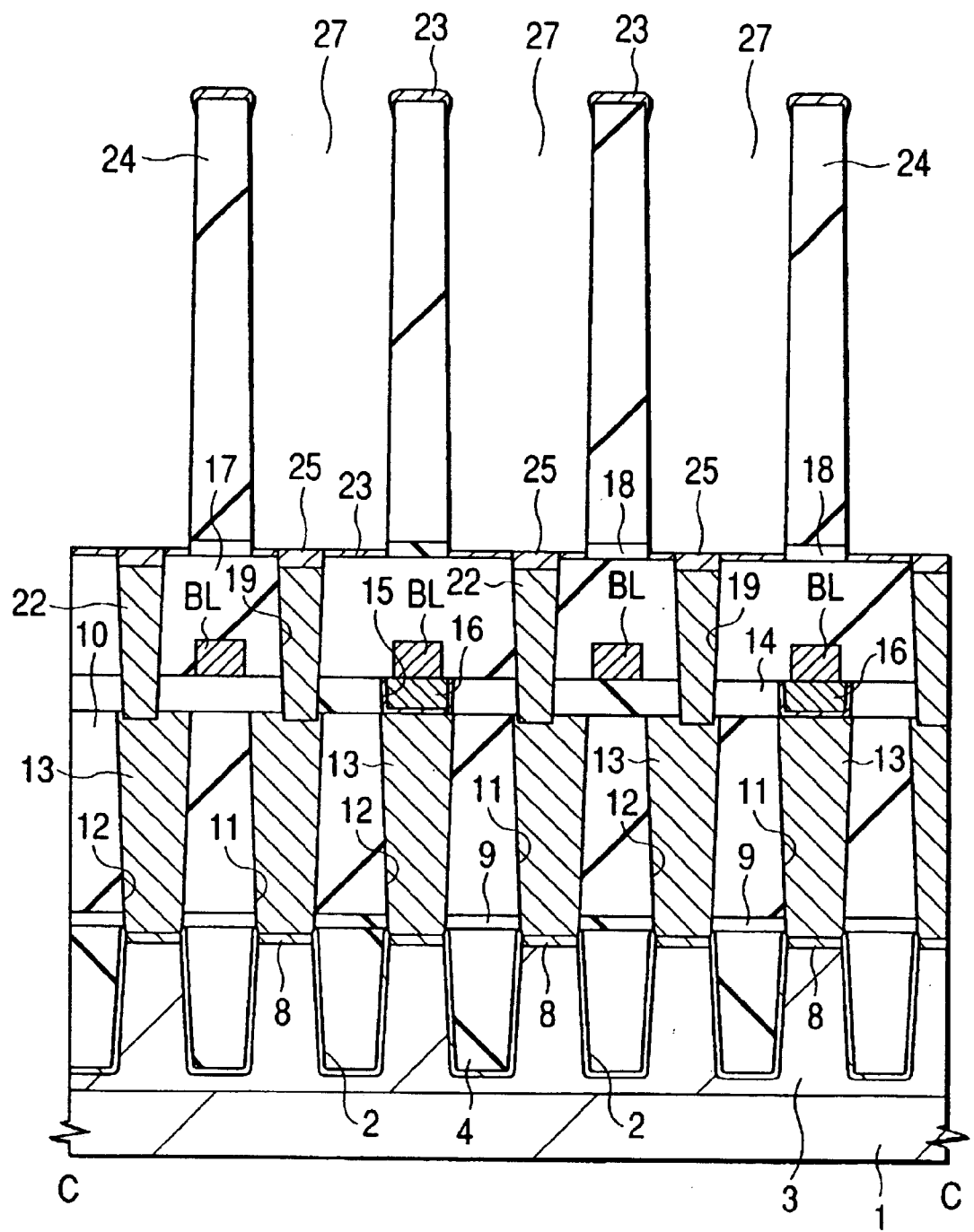
FIG. 44 is a cross sectional view for a main portion of a semiconductor substrate illustrating a process for manufacturing a DRAM as one embodiment according to this invention.

Then, as shown in FIG. 43 and FIG. 44 heat treatment is conducted at about 700° C. for one min in a non-oxidative gas atmosphere such as nitrogen, to react the Ru film 23 at the bottom of the groove 27 and the plug 22 therebelow comprising polycrystal silicon to form an Ru silicide layer 25 on the surface of the plug 22. In this case, since the Ru film 23 over the silicon oxide film 24 causes no silicide reaction, it remains as it is.

The Ru silicide layer 25 is formed for preventing occurrence of undesired siliciding reaction at the boundary between Ru constituting the lower electrode 28 and the polycrystal silicon constituting the plug 22 and reducing the contact resistance upon heat treatment conducted in the subsequent step, for example, a high temperature heat treatment conducted in the dielectric film forming step for the information storage capacitance device C to be described later.

Figure 45:
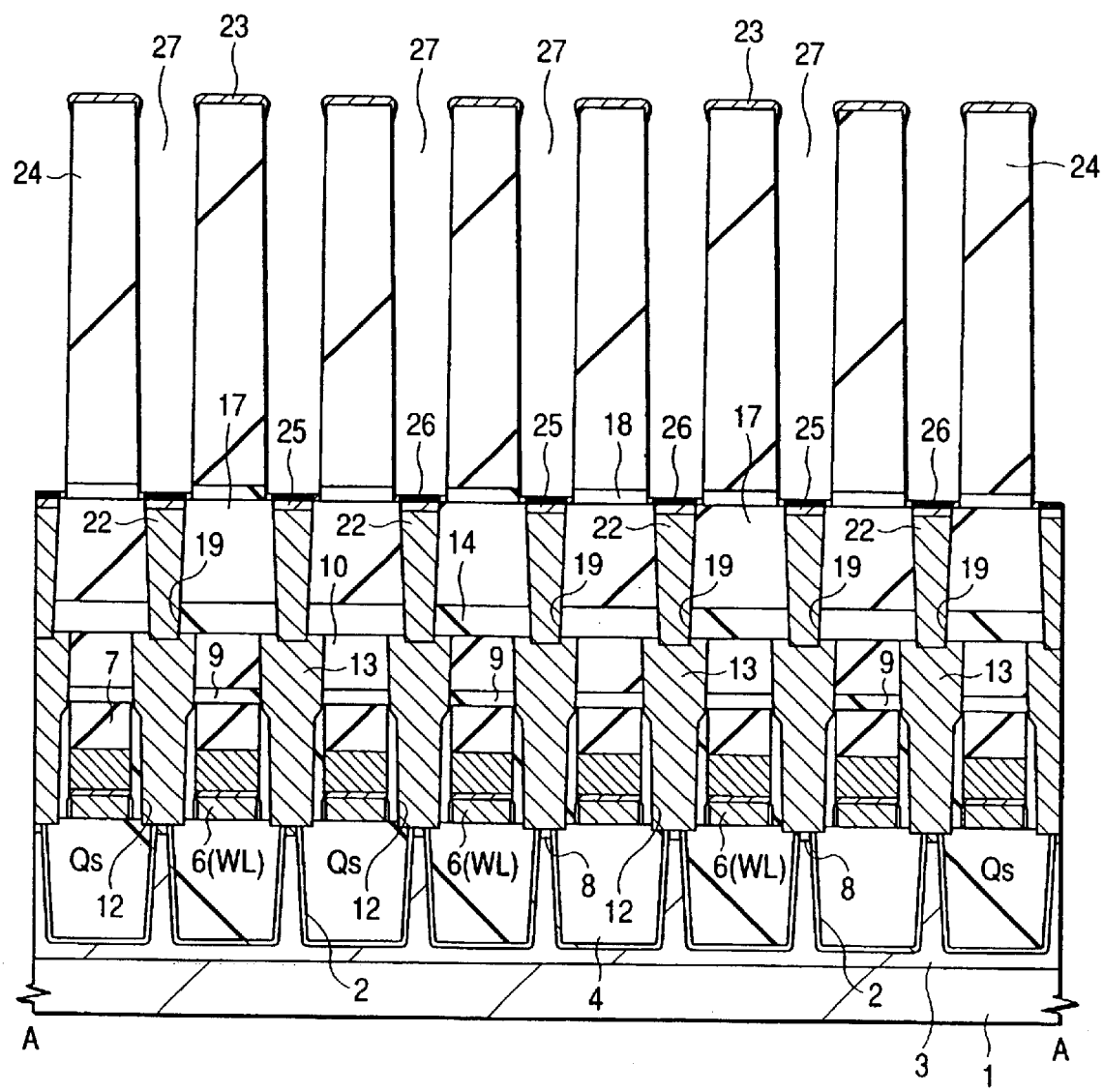
FIG. 45 is a cross sectional view for a main portion of a semiconductor substrate illustrating a process for manufacturing a DRAM as one embodiment according to this invention.
Figure 46:
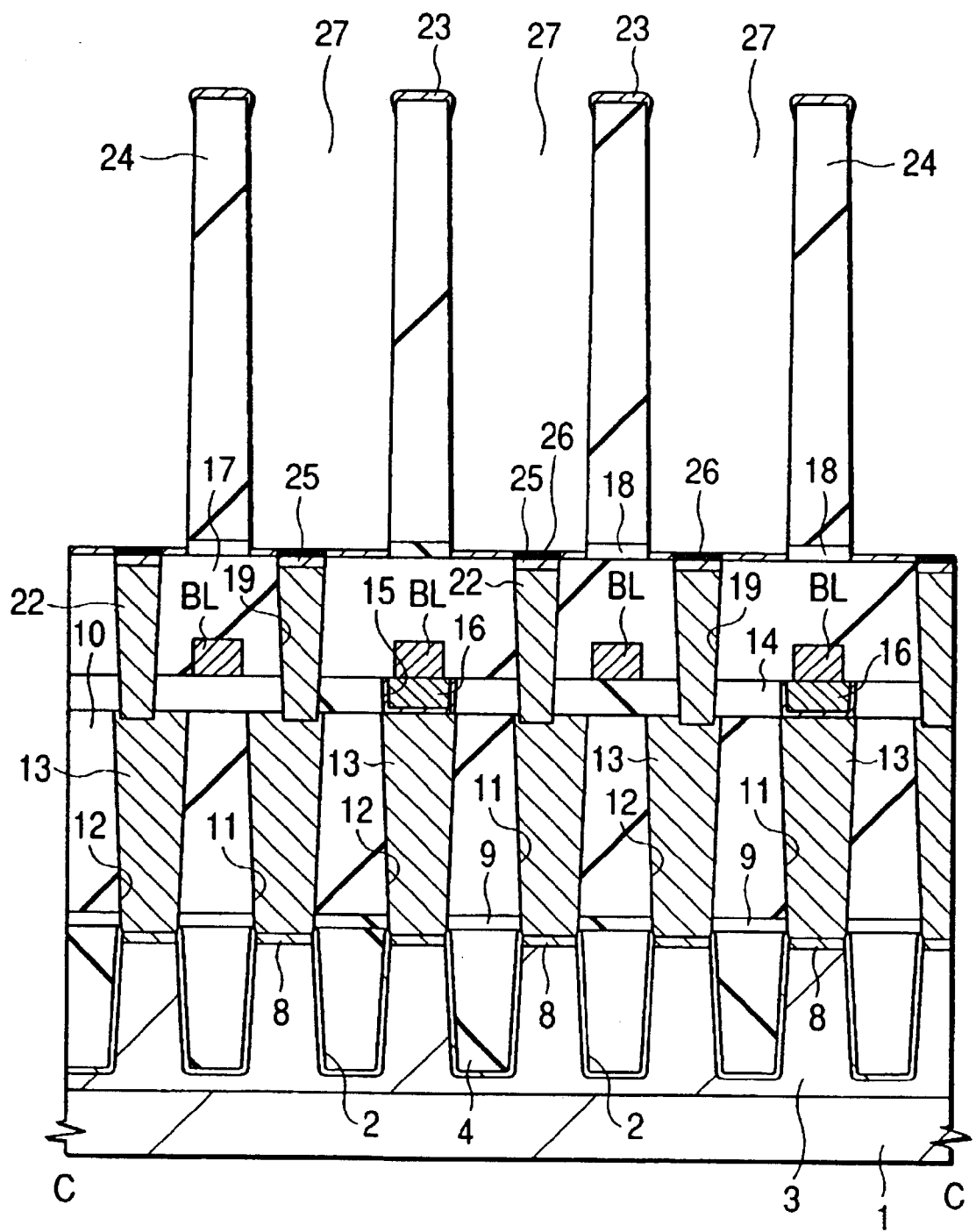
FIG. 46 is a cross sectional view for a main portion of a semiconductor substrate illustrating a process for manufacturing a DRAM as one embodiment according to this invention.

Then, as shown in FIG. 45 and FIG. 46, an Ru silicon nitride layer 26 is formed by conducting a heat treatment at about 650° C. for 3 min in an ammonia gas atmosphere to nitride the surface of the Ru silicide 25. The thickness of the Ru silicon nitride layer 26 formed under the heat treatment conditions described above is extremely thin and it was within a range from 0.5 nm to 1.0 nm as a result of observation made by the present inventors by a transmission electron microscope.

The thickness of the Ru silicon nitride layer 26 can be controlled by varying the heat treatment condition described above. That is, when the surface of the polycrystal silicon (plug 22) is nitrided in the ammonia gas atmosphere, the nitriding reaction starts at about 550° C. and the reaction proceeds rapidly as the temperature goes higher. Since the feature of the nitriding reaction resides in that the reaction stops in a self-alignment manner, it has a merit that the thickness of the Ru silicon nitride layer 26 can be controlled at an extremely high accuracy.

It may be considered that the Ru silicon nitride layer 26 is formed by depositing a silicon nitride film over the Ru silicide layer 25 by a CVD method and reacting both of them by a heat treatment. However, it is difficult by the method to form an extremely thin film of about 1 nm at a good controllability. In the heat treatment in the ammonia gas atmosphere (thermal nitridation method), the thickness of the film formed is utmost about 2 nm even when the heat treatment is conducted at a high temperature of about 1000° C., which scarcely depends on the treating time. When the treating time is one min or more, the film thickness can substantially be controlled only by setting the temperature. The thermal nitridation method proceeds such that a nitriding agent diffuses in the formed film and reaches the silicon surface to form a nitrided film. Since the nitride film is extremely dense, the formed film itself has a function of inhibiting the diffusion of the nitriding agent. Accordingly, this is a method which is extremely advantageous for forming the Ru silicon nitride layer 26 of a thin film thickness as described above although it can not form a thick film.

The Ru silicon nitride layer 26 may be formed also by a nitriding treatment utilizing active nitrogen formed in a plasma atmosphere (plasma nitriding method) instead of the thermal nitriding method described above. The principle of forming the nitride film in the plasma nitriding method is identical with that in the thermal nitriding method but this method has an advantage capable of forming a film at a lower temperature since active nitrogen in plasmas is used as the nitriding agent and a nitride film, for example, of about 1 nm thickness can be formed at a temperature within a range from 300° C. to 400° C.

As described above, in this embodiment, the Ru silicide layer 25 and the Ru silicon nitride layer 26 are formed on the surface of the plug 22 as a barrier layer for preventing occurrence of undesired siliciding reaction between Ru constituting the lower electrode 28 for the information storage capacitance device C and the polycrystal silicon constituting the plug 22. The Ru silicon nitride layer 26 has a function of preventing disadvantage that an oxidizer (oxygen) diffusing in the dielectric film 29 and in the lower electrode 28 oxidizes the surface of the Ru silicide layer 25, to form a silicon oxide film (Ru silicon oxide layer) of lower dielectric constant or, in an extremely case, result in a shape abnormality to the lower electrode 28 upon high temperature heat treatment in an oxygen atmosphere conducted in the step of forming the dielectric film for the information storage capacitance device C. Further, in this embodiment, the Ru silicon nitride layer 26 is formed in a self alignment manner by a thermal nitriding method (or plasma nitriding method). Since this reduces the film thickness of the Ru silicon nitride layer 26 extremely, it does not hinder the electric conduction between the lower electrode 28 and the plug 22.

Figure 47:
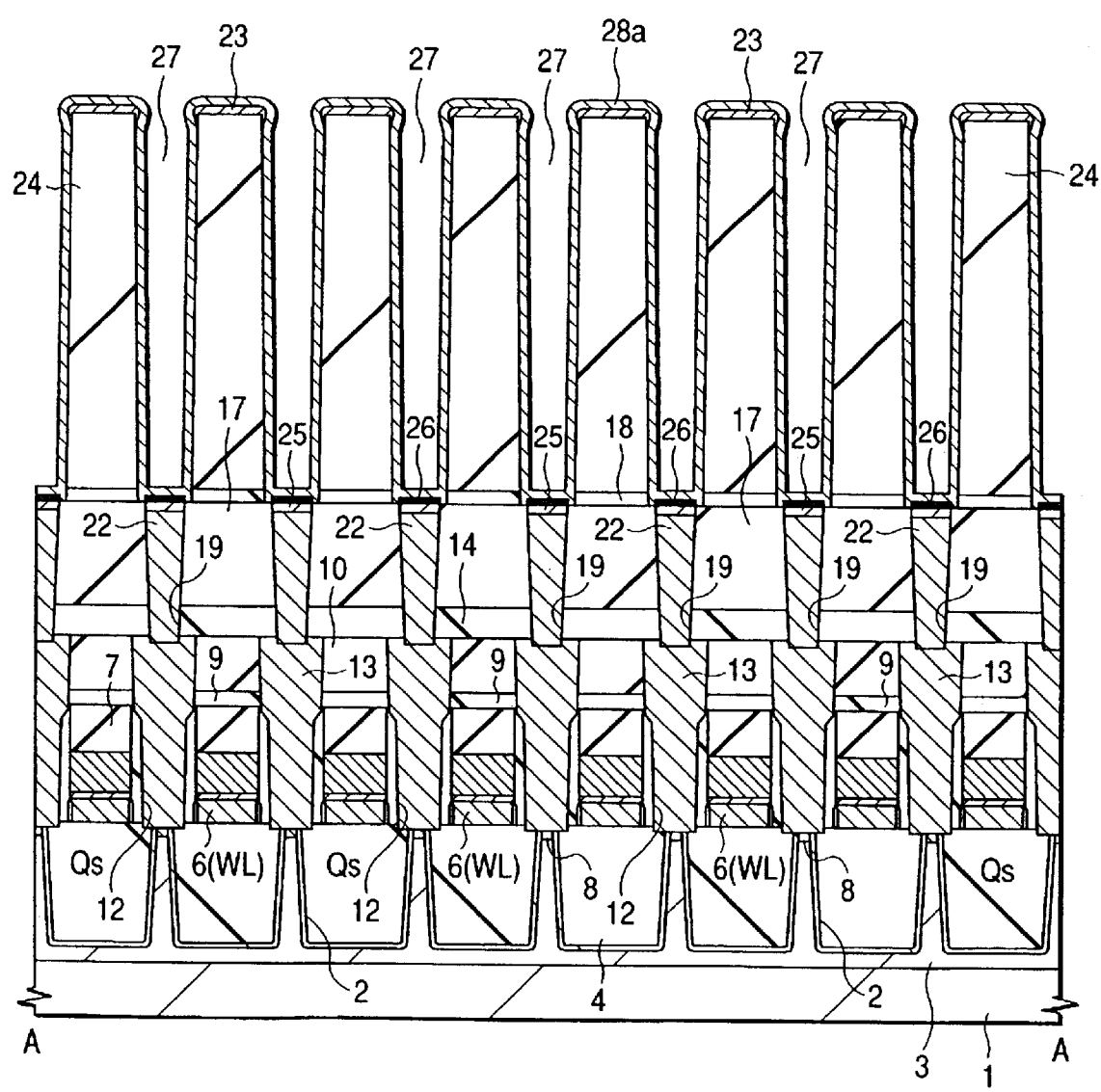
FIG. 47 is a cross sectional view for a main portion of a semiconductor substrate illustrating a process for manufacturing a DRAM as one embodiment according to this invention.
Figure 48:
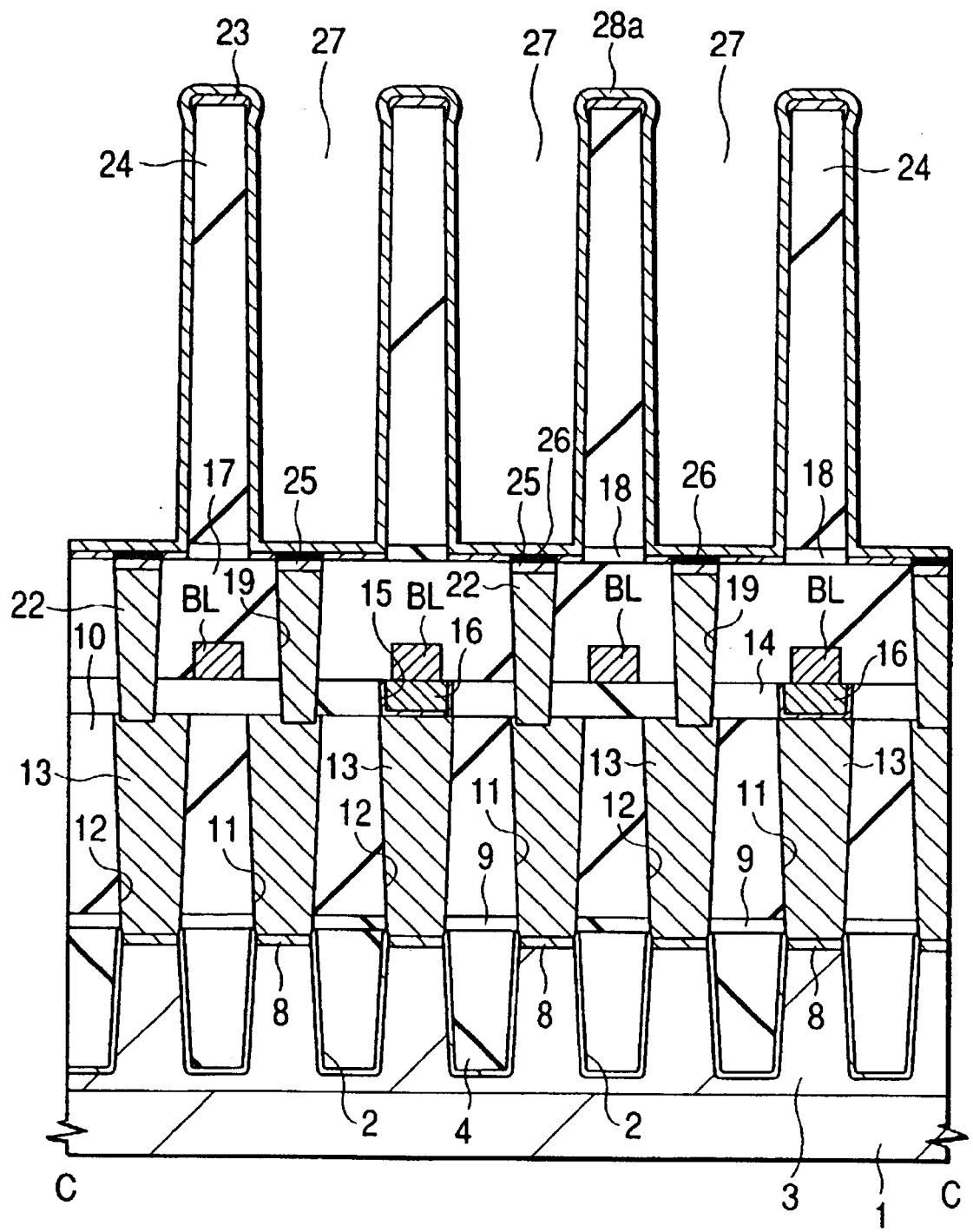
FIG. 48 is a cross sectional view for a main portion of a semiconductor substrate illustrating a process for manufacturing a DRAM as one embodiment according to this invention.
Figure 49:
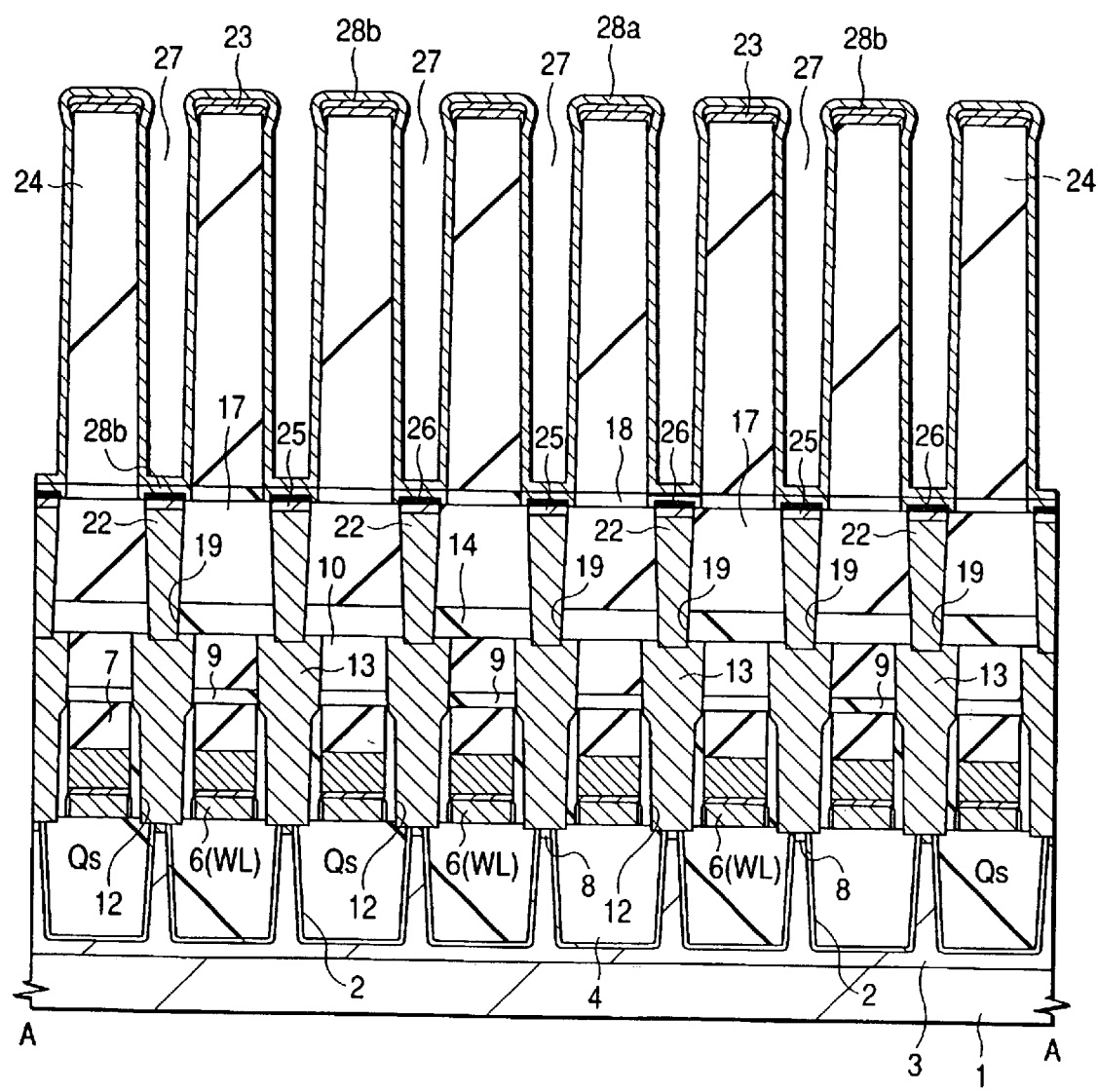
FIG. 49 is a cross sectional view for a main portion of a semiconductor substrate illustrating a process for manufacturing a DRAM as one embodiment according to this invention.
Figure 50:
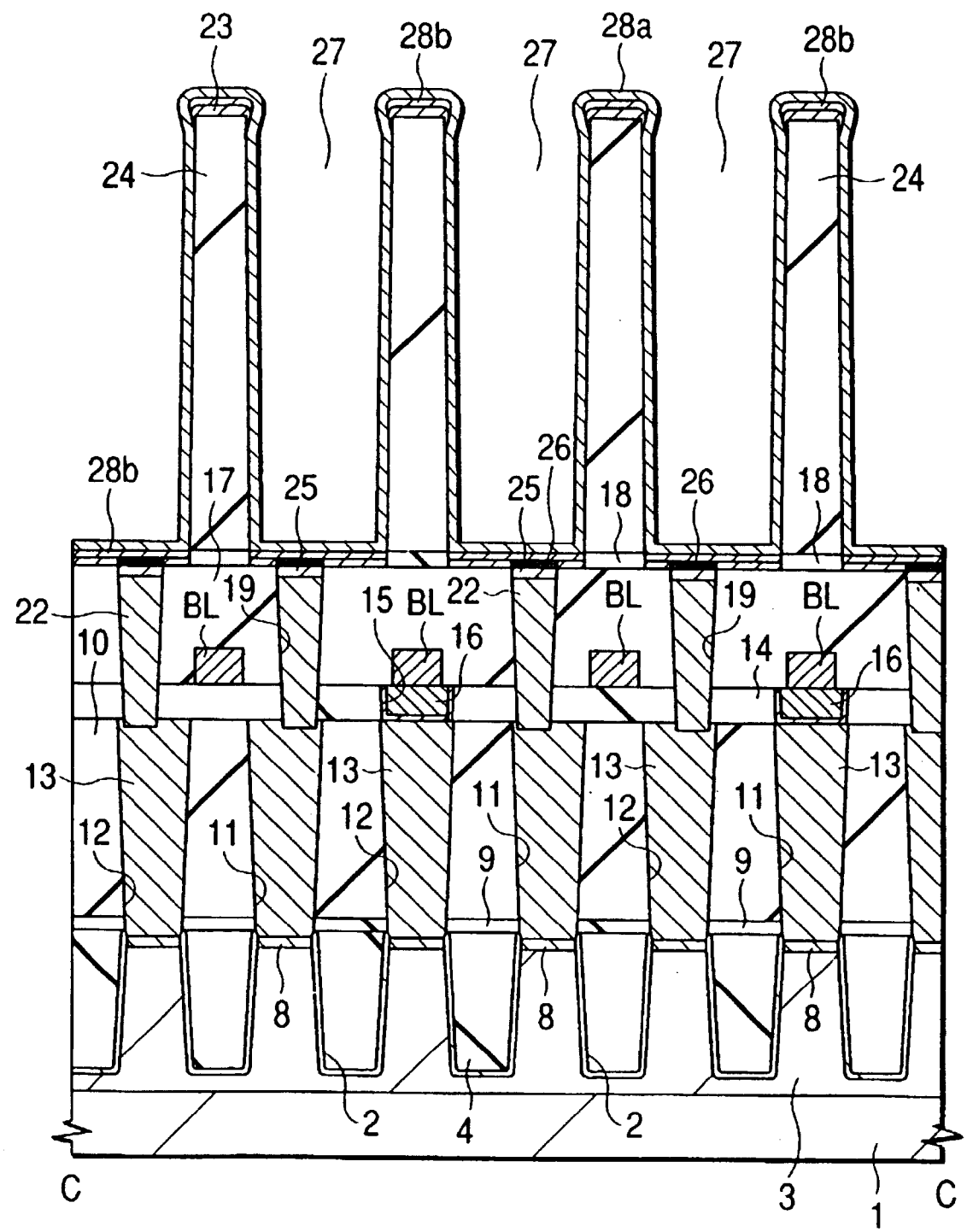
FIG. 50 is a cross sectional view for a main portion of a semiconductor substrate illustrating a process for manufacturing a DRAM as one embodiment according to this invention.

Then, as shown in FIG. 47 and FIG. 48, a thin Ru film 28a of about 10 nm to 20 nm thickness is deposited over the silicon oxide film 24 and inside the groove 27 by a CVD method. The Ru film 28a is deposited, for example, by a thermal CVD method using $Ru(C_2H_5—C_5H_4)_2$ (ethylcyclopentadienyl ruthenium) and oxygen as the starting gas. Since the Ru film 28a deposited by the CVD method has a higher step coverage compared with the Ru film 23 deposited by the sputtering method, it provides a substantially uniform film thickness in the inside (bottom and side wall) of the deep groove 27. The Ru film 28a deposited by the CVD method has less adhesion with the silicon oxide film 24 compared with the Ru film 23 deposited by the sputtering method. However, the disadvantage that the Ru film 28a on the inner wall of the groove 27 is peeled can be prevented by previously depositing the Ru film 23 by the sputtering method as the underlayer thereof. However, since the Ru film 23 deposited on the side wall of the groove 27 is extremely thin, it can not sometimes prevent the peeling of the Ru film 28a completely. In order to prevent this, a thin Ru film 28b of about 10 nm to 20 nm thickness may be deposited previously by the sputtering method and then the Ru film 28a may be deposited on the surface, for example, as shown in FIG. 49 and FIG. 50.

Figure 51:
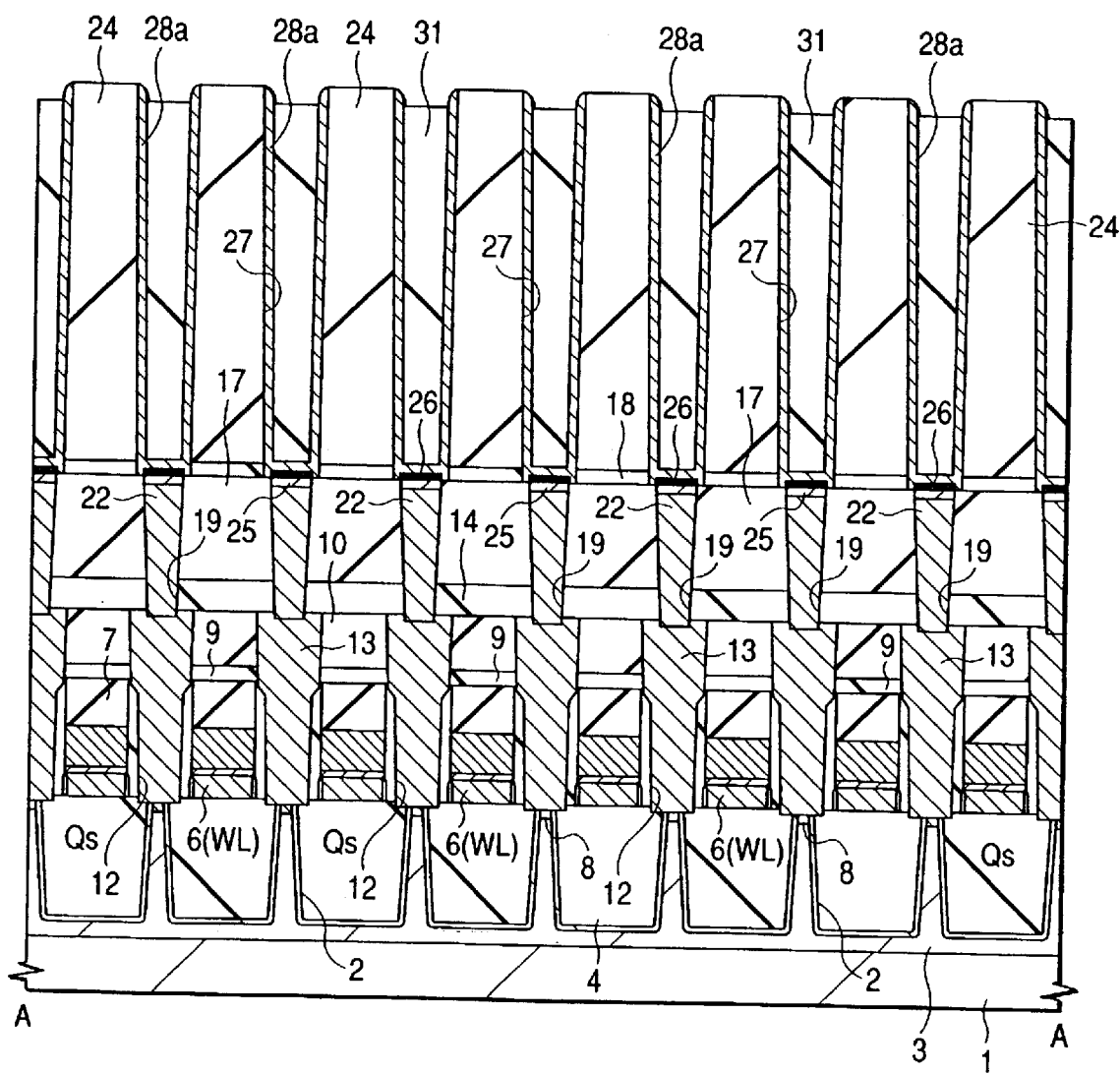
FIG. 51 is a cross sectional view for a main portion of a semiconductor substrate illustrating a process for manufacturing a DRAM as one embodiment according to this invention.
Figure 52:
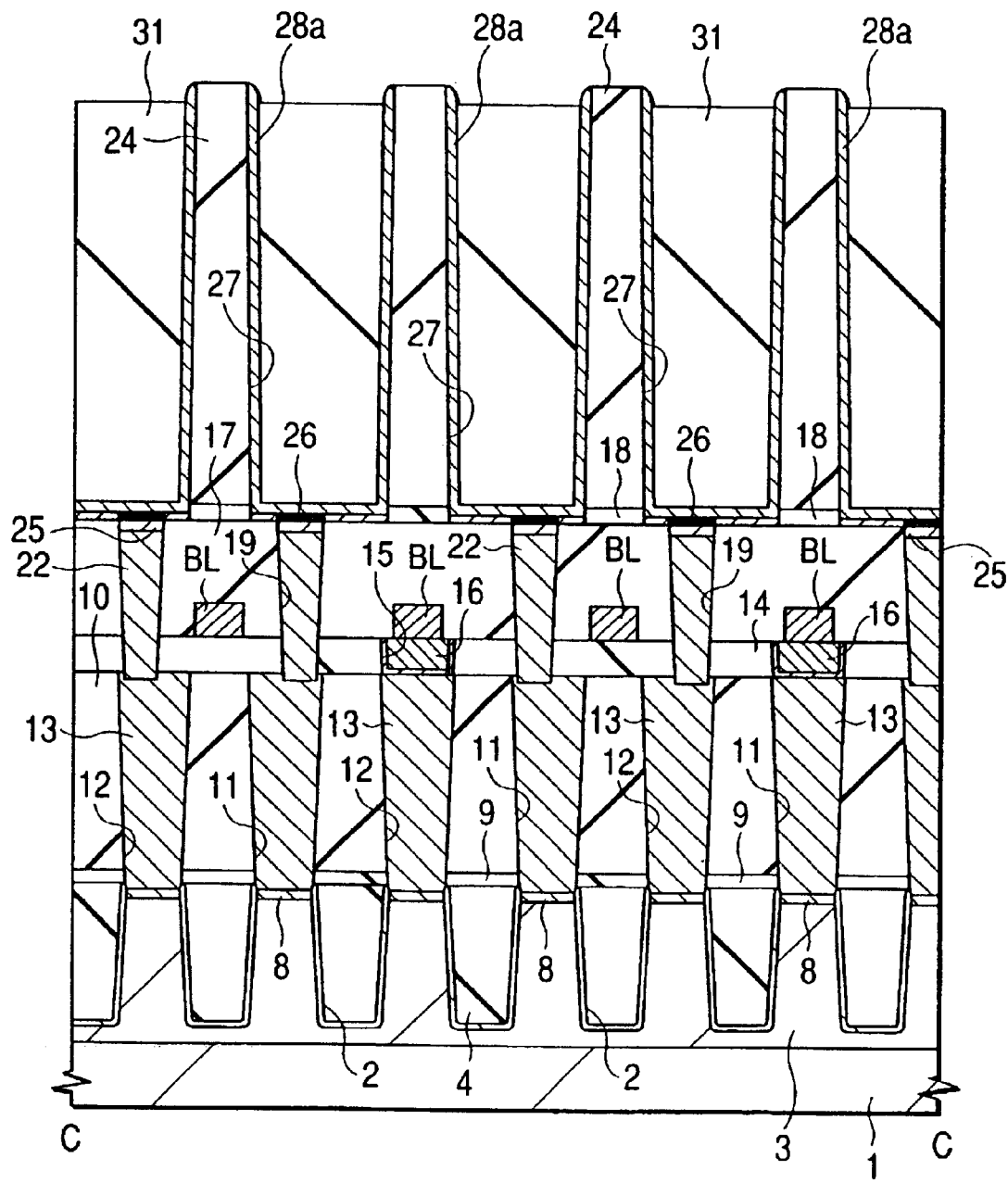
FIG. 52 is a cross sectional view for a main portion of a semiconductor substrate illustrating a process for manufacturing a DRAM as one embodiment according to this invention.

Then, as shown in FIG. 51 and FIG. 52, an insulating film 31 is buried inside the groove 27 and the Ru films 28a and 23 outside the groove 27 not covered with the insulating film 31 are eliminated by dry etching. The insulating film 31 is constituted with an insulative material having a high etching selectivity to the silicon oxide film 24, for example, a photoresist or spin-on-glass. When the insulating film 31 is constituted with a photoresist, a positive type photoresist film may be spin coated to the inside of the groove 27 and on the silicon oxide film 24 and then entire exposure and development are applied to remove the exposed portion outside the groove 27 and leave the unexposed portion inside the groove 27.

Figure 53:
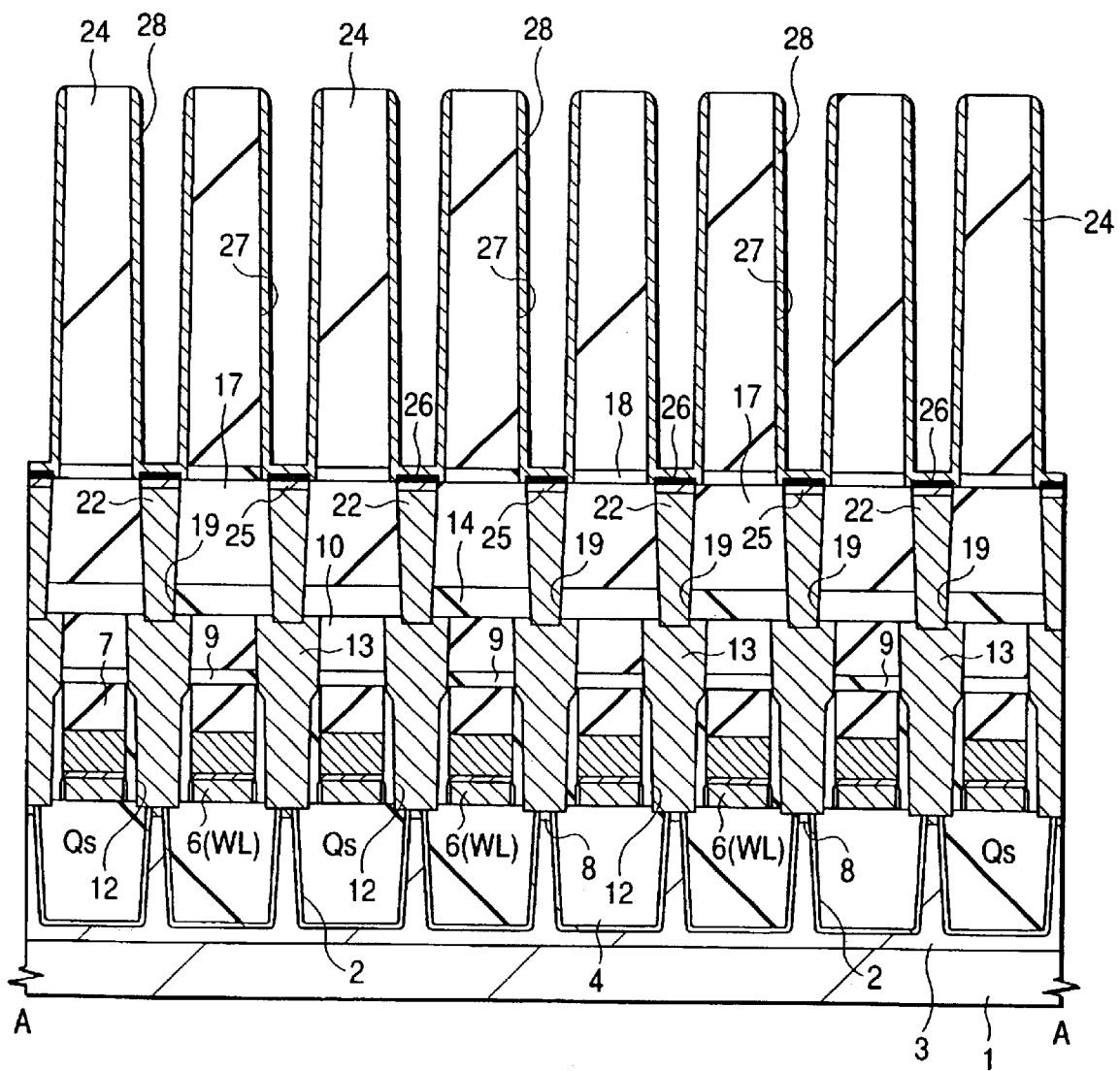
FIG. 53 is a cross sectional view for a main portion of a semiconductor substrate illustrating a process for manufacturing a DRAM as one embodiment according to this invention.
Figure 54:
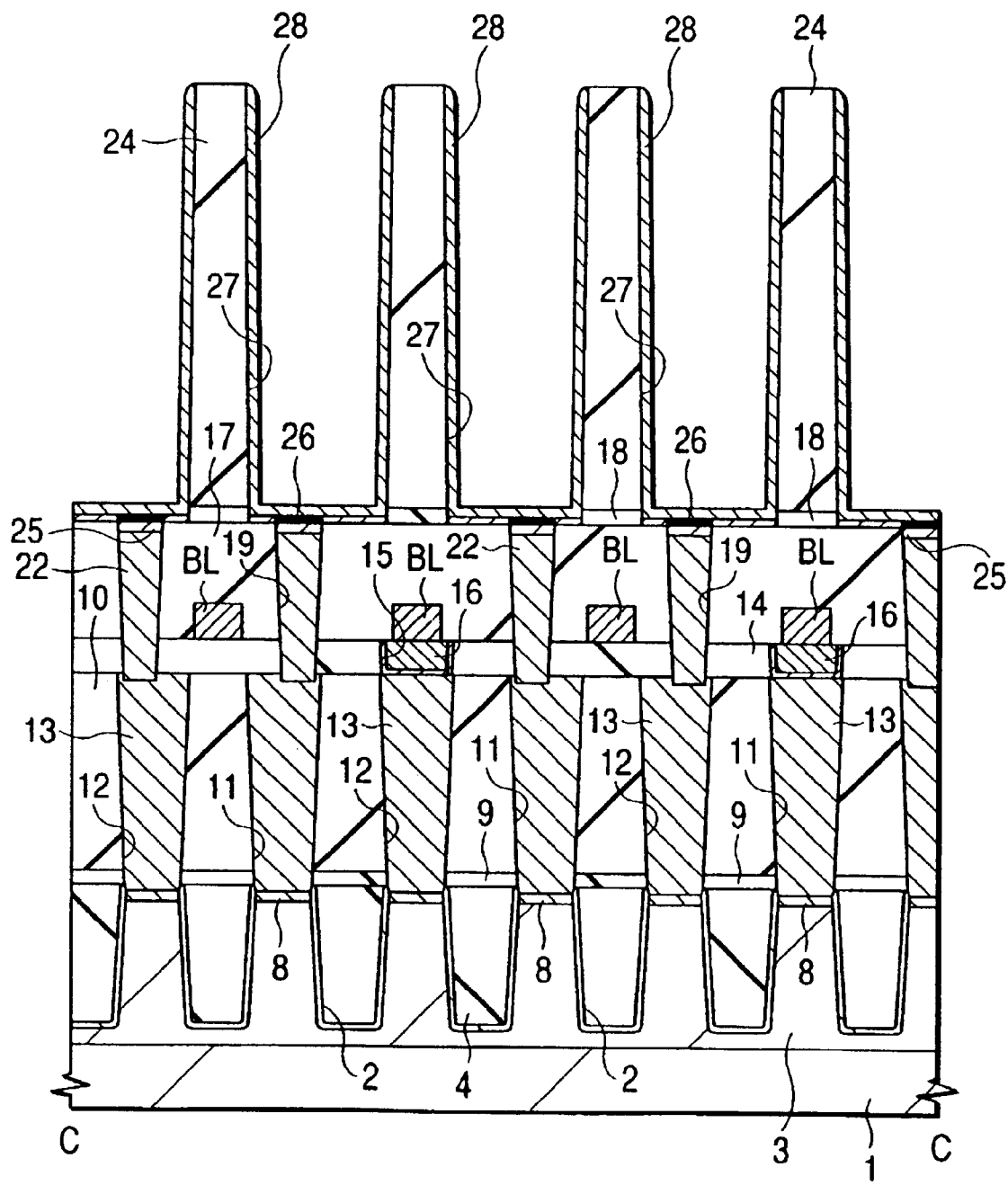
FIG. 54 is a cross sectional view for a main portion of a semiconductor substrate illustrating a process for manufacturing a DRAM as one embodiment according to this invention.

Then, as shown in FIG. 53 and FIG. 54, the insulating film 31 inside the groove 27 is removed. When the insulating film 31 is constituted with the photoresist, the insulating film 31 can be removed by an ashing treatment by oxygen radicals. Further, for densifying the Ru film 28a in this stage, a heat treatment about at 700° C. for one min is conducted in vacuum. This can provide a lower electrode 28 comprising the Ru film 28a deposited on the inner wall of the groove 27. The lower electrode 28 is connected electrically with the other of the n-semiconductor region 8 (source and drain) of the memory cell selecting MISFETQs by way of the plug 22 buried in the through hole 19 therebelow and the plug 13 buried in the contact hole 12 further therebelow.

Figure 55:
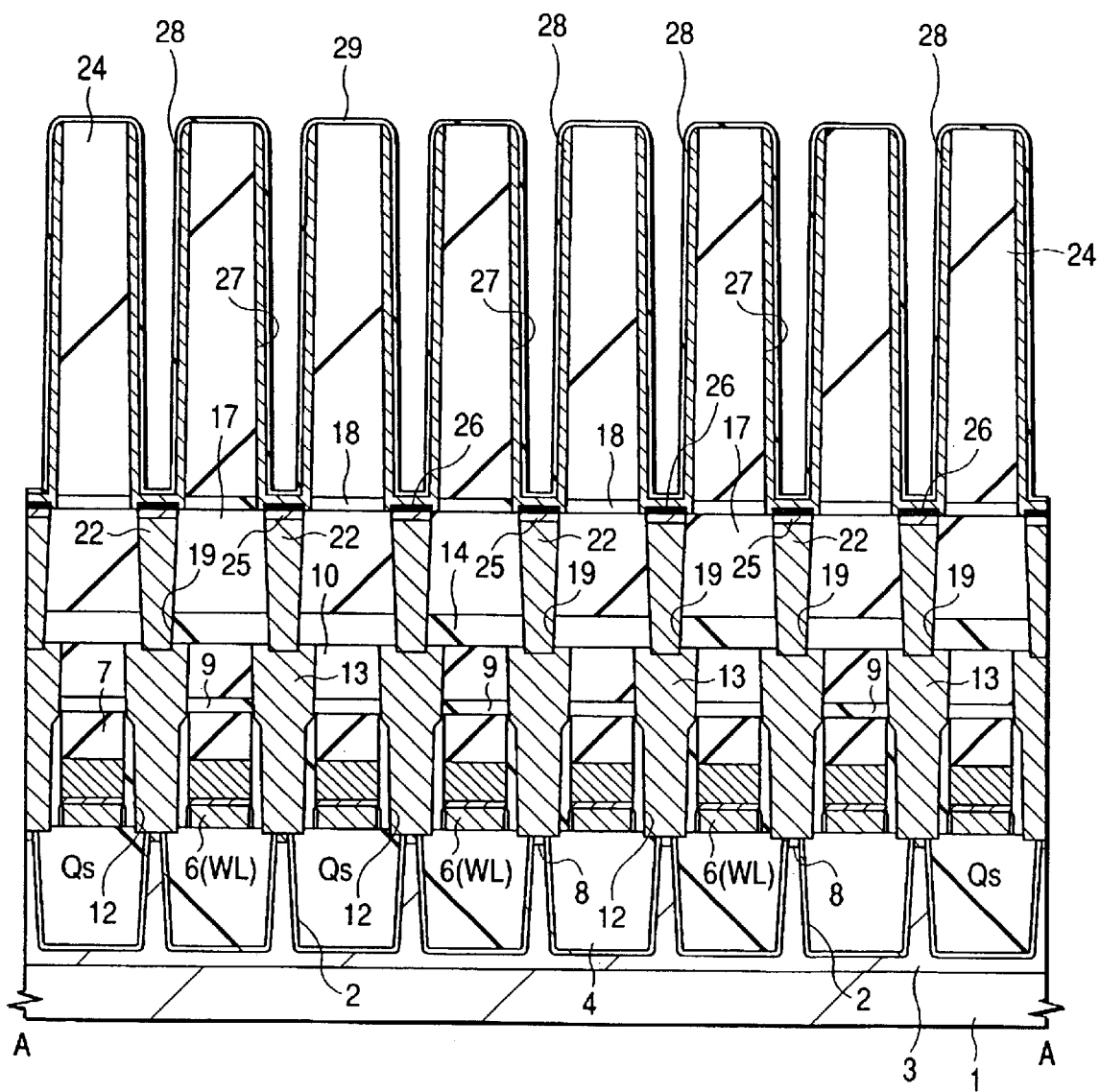
FIG. 55 is a cross sectional view for a main portion of a semiconductor substrate illustrating a process for manufacturing a DRAM as one embodiment according to this invention.
Figure 56:
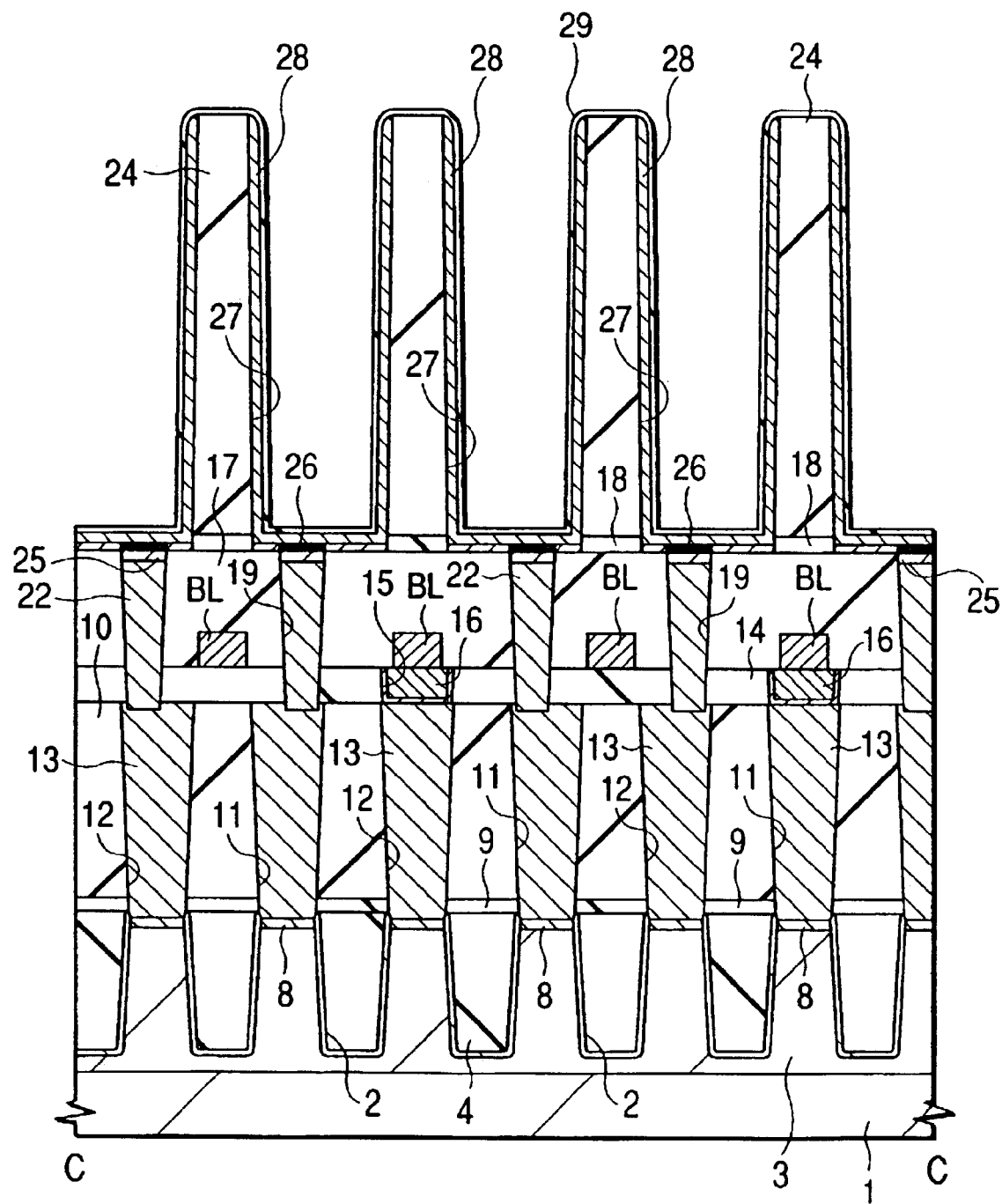
FIG. 56 is a cross sectional view for a main portion of a semiconductor substrate illustrating a process for manufacturing a DRAM as one embodiment according to this invention.

Then, as shown in FIG. 55 and FIG. 56, a dielectric film 29 comprising tantalum oxide is deposited thinly on the inner wall of the groove 27 and the surface of the silicon oxide film 24 formed with the lower electrode 28. The tantalum oxide film is deposited, for example, by using pentaethoxy tantalum $(Ta(OC_2H_5)_5)$ and oxygen as a starting gas under the conditions at a temperature of 430° C. and a pressure of 50 Pa and then a heat treatment is applied in an oxygen atmosphere in order to crystallize the film and improve the film quality.

For effectively crystallizing the tantalum oxide film and improving the film quality at a portion in contact with the lower electrode 28, film deposition and heat treatment are conducted each twice in this embodiment although not particularly restricted thereto. Specifically, a hot wall type batchwise CVD apparatus is used and a tantalum oxide film of 5 nm is deposited at first, then a heat treatment is conducted in an oxygen atmosphere at 650° C. for one min by using an RTA (Rapid Thermal Annealing) device and, further, tantalum oxide film of 5 nm thickness is deposited and a heat treatment is conducted at 600° C. for 2 min in an oxygen atmosphere by using the apparatus.

When film deposition and heat treatment for the tantalum oxide film are conducted each twice, the condition for the first heat treatment after the first film deposition is important and it is necessary to complete crystallization of the tantalum oxide film in the first heat treatment. If the tantalum oxide film is crystallized already by the heat treatment, since the tantalum oxide film formed by the second deposition is already completed for crystallization upon complete of the deposition (homoepitaxial growing), the second heat treatment is not always necessary. This homoepitaxial growing is a phenomenon in common with metal oxides, not restricted to tantalum oxide, to be deposited by the CVD method, although the extent of growth differs more or less. However, the second heat treatment is preferably conducted for obtaining a tantalum oxide film with less leak current.

By the heat treatment described above, the Ru silicon nitride layer 26 formed on the surface of the plug 22 is oxidized and at least a portion thereof is transformed into Ru silicon oxynitride that is, when the tantalum oxide film constituting the dielectric film 29 is heat treated at a high temperature in an oxygen atmosphere, oxygen permeating and diffusing through the tantalum oxide film and the lower electrode 28 reaches the Ru silicon nitride layer 26 to at least partially oxidize the same into Ru silicon oxynitride. Thus, since the Ru silicon nitride layer 26 or Ru silicon oxynitride forms a barrier layer to the oxygen diffusion, it can prevent a disadvantage that the Ru silicide layer 25 as the underlayer for the Ru silicon nitride layer 26 is oxidized by oxygen to form a silicon oxide layer of lower conductivity (Ru silicon oxide layer) on the surface of the plug 22, or the lower electrode 28 suffers from shape abnormality.

In this embodiment, the heat treatment for crystallizing and improving the film quality of the tantalum oxide film constituting the dielectric film 29 is conducted at 650° C. Crystallization and improvement for the film quality at such a low heat treatment temperature is characteristic to a case of constituting the lower electrode 28 as the underlayer for the tantalum oxide film with an Ru film. For example, for crystallizing and improving the quality of the tantalum oxide film deposited on the insulating film such as silicon oxide a heat treatment at a high temperature of 750° C. or higher is required in view of practical use. However, when the lower electrode 28 as the underlayer for the tantalum oxide film is constituted with the Ru film, a heat treatment can be done at a temperature lower by 100° C. or more. This can provide a remarkable merit in reducing the amount of heat treatment over the entire production steps.

Figure 57:
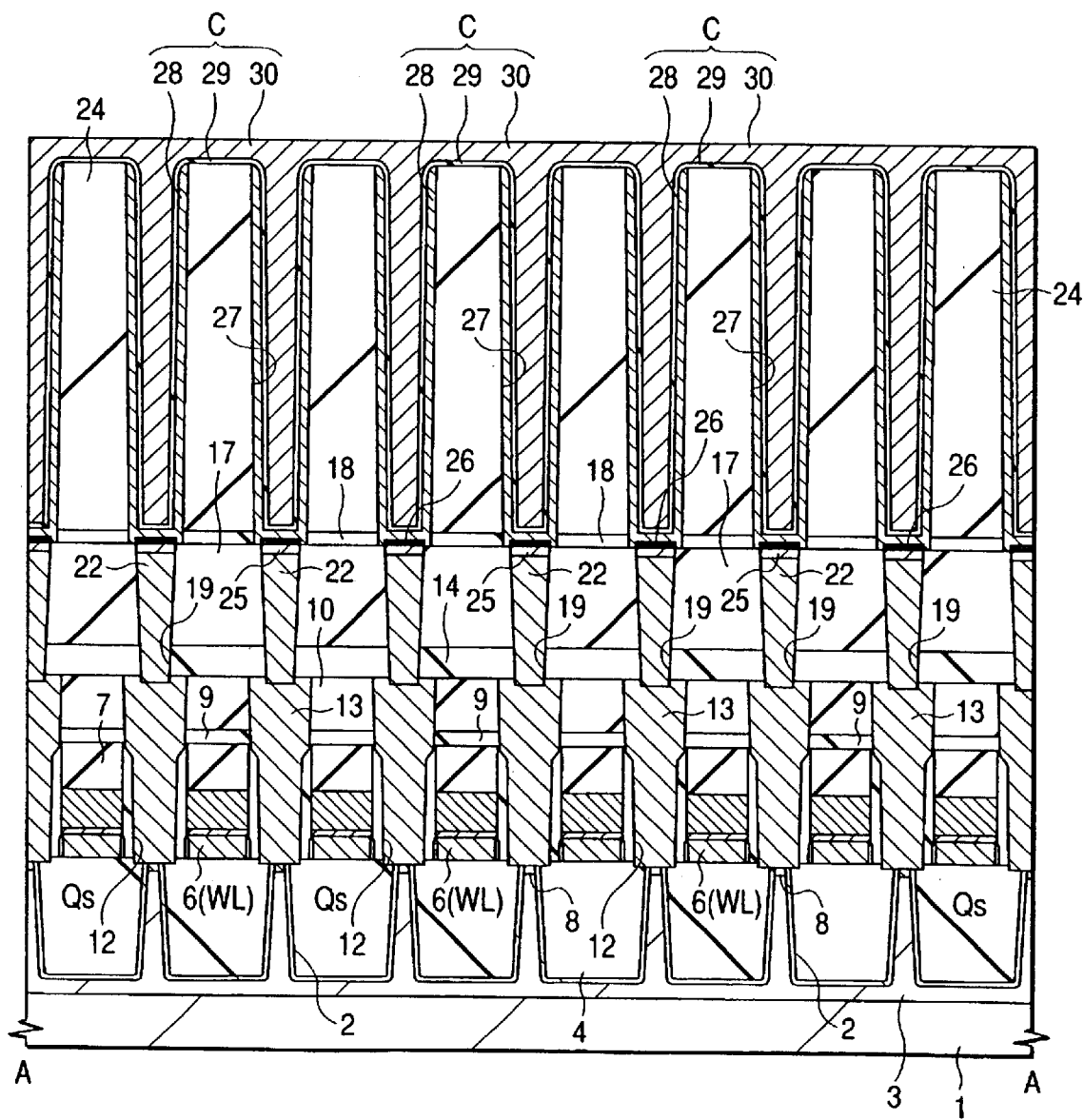
FIG. 57 is a cross sectional view for a main portion of a semiconductor substrate illustrating a process for manufacturing a DRAM as one embodiment according to this invention.

Then, as shown in FIG. 57 and FIG. 58, an upper electrode 30 is formed over the dielectric film 29. The upper electrode 30 is formed by at first filling the inside of the groove 27 with a TiN film deposited by a CVD method and, successively, depositing a TiN film thereover by a sputtering method and then removing unnecessary TiN film and dielectric film 29 from the area other than the memory array (MARY) region by etching.

It is not necessary to completely fill the inside of the groove 27 with the TiN film to be deposited by the CVD method. It may suffice that the TiN film deposited by the CVD method covers at least the entire surface of the dielectric film 29 and, subsequently, the inside of the groove 27 may be covered completely with the TiN film deposited by the sputtering method. Further, as the upper electrode material, a laminate film of an Ru film and a TiN film or a laminate film of an Ru film and a W film may also be used.

By the steps so far, the information storage capacitance device C comprising the lower electrode 28, the dielectric film 29 and the upper electrode 30 is completed and a memory cell constituted with a memory cell selecting MISFETQs and a information storage capacitance device C connected in series therewith as shown in FIG. 2 and FIG. 3 is substantially completed.

Subsequently, Al wirings of about two layers are formed over the information storage capacitance device C with an interlayer insulating film being put therebetween, and a passivation film is formed over the Al wirings at the uppermost layer, although they are not illustrated.

As has been described above specifically, according to this embodiment, when the Ru silicide layer 25 is formed on the surface of the plug 22 connected with the lower electrode 28 of the information storage capacitance device C and, further, the Ru silicon nitride layer 26 is formed on the surface of the Ru silicide layer 25, the Ru silicon oxynitride formed by oxidation of the Ru silicide layer 25 or the Ru silicon nitride layer 26 forms an oxygen barrier, so that this can effectively prevent the progress of oxidation for the Ru silicide layer 25 upon heat treatment at high temperature in an oxygen atmosphere conducted in the step of forming the dielectric film 29 on the lower electrode 28. Since this can prevent occurrence of shape failure for the lower electrode 28 caused by abnormal oxidation at the boundary between the lower electrode 28 and the plug 22, leak current through the dielectric film 29 formed on the lower electrode 28 can be reduced.

In this embodiment, the Ru film 23 is deposited over the silicon oxide film 24 formed with the groove 27 and, successively, the Ru silicide layer 25 is formed by the heat treatment on the surface of the plug 22 but, since the Ru film 23 is deposited by the sputtering method, it is scarcely deposited on the side wall of the groove 27. However, it is deposited although slightly on the side wall of the groove 27 in a micro view, which functions as a seed layer for the Ru film 28a to be deposited by the subsequent step by the CVD method to improve the adhesion between the Ru film 28 and the silicon oxide film 24. The seed layer is not restricted only to the Ru film but, in a case of depositing the Ru film by the CVD method on the insulating film such as of silicon oxide, it is generally effective to form a seed layer made of a metal material for preventing peeling of the Ru film.

Further, in the production process according to this embodiment, after burying the plug 22 of polycrystal silicon in the through hole 19 and, successively, depositing the silicon oxide film 24 thereon to form the groove 27, the Ru silicide layer 25 and the Ru silicon nitride layer 26 are formed on the surface of the plug 22 exposed to the bottom of the groove 27. Since this can form the Ru silicide layer 25 and the Ru silicon nitride layer 26 in the self alignment manner to the groove 27, even when misalignment is caused between the through hole 19 and the groove 27, contact between the dielectric film 29 for the information storage capacitance device C and the plug 22 can be avoided to suppress the increase of the leak current in the information storage capacitance device C.

The silicide layer formed on the surface of the plug 22 is not restricted to Ru silicide but it may be constituted, for example, also with Pt (platinum) silicide, Ti (titanium) silicide or Co (cobalt) silicide.

Further, the material for the lower electrode is not restricted only to Ru but it may be constituted, for example, also with Pt or Ir (iridium). Ru used in this embodiment, if heat treated in an excessively oxidative atmosphere, forms ruthenium oxide by the oxidation of Ru itself and may cause disadvantage in the subsequent step. Pt has a merit of not forming such an oxide.

Further, the material for the upper electrode of the information storage capacitance device C is not restricted only to TiN but it may be constituted, for example, also with metal such as W, Ru, Pt or Ir or a laminate of such metal with TiN.

Since the manufacturing method of this embodiment (Embodiment 2) is identical with that for Embodiment 1 with respect to the steps up to the formation of the Ru silicide layer 25 on the surface of the plug 22 and the subsequent formation of the Ru silicon nitride layer 26 on the surface of the Ru silicide layer 25 (steps in FIG. 4 to FIG. 46), explanations therefor are omitted and only the subsequent steps will be explained.

Figure 59:
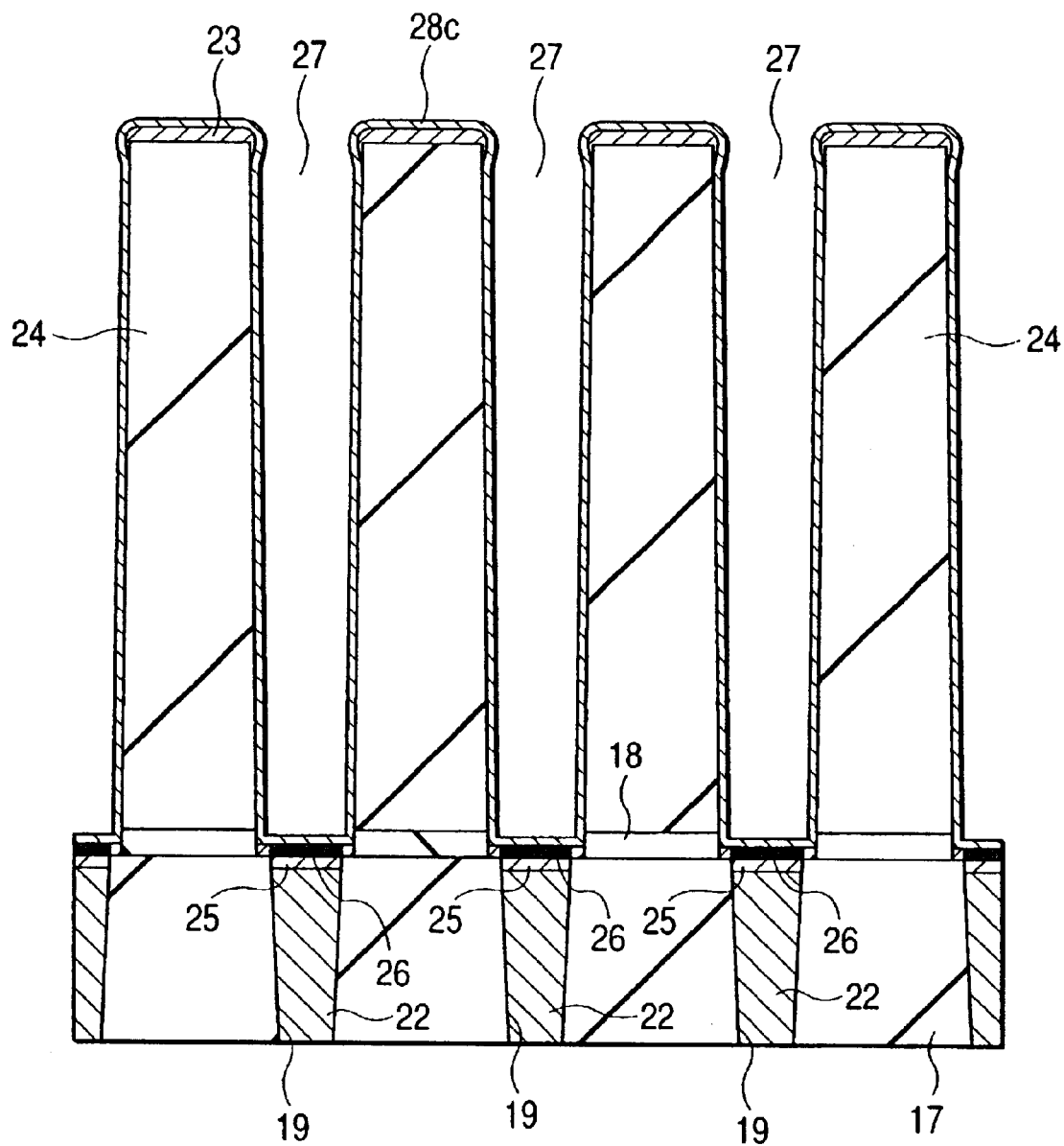
FIG. 59 is an enlarged cross sectional view for a main portion of a semiconductor substrate illustrating a process for manufacturing a DRAM as other embodiment according to this invention.

At first, succeeding to the step shown in FIG. 46, a thin Ru film 28c is deposited, as shown in FIG. 59, over the silicon oxide film 24 and in a groove 27 by a CVD method having good step coverage. The Ru film 28c corresponds to the Ru film 28a in the Embodiment 1 and the thickness is about one half (about 5 nm to 10 nm) of the Ru film 28a. As described above, the Ru film 28c deposited by the CVD method has better step coverage compared with the Ru film deposited by the sputtering method but has less adhesion with the silicon oxide film 24. Accordingly, like that the Embodiment 1, a thin Ru film may be deposited by the sputtering method (not illustrated) prior to the Ru film 28c.

Figure 60:
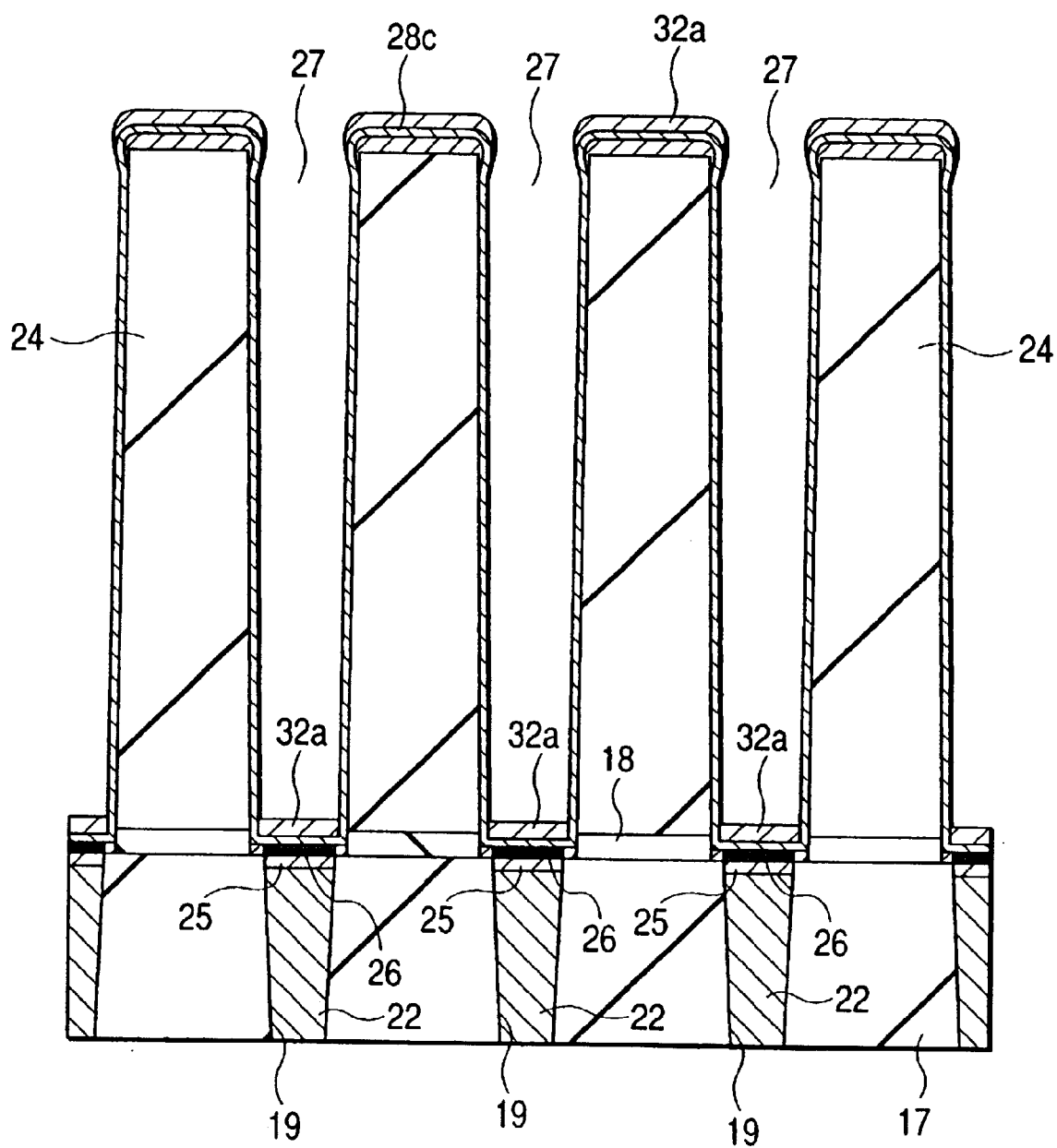
FIG. 60 is an enlarged cross sectional view for a main portion of a semiconductor substrate illustrating a process for manufacturing a DRAM as other embodiment according to this invention.

Then, as shown in FIG. 60, a W silicide film 32a of about 10 nm to 20 nm thickness is deposited over the Ru film 28c by a sputtering method as shown in FIG. 60. Since the W silicide film 32a is deposited by the sputtering method, while it is deposited on the silicon oxide film 24 outside the groove 27 or the bottom of the groove 27, it is deposited only at an extremely thin thickness to the side wall to the groove 27. On the other hand, when the W silicide film 32a is deposited on the side wall of the groove 27, when the thin Ru film 28d is deposited in the next step, the W silicide film 32a may sometimes be exposed at a portion thereof (where the thickness of the Ru film 28d is reduced). When such a phenomenon occurs, it may be a worry that a dielectric film 29 to be deposited in the subsequent step may be in contact with the W silicide film 32a to deteriorate the characteristic of the dielectric film 29. If such a worry is present, it is desirable to remove the thin W silicide film 32a on the side wall, particularly, at the upper end of the side wall of the groove 27 by dry etching or wet etching after the deposition of the W silicide 32a. Further, since the thickness of the W silicide film 32a is larger at the bottom than on the side wall of the groove 27, the W silicide film 32a may be left only at the bottom of the groove 27 by controlling the etching time. Alternatively, an insulating film such as a photoresist film may be buried to the bottom of the groove 27 and only the W silicide film 32a at the upper end on the side wall not covered with the insulating film may be removed by etching.

Figure 61:
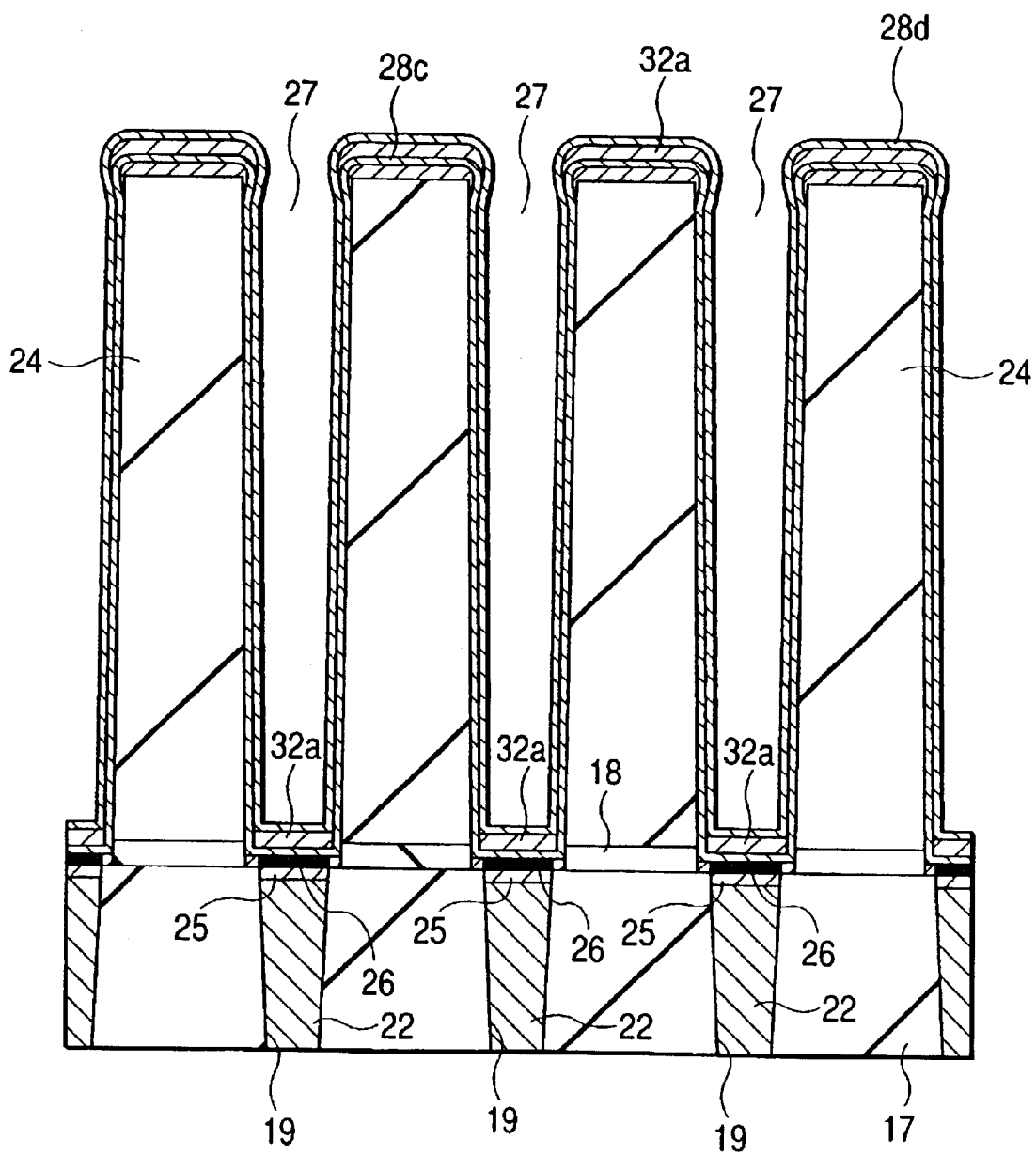
FIG. 61 is an enlarged cross sectional view for a main portion of a semiconductor substrate illustrating a process for manufacturing a DRAM as other embodiment according to this invention.

Then, as shown in FIG. 61, a thin Ru film 28d is deposited to about 5 nm to 10 nm thickness over the W silicide film 32a by a CVD method having good step coverage. By the steps so far, the Ru films 28c and 28d are deposited over the silicone oxide film 24 and on the inner wall of the groove 27, and the W silicide film 32a is left over the silicon oxide film 24 and on the bottom of the groove 27 in a state being put between the Ru films 28c and 28d.

Figure 62:
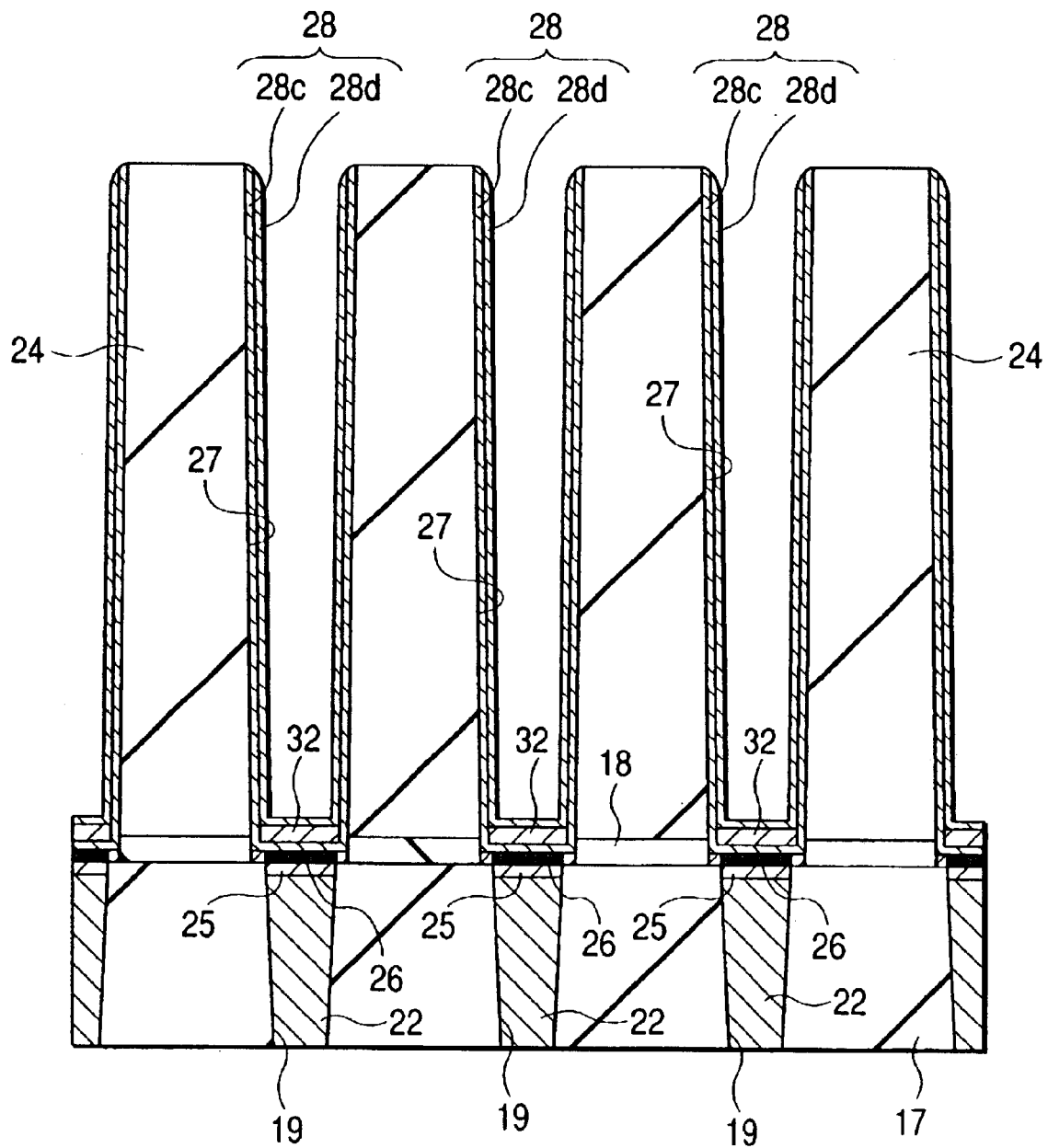
FIG. 62 is an enlarged cross sectional view for a main portion of a semiconductor substrate illustrating a process for manufacturing a DRAM as other embodiment according to this invention.

Then, as shown in FIG. 62, the Ru films 28c, 28d, 23 and the W silicide film 32a outside of the groove 27 are removed by dry etching. Thus, a lower electrode 28 comprising two layers of the Ru films 28c and 28d are formed on the inner wall of the groove 27 and an oxygen absorption layer 32 comprising the W silicide film 32a is formed in the lower electrode 28 at the bottom of the groove 27. The Ru films 28c, 28d and 23 and the W silicide film 32a outside of the groove 27 may be removed, like that in the Embodiment 1, by dry etching while burying an insulating film 31 such as a photoresist or spin-on-glass in the groove 27.

Figure 63:
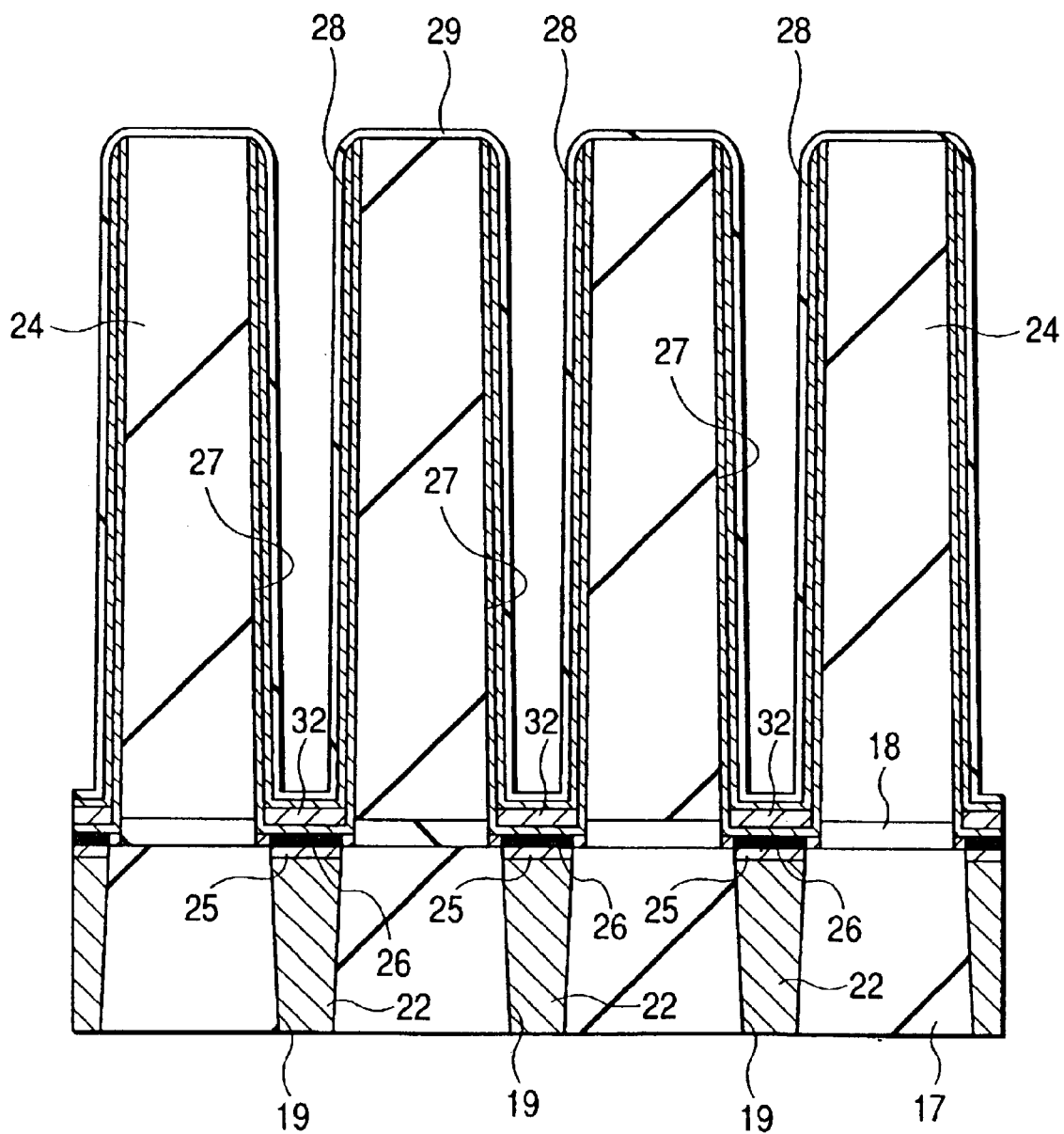
FIG. 63 is an enlarged cross sectional view for a main portion of a semiconductor substrate illustrating a process for manufacturing a DRAM as other embodiment according to this invention.

Then, as shown in FIG. 63, a dielectric film 29 is deposited thinly on the inner wall of the groove 27 formed with the lower electrode 28 and on the surface of the silicon oxide film 24. The dielectric film 29 is constituted with a tantalum oxide ($Ta_2O_5$) film of about 10 nm thickness and then applied with a heat treatment at about 600° C. in an oxygen atmosphere for the crystallization of film and improvement of the film quality. By the heat treatment, the Ru silicon nitride layer 26 formed on the surface of the plug 22 is oxidized and at least a portion thereof may be sometimes transformed to silicon oxynitride.

Figure 64:
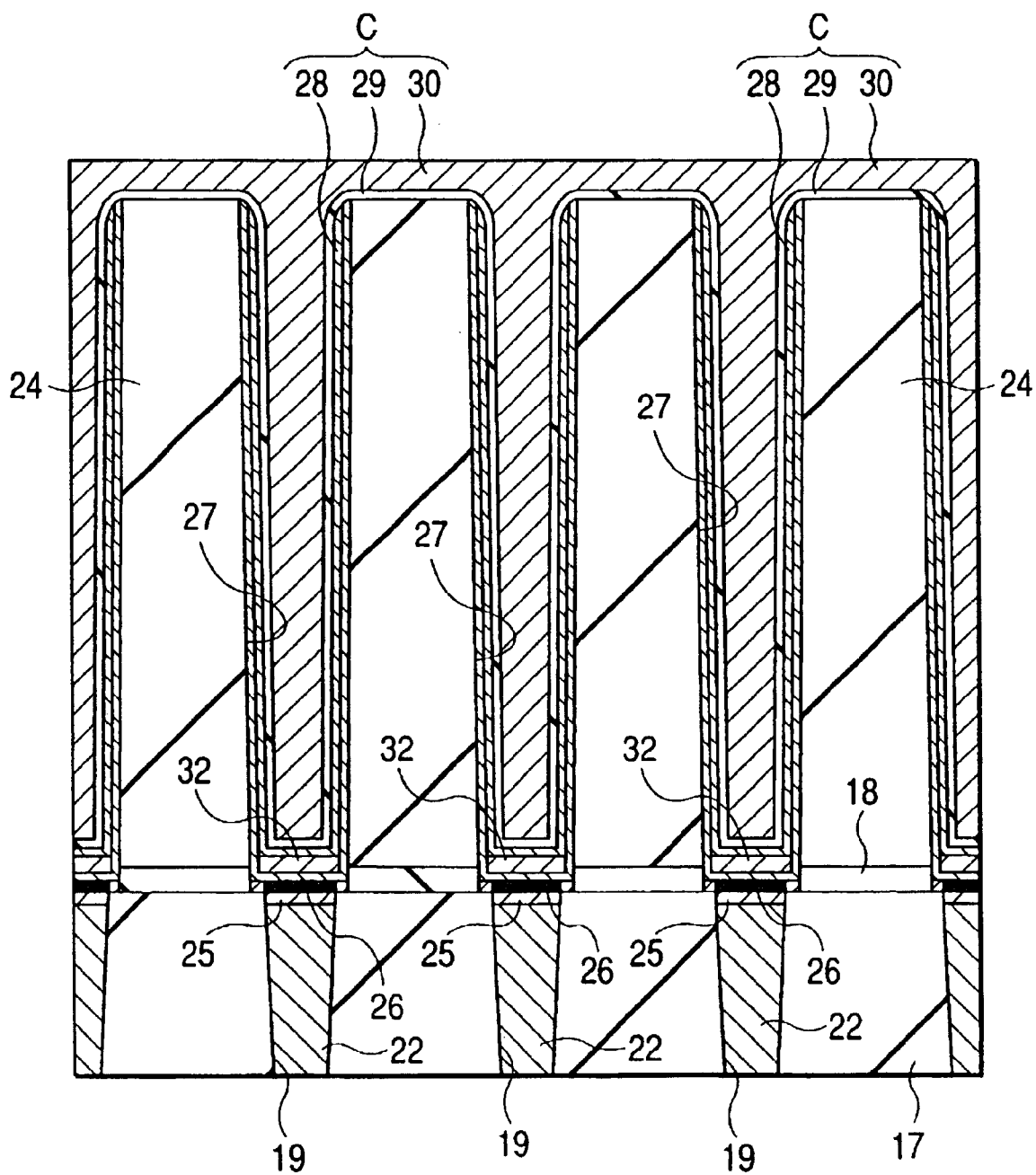
FIG. 64 is an enlarged cross sectional view for a main portion of a semiconductor substrate illustrating a process for manufacturing a DRAM as other embodiment according to this invention.

Then, as shown in FIG. 64, an upper electrode 30 is formed by depositing a TiN film over the dielectric film 29 by the combination of a CVD method and a sputtering method to complete an information storage capacitance device C comprising the lower electrode 28, the electrode film 29 and the upper electrode 30, by which a memory cell comprising a memory cell selecting MISFETQs and an information storage capacitance device C connected in series therewith is completed substantially.

As described above, in this embodiment, after forming the Ru silicide layer 25 on the surface of the plug 22 and forming the Ru silicon nitride layer 26 on the surface of the Ru silicide layer 25, the oxygen absorption layer 32 is formed on the lower electrode 28 at the bottom of the groove 27. In this constitution, upon heat treatment at high temperature in an oxygen atmosphere conducted in the step of forming the dielectric film 29 on the lower electrode 28, since the Ru silicon nitride layer 26 and the oxygen absorption layer 32 function as the barrier layer for oxygen that permeates and diffuses in the lower electrode 28 and are sacrificially oxidized, progress of oxidation to the Ru silicide layer 25 can be prevented more effectively than in the Embodiment 1.

The oxygen absorption layer 32 is formed in a state sandwiched between the two layers of the Ru films 28c and 28d that constitute the lower electrode 28. Therefore, even when the oxygen absorption layer 32 is oxidized to loss its conductivity, since conduction between the lower electrode 28 and the plug 22 is ensured by the Ru film 28c at the outside, the entire function and characteristic of the information storage capacitance device C are not deteriorated.

The conductive material for constituting the oxygen absorption layer 32 is not restricted to W silicide. However, since this is formed in a state being sandwiched between the two layers of the films 28c and 28d constituting the lower electrode 28, a material causing large volumic change upon high temperature heat treatment is not preferred, because this causes distortion in the dielectric film to possibly degrade the characteristic thereof.

For instance, pure metal such as W or Ti is ideal as the conductive material for absorbing oxygen but it causes volumic change by oxidation, so that the thickness is desirably restricted to 5 nm when used as the oxygen absorption layer 32. Further, although silicon is also a preferable oxygen absorbent, since this causes volumic change by oxidation, it is desirable to restrict the film thickness to 5 nm or less when used as the oxygen absorption layer 32. Further, while Al (aluminum) may also be used, since the melting point is as low as about 660° C., it is restricted only to the case where the heat treatment for the dielectric film 29 can be applied at a temperature lower than the melting point.

Most preferred conductive material constituting the oxygen absorption layer 32 is a metal silicide already silicided completely in the course of film deposition or just before the formation of the dielectric film 29, and it can include, specifically, Ti silicide, Ru silicide and Co silicide in addition to W silicide used in this embodiment. In addition, a metal nitride such as TaN (tantalum nitride) can also be used.

In the Embodiment 2 described above, the oxygen absorption layer 32 is formed at the bottom of the groove 27 but an oxygen absorption layer 32 is formed at the bottom and on the side wall of the groove 27 in an Embodiment 3.

Figure 65:
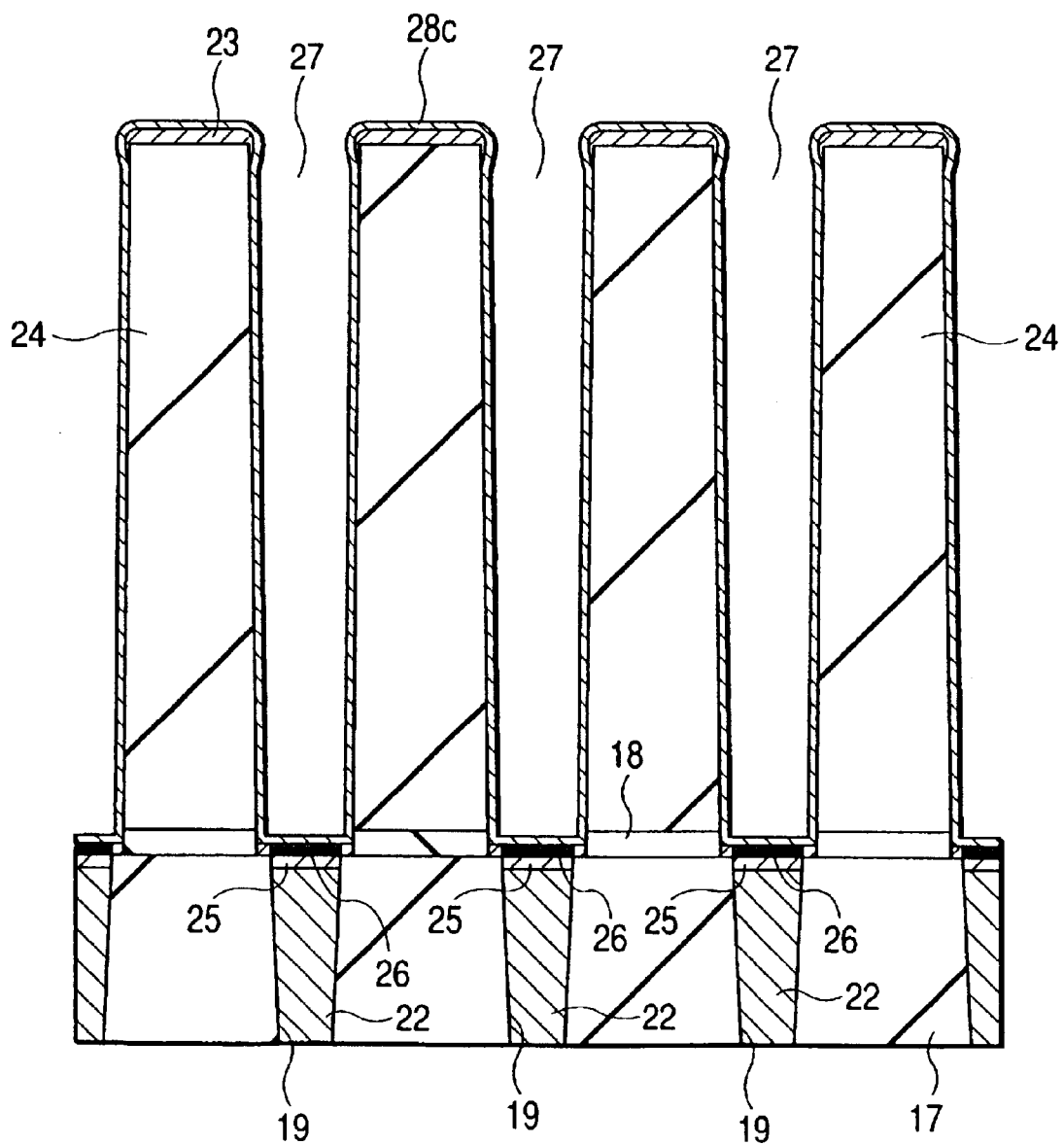
FIG. 65 is an enlarged cross sectional view for a main portion of a semiconductor substrate illustrating a process for manufacturing a DRAM as other embodiment according to this invention.

At first, succeeding to the step shown in FIG. 46, an Ru film 28c of about 5 nm to 10 nm thickness is deposited over the silicon oxide film 24 and inside the groove 27 by a CVD method as shown in FIG. 65. For ensuring the adhesion of the Ru film 28c, the Ru film 28c may be deposited after previously depositing an Ru film by a sputtering method (not illustrated).

Figure 66:
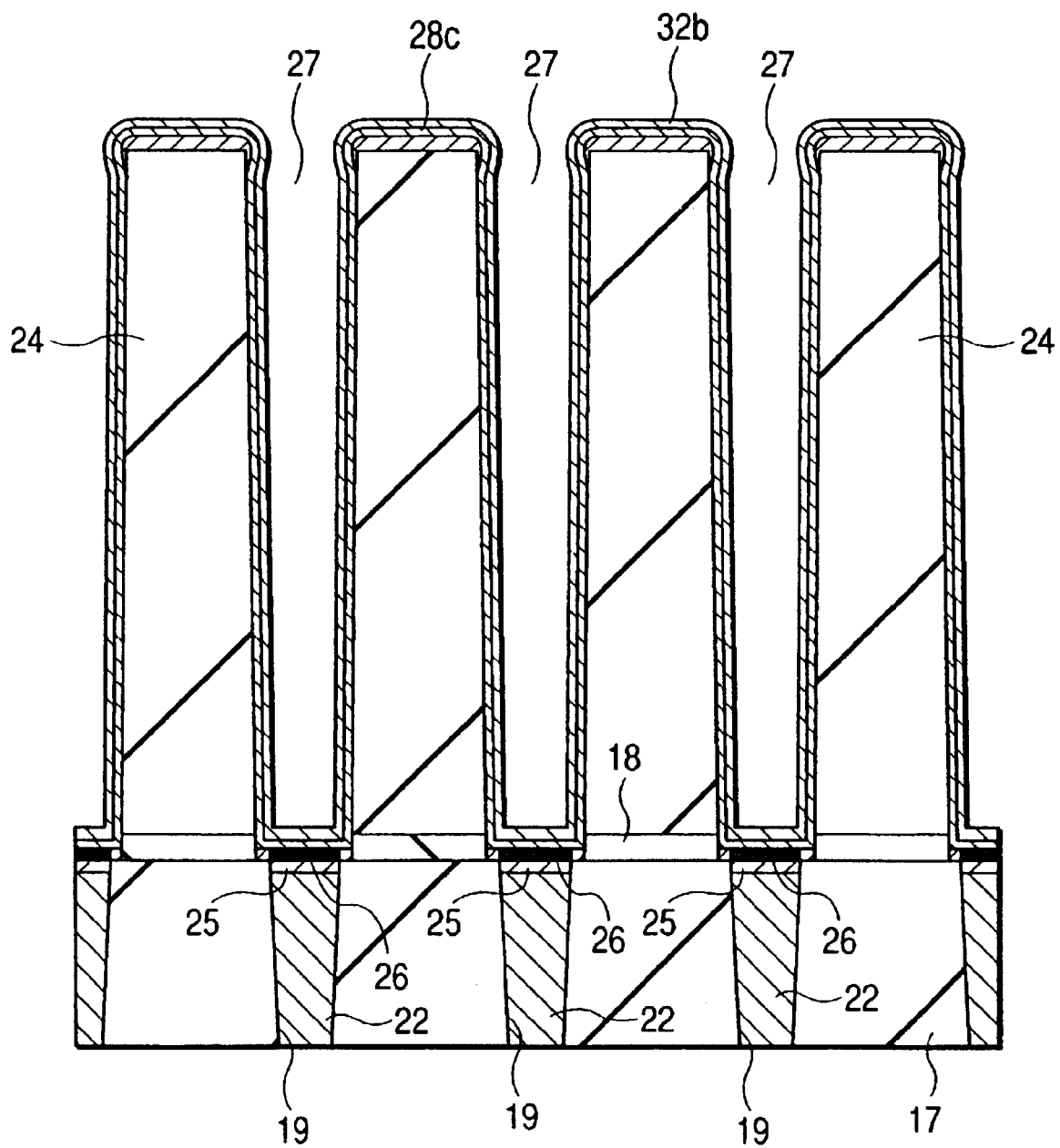
FIG. 66 is an enlarged cross sectional view for a main portion of a semiconductor substrate illustrating a process for manufacturing a DRAM as other embodiment according to this invention.

Then, as shown in FIG. 66, a W silicide film 32b is deposited at about 10 nm to 20 nm thickness over the Ru film 28c by a CVD method. Since the W silicide film 32b is deposited by the CVD method, the film is deposited substantially at a uniform thickness over the silicon oxide film 24 outside of the groove 27, and at the bottom and on the side wall of the groove 27.

Figure 67:
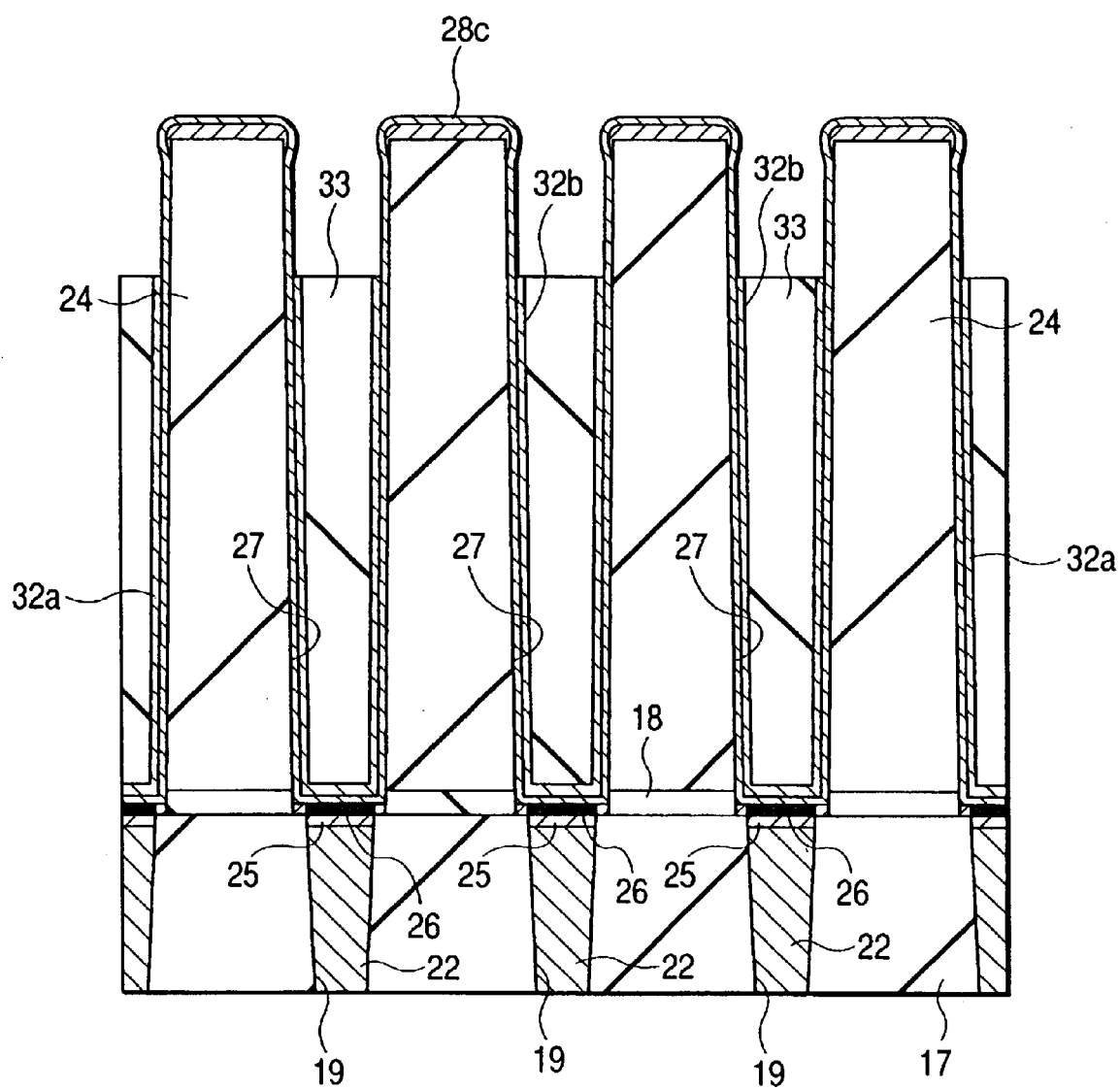
FIG. 67 is an enlarged cross sectional view for a main portion of a semiconductor substrate illustrating a process for manufacturing a DRAM as other embodiment according to this invention.

Then, as shown in FIG. 67, an insulating film 33 comprising a photoresist or spin-on-glass is buried in the groove 27, and the W silicide film 32b outside of the groove 27 not covered with the insulating film 33 is removed by dry etching. In this process, for avoiding contact between the W silicide film 32b and a dielectric film 29 to be deposited in the subsequent step, the upper end of the insulating film 31 is retracted downward below the opening of the groove 27, and the W silicide film 32b at the other upper end on the side wall of the groove 27 is removed simultaneously.

Figure 68:
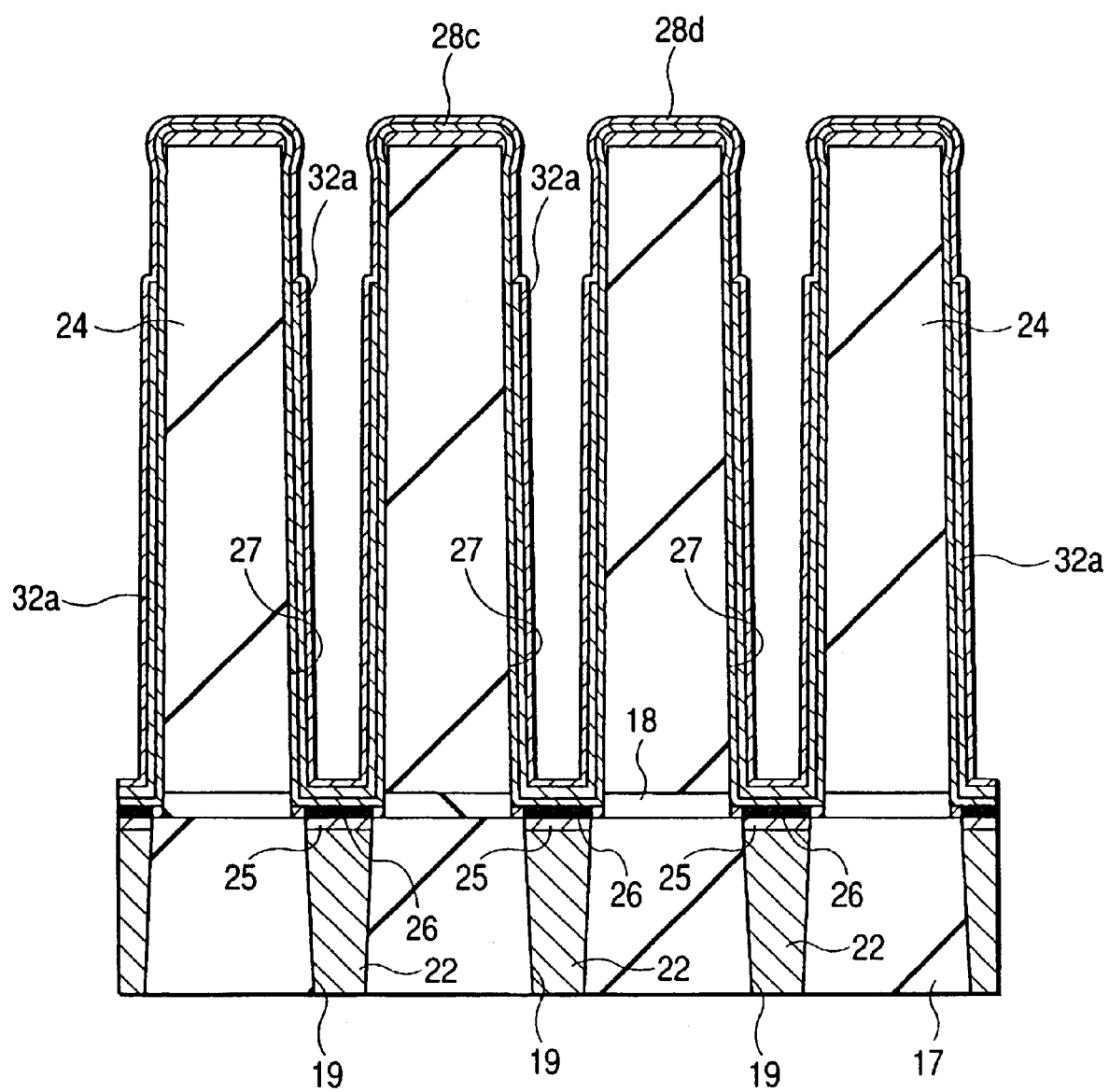
FIG. 68 is an enlarged cross sectional view for a main portion of a semiconductor substrate illustrating a process for manufacturing a DRAM as other embodiment according to this invention.
Figure 69:
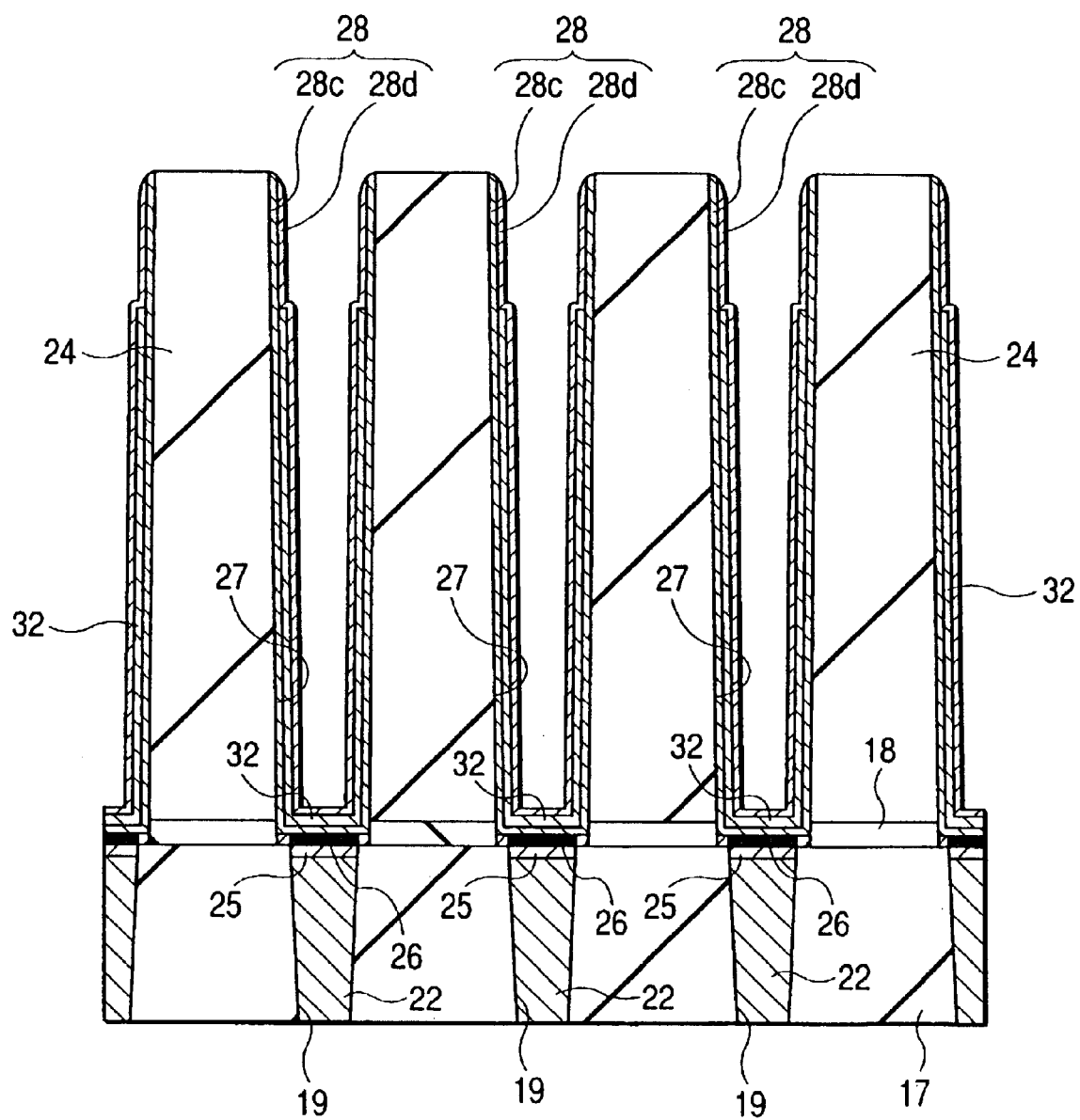
FIG. 69 is an enlarged cross sectional view for a main portion of a semiconductor substrate illustrating a process for manufacturing a DRAM as other embodiment according to this invention.

Then, after removing the insulating film 33 inside the groove 27, a thin Ru film 28d of about 5 nm to 10 nm thickness is deposited, as shown in FIG. 68, over the W silicide film 32b by a CVD method and, successively, as shown in FIG. 69, the Ru films 28d, 28c and 23 outside of the groove 27 are removed by dry etching. Thus, a lower electrode 28 comprising two layers of the Ru films 28c and 28d is formed on the inner wall of the groove 27 and an oxygen absorption layer 32 comprising the W silicide film 32a is formed in the lower electrode 28 at the bottom and on the side wall of the groove 27.

Figure 70:
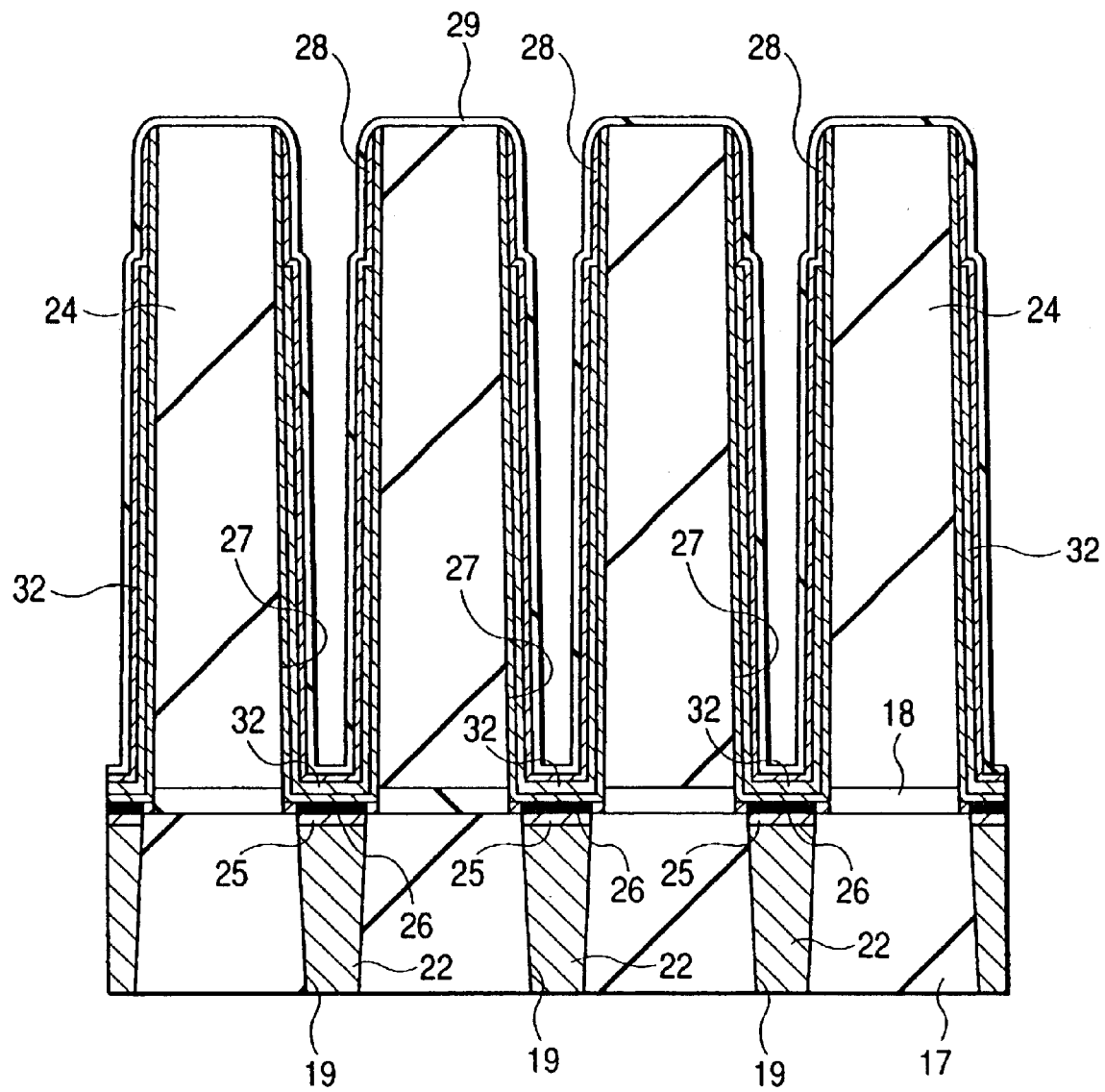
FIG. 70 is an enlarged cross sectional view for a main portion of a semiconductor substrate illustrating a process for manufacturing a DRAM as other embodiment according to this invention.

Then, as shown in FIG. 70, a dielectric film 29 is deposited thinly on the inner wall of the groove 27 formed with the lower electrode 28 on the surface of the silicone oxide film 24. The dielectric film 29 is constituted with a tantalum oxide of about 10 nm thickness and applied, subsequently, with a heat treatment at about 650° C. for 2 min in an oxygen atmosphere for crystallization of the film and improvement of the film quality. In this process, the Ru silicon nitride layer 26 formed on the surface of the plug 22 is oxidized and at least a portion thereof may sometimes be transformed into Ru silicon oxynitride.

Figure 71:
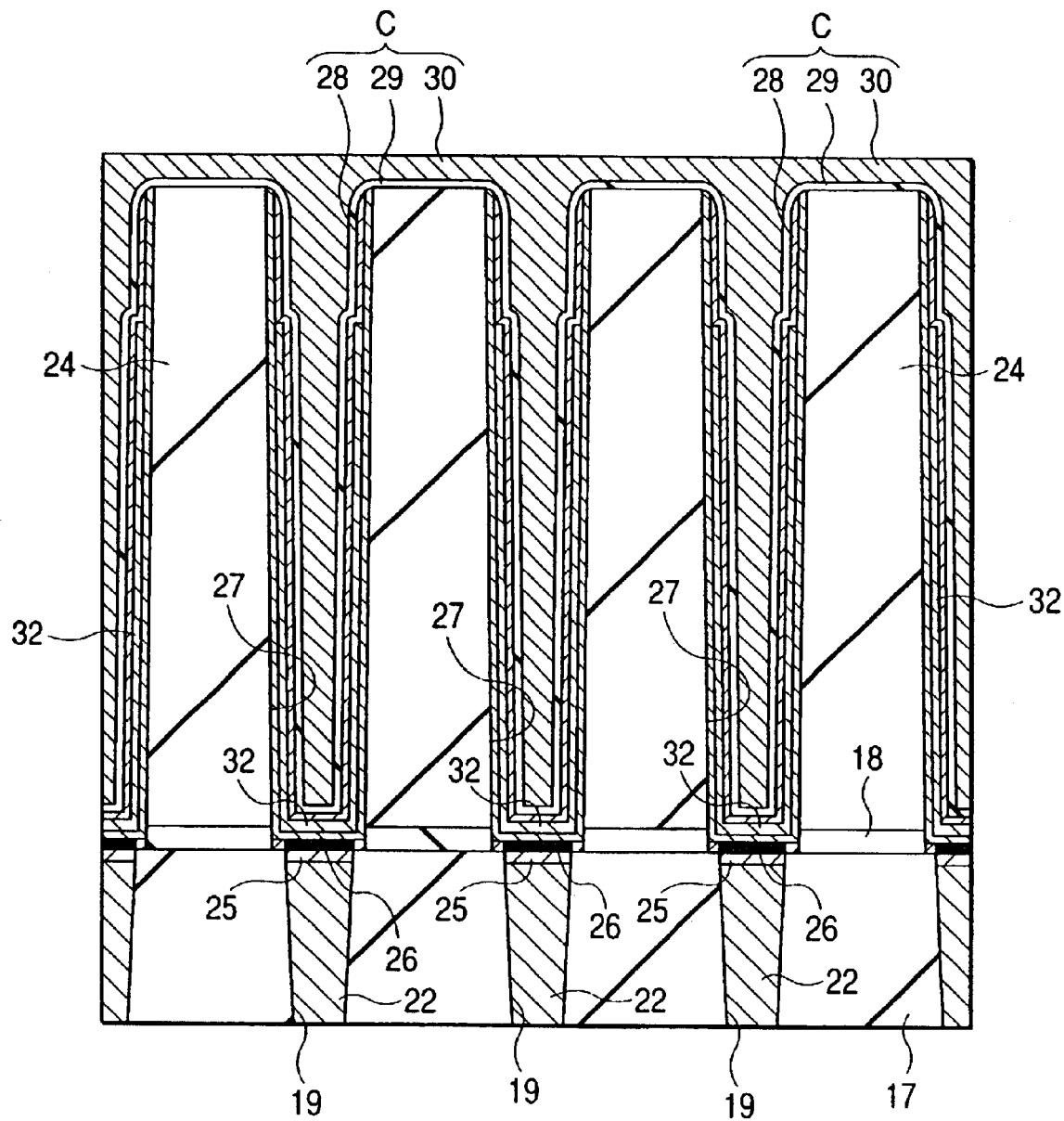
FIG. 71 is an enlarged cross sectional view for a main portion of a semiconductor substrate illustrating a process for manufacturing a DRAM as other embodiment according to this invention.

Then, as shown in FIG. 71, an upper electrode 30 is formed by depositing a TiN film over the dielectric film 29 by the combination of a CVD method and a sputtering method to complete an information storage capacitance device C comprising the lower electrode 28, the dielectric film 29 and the upper electrode 30, by which a memory cell comprising a memory cell selecting MISFETQs and an information storage capacitance device C connected in series therewith is completed substantially.

In this embodiment, since the oxygen absorption layer 32 is formed not only at the bottom but also on the side wall of the groove 27, the barrier effect of the oxygen absorption layer 32 is larger compared with the Embodiment 2 in which the oxygen absorption layer 32 is formed only at the bottom of the groove 27, and progress of oxidation in the Ru silicide layer 25 can be prevented more effectively.

The oxygen absorption layer 32 is formed in a state being sandwiched between the two layers of the Ru films 28c and 28d constituting the lower electrode 28. Therefore, like that in the Embodiment 2, even when the oxygen absorption layer 32 is oxidized to loss its conductivity, since conduction between the lower electrode 28 and the plug 22 is ensured by the Ru film 28c at the outside thereof, the entire function and characteristic of the information storage capacitance device C are not deteriorated.

The conductive material constituting the oxygen absorption layer 32 is not restricted to W silicide but various kinds of conductive materials exemplified in the Embodiment 2 can be used. Further, silicon may be used instead of the conductive materials described above.

When the oxygen absorption layer 32 is constituted with silicon, the Ru film 28c is deposited over the silicon oxide film 24 and in the inside of the groove 27 (refer to FIG. 65) and then a polycrystal silicon film or the like is deposited over the Ru film 28c by a CVD method. Then, after removing the polycrystal silicon film outside of the groove 27 by dry etching, a heat treatment is applied to react the Ru film 28c and the polycrystal silicon film to silicide the polycrystal silicon film and form an Ru silicide film in the groove 27. Subsequently, the Ru film 28d is deposited, and, successively, the Ru films 28d, 28c and 23 outside of the groove 27 are removed by dry etching to form the lower electrode 28 comprising the two layers of the Ru films 28c and 28d on the inner wall of the groove 27, and the oxygen absorption layer 32 comprising the Ru silicide film is formed in the lower electrode 28 at the bottom and on the side wall of the groove 27.

When the oxygen absorption layer 32 is formed by siliciding silicon as described above, the thickness of the Ru film 28c deposited initially is made twice or more the thickness of the polycrystal silicon film. For example, when the thickness of the Ru film 28c is 20 nm and the thickness of the polycrystal silicon film is 5 nm, and both of them are reacted by the heat treatment, even if the polycrystal silicon film is completely silicided, the Ru film is silicided to only about 5 nm at the greatest and remaining 15 nm is left as metal Ru, so that electric conduction of the lower electrode 28 can be ensured efficiently.

In the Embodiments 1 to 3 described above, the plug 22 buried in the through hole 19 below the lower electrode 28 has been constituted with polycrystal silicon. In an Embodiment 4, the plug buried in the through hole 19 is constituted with Ru.

Figure 72:
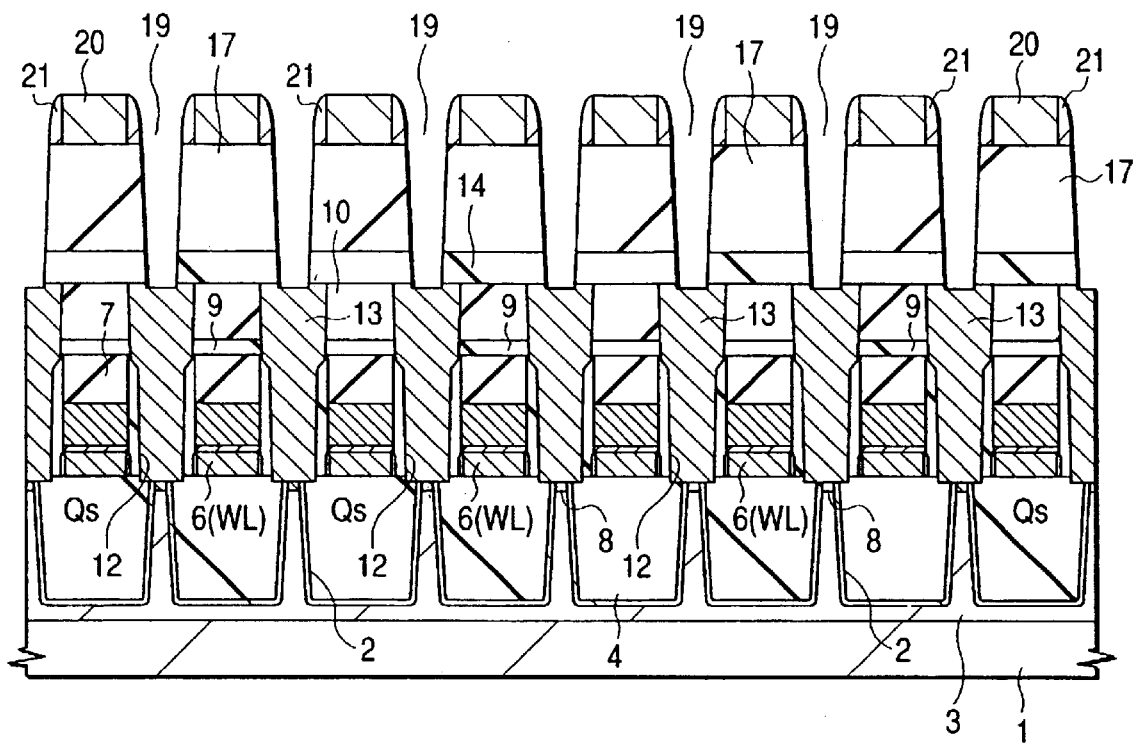
FIG. 72 is a cross sectional view for a main portion of a semiconductor substrate illustrating a process for manufacturing a DRAM as other embodiment according to this invention.

At first, as shown in FIG. 72, a through hole 19 is formed by dry etching a silicon oxide film 17 deposited over a bit line BL. The steps so far are identical with the steps shown in FIG. 4 to FIG. 32 for the Embodiment 1.

Figure 73:
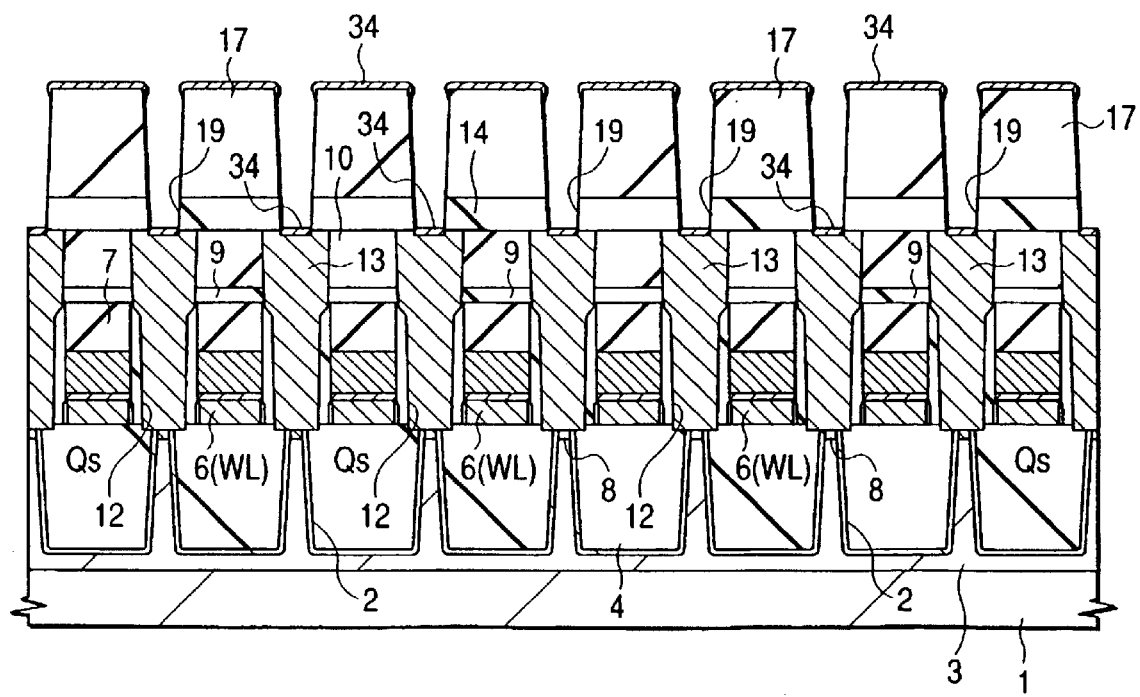
FIG. 73 is a cross sectional view for a main portion of a semiconductor substrate illustrating a process for manufacturing a DRAM as other embodiment according to this invention.

As shown in FIG. 73, an Ru film 34 is deposited over the silicon oxide film 17 formed with the through hole 19 by a sputtering method. The Ru film 23 is deposited at such a thin thickness that it is about 50 nm at the bottom of the through hole 19. The drawing shows a state in which the Ru film 34 is deposited over the silicon oxide film 17 and at the bottom of the through hole 19 but, actually, an extremely thin Ru film 34 is deposited also on the side wall of the through hole 19.

Figure 74:
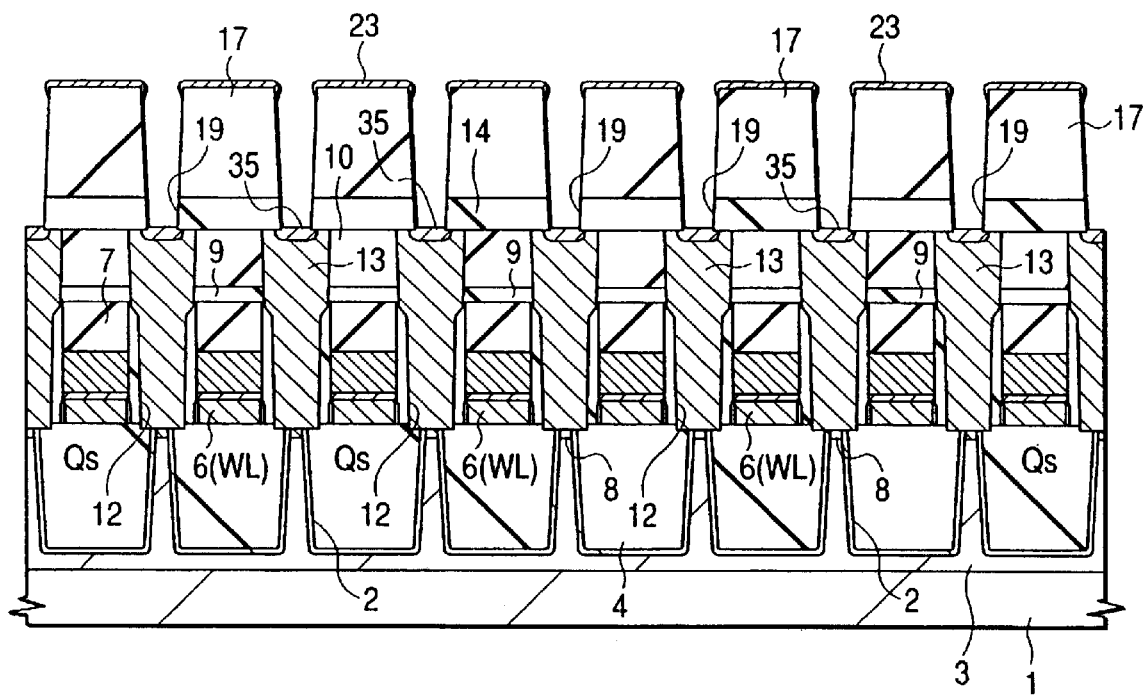
FIG. 74 is a cross sectional view for a main portion of a semiconductor substrate illustrating a process for manufacturing a DRAM as other embodiment according to this invention.

Then, as shown in FIG. 74, a heat treatment about at 600° C. for one min is conducted in a non-oxidative gas atmosphere such as nitrogen to react the Ru film 34 at the bottom of the through hole 19 and a plug 13 comprising polycrystal silicon buried in a contact hole 12 therebelow thereby forming an Ru silicide layer 35 on the surface of the plug 13. In this step, since the Ru film 34 over the silicon oxide film 17 does not take place siliciding reaction, it remains as it is.

Figure 75:
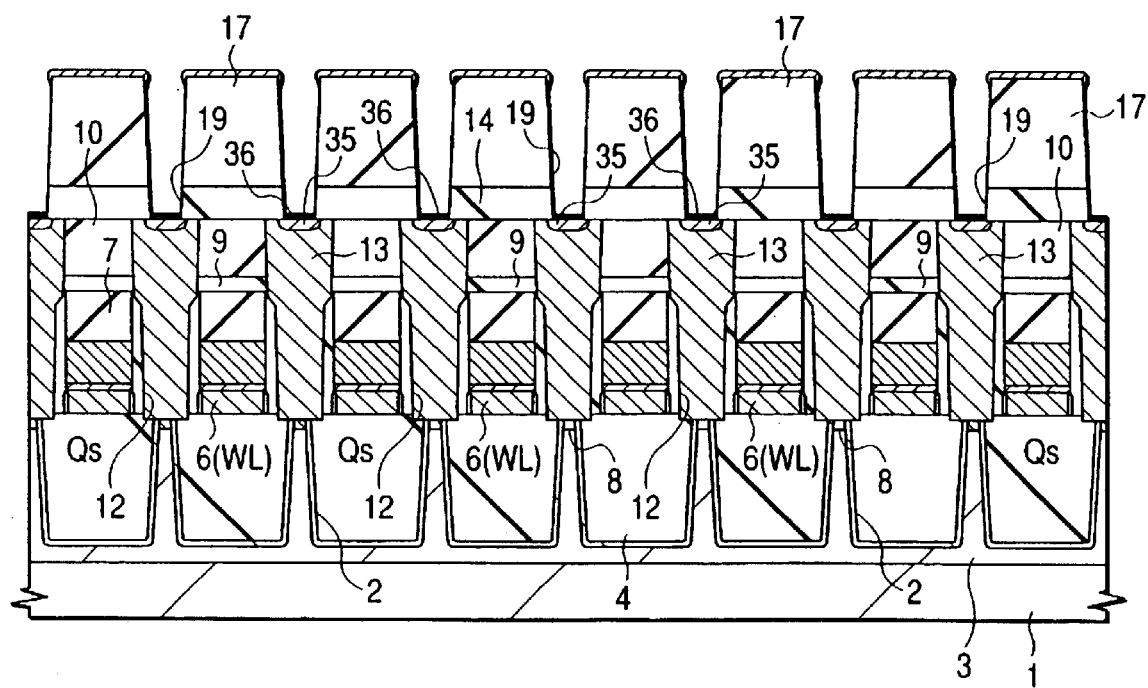
FIG. 75 is a cross sectional view for a main portion of a semiconductor substrate illustrating a process for manufacturing a DRAM as other embodiment according to this invention.

Then, as shown in FIG. 75, a heat treatment at about 650° C. for 3 min is conducted in an ammonia gas atmosphere (hot nitridation) to nitride the surface of the Ru silicide layer 35 thereby forming an Ru silicon nitride layer 36. The Ru silicon nitride layer 36 may be formed by nitridation utilizing active nitrogen formed in a plasma atmosphere (plasma nitridation) in stead of the thermal nitridation described above.

Figure 76:
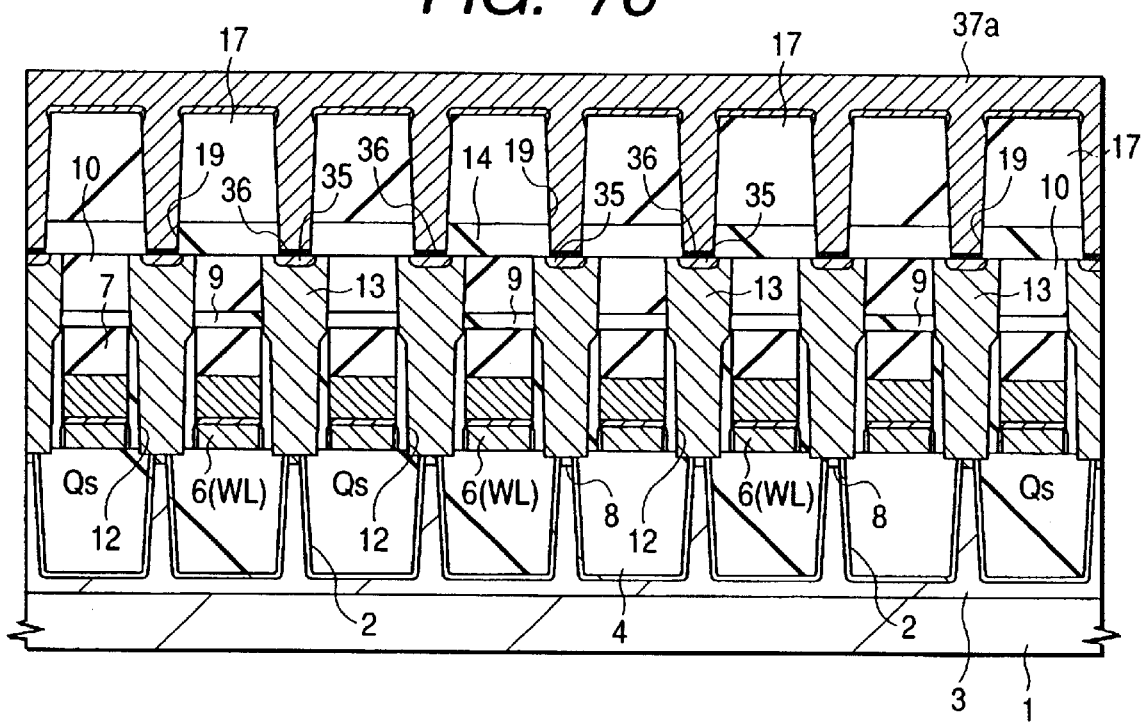
FIG. 76 is a cross sectional view for a main portion of a semiconductor substrate illustrating a process for manufacturing a DRAM as other embodiment according to this invention.
Figure 77:
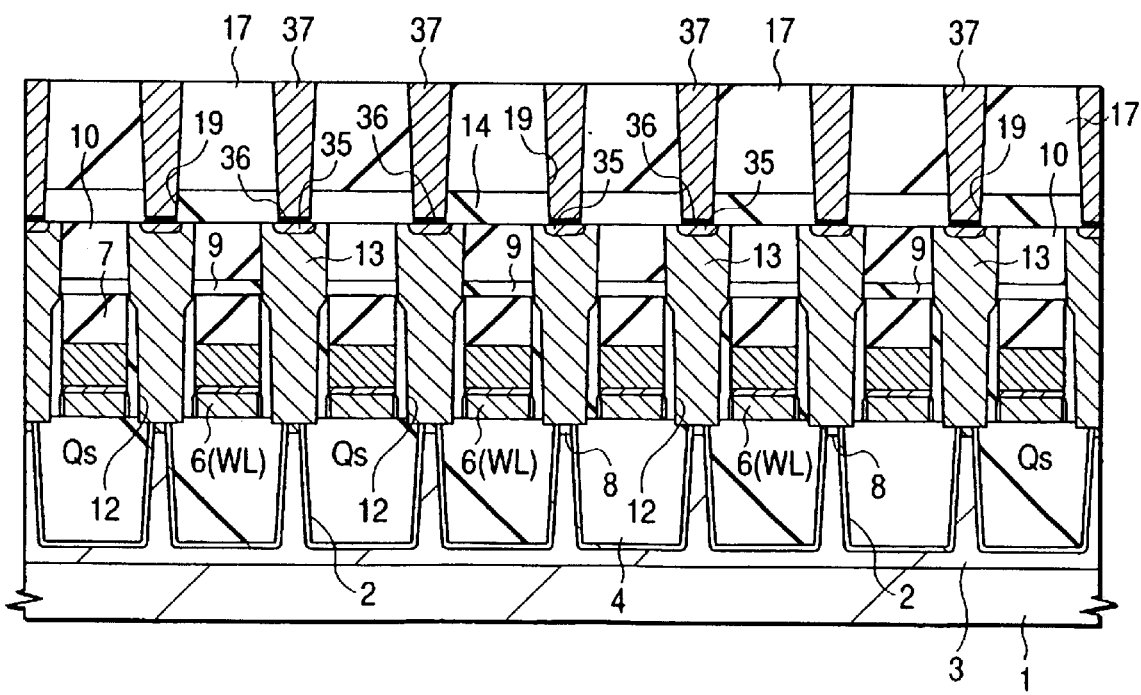
FIG. 77 is a cross sectional view for a main portion of a semiconductor substrate illustrating a process for manufacturing a DRAM as other embodiment according to this invention.

Then, as shown in FIG. 76, after depositing an Ru film 37a over the silicon oxide film 17 and the through hole 19 by a CVD method, the Ru film 37a outside of the through hole is removed as shown in FIG. 77 by a chemical mechanical polishing method (or by etching back) to form a plug 37 comprising the Ru film 37a inside the through hole 19. Since the Ru film 37a deposited by the CVD method provides less adhesion with the silicon oxide film 17 compared with an Ru film deposited by a sputtering method, the Ru film 37a may be deposited after previously depositing an Ru film by a sputtering method (not illustrated).

Figure 78:
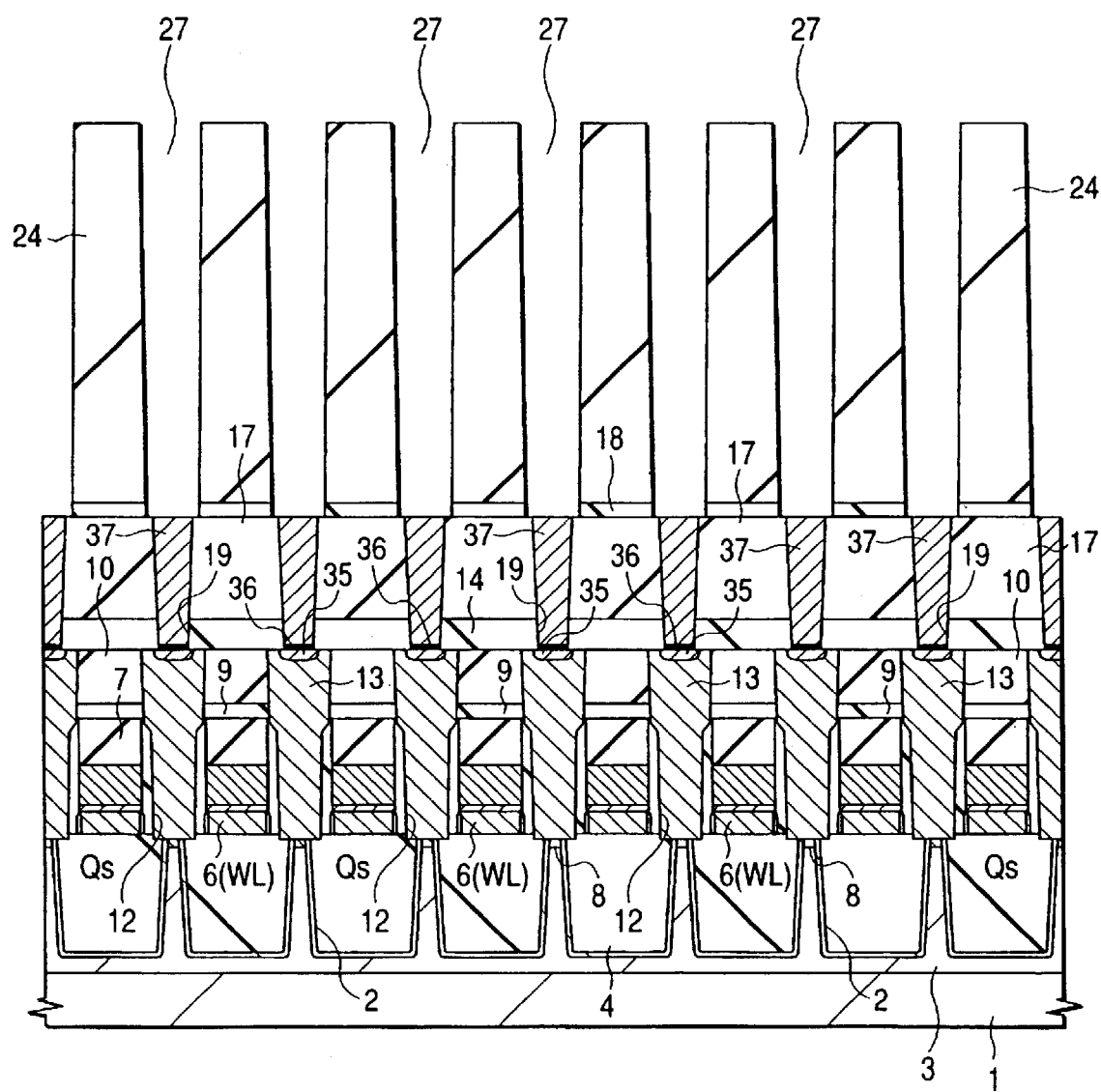
FIG. 78 is a cross sectional view for a main portion of a semiconductor substrate illustrating a process for manufacturing a DRAM as other embodiment according to this invention.

Then, as shown in FIG. 78, after depositing a silicon nitride film 18 and a silicon oxide film 24 over the silicon oxide film 17 by a CVD method, the silicon oxide film 24 and the silicon nitride film 18 are dry etched by using a photoresist film (not illustrated) as a mask to form a groove 27 in which the surface of the plug 37 in the through hole 19 is exposed at the bottom thereof.

Figure 79:
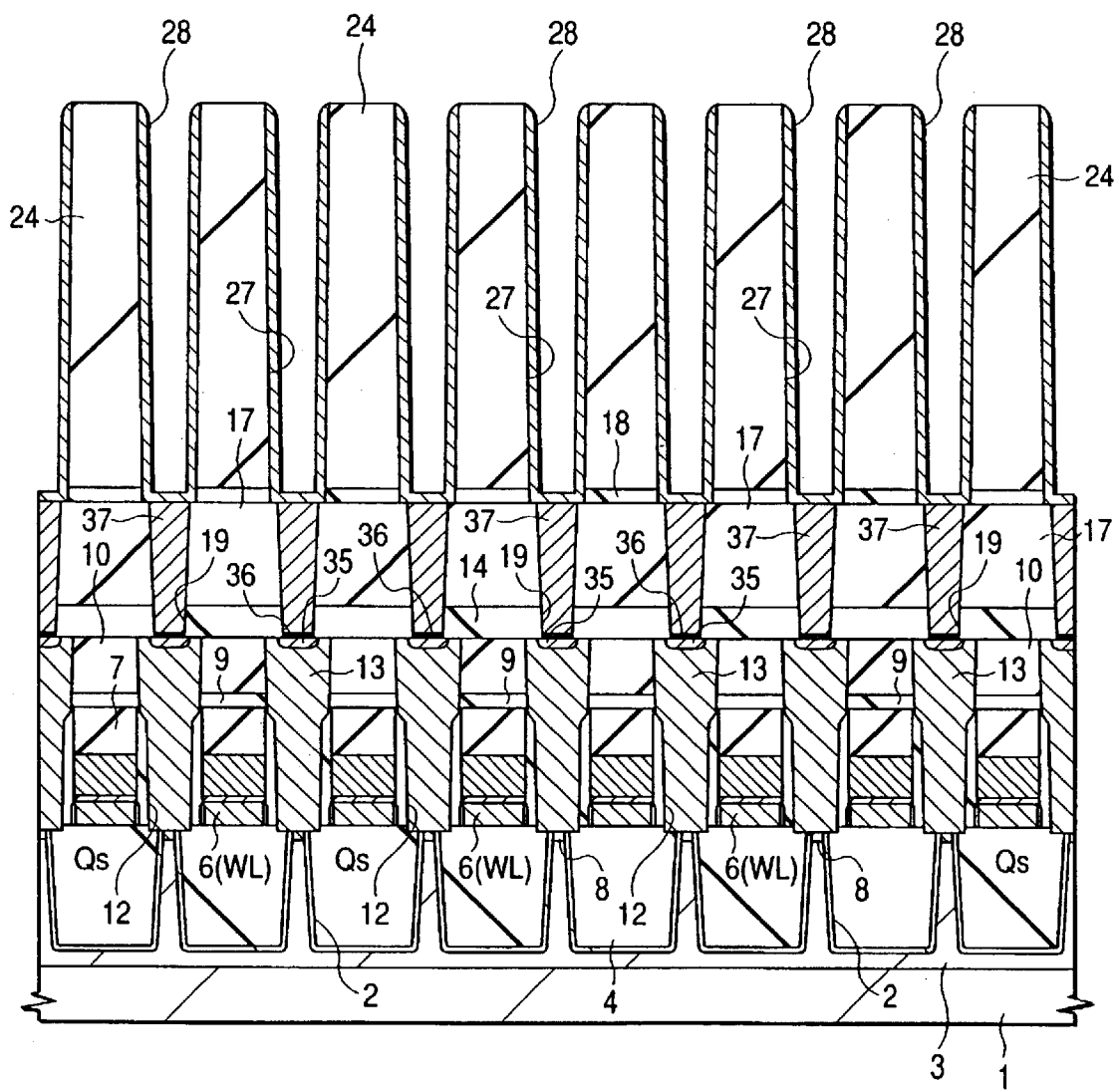
FIG. 79 is a cross sectional view for a main portion of a semiconductor substrate illustrating a process for manufacturing a DRAM as other embodiment according to this invention.
Figure 80:
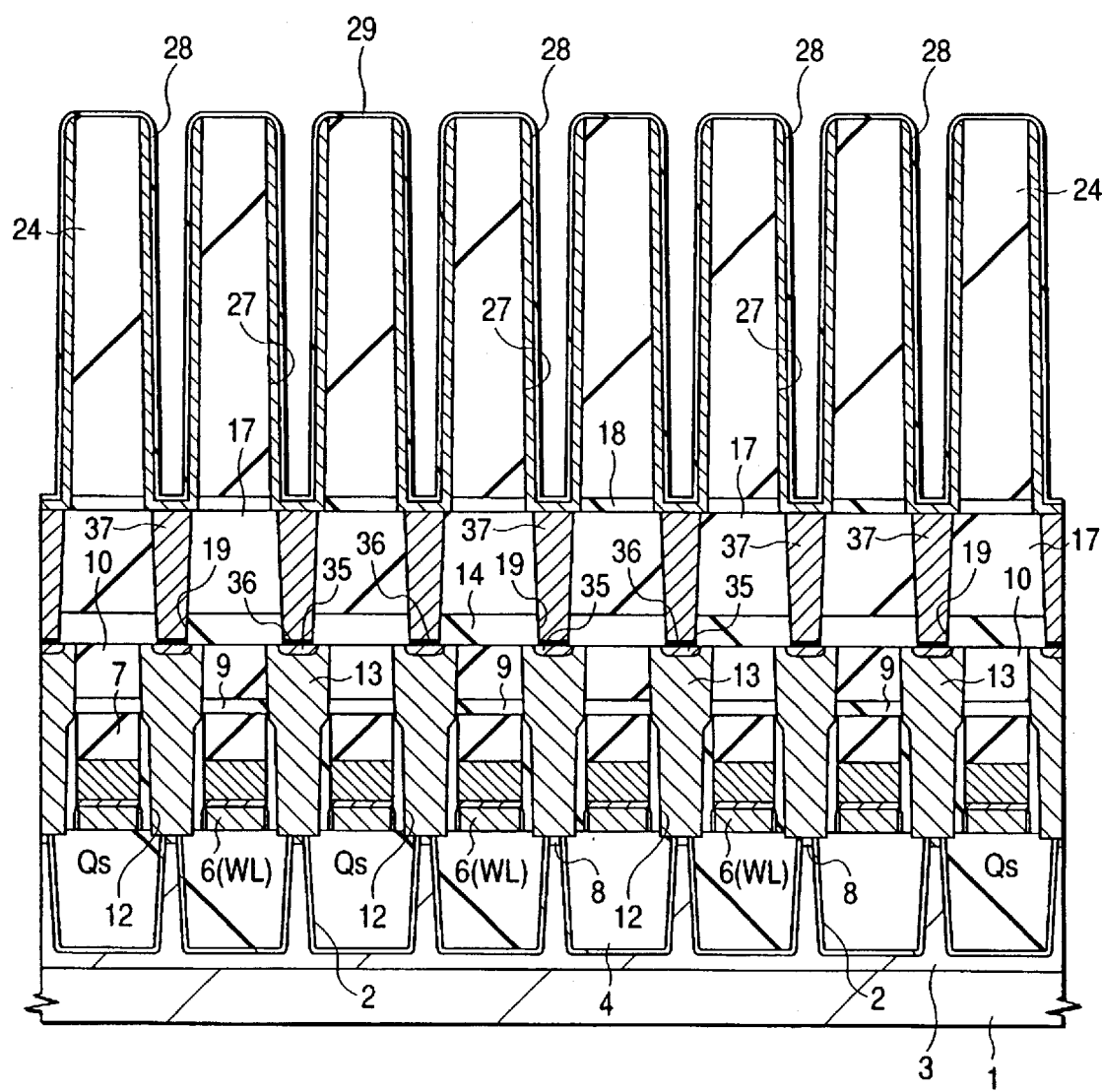
FIG. 80 is a cross sectional view for a main portion of a semiconductor substrate illustrating a process for manufacturing a DRAM as other embodiment according to this invention.

Then, as shown in FIG. 79, after forming a lower electrode 28 comprising an Ru film along the inner wall of the groove 27 in accordance with the steps shown in FIG. 47 to FIG. 54 for the Embodiment 1, a dielectric film 29 is deposited thinly, as shown in FIG. 80, on the inner wall of the groove 27 formed with the lower electrode 28 and on the surface of the silicon oxide film 24. The dielectric film 29 is constituted with a tantalum oxide ($Ta_2O_5$) film of about 10 nm thickness and then applied with a heat treatment about at 650° C. for 2 min in an oxygen atmosphere for the crystallization of the film and improvement of the film quality.

Figure 81:
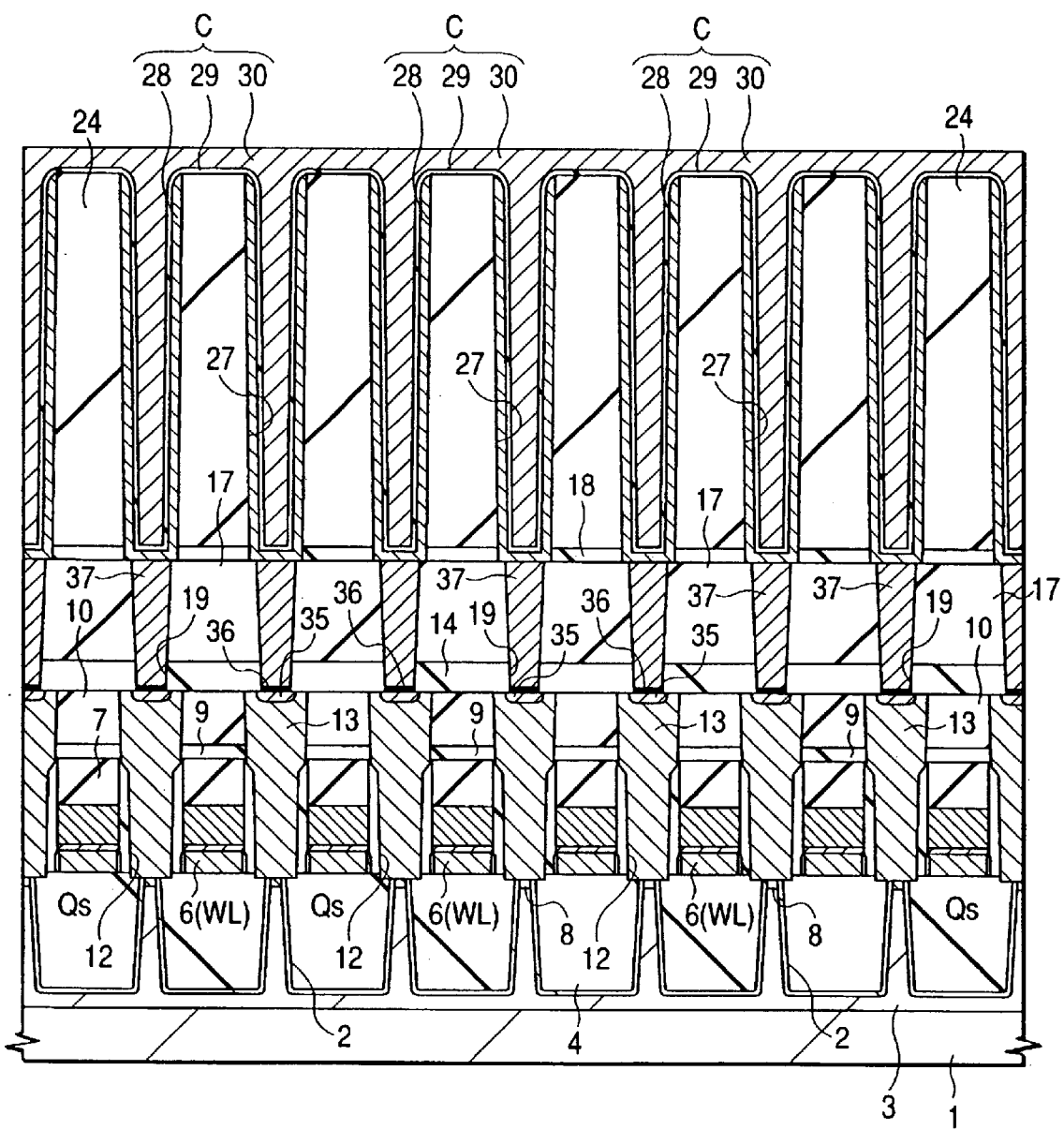
FIG. 81 is a cross sectional view for a main portion of a semiconductor substrate illustrating a process for manufacturing a DRAM as other embodiment according to this invention.

Then, as shown in FIG. 81, an upper electrode 30 is formed by depositing a titanium nitride film over the dielectric film 29 by the combination of a CVD method and a sputtering method to complete an information storage capacitance device C comprising the lower electrode 28, the electrode film 29 and the upper electrode 30, by which a memory cell comprising a memory cell selecting MISFETQs and an information storage capacitance device C connected in series therewith is completed substantially.

As described above, in this embodiment, the Ru silicide layer 35 is formed on the surface of the plug 13 comprising polycrystal silicon buried in the contact hole 12 below the through hole 19 and the silicon nitride layer 36 formed on the surface of the Ru silicide layer 35. Further, a plug 37 comprising an Ru film 37a is buried in the through hole 19 over the contact hole 12.

According to this embodiment, since the Ru silicide layer 35 and the Ru silicon nitride layer 36 formed on the surface of the plug 13 and the dielectric film 29 of the information storage capacitance device C are isolated by the plug 37 comprising the Ru film 37a in the through hole 19, oxidation to the Ru silicide layer 35 by the diffusion of oxygen upon heat treatment at high temperature in an oxygen atmosphere conducted in the step of forming the dielectric film 29 can be prevented effectively.

In this embodiment, the Ru silicide layer 35 and the Ru silicide layer 36 are formed on the surface of the plug 13 but this is not restrictive and, for example, the same effect can also be obtained by forming, for example, a Ti silicide layer and a Ti silicon nitride layer, or a Co silicide layer and a Co silicon nitride layer.

Figure 82:
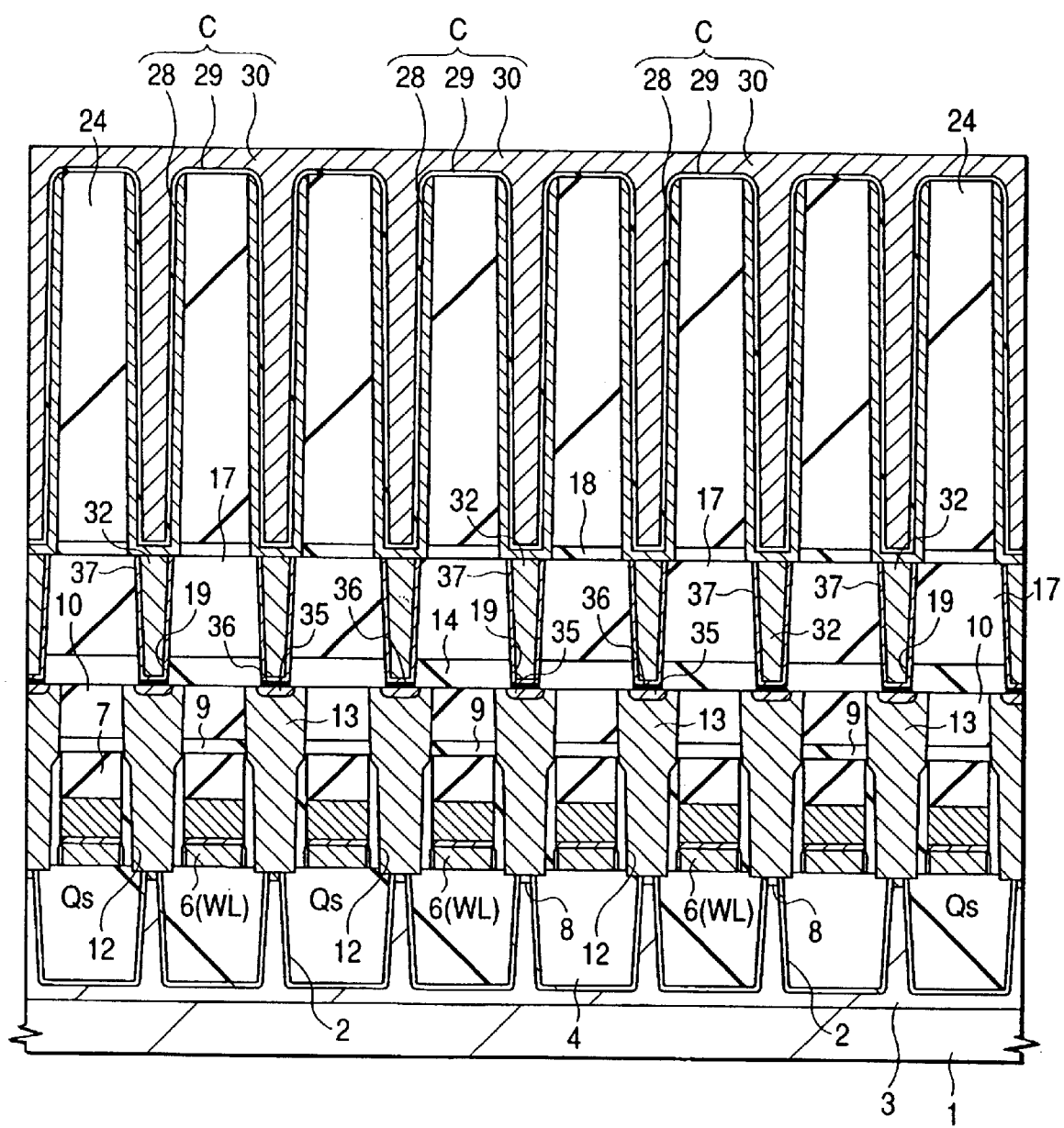
FIG. 82 is a cross sectional view for a main portion of a semiconductor substrate illustrating a process for manufacturing a DRAM as other embodiment according to this invention.

Further, as shown in the Embodiments 2 and 3, the oxygen absorption layer 32 may be sandwiched between the lower electrode 28 or, as shown in FIG. 82, the oxygen absorption layer 32 may be formed in the through hole 19 in which the plug 37 comprising the Ru film 37a is buried.

Further, the plug 37 in the through hole 19 is not restricted to the Ru film 37a and, for example, Pt or Ir may also be used.

In DRAM of the Embodiments 1 to 4, the lower electrode 28 for the information storage capacitance device C is formed on the inner wall of the groove 27 formed in the silicon oxide film 27, but in DRAM in an Embodiment 5, a lower electrode for the information storage capacitance device C is formed in a columnar shape.

In the manufacturing method according to this Embodiment 5, since the steps up to the step of forming the Ru silicide layer 25 on the surface of the plug 22 and, successively, forming the Ru silicon nitride layer 26 on the surface of the Ru silicide layer. (steps in FIG. 4 to FIG. 46) are identical with those in the Embodiment 1, explanation for them is omitted and only the subsequent steps are to be explained.

Figure 83:
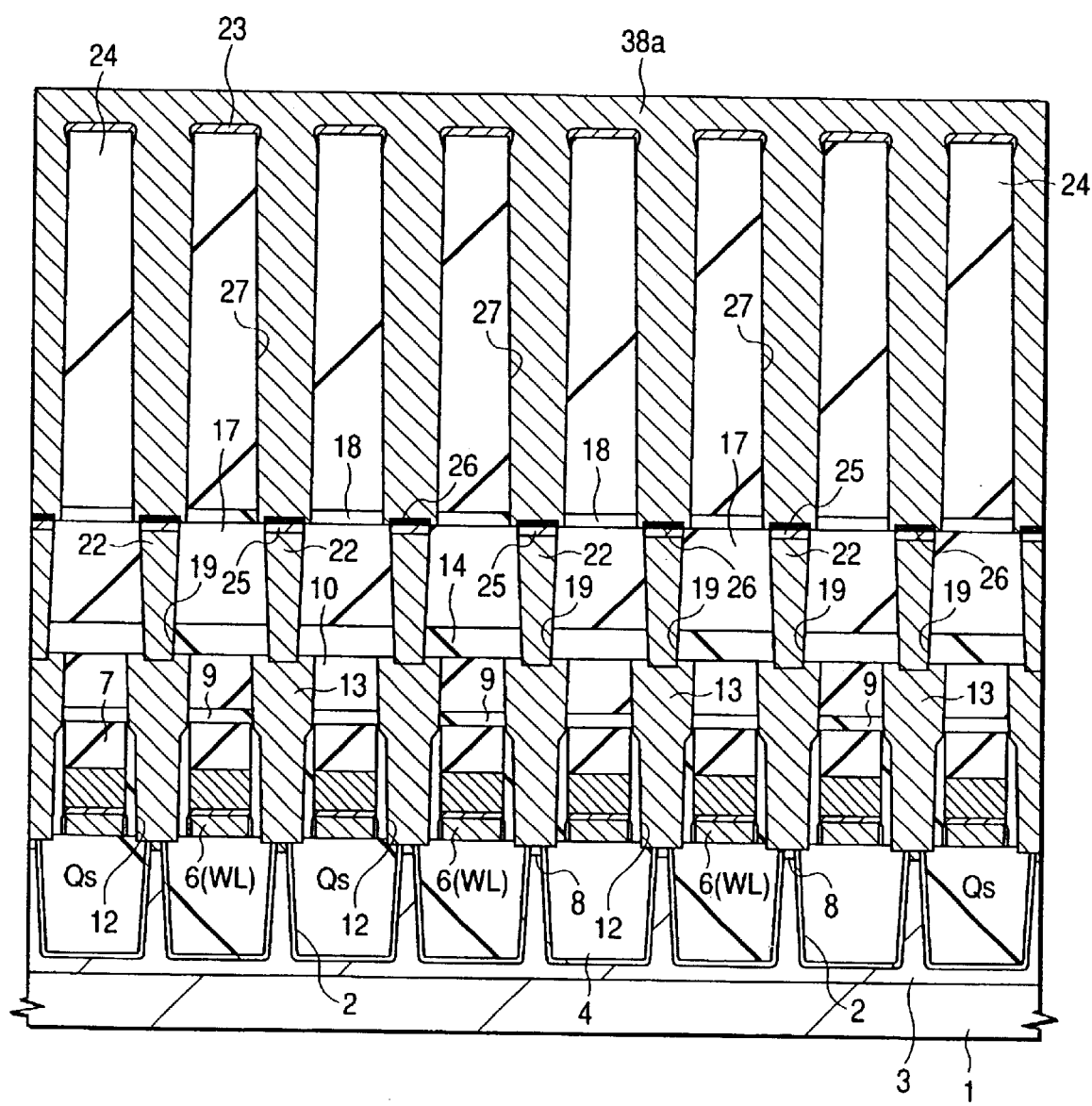
FIG. 83 is a cross sectional view for a main portion of a semiconductor substrate illustrating a process for manufacturing a DRAM as other embodiment according to this invention.
Figure 84:
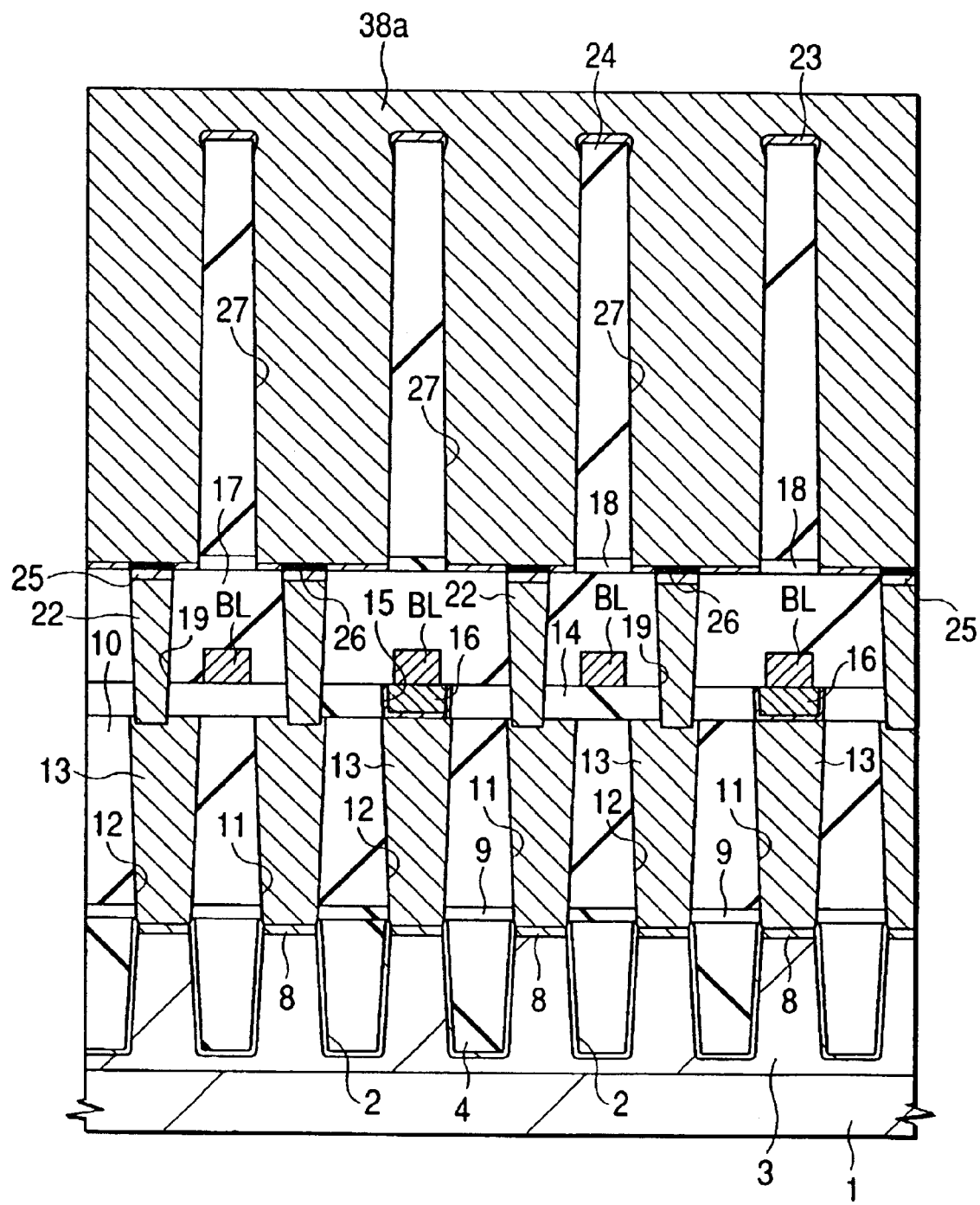
FIG. 84 is a cross sectional view for a main portion of a semiconductor substrate illustrating a process for manufacturing a DRAM as other embodiment according to this invention.

At first, succeeding to the step shown in FIG. 46, an Ru film 38a is deposited as shown in FIG. 83 and FIG. 84 over the silicon oxide film 24 and in the inside of the groove 27 by a CVD method of good step coverage. The Ru film 38a is deposited at such a large thickness as completely filling the inside of the groove 27.

Figure 85:
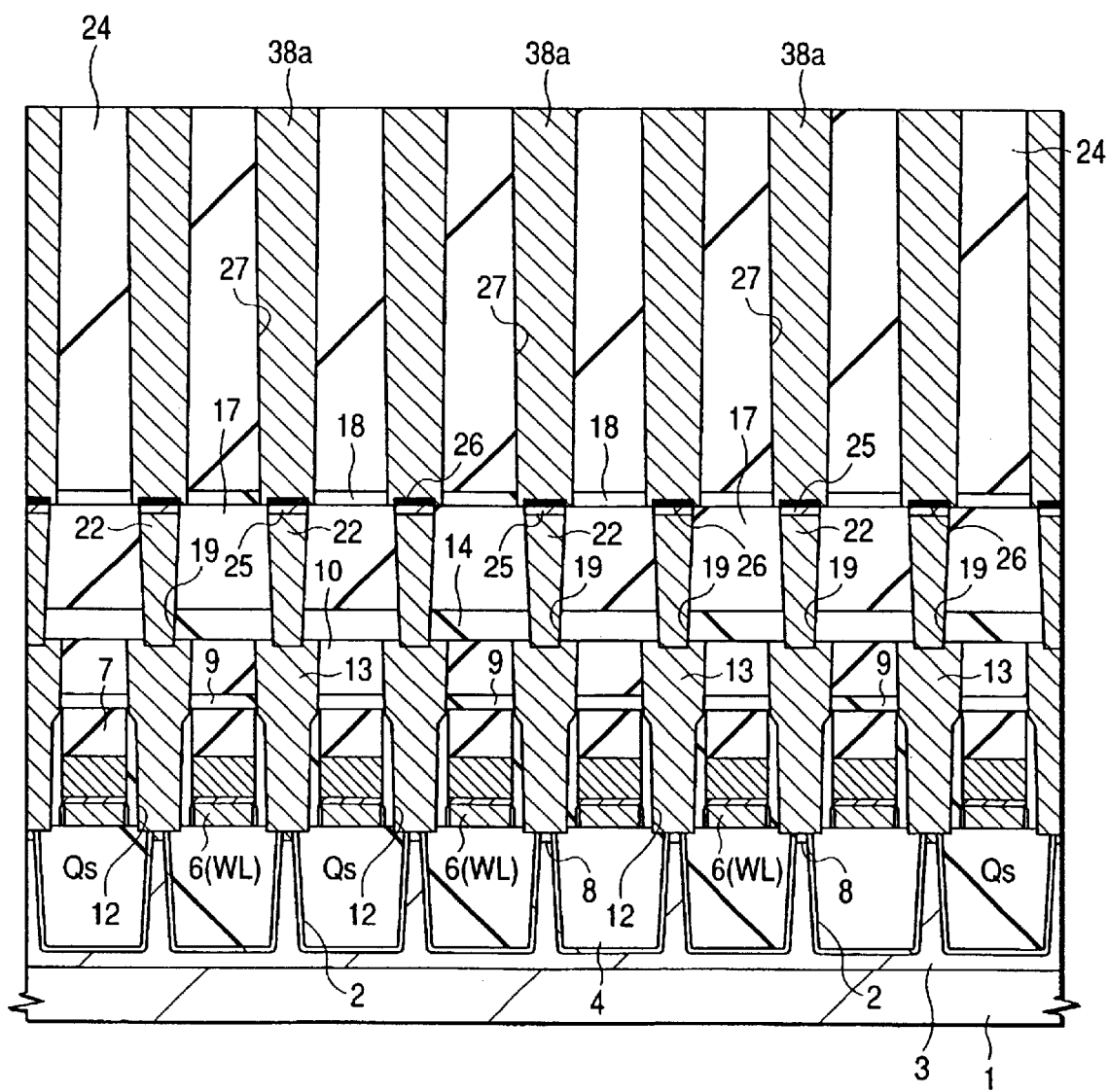
FIG. 85 is a cross sectional view for a main portion of a semiconductor substrate illustrating a process for manufacturing a DRAM as other embodiment according to this invention.
Figure 86:
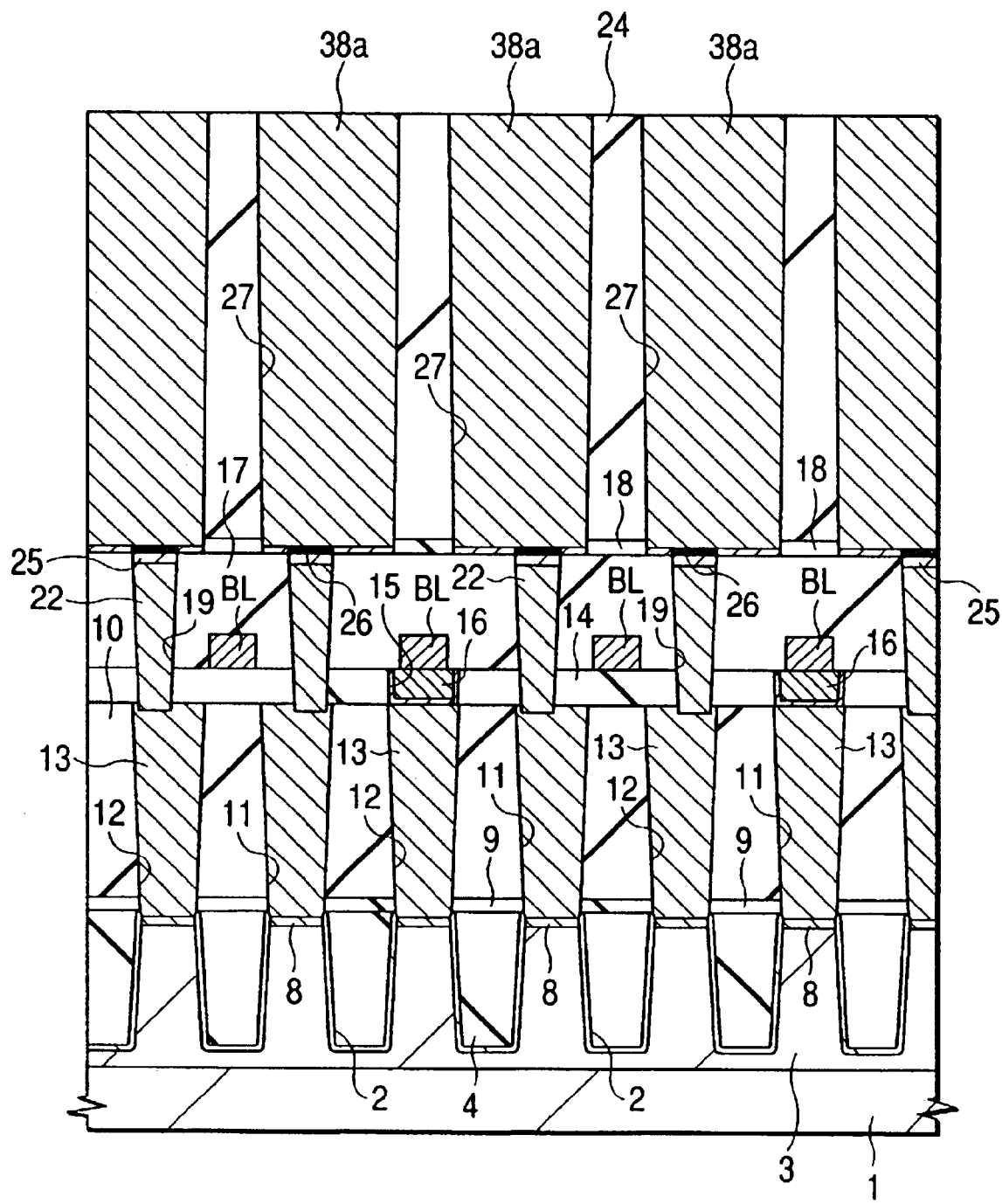
FIG. 86 is a cross sectional view for a main portion of a semiconductor substrate illustrating a process for manufacturing a DRAM as other embodiment according to this invention.
Figure 87:
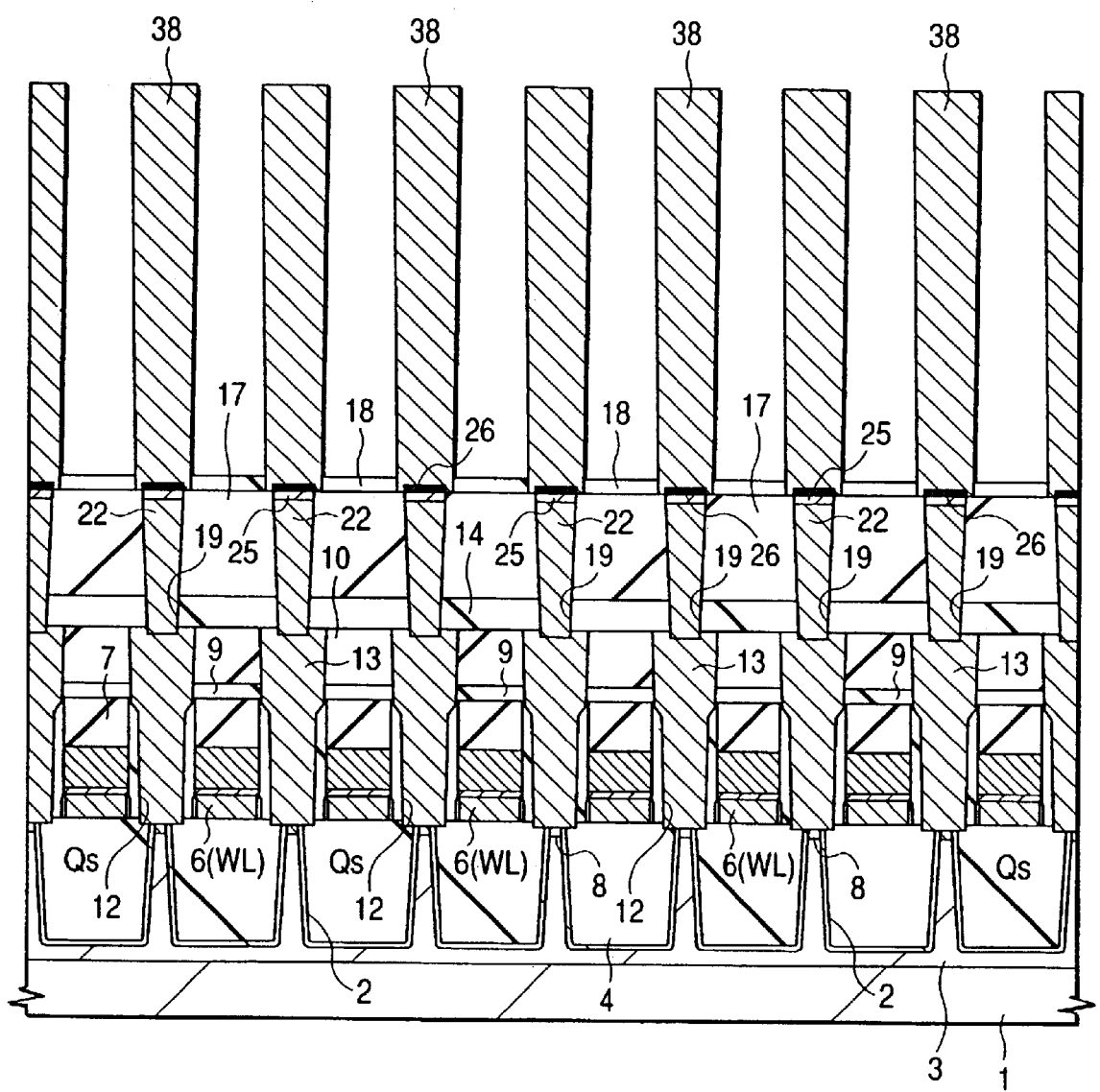
FIG. 87 is a cross sectional view for a main portion of a semiconductor substrate illustrating a process for manufacturing a DRAM as other embodiment according to this invention.
Figure 88:
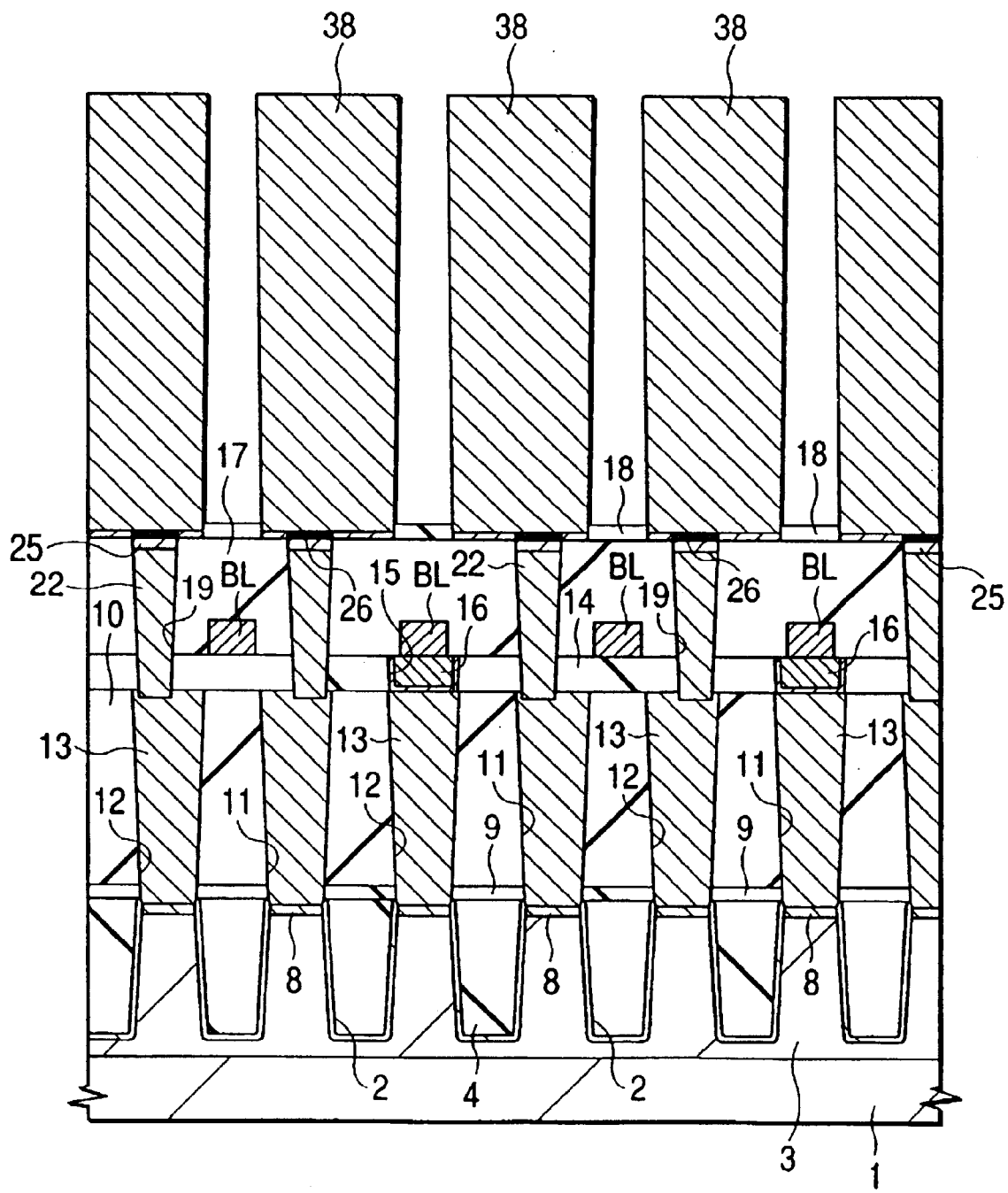
FIG. 88 is a cross sectional view for a main portion of a semiconductor substrate illustrating a process for manufacturing a DRAM as other embodiment according to this invention.

Then, as shown in FIG. 85 and FIG. 86, after removing the Ru films 38a and 23 outside of the groove 27 by dry etching to leave the Ru film 38 inside of the groove 27, the silicon oxide film 24 is removed, for example, by wet etching using a hydrofluoric acid type etching solution as shown in FIG. 87 and FIG. 88, to form a columnar lower electrode 38 comprising the Ru film 38a.

Figure 89:
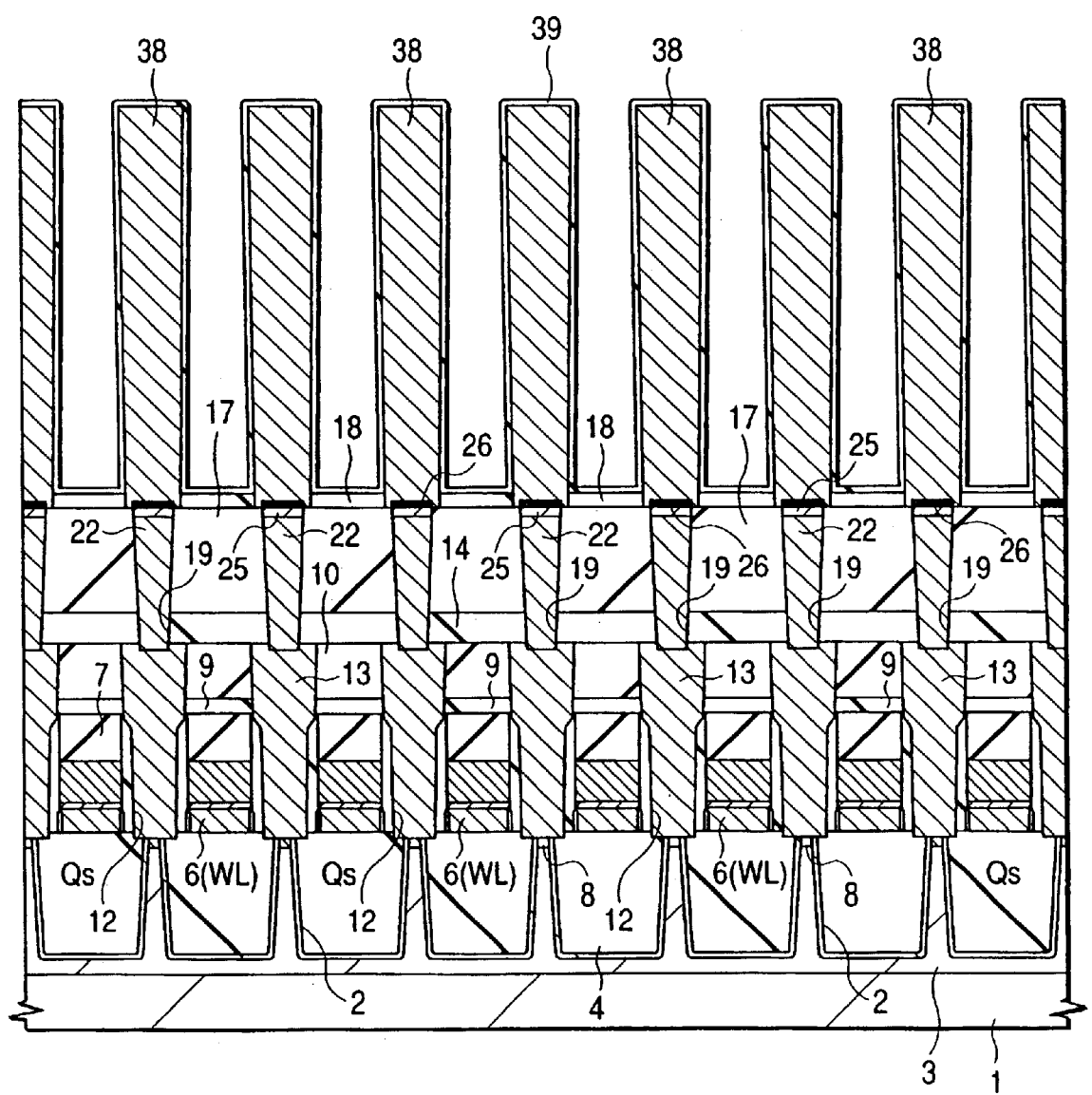
FIG. 89 is a cross sectional view for a main portion of a semiconductor substrate illustrating a process for manufacturing a DRAM as other embodiment according to this invention.
Figure 90:
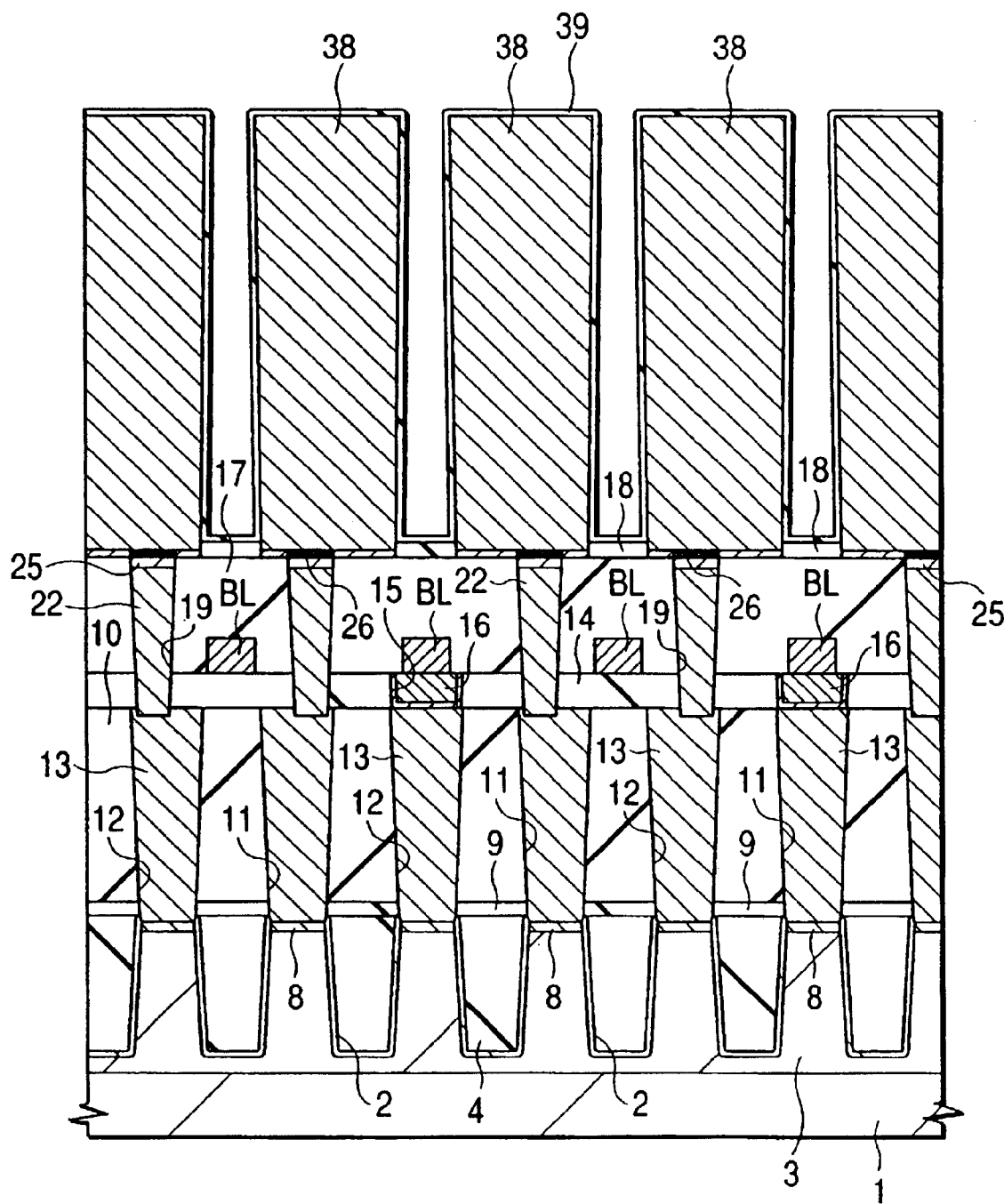
FIG. 90 is a cross sectional view for a main portion of a semiconductor substrate illustrating a process for manufacturing a DRAM as other embodiment according to this invention.

Then, as shown in FIGS. 89 and 90, a dielectric film 39 is deposited thinly on the surface of the lower electrode 38. The dielectric film 39 is constituted with a tantalum oxide film of about 10 nm thickness and, subsequently, applied with a heat treatment about at 650° C. for 2 min in an oxygen atmosphere for crystallization of the film and improvement of the film quality.

Figure 91:
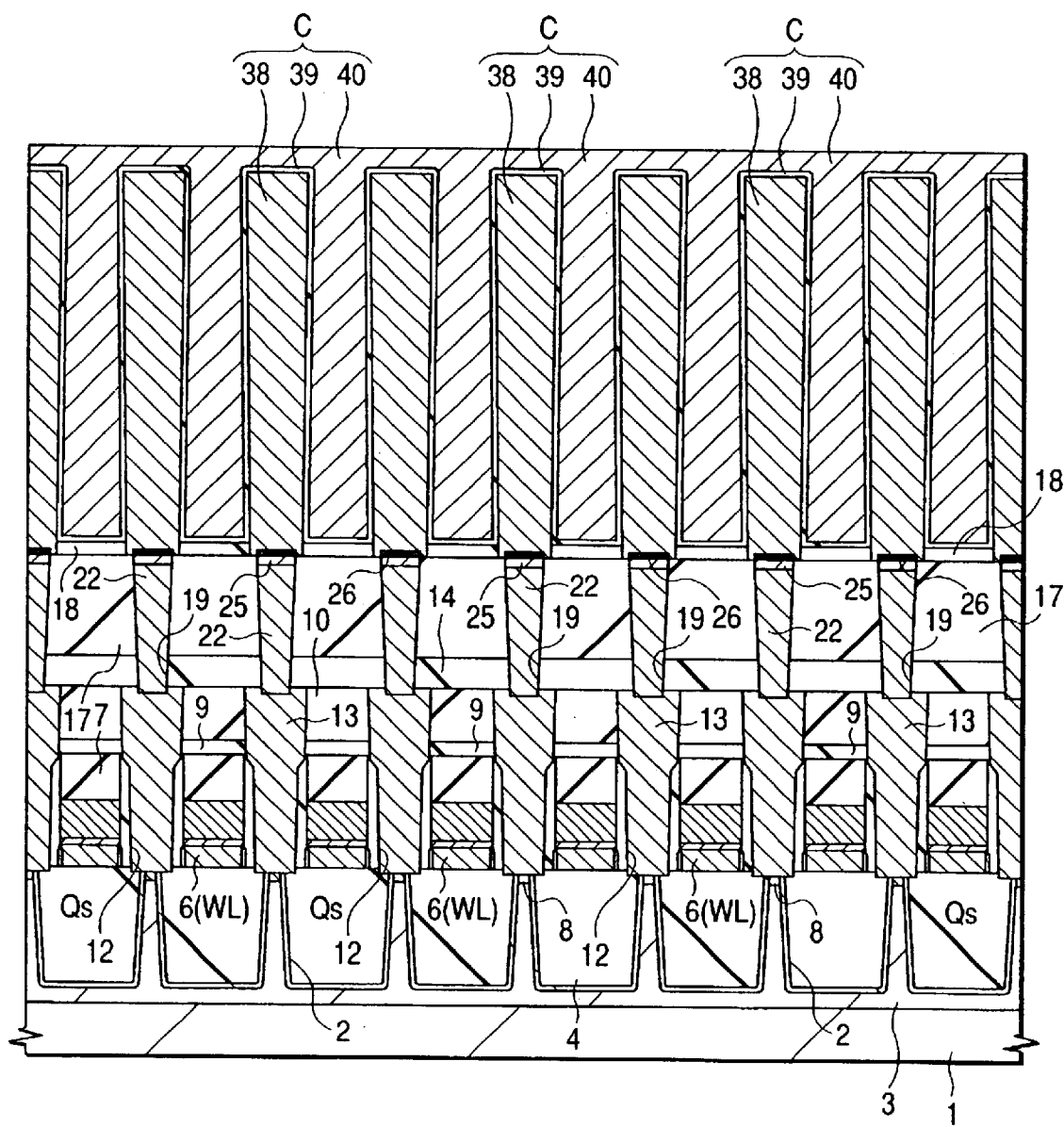
FIG. 91 is a cross sectional view for a main portion of a semiconductor substrate illustrating a process for manufacturing a DRAM as other embodiment according to this invention.
Figure 92:
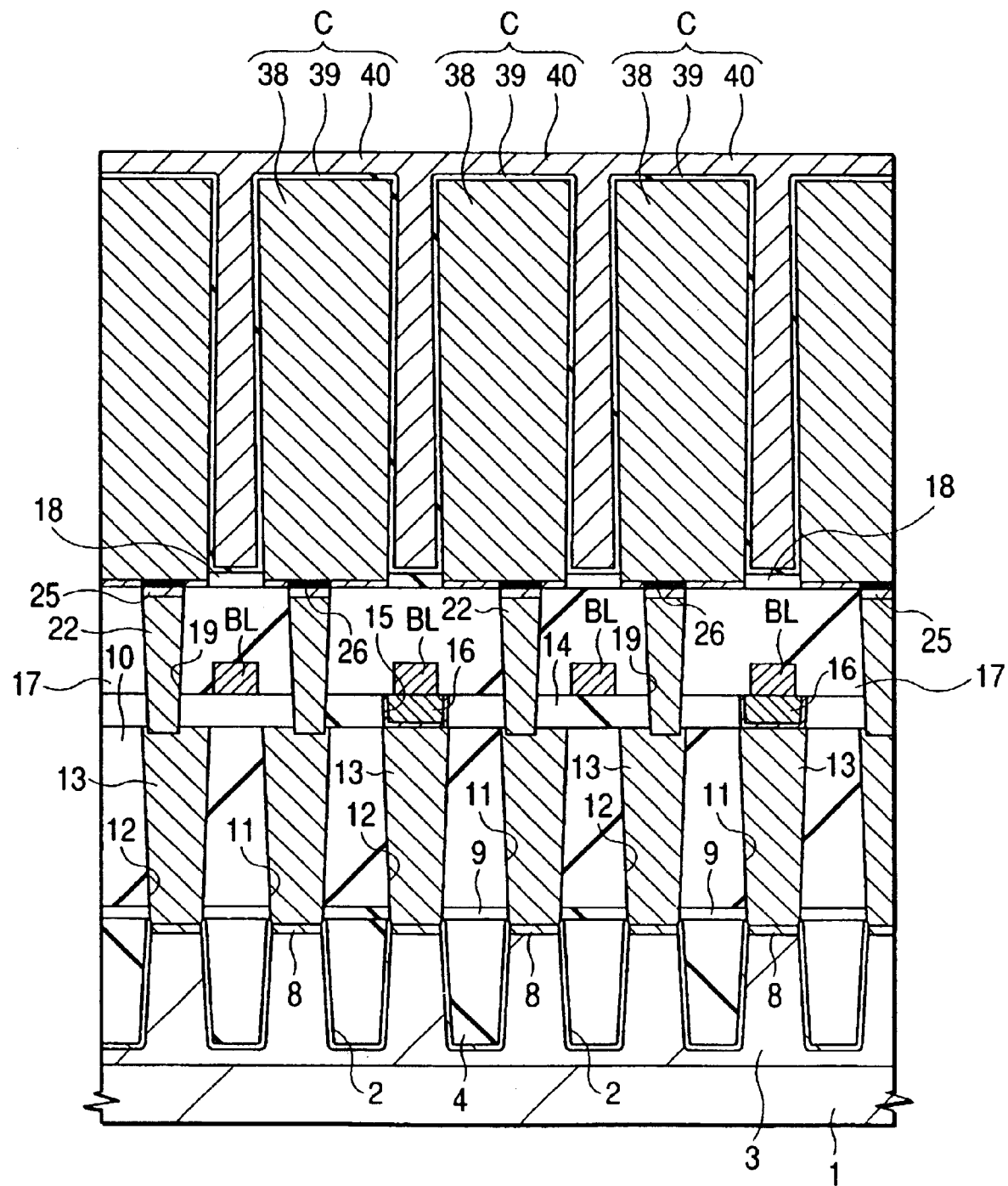
FIG. 92 is a cross sectional view for a main portion of a semiconductor substrate illustrating a process for manufacturing a DRAM as other embodiment according to this invention.

Then, as shown in FIG. 91 and FIG. 92, an upper electrode 40 is formed by depositing a TiN film or the like over the dielectric film 39 by the combination of a CVD method and a sputtering method to complete an information storage capacitance device C comprising the lower electrode 38, the electrode film 39 and the upper electrode 40, by which a memory cell comprising a memory cell selecting MISFETQs and an information storage capacitance device C connected in series therewith is completed substantially.

As described above, according to this embodiment, also in a case of forming the lower electrode 28 for the information storage capacitance device C in a columnar shape, since the Ru silicide layer 25 is formed on the surface of the plug 22 connected with the lower electrode 28 and, further, the Ru silicon nitride layer 26 is formed on the surface of the Ru silicide layer 25, the Ru silicon nitride layer 26 is sacrificially oxidized and transformed into Ru silicon oxynitride upon heat treatment at high temperature in the oxygen atmosphere conducted in the step of forming the dielectric film 29 on the lower electrode 28 and, accordingly, progress of oxidation in the Ru silicide layer 25 can be prevented effectively. Since this can prevent occurrence of shape failure of the lower electrode 28 caused by abnormal oxidation at the boundary between the lower electrode 28 and the plug 22, the leak current in the dielectric film 29 formed on the lower electrode 28 can be decreased.

In the manufacturing method of this embodiment, after burying the plug 22 of polycrystal silicon in the through hole 19 and, successively, depositing the silicon oxide film 24 thereover to form the groove 27, the Ru silicide layer 25 and the Ru silicon nitride layer 26 are formed on the surface of the plug 22 exposed to the bottom of the groove 27. With this constitution, since the Ru silicide layer 25 and the Ru silicon nitride layer 26 are formed in self alignment with the groove 27, even when misalignment is caused between the columnar lower electrode 28 whose region is defined by the groove 27 and the through hole 19, contact between the dielectric film 29 and the plug 22 can be avoided to suppress increase of the leak current in information storage capacitance device C.

Further, in this embodiment in which the lower electrode 38 for the information storage capacitance device C is constituted as a columnar body, the step coverage of the dielectric material (tantalum oxide film) deposited over the lower electrode 38 and the upper electrode material (TiN film) can be improved compared with that in the Embodiments 1 to 4 in which the lower electrode 28 is formed inside the groove 27.

In the DRAM in an Embodiment 6, a lower electrode for the information storage capacitance device C is constituted with a columnar body like that the Embodiment 5 and an oxygen absorption layer is formed at the bottom of a lower electrode like that the Embodiment 2.

Figure 93:
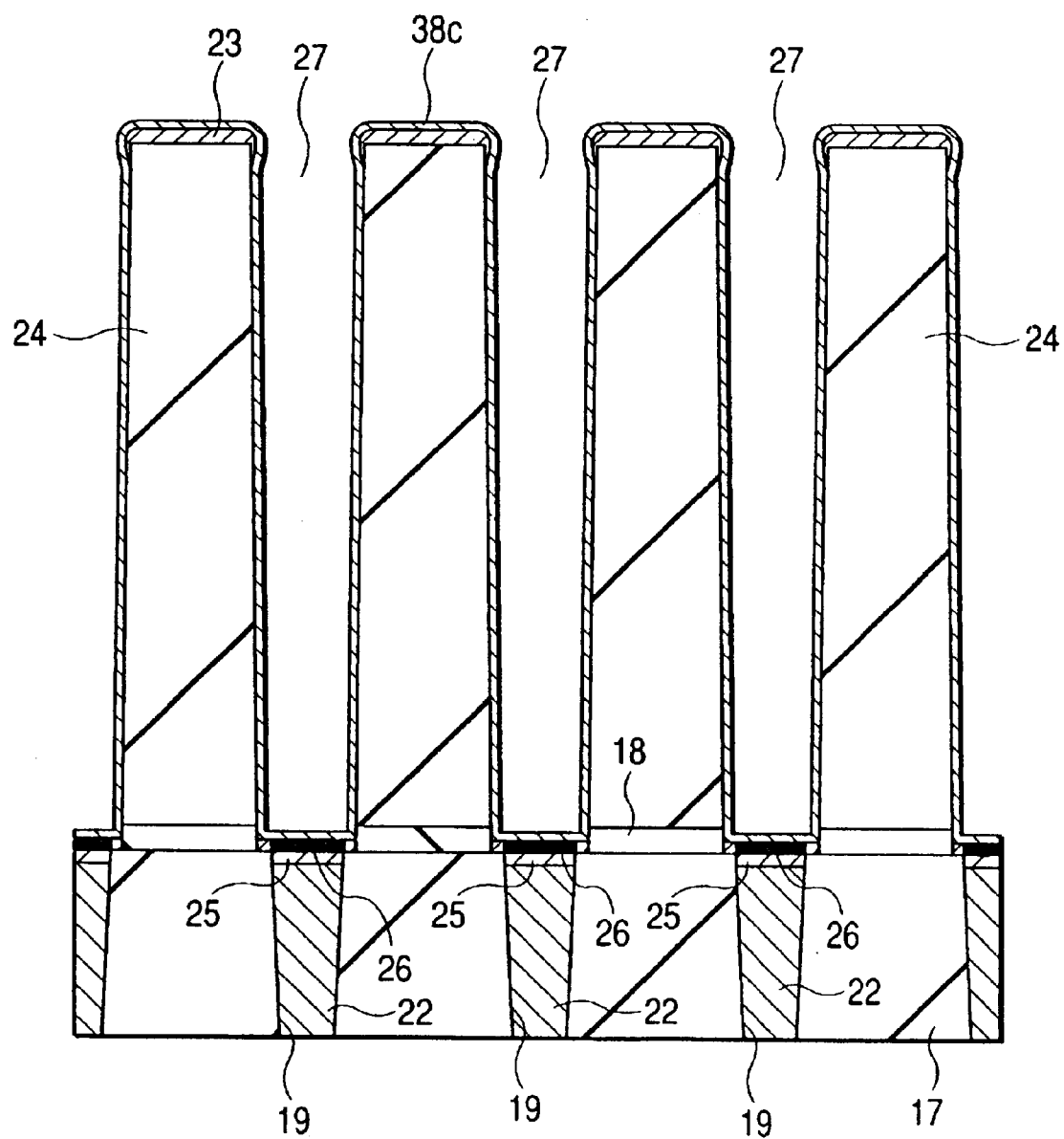
FIG. 93 is a enlarged cross sectional view for a main portion of a semiconductor substrate illustrating a process for manufacturing a DRAM as other embodiment according to this invention.

At first, succeeding to the step shown in FIG. 46, a thin Ru film 38c is deposited, as shown in FIG. 93, over the silicon oxide film 24 and inside the groove 27 by a CVD method having good step coverage. As described previously, since the Ru film 38c deposited by the CVD method has better step coverage compared with the Ru film deposited by the sputtering method but provides less adhesion with the silicon oxide film 24, the Ru film 38c may be deposited after depositing a thin Ru film by a sputtering method (not illustrated).

Figure 94:
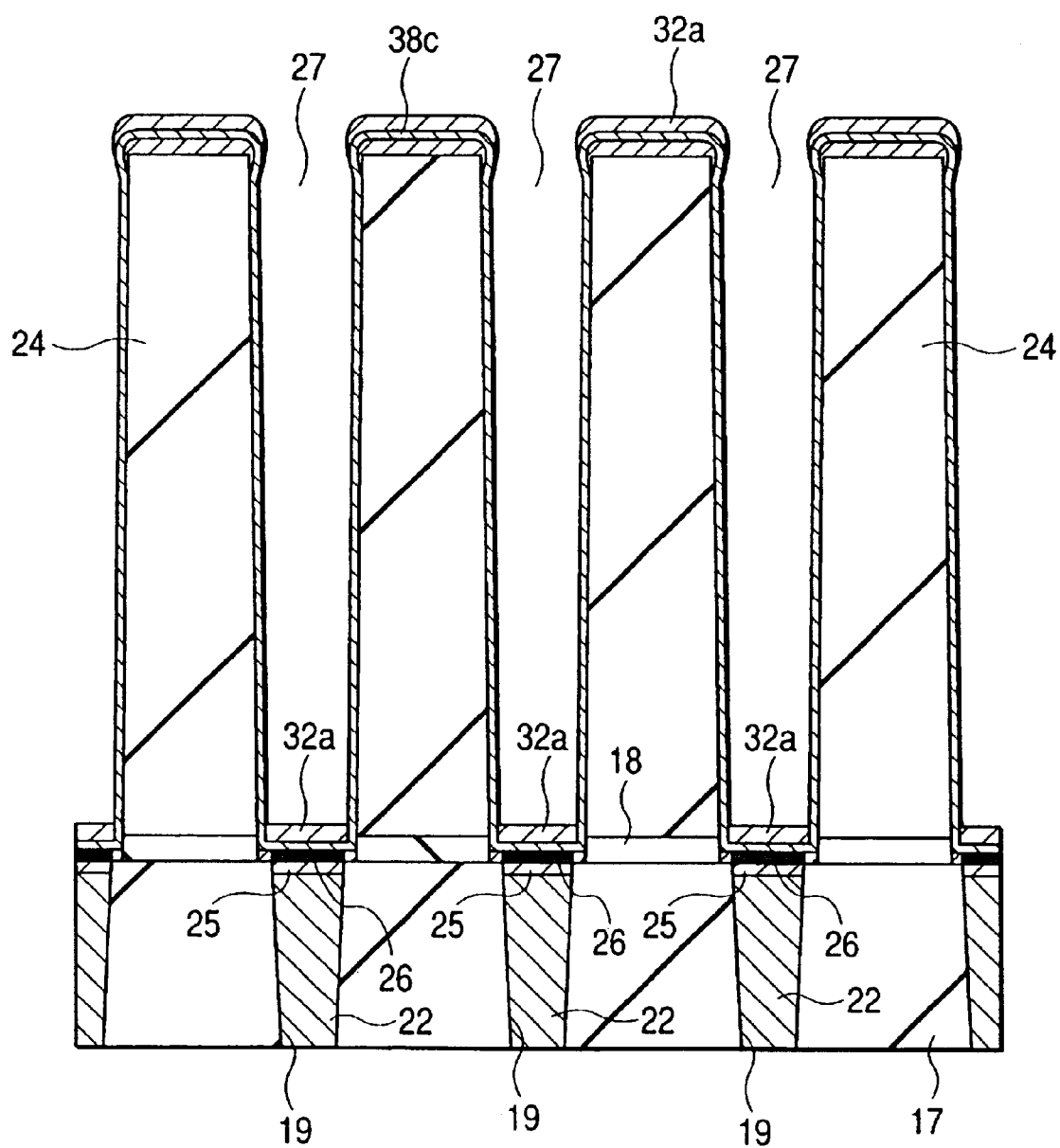
FIG. 94 is an enlarged cross sectional view for a main portion of a semiconductor substrate illustrating a process for manufacturing a DRAM as other embodiment according to this invention.

Then, as shown in FIG. 94, a W silicide film 32a is deposited to about 10 nm to 20 nm thickness by a sputtering method over the Ru film 38c. Since the W silicide film 32a is deposited by the sputtering method, while it is deposited over the silicon oxide film 24 outside of the groove 27 or on the bottom of the groove 27, it is deposited only as an extremely thin thickness on the side wall of the groove 27.

Figure 95:
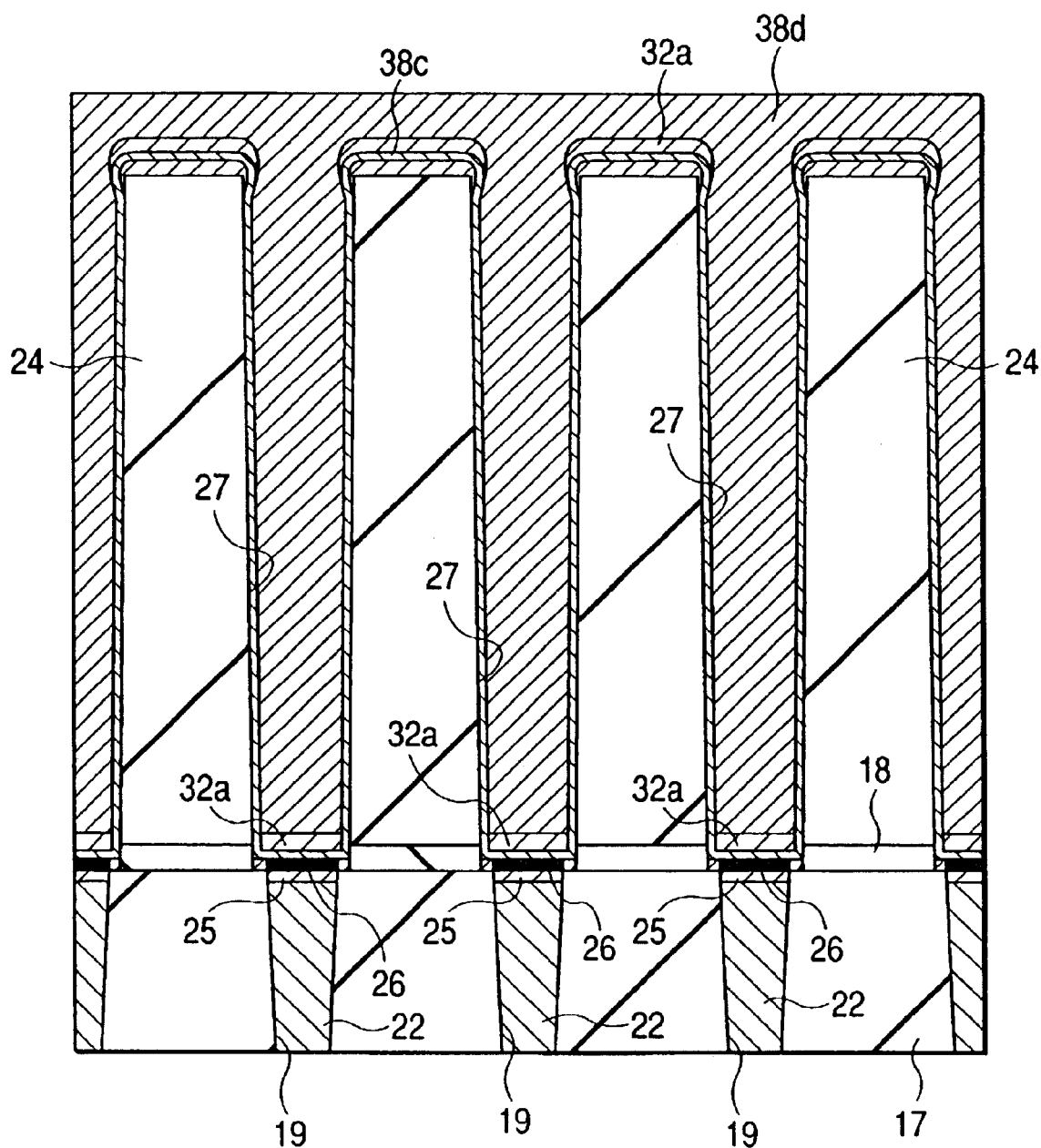
FIG. 95 is an enlarged cross sectional view for a main portion of a semiconductor substrate illustrating a process for manufacturing a DRAM as other embodiment according to this invention.

Then, as shown in FIG. 95, an Ru film 38d is deposited over the silicon oxide film 24 deposited with the W silicide film 32a and inside the groove 27 by a CVD method providing a good step coverage. The Ru film 38d is deposited to such a large thickness as completely filling the inside of the groove 27.

Figure 96:
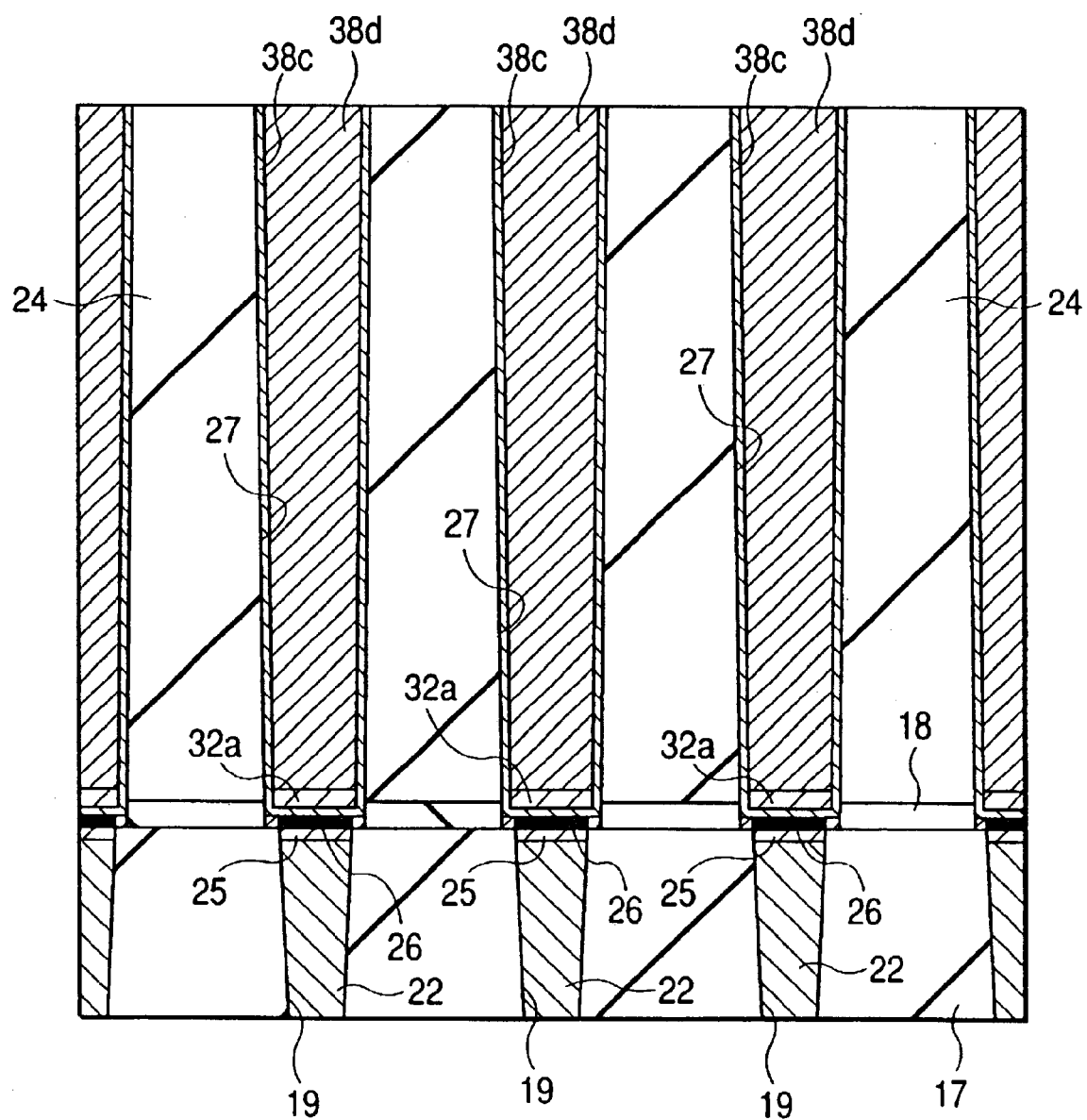
FIG. 96 is an enlarged cross sectional view for a main portion of a semiconductor substrate illustrating a process for manufacturing a DRAM as other embodiment according to this invention.
Figure 97:
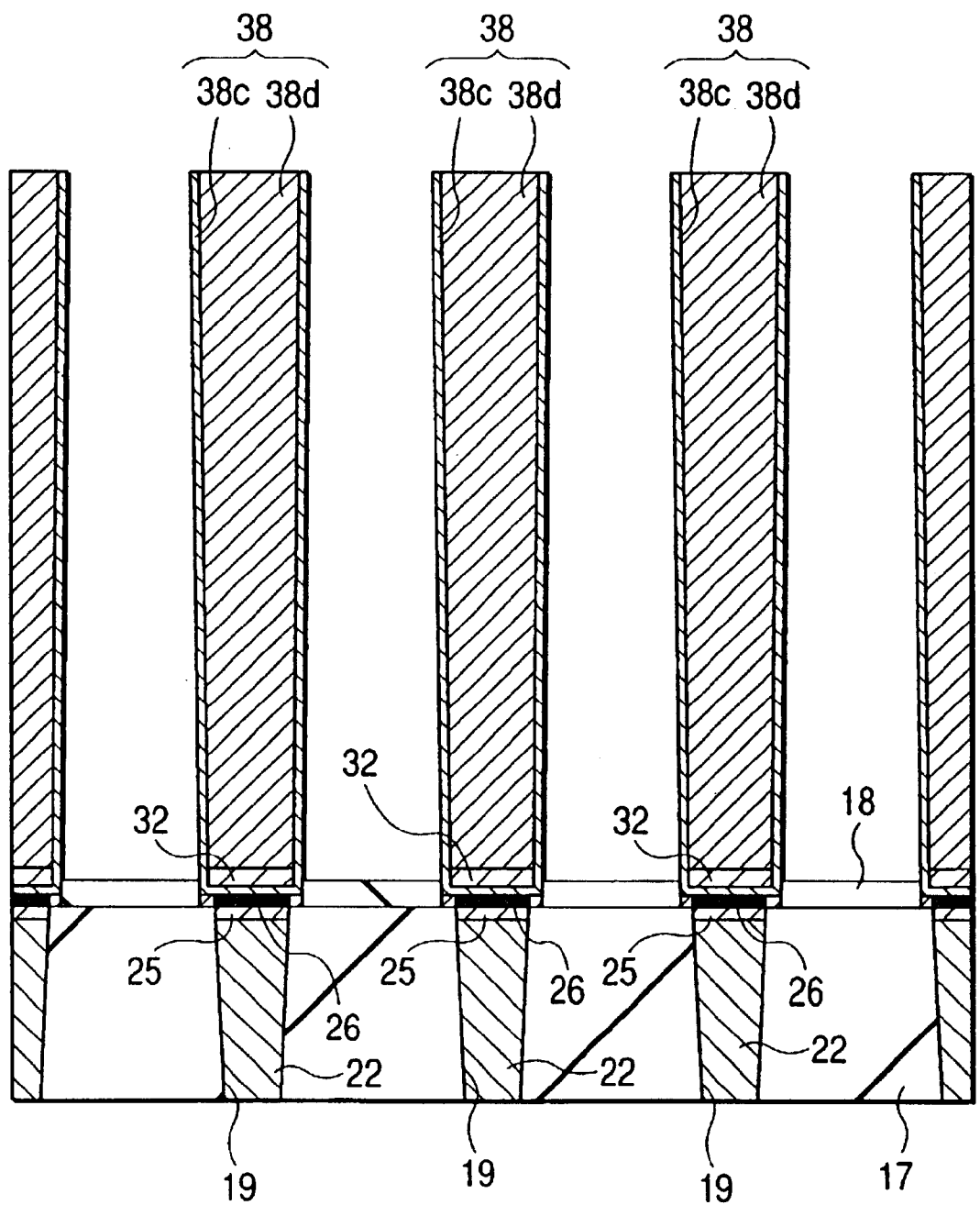
FIG. 97 is an enlarged cross sectional view for a main portion of a semiconductor substrate illustrating a process for manufacturing a DRAM as other embodiment according to this invention.

Then, as shown in FIG. 96, after removing the Ru films 38c, 38d and the W silicide film 32a outside of the groove 27 by drying etching while leaving the Ru films 38c and 38d and the W silicide film 32a inside the groove 27, the silicon oxide film 24 is removed as shown in FIG. 97, for example, by wet etching using a fluoric acid type etching solution to form a columnar lower electrode 38 comprising the Ru film 38a and an oxygen absorption layer 32 comprising the W silicide film 32a on the bottom of the lower electrode 38.

Figure 98:
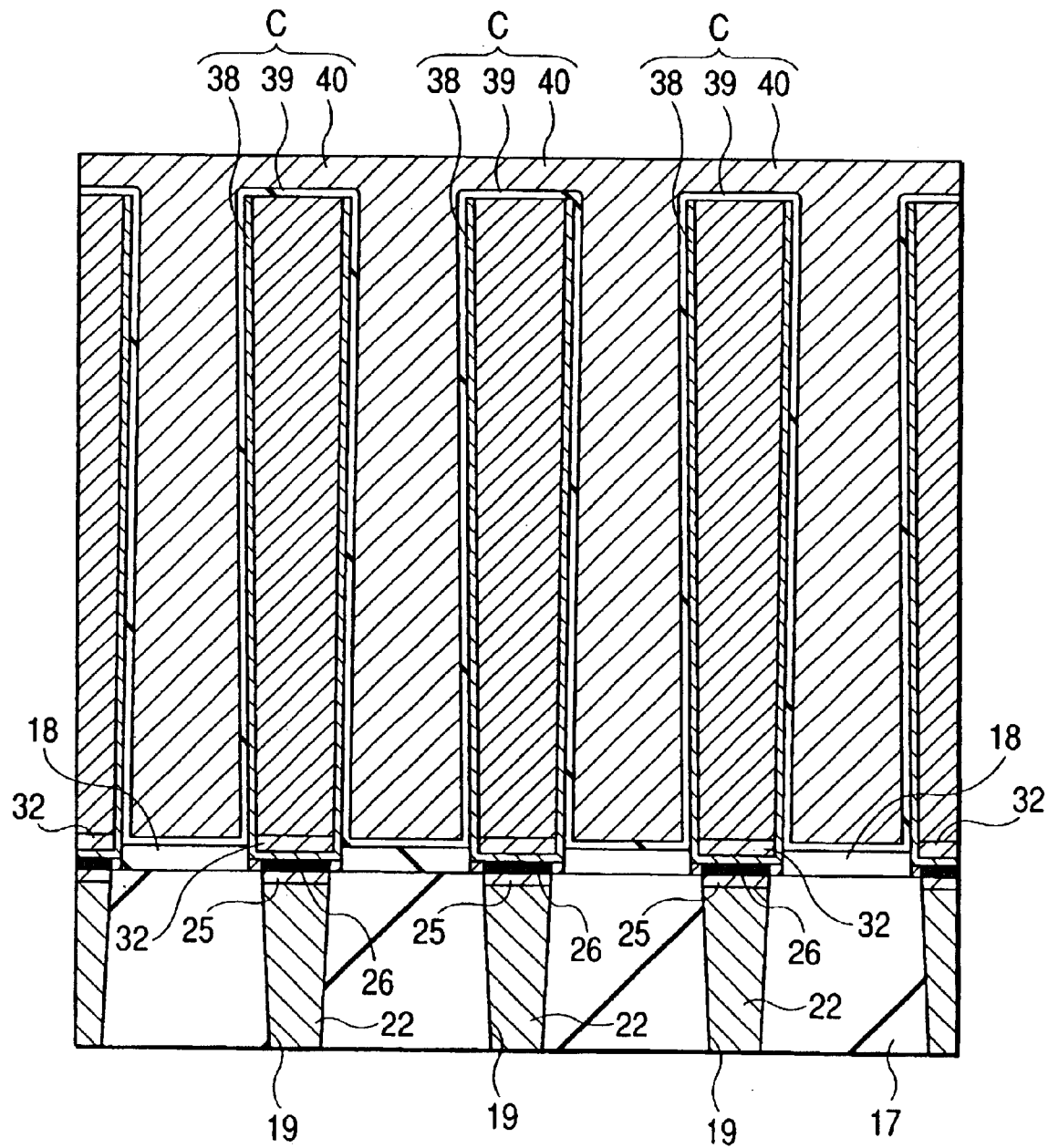
FIG. 98 is an enlarged cross sectional view for a main portion of a semiconductor substrate illustrating a process for manufacturing a DRAM as other embodiment according to this invention.

Then, as shown in FIG. 98, after depositing a dielectric film thinly on the surface of the lower electrode 38 by the same method as in the Embodiment 5, and then applying a heat treatment successively in an oxygen atmosphere, a TiN film or the like is deposited over the dielectric film 39 to form an upper electrode 40.

As described above, in this embodiment, after forming the Ru silicide layer 25 on the surface of the plug 22 and forming the Ru silicon nitride layer 26 on the surface of the Ru silicide layer 25, the oxygen absorption layer 32 is formed at the bottom of the columnar lower electrode 28. With this constitution, since the Ru silicon nitride layer 26 and the oxygen absorption layer 32 function as the barrier layer for oxygen that permeates and diffuses in the lower electrode 28, and are sacrificially oxidized upon heat treatment at high treatment in an oxygen atmosphere conducted in the step of forming the dielectric film 29 on the lower electrode 28, progress of oxidation to the Ru silicide layer 25 can be prevented more effectively compared with the Embodiment 5.

In the DRAM in an Embodiment 7, a lower electrode for the information storage capacitance device C is constituted with a columnar body like that the Embodiments 5 and 6 and an oxygen absorption layer is formed inside lower electrode.

Figure 99:
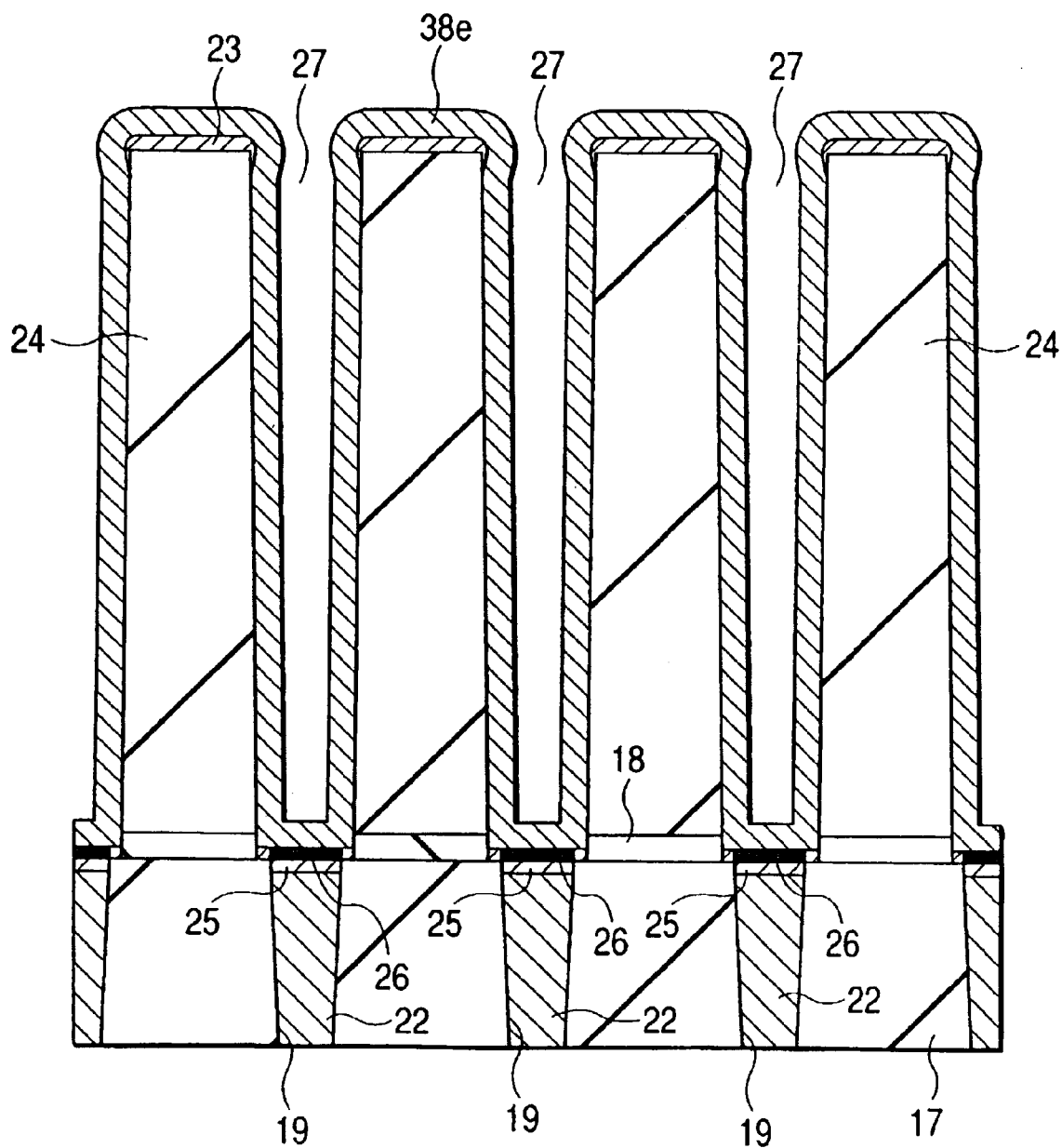
FIG. 99 is an enlarged cross sectional view for a main portion of a semiconductor substrate illustrating a process for manufacturing a DRAM as other embodiment according to this invention.

At first, succeeding to the step shown in FIG. 46, an Ru film 38e is deposited, as shown in FIG. 99, over a silicon oxide film 24 and in the inside of the groove 27 by a CVD method providing a good step coverage. The Ru film 38e is deposited to such a thickness as not completely filling the inside of the groove 27. Also in this case, the Ru film 38e may be deposited after depositing a thin Ru film previously by a sputtering method (not illustrated).

Figure 100:
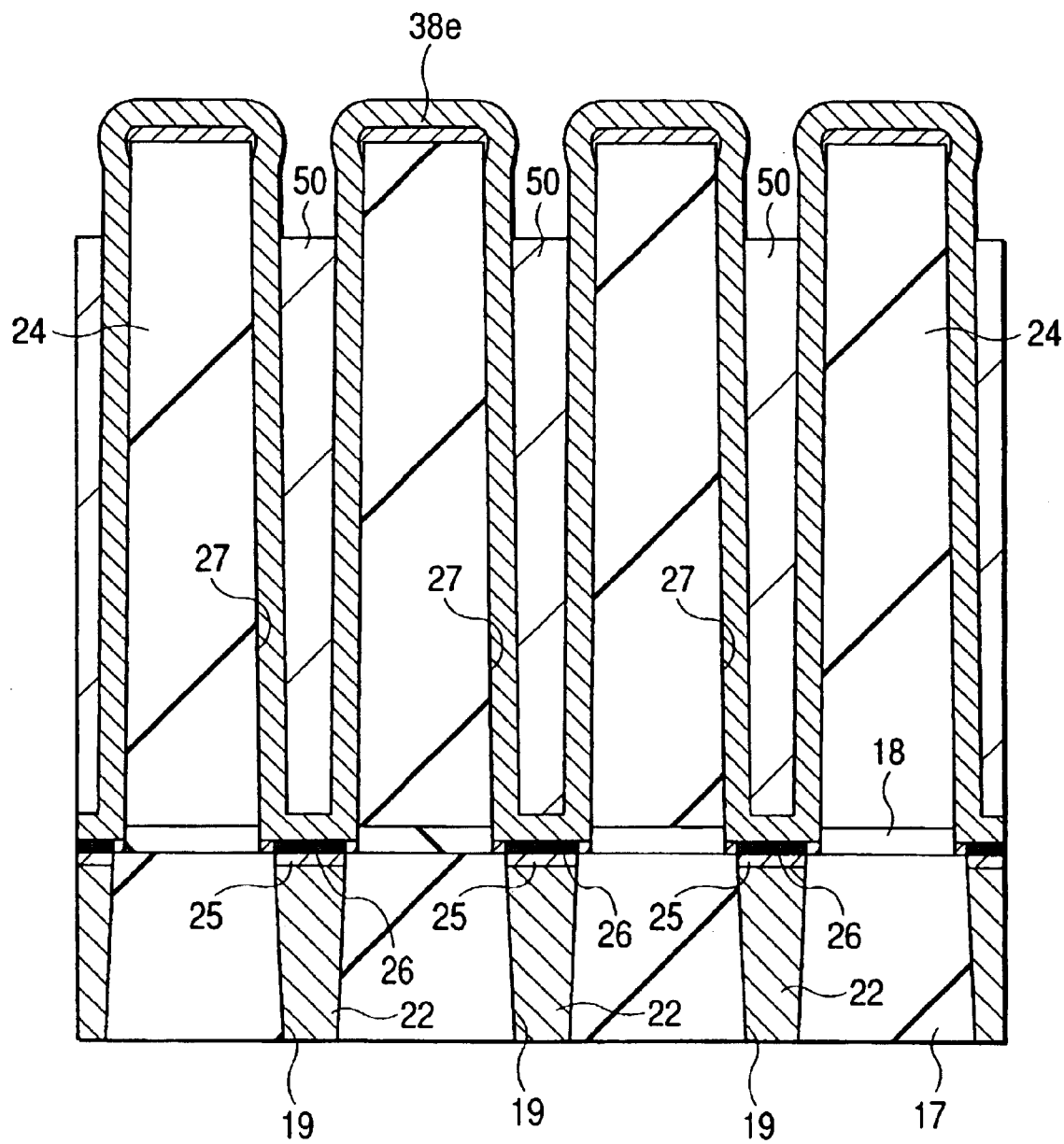
FIG. 100 is an enlarged cross sectional view for a main portion of a semiconductor substrate illustrating a process for manufacturing a DRAM as other embodiment according to this invention.

Then, as shown in FIG. 100, a polycrystal silicon film 50 is buried inside the groove 27. For burying the polycrystal silicon film 50, the polycrystal silicon film 50 is deposited over the silicon oxide film 24 and in the inside of the groove 27 deposited with the Ru film 38e and then the polycrystal silicon film 50 outside of the groove 27 is removed by dry etching. In this case, the polycrystal silicon film 50 near the upper end of the groove 27 is removed by overetching to retract the upper surface of the polycrystal silicon film 50 below the upper end of the groove 27.

Figure 101:
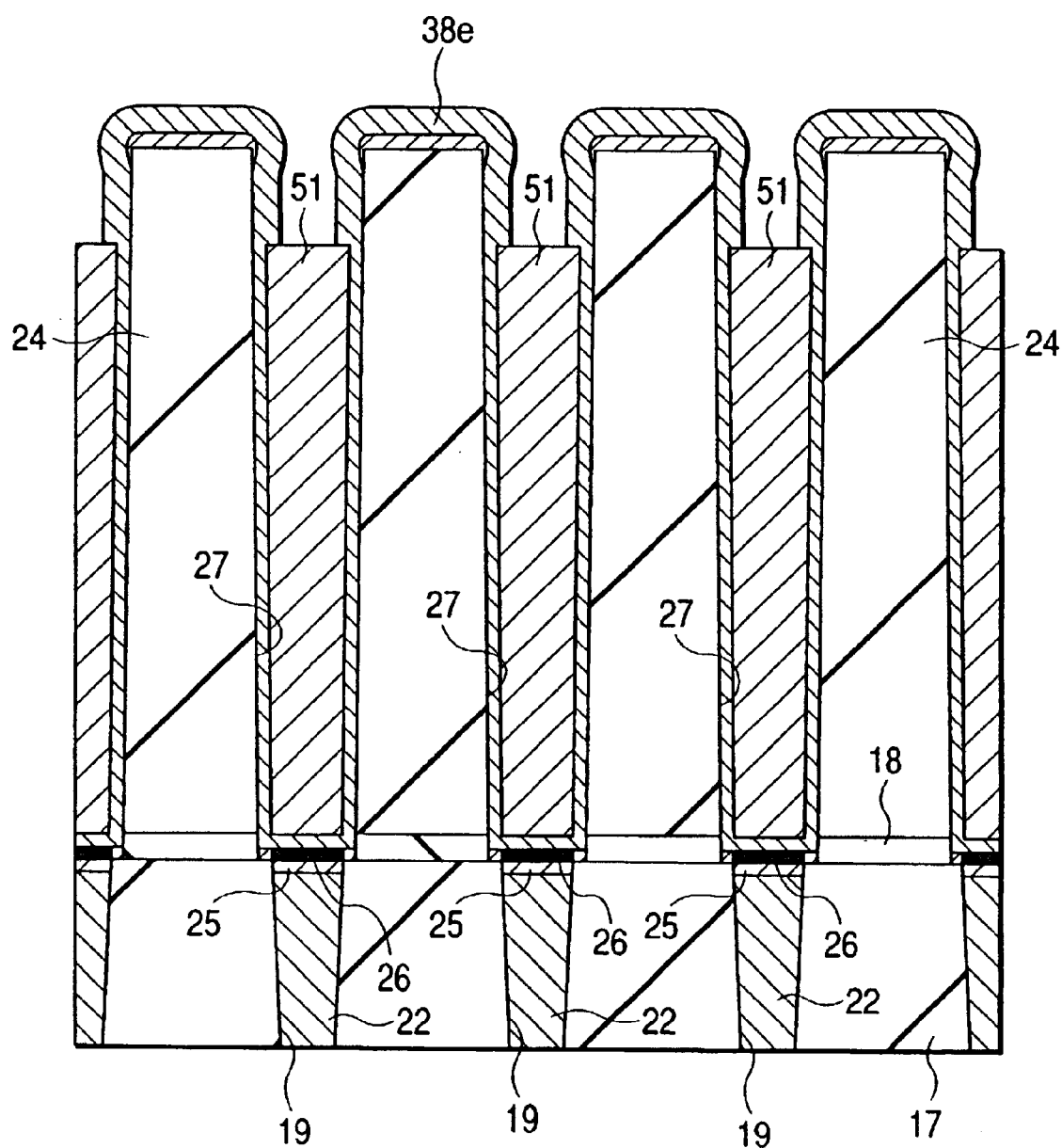
FIG. 101 is an enlarged cross sectional view for a main portion of a semiconductor substrate illustrating a process for manufacturing a DRAM as other embodiment according to this invention.

Then, as shown in FIG. 101, a heat treatment is conducted in a non-oxidative gas atmosphere such as nitrogen to react the Ru film 38e and the polycrystal silicon film 50 in the inside of the groove 27 and form an Ru silicide film, thereby forming an oxygen absorption layer 51 comprising Ru silicide in the inside of the groove 27.

When the oxygen absorption layer 51 is formed by siliciding the polycrystal silicon film 50, the thickness of the Ru film 28e deposited initially is made twice or more the thickness of the polycrystal silicon film 50. For example, when the diameter of the groove 27 is 100 nm and the thickness of the Ru film 28e is 30 nm, since the thickness of the Ru film 28e deposited on both side walls of the groove 27 is 60 nm, the lateral thickness of the polycrystal silicon film 50 buried in the inside of the groove 27 subsequently is 40 mm. When the Ru film 28e and the polycrystal silicon film 50 are reacted at the thickness ratio described above, even after the polycrystal silicon film 50 has been completely silicided, the Ru film 28e is silicided only to about 10 nm and remaining 20 nm portion is left as metal Ru, so that electric conduction of the lower electrode 38 can be ensured sufficiently.

Figure 102:
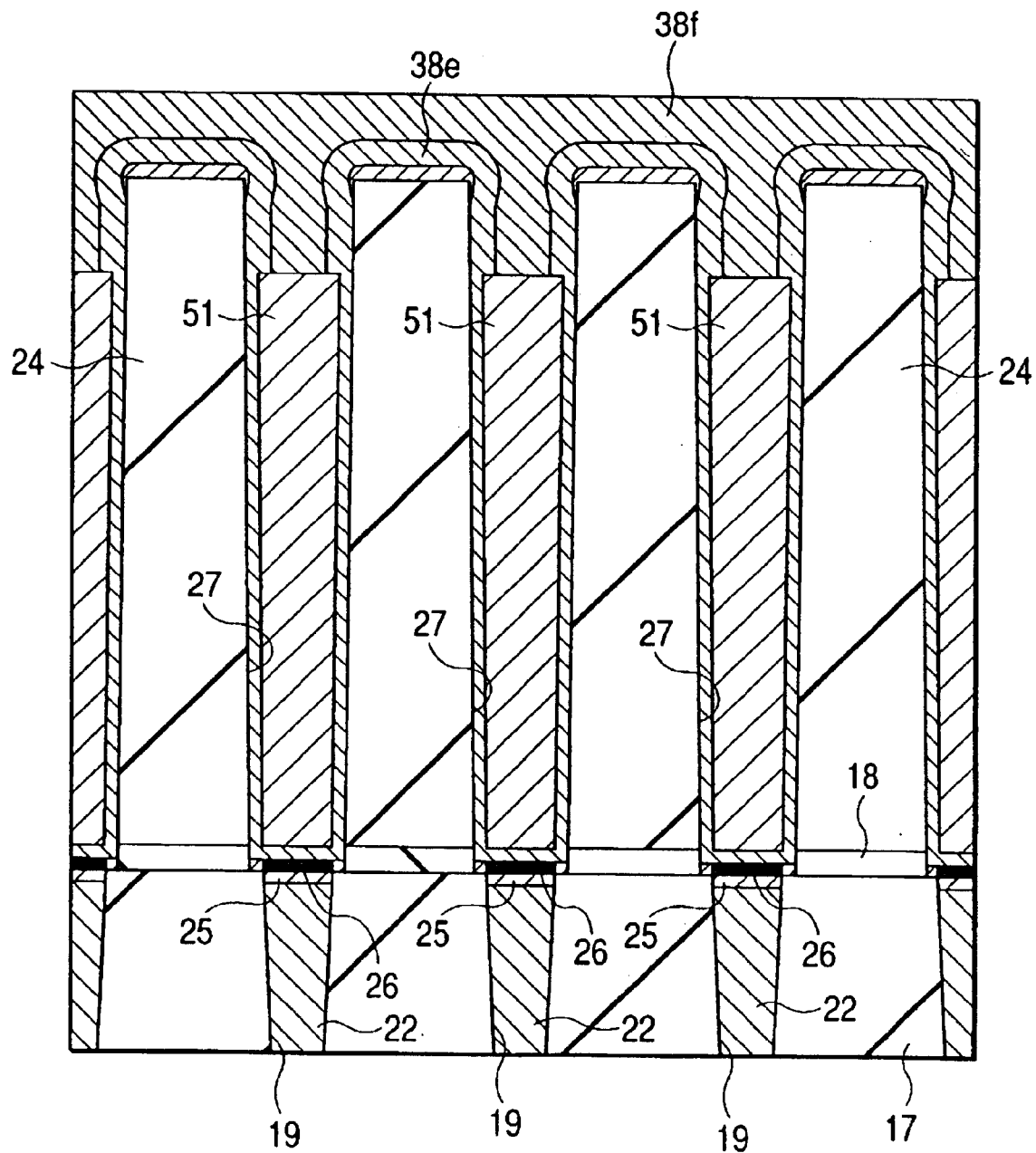
FIG. 102 is an enlarged cross sectional view for a main portion of a semiconductor substrate illustrating a process for manufacturing a DRAM as other embodiment according to this invention.

Then, as shown in FIG. 102, an Ru film 38f is deposited over the silicon oxide film 24 and in the inside of the groove 27 formed with the oxygen absorption layer 51 by a CVD method. The Ru film 38f is deposited at such a thickness as completely filling the inside of the groove 27.

Figure 103:
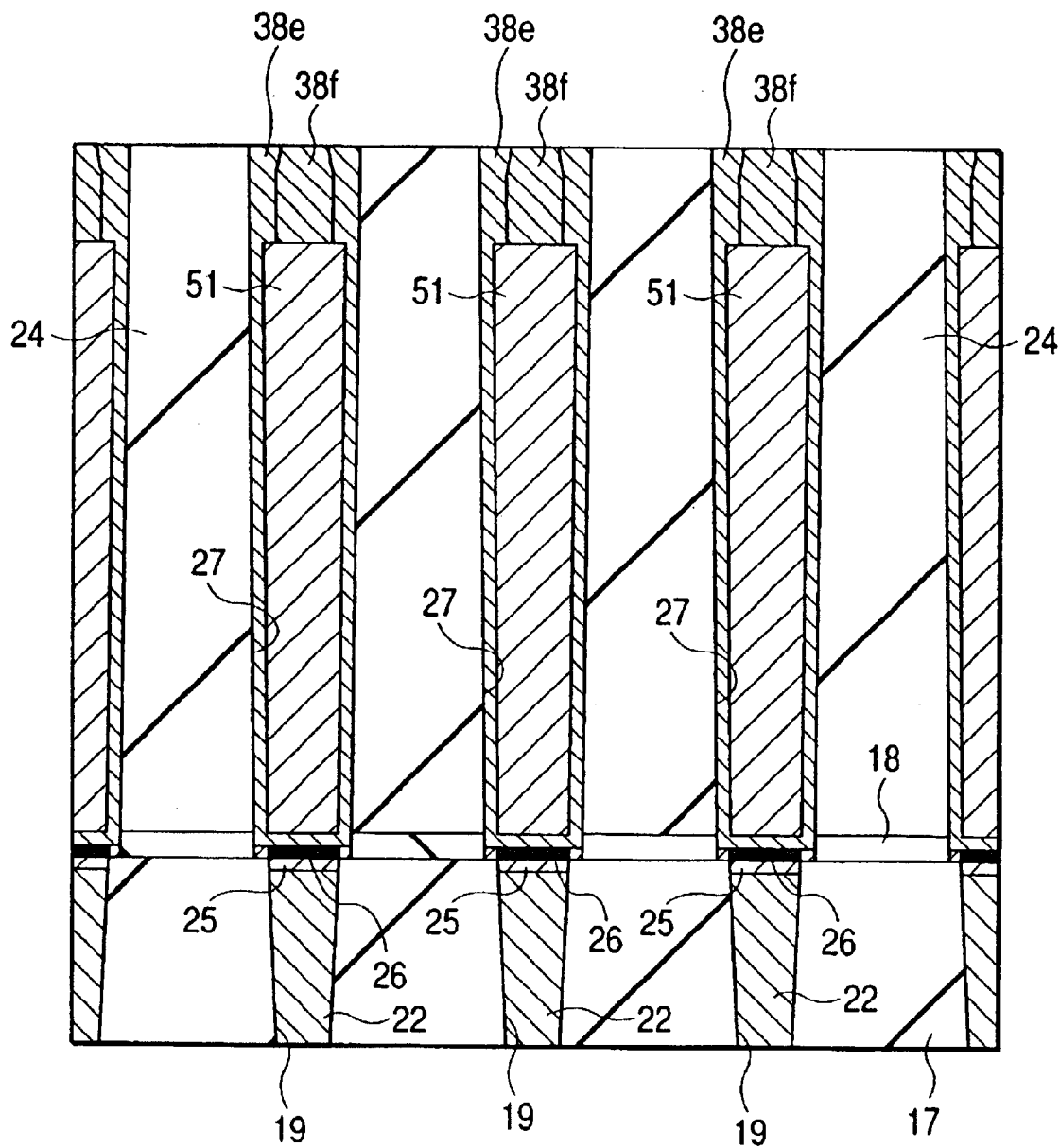
FIG. 103 is an enlarged cross sectional view for a main portion of a semiconductor substrate illustrating a process for manufacturing a DRAM as other embodiment according to this invention.
Figure 104:
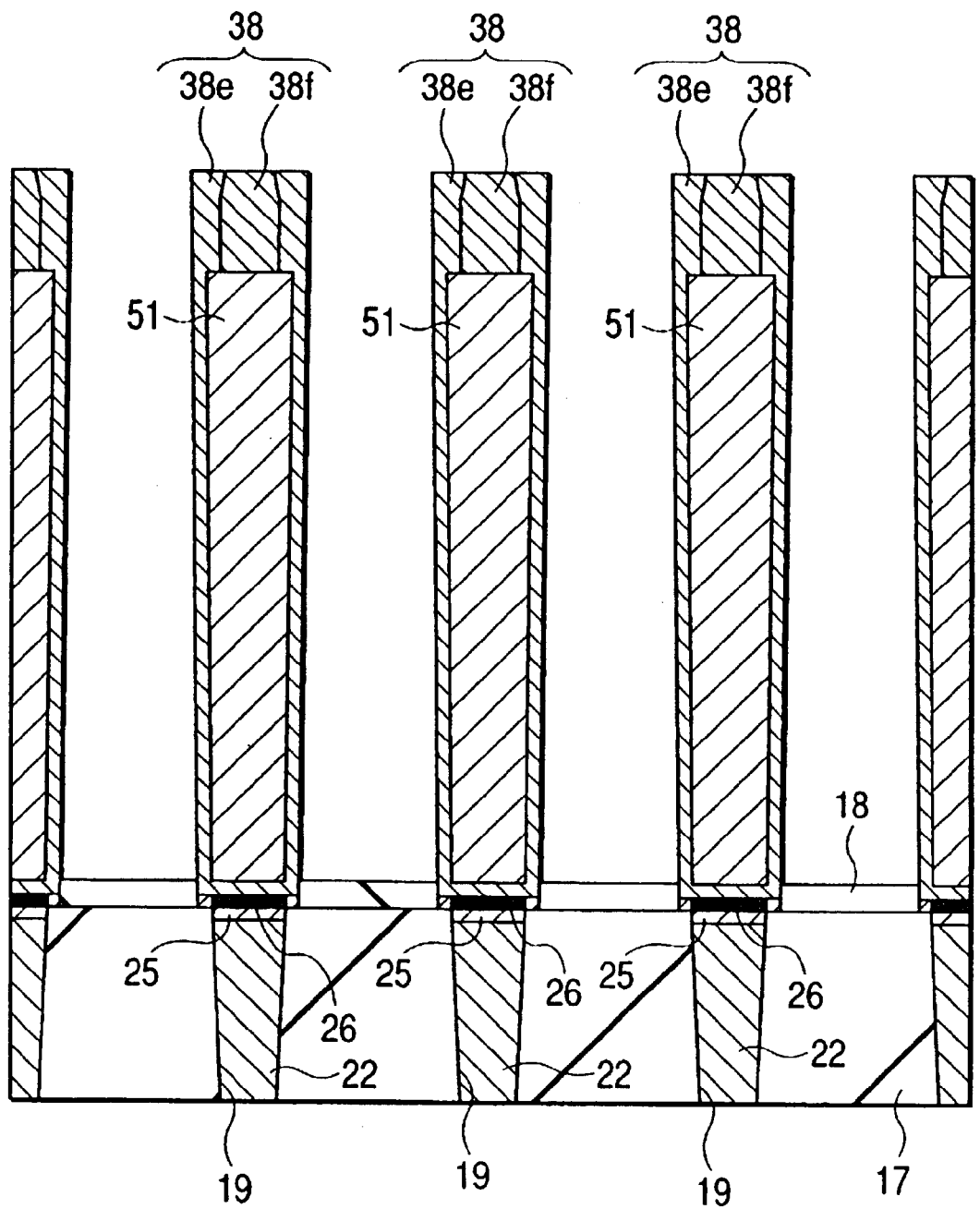
FIG. 104 is an enlarged cross sectional view for a main portion of a semiconductor substrate illustrating a process for manufacturing a DRAM as other embodiment according to this invention.

Then, as shown in FIG. 103, after removing the Ru films 38f and 38e outside of the groove 27 by dry etching, the silicon oxide film 24 is removed, as shown in FIG. 104, by wet etching to form a columnar lower electrode 38 in which the oxygen absorption layer 51 is buried at the inside.

Figure 105:
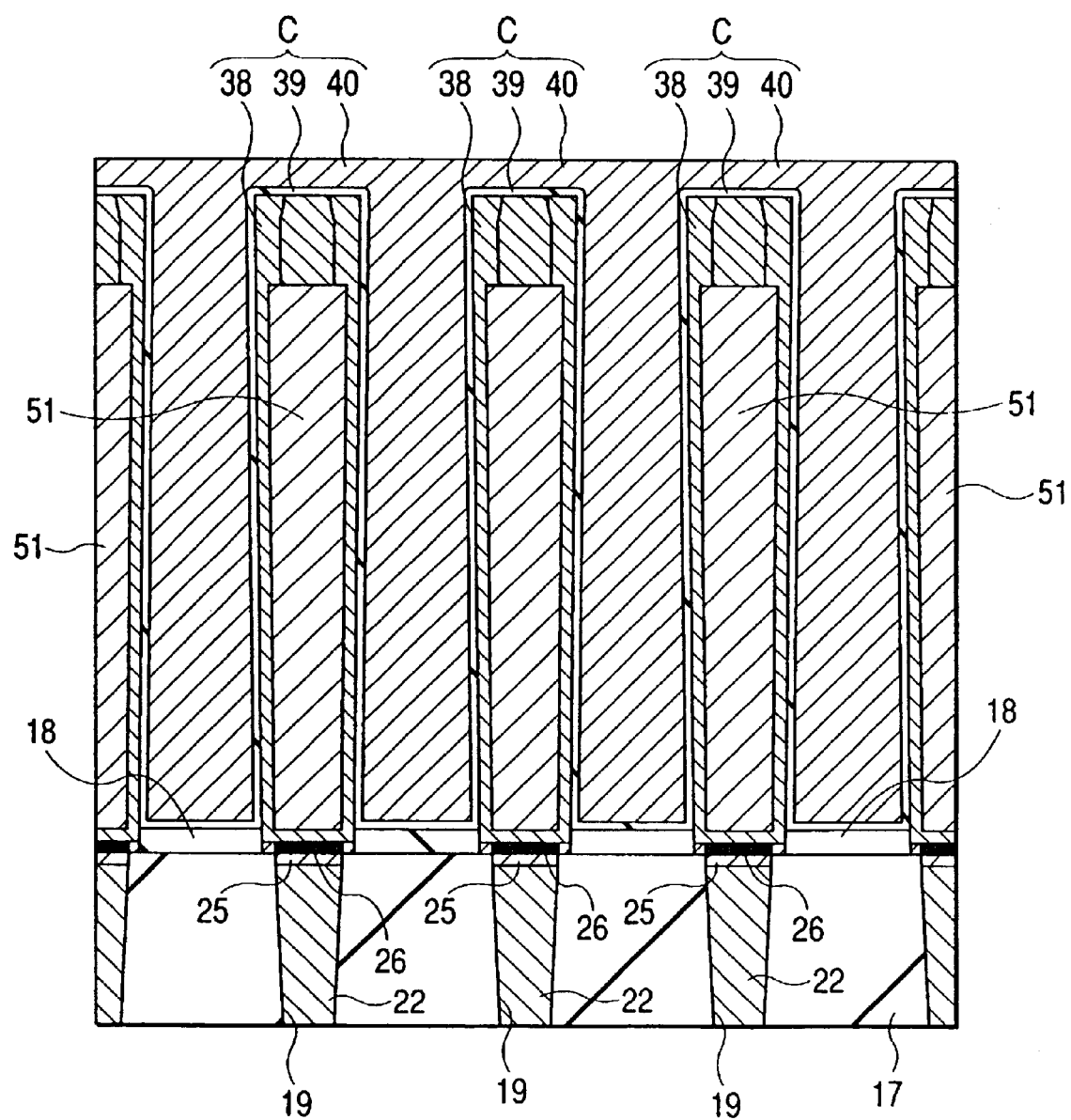
FIG. 105 is an enlarged cross sectional view for a main portion of a semiconductor substrate illustrating a process for manufacturing a DRAM as other embodiment according to this invention.

Then, as shown in FIG. 105, a dielectric film 39 is deposited thinly on the surface of the lower electrode 38 in the same method as in Embodiment 6 and, successively, heat treatment is applied in an oxygen atmosphere and then a TiN film or the like is deposited over the dielectric film 39 to form an upper electrode 40.

In this embodiment, since the oxygen absorption layer 51 is formed in the entire inside of the lower electrode 38, the barrier effect for oxygen can be improved more.

In an Embodiment 8, a method of further improving the adhesion between the Ru film and the silicon oxide film as the material for the lower electrode is to be explained.

Since the steps up to the step of forming the plug 22 in the inside of the through hole 19 in the manufacturing method of this embodiment (steps in FIG. 4 to FIG. 35) are identical with those in Embodiment 1, explanations therefore are omitted and only the subsequent steps are to be explained.

Figure 106:
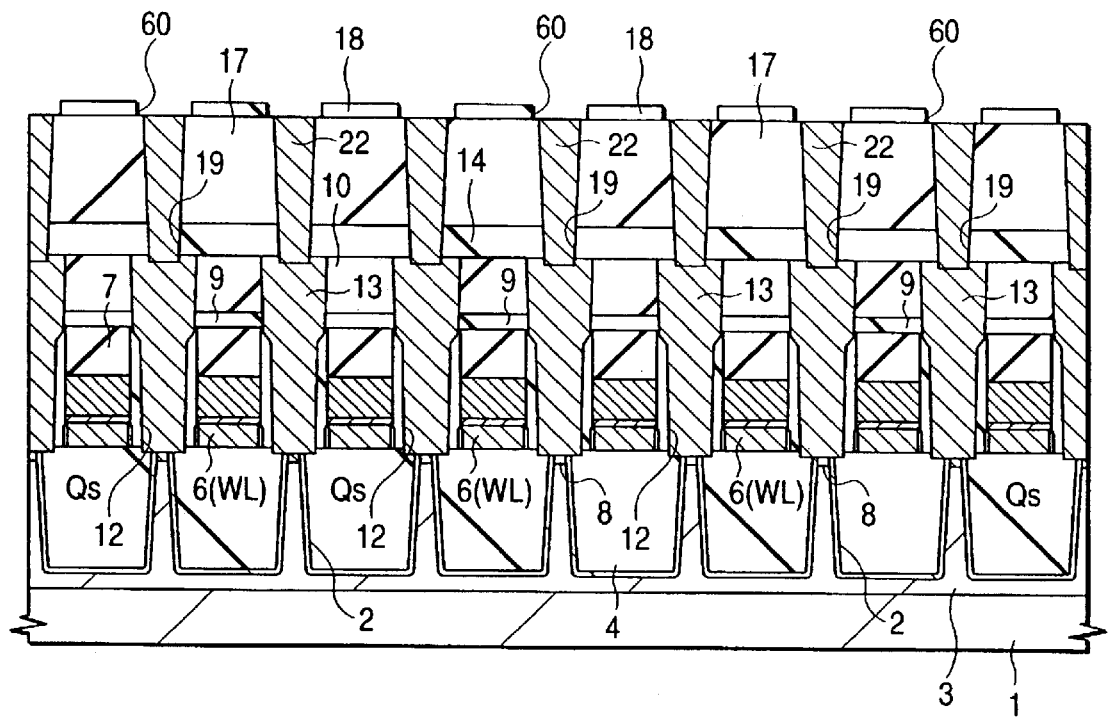
FIG. 106 is a cross sectional view for a main portion of a semiconductor substrate illustrating a process for manufacturing a DRAM as other embodiment according to this invention.

At first, succeeding to the step shown in FIG. 35, a silicon nitride film 18 is deposited to about 200 nm thickness over the silicon oxide film 17 as shown in FIG. 106 by a CVD method, and then a through hole 60 is formed in a silicon nitride film 18 over the through hole 19 by dry etching using a photoresist film as a mask (not illustrated).

Figure 107:
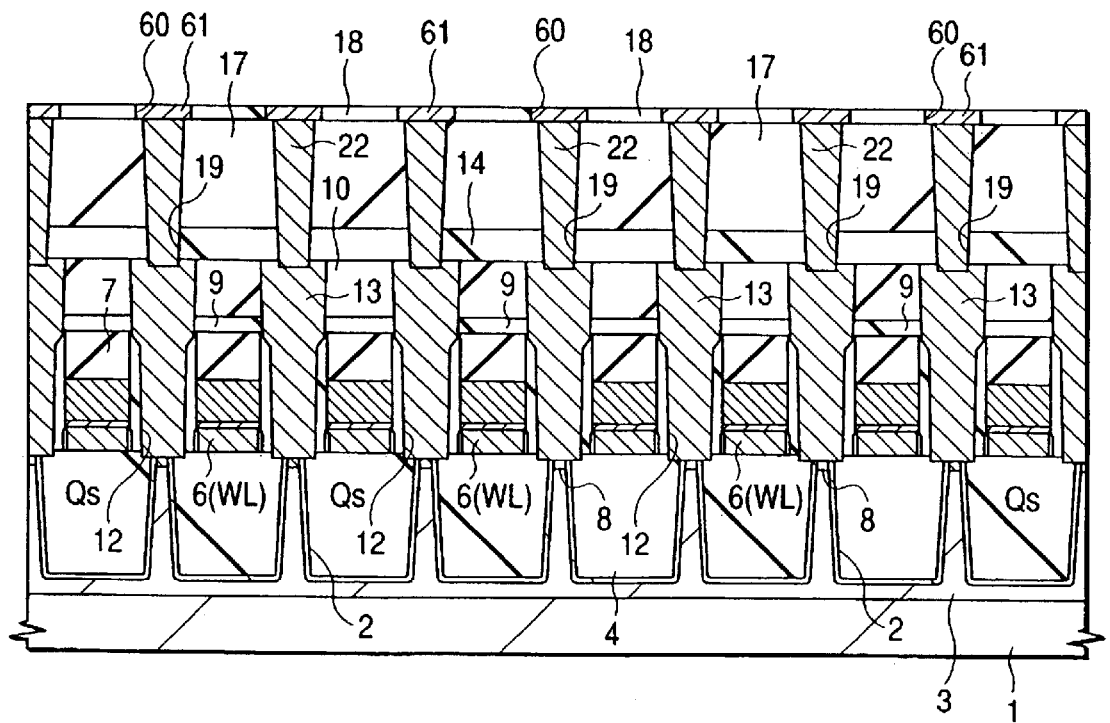
FIG. 107 is a cross sectional view for a main portion of a semiconductor substrate illustrating a process for manufacturing a DRAM as other embodiment according to this invention.

Then, as shown in FIG. 107, a TaN layer 61 is formed in the inside of the through hole 60. The TaN layer 61 is formed by depositing a TiN film over a silicon nitride film 18 including the inside of the through hole 60 by a sputtering method and then removing the TiN film outside of the through hole 60 by a chemical mechanical polishing method (or by etching back). The TaN layer 61 functions as a barrier layer for preventing occurrence of undesired silicon reaction at the boundary between the Ru constituting the lower electrode and polycrystal silicon constituting the plug 22.

Figure 108:
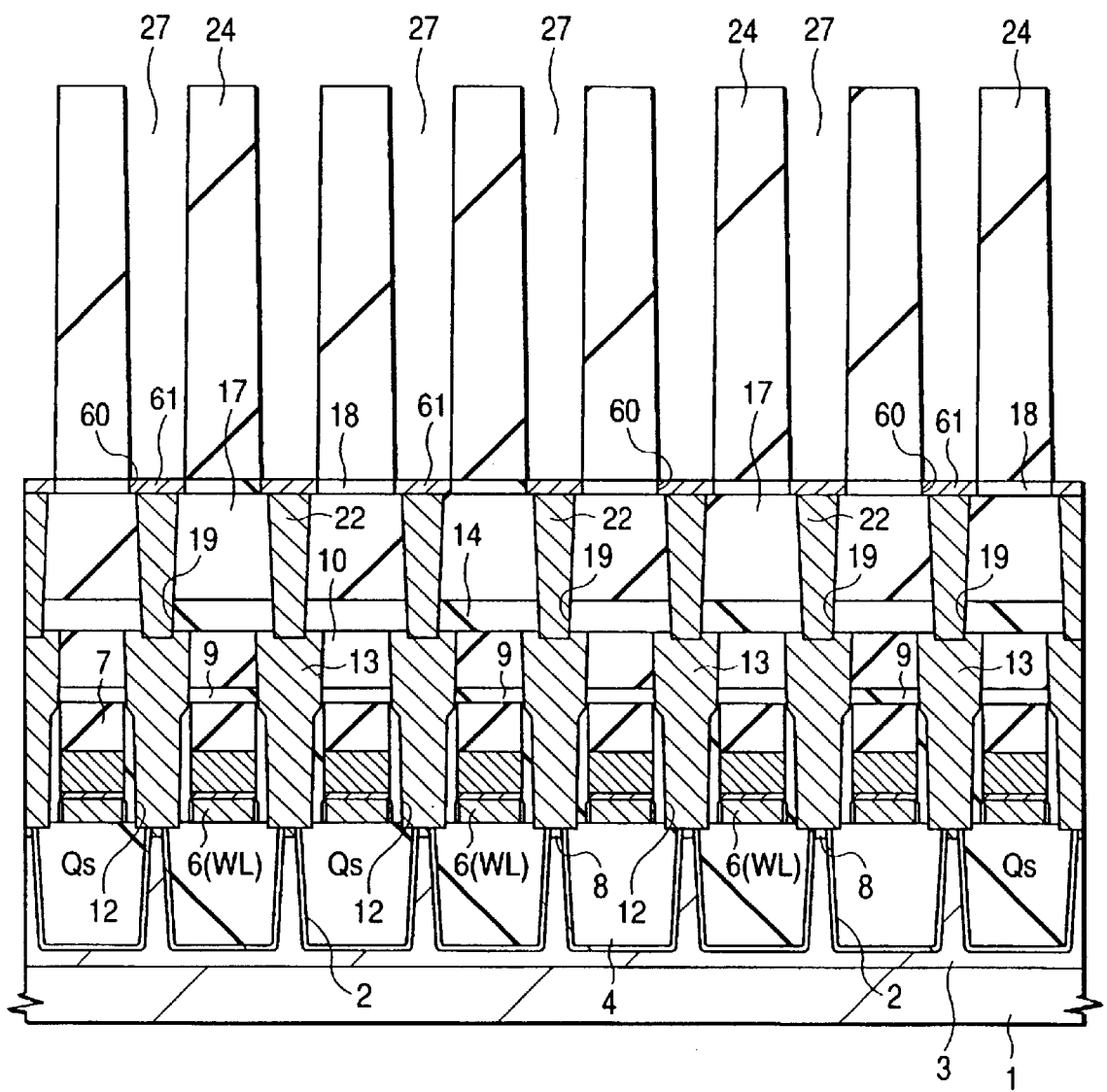
FIG. 108 is a cross sectional view for a main portion of a semiconductor substrate illustrating a process for manufacturing a DRAM as other embodiment according to this invention.

Then as shown in FIG. 108, after depositing a silicon oxide film 24 over a silicon nitride film 18 by a CVD method and optionally flattening the surface by a chemical mechanical polishing method, the silicon oxide film 24 is dry etched by using a photoresist as a mask (not illustrated) to form a groove 27 in which the surface of the TiN layer 61 in the through hole 60 is exposed at the bottom thereon.

Figure 109:
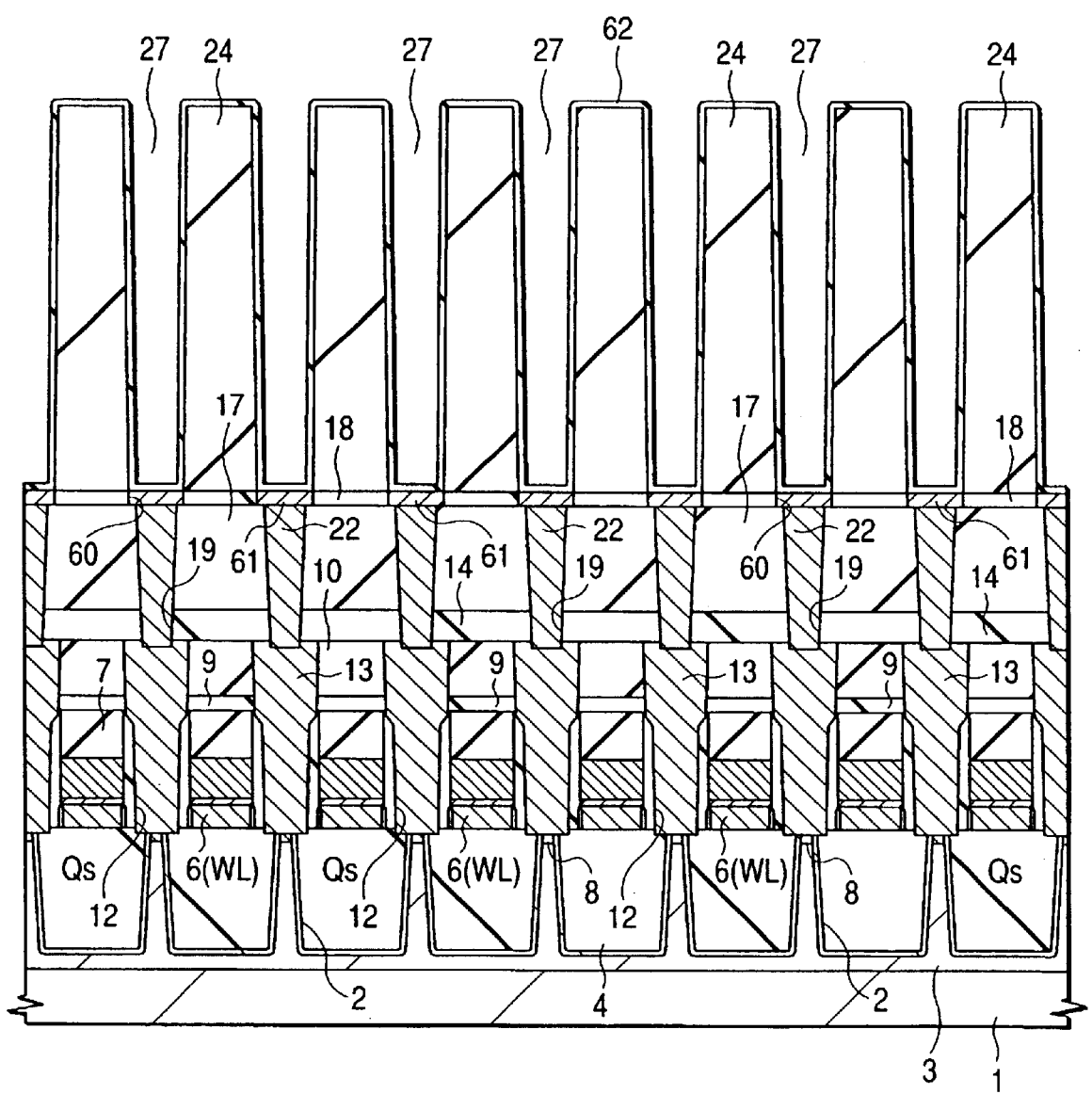
FIG. 109 is a cross sectional view for a main portion of a semiconductor substrate illustrating a process for manufacturing a DRAM as other embodiment according to this invention.

Then, as shown in FIG. 109, a tantalum oxide film 62 of about 10 nm thickness is deposited on the inner wall of the groove 27 and the surface of the silicon oxide film 24 by a CVD method. The tantalum oxide layer is deposited, for example, using pentaethoxy tantalum ($Ta(OC_2H_5)_5$) and oxygen as a starting gas and under the condition at a temperature of 400° C. to 450° C.

Figure 110:
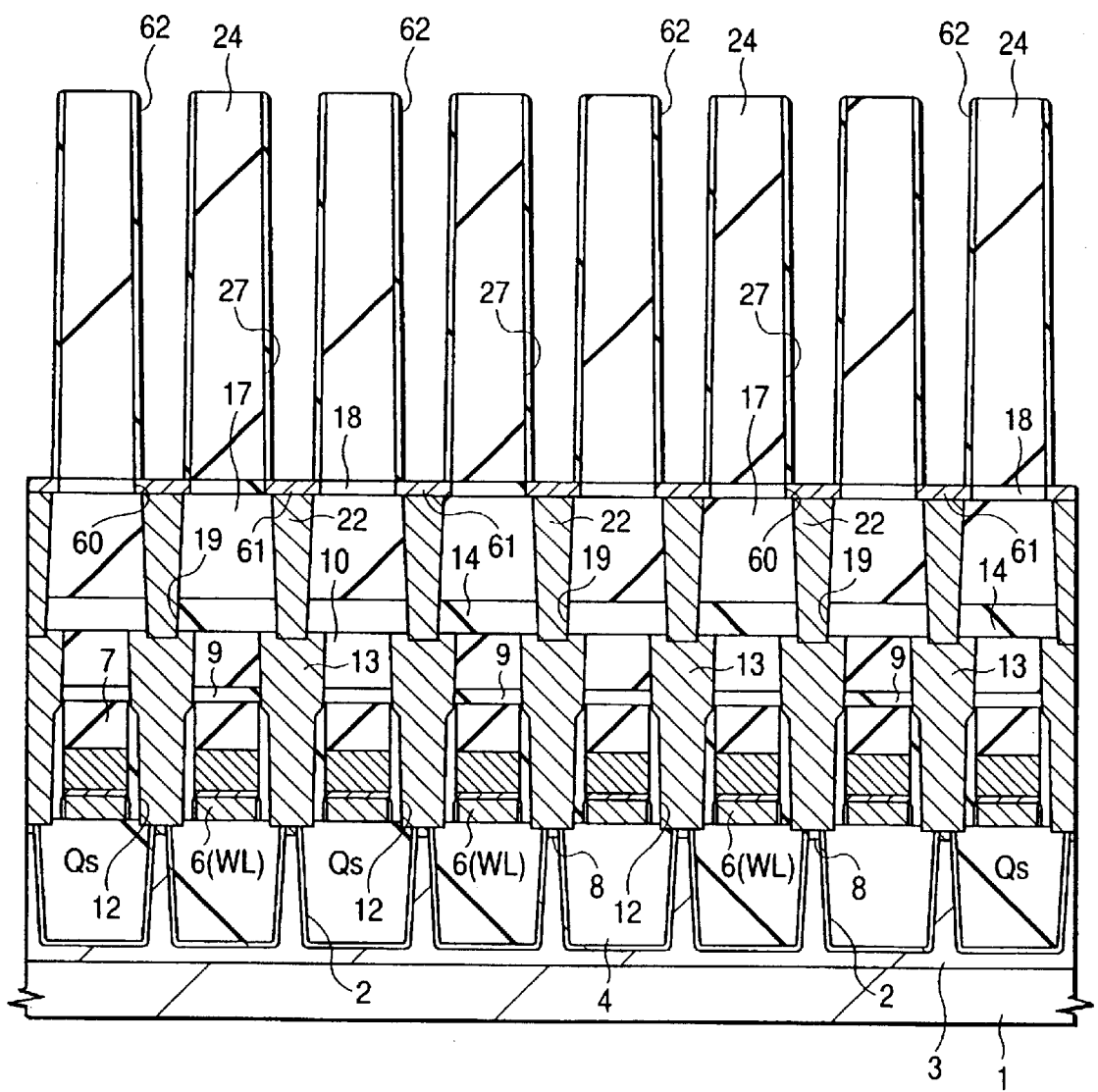
FIG. 110 is a cross sectional view for a main portion of a semiconductor substrate illustrating a process for manufacturing a DRAM as other embodiment according to this invention.

Then, as shown in FIG. 110, the tantalum film oxide film 61 on the bottom of the groove 27 and on the surface of the silicon oxide film 24 by an anisotropic dry etching to leave the tantalum oxide film 62 only on the side wall of the groove 27. Subsequently, a heat treatment about at 700° C. for 1 min is conducted to degas impurities in the tantalum oxide film 62. This heat treatment may also be conducted just after the deposition of the tantalum oxide film 62. Since the tantalum oxide film 62 is an insulative material, even when removal of the tantalum oxide film 62 on the silicon oxide film 24 is insufficient, there is no worry that the lower electrodes 28 formed on the inner wall of the groove 27 in the subsequent step are short-circuited by way of an etching residue of the tantalum oxide film 62 remaining on the silicon oxide film 24.

Figure 111:
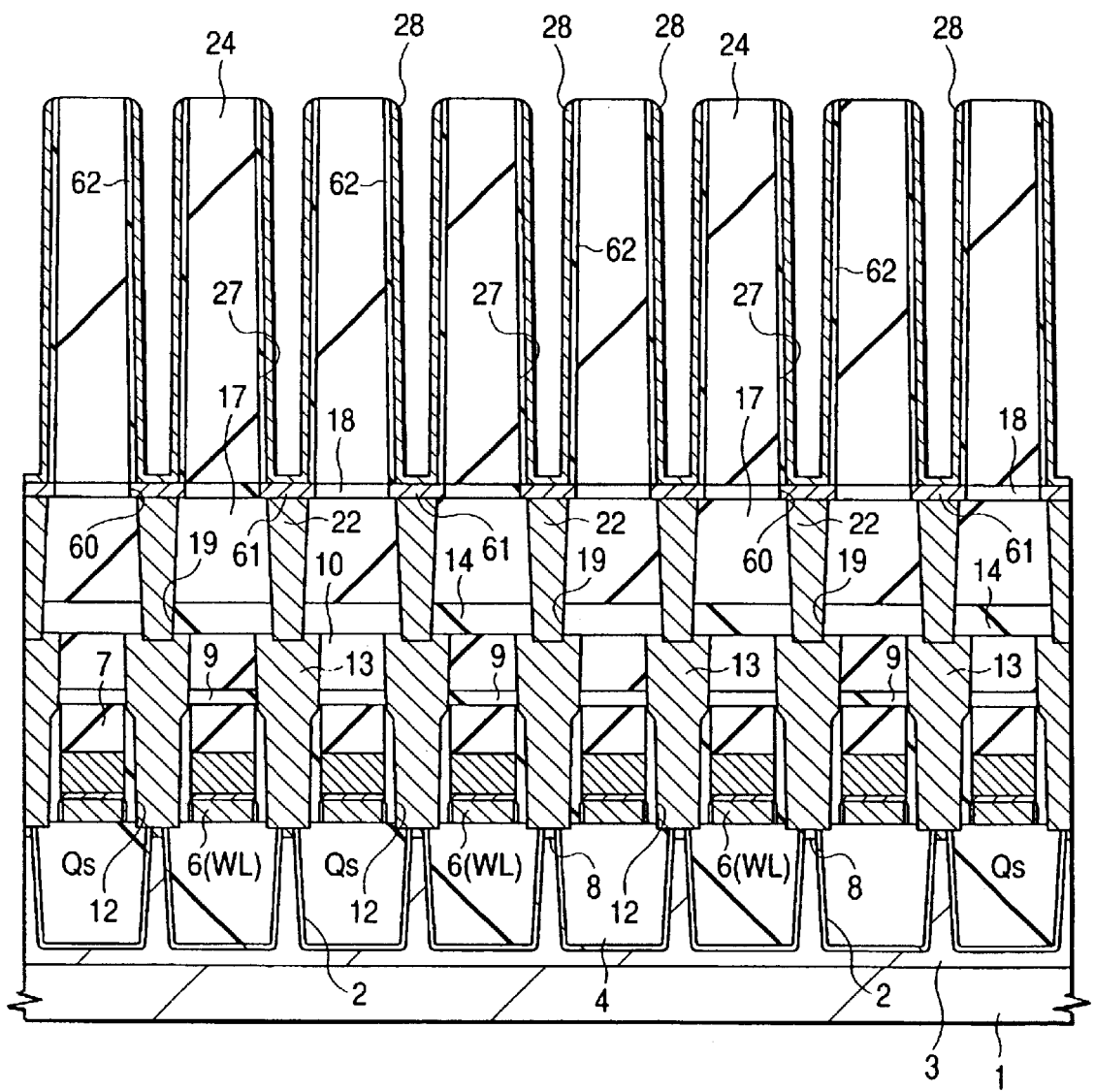
FIG. 111 is a cross sectional view for a main portion of a semiconductor substrate illustrating a process for manufacturing a DRAM as other embodiment according to this invention.

Then, as shown in FIG. 111, a lower electrode 28 comprising Ru is formed on the inner wall of the groove 27. The lower electrode 28 is formed, like that in the Embodiment 1, by depositing a thin Ru film of about 20 nm thickness over the silicon oxide film 24 and in the inside of the groove 27 by using a sputtering method and a CVD method and, successively, burying an insulating film such as a photoresist in the inside of the groove 27 and then the Ru film is removed by drying etching. The Ru film deposited by the sputtering method is intended to form a seed and the Ru film deposited by the CVD method constitutes a substantial lower electrode material.

Figure 112:
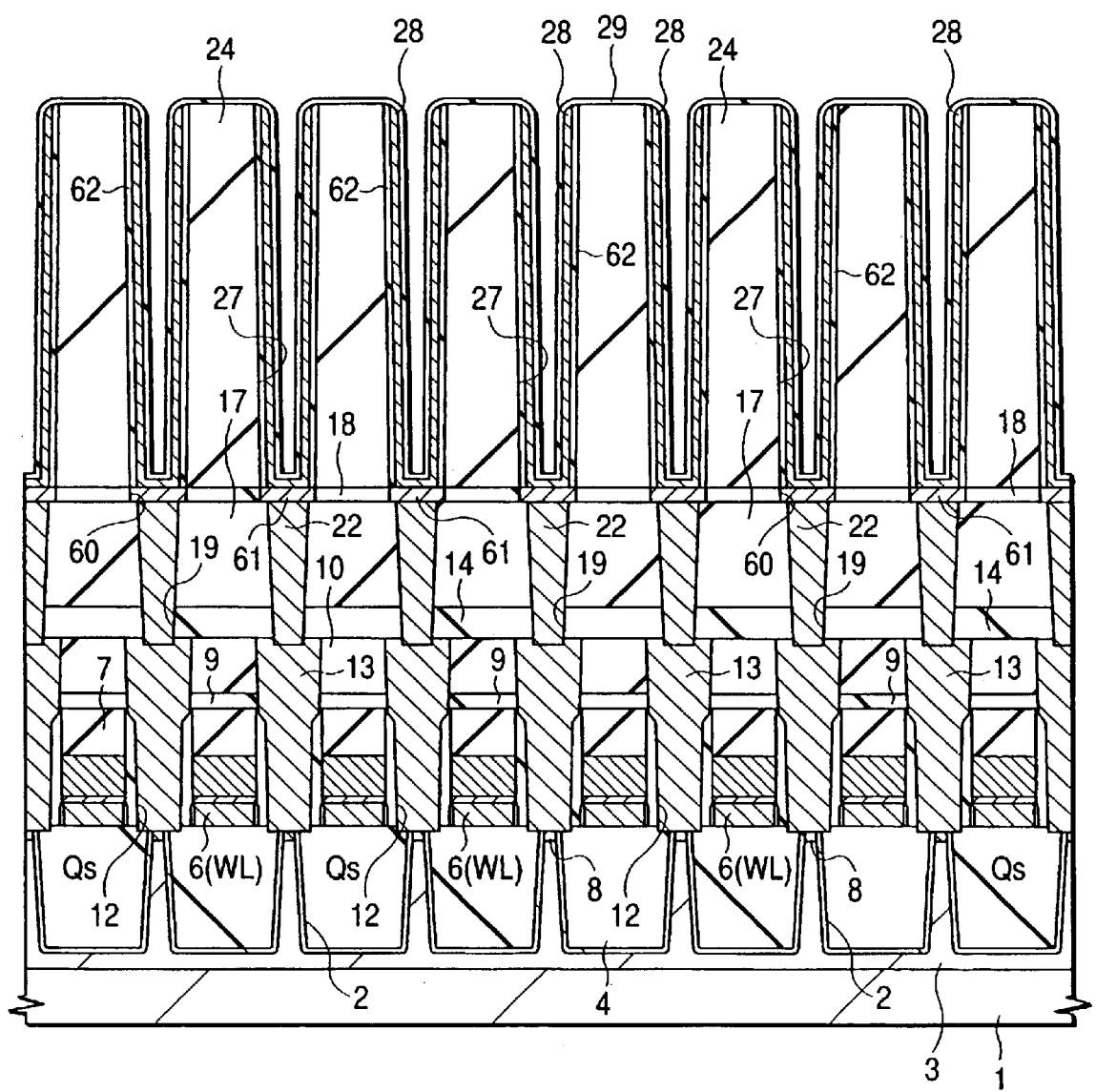
FIG. 112 is a cross sectional view for a main portion of a semiconductor substrate illustrating a process for manufacturing a DRAM as other embodiment according to this invention.

Then, for densifying the Ru film constituting the lower electrode 28, after conducting a heat treatment about at 700° C. for one min in vacuum, a dielectric film 29 comprising tantalum oxide of about 10 nm thickness is deposited on the inner wall of the groove 27 and on the surface of the silicon oxide film 24 as shown in FIG. 112, and, successively, a heat treatment at 550° C. to 700° C. is conducted in an oxygen atmosphere for crystallization of the film and improvement of the film quality. In this case, while the tantalum oxide film 62 and the dielectric film 29 are sometimes in contact with each other at the upper end on the side wall of the groove 27, there is no troubles since both of them are made of an identical insulation material.

Figure 113:
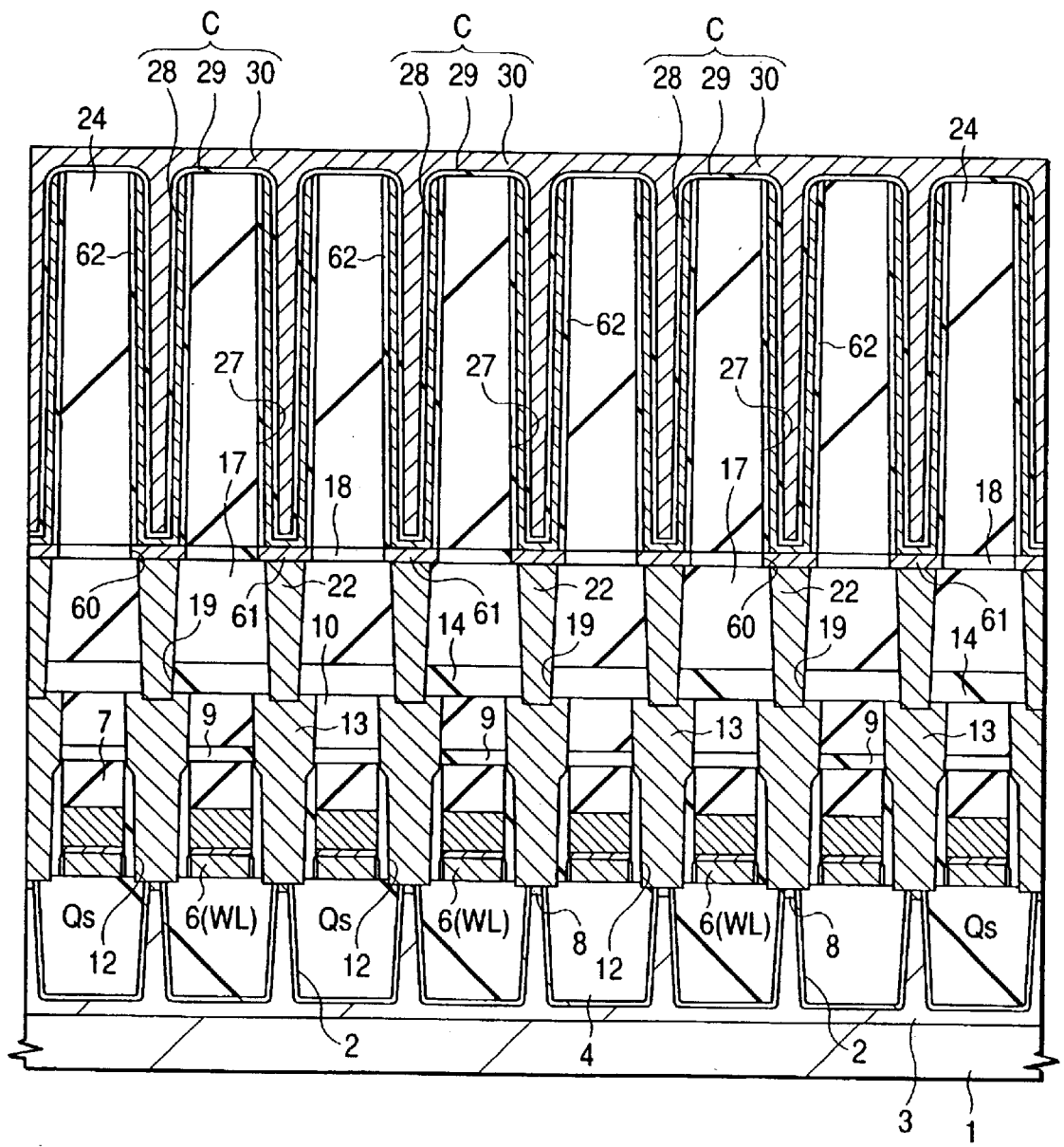
FIG. 113 is a cross sectional view for a main portion of a semiconductor substrate illustrating a process for manufacturing a DRAM as other embodiment according to this invention.

Subsequently, as shown in FIG. 113, an upper electrode 30 is formed over the dielectric film 29 in the same method as in the Embodiment 1 to complete an information storage capacitance device C constituted with the lower electrode 28, the dielectric film 29 and the upper electrode 30.

Figure 114:
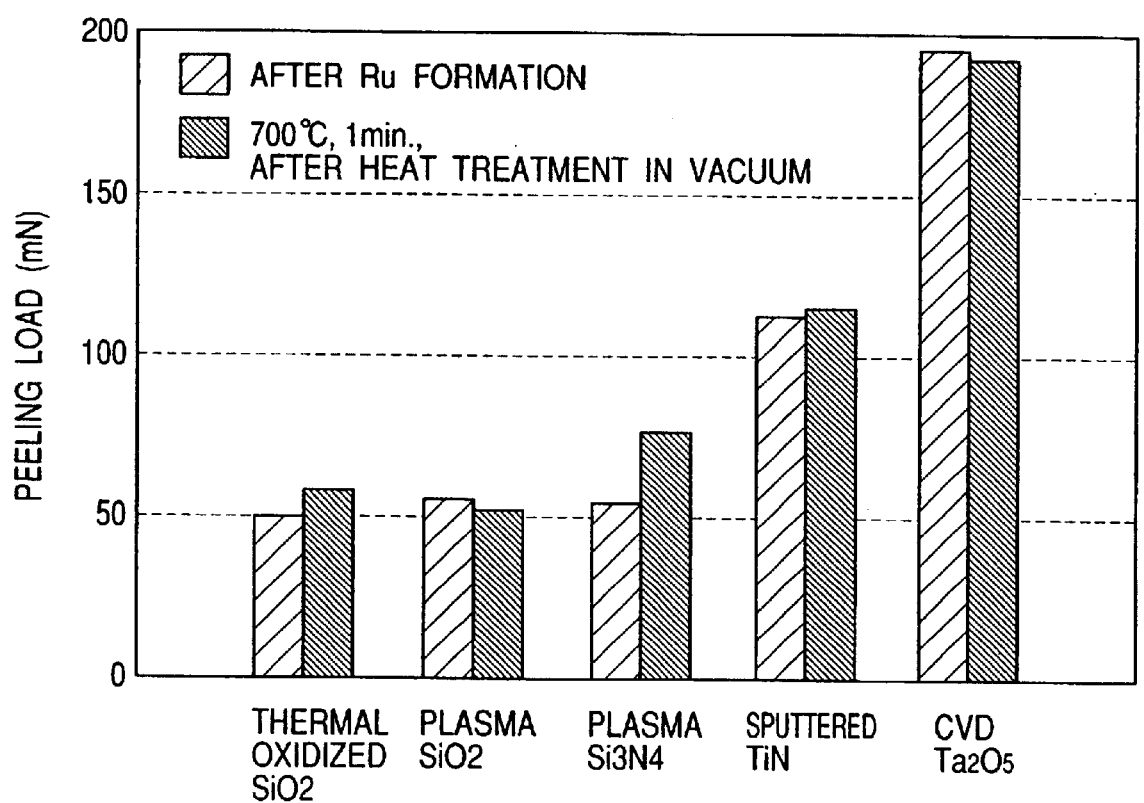
FIG. 114 is a graph showing adhesion between an Ru film constituting a lower electrode and various kinds of underlayer materials.

FIG. 114 is a graph showing the result of the examination for adhesion between the Ru film constituting the lower electrode 28 and various kinds of underlayer materials. The underlayer materials used herein include five types, namely, a silicon oxide film formed by thermal oxidation, a silicon oxide film deposited by a plasma CVD method (corresponding to the silicon oxide film 24 used in this invention), a silicon nitride film deposited by a plasma CVD method, a TiN film deposited by a sputtering method and a tantalum oxide film deposited by a CVD method.

An Ru film was deposited over each of the five types of the underlayer materials by a sputtering method, and a scratch test was conducted by abutting a probe under a load against the surface and varying the load. The graph shows the extent of the peeling, relatively, depending on the load applied to the probe when the Ru film is peeled in this scratch test in which the abscissa denotes five types of underlayer materials and the ordinate denotes the load under which the Ru film is peeled. Further, in this scratch test, evaluation was made for the Ru film just after the deposition and the Ru film densified by a heat treatment at 700° C. for one min.

As a result of the scratch test, the Ru film on the two types of silicon oxide films was peeled under the load of about 50 mN. Adhesion of the Ru film on the silicon nitride film is somewhat improved by the densifying treatment but the film just after the deposition was peeled at about 50 nm like that the Ru film on the silicon oxide film. The Ru film on the TiN film was peeled under a load slightly larger than 100 nm. On the contrary, the Ru film on the tantalum oxide film was peeled at a load as large as 200 mN and it was found to have a practically sufficient adhesion.

As described above, when the lower electrode 28 comprising Ru is formed on the inner wall of the groove 27 apertured in the silicon oxide film 24, the adhesion strength between the Ru film and the underlayer is remarkably improved by previously forming the tantalum oxide film 62 on the inner wall of the groove 27. Since this can reliably prevent disadvantage that the lower electrode 28 is peeled by the heat treatment upon densifying the Ru film or by the heat treatment upon crystallizing the dielectric film (tantalum oxide film), production yield of DRAM in which the lower electrode 28 for the information storage capacitance device C is constituted with the Ru film can be improved.

Figure 115:
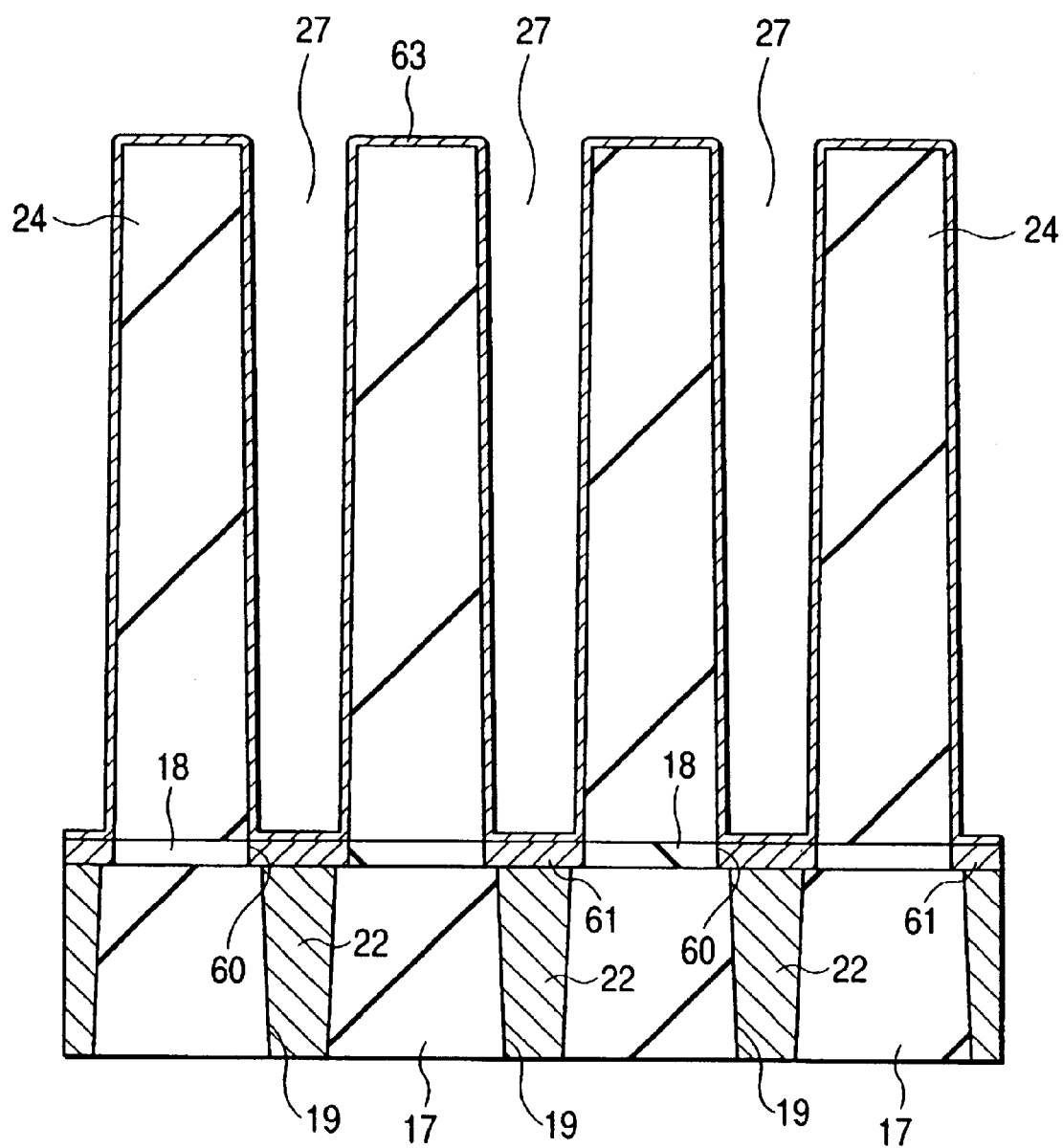
FIG. 115 is an enlarged cross sectional view for a main portion of a semiconductor substrate illustrating a process for manufacturing a DRAM as other embodiment according to this invention.

As the underlayer materiel of the lower electrode 28 comprising Ru, TiN can also be used although the adhesion strength is lower compared with tantalum oxide. In this case, succeeding to the step shown in FIG. 108, a TiN film 63 of about 10 nm thickness is deposited on the inner wall of the groove 27 and on the surface of the silicon oxide 24 as shown in FIG. 115. The TiN film 63 is deposited by a CVD method using titanium tetrachloride (TICl$_4$) and ammonia (NH$_3$) as the starting gas.

As the underlayer material of the lower electrode 28 comprising Ru, those materials that can be deposited by the CVD method such as TaN (tantalum nitride) or TiO$_2$ (titanium oxide) can be used in addition to tantalum oxide or TiN.

Figure 116:
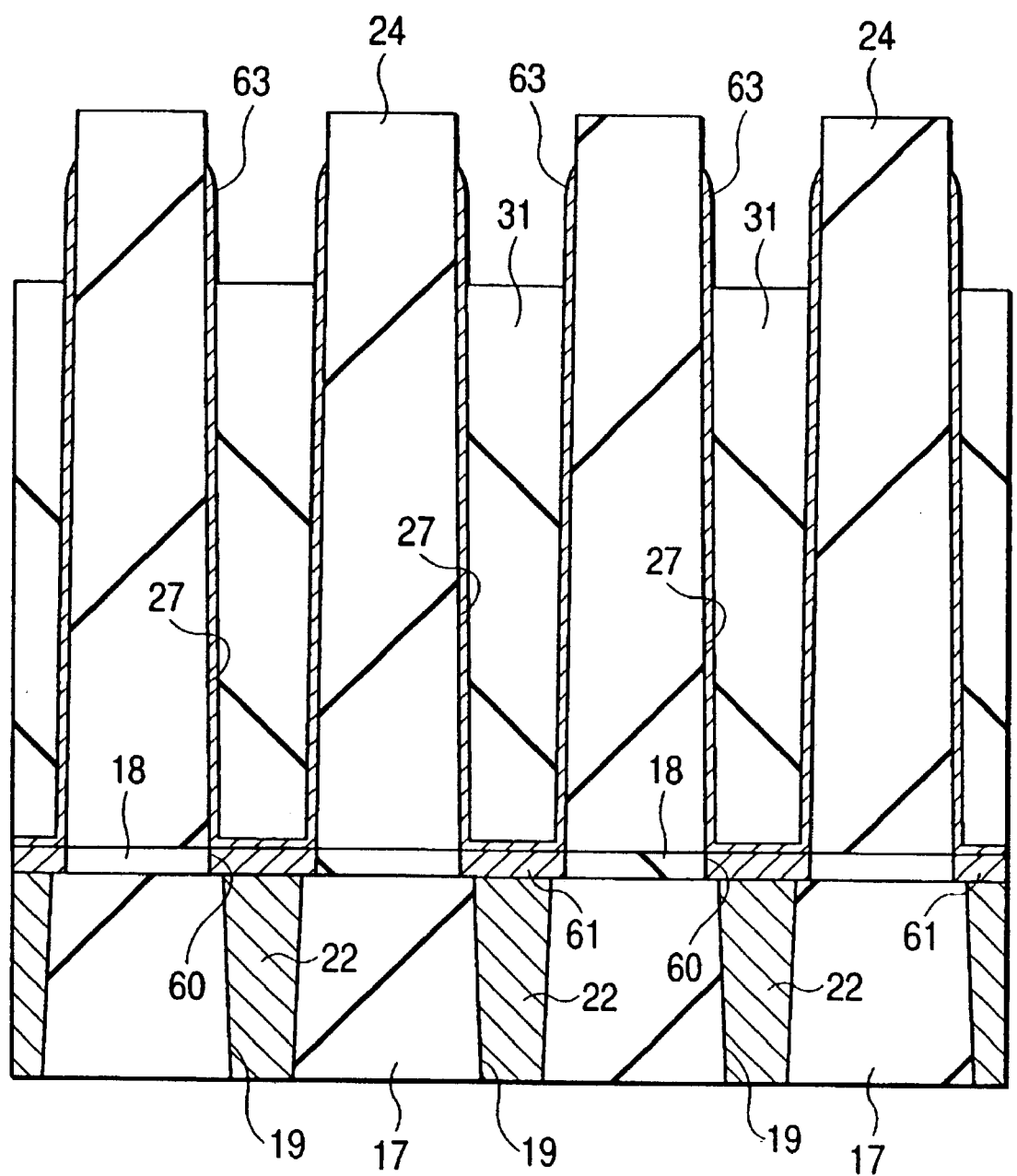
FIG. 116 is an enlarged cross sectional view for a main portion of a semiconductor substrate illustrating a process for manufacturing a DRAM as other embodiment according to this invention.

Then as shown in FIG. 116, after burying an insulating film 31 such as a photoresist in the inside of the groove 27, the TiN film 63 outside of the groove 27 is removed by dry etching. Since the TiN film 63 is a conductive material, it can be left at the bottom (surface of the TiN layer 62) of the groove 27 different from the case of using the tantalum oxide film 62. The TiN film 63 left at the bottom of the groove 27 functions, together with the TiN underlayer 62, as a barrier layer for preventing occurrence of undesired siliciding reaction at the boundary between the lower electrode 28 and the plug 22. Further, when the TiN film 63 on the surface of the silicon oxide film 24 is removed, the TiN film 63 at the upper end on the side wall of the groove 27 is retracted downwardly. This can avoid contact with the dielectric film (tantalum oxide film) 29 to be deposited subsequently and prevent increase of the leak current.

Figure 117:
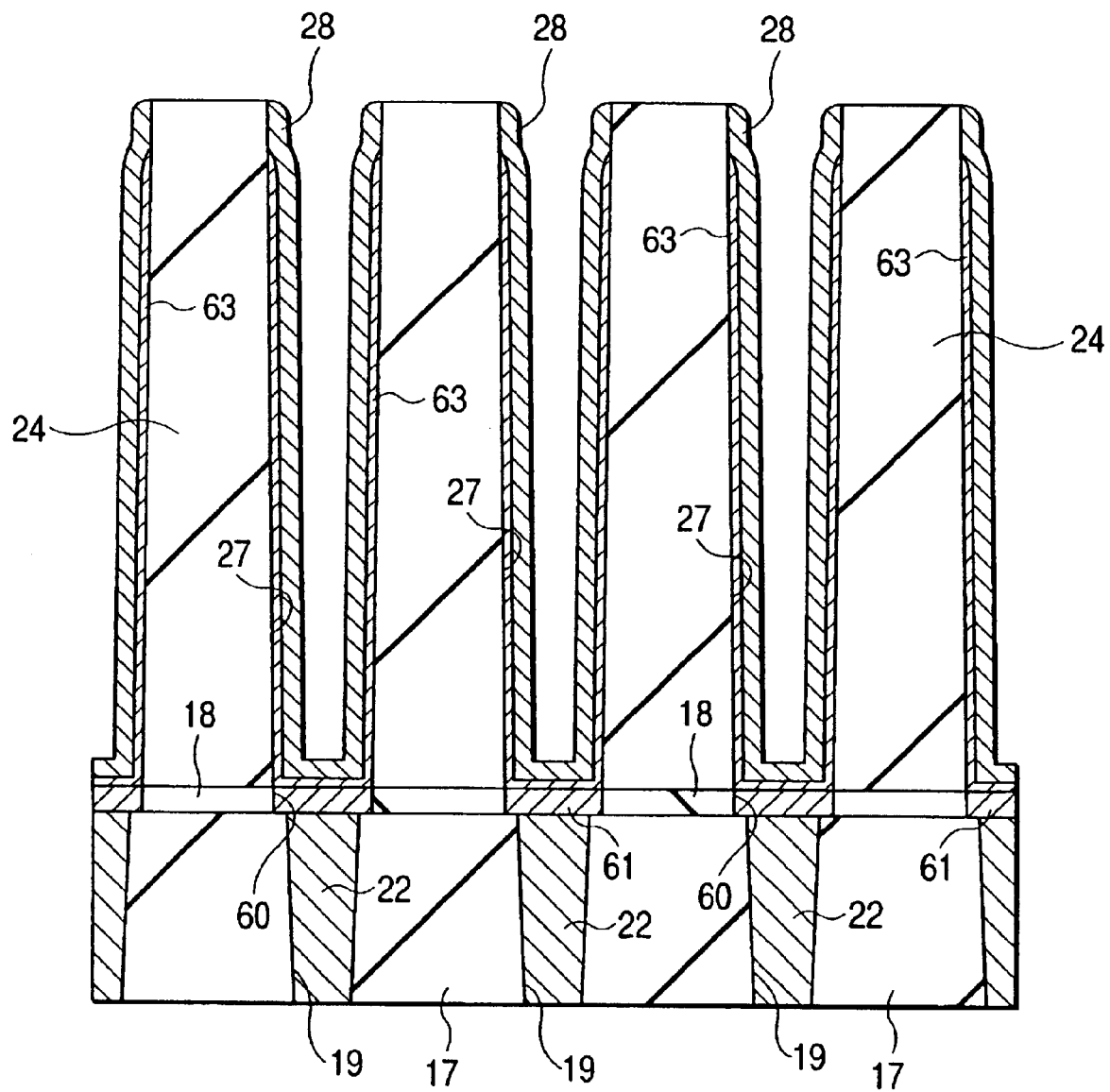
FIG. 117 is an enlarged cross sectional view for a main portion of a semiconductor substrate illustrating a process for manufacturing a DRAM as other embodiment according to this invention.
Figure 118:
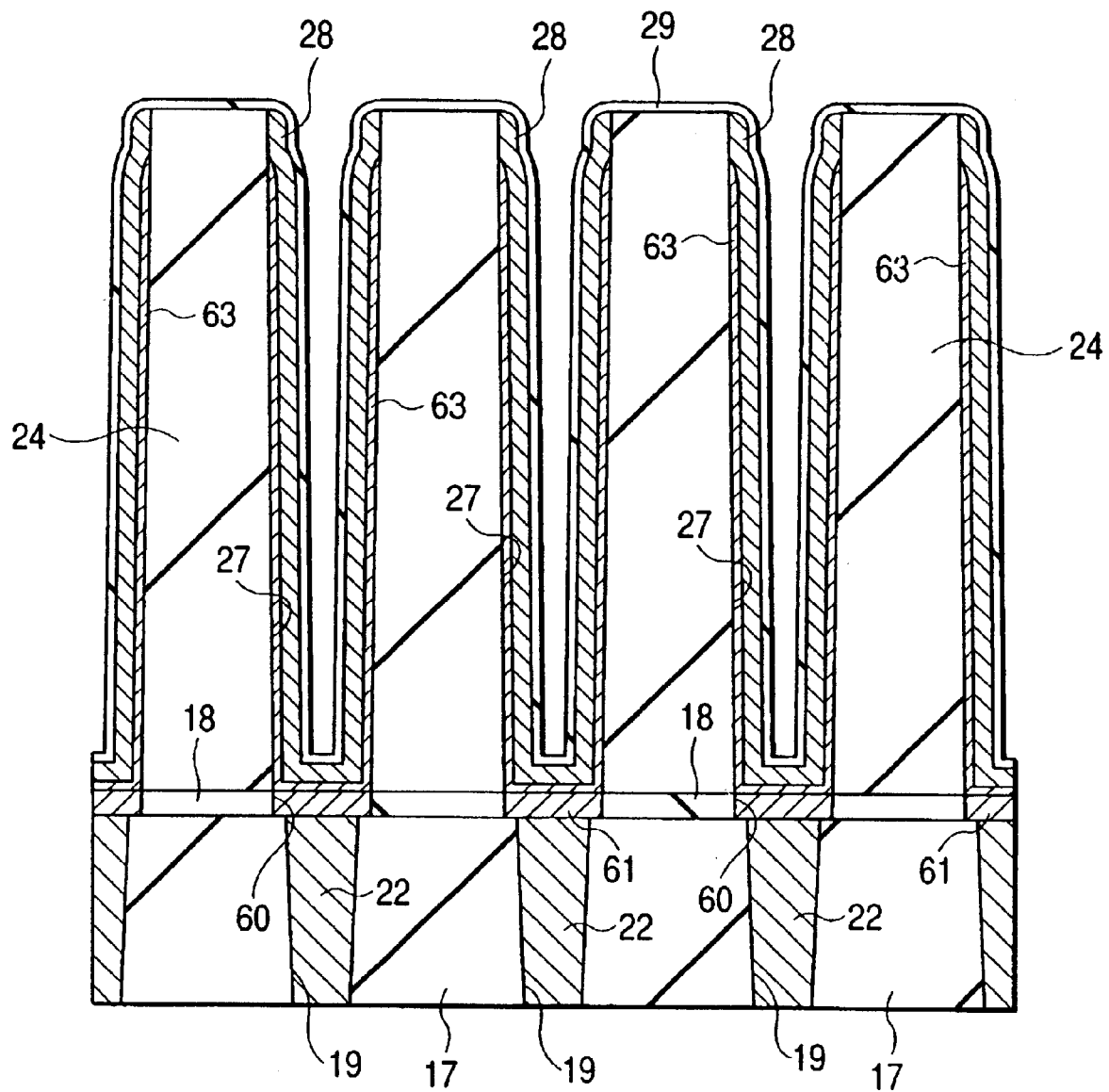
FIG. 118 is an enlarged cross sectional view for a main portion of a semiconductor substrate illustrating a process for manufacturing a DRAM as other embodiment according to this invention.
Figure 119:
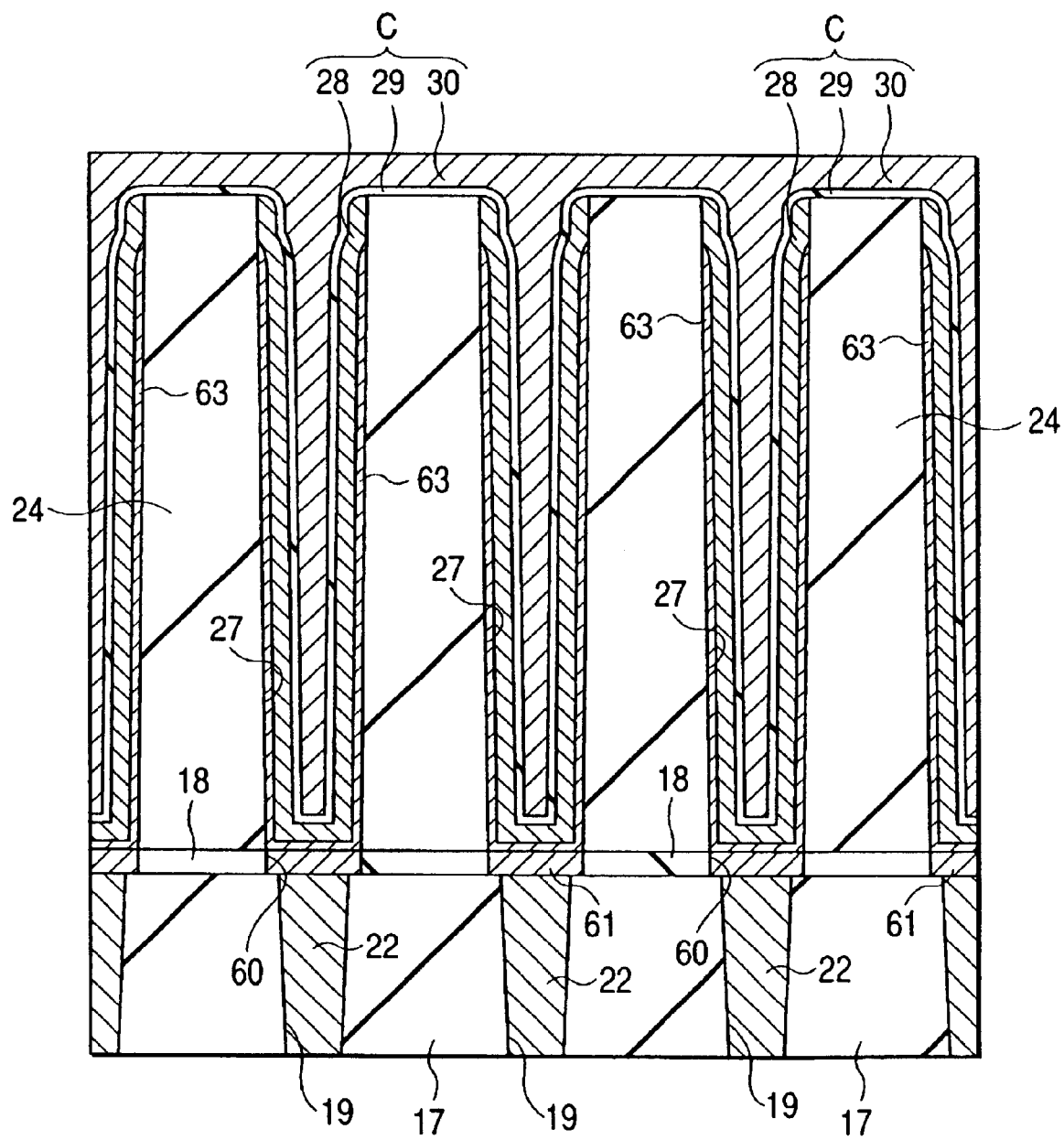
FIG. 119 is an enlarged cross sectional view for a main portion of a semiconductor substrate illustrating a process for manufacturing a DRAM as other embodiment according to this invention.

Then, after removing the insulating film 31 in the inside of the groove 27 as shown in FIG. 117, a lower electrode 28 is formed in the inside of the groove 27 by the method described above and, successively, as shown in FIG. 118, after depositing the tantalum oxide film over the lower electrode 28 to form a dielectric film 29, an upper electrode 30 is formed over the dielectric film 29 as shown in FIG. 119, to complete an information storage capacitance device C.

Since the steps up to step of forming a TaN layer 61 in the inside of the through hole 60 in the manufacturing of an Embodiment 9 are identical with those in the Embodiment 8, explanation therefor is omitted and only the subsequent steps are to be explained.

Figure 120:
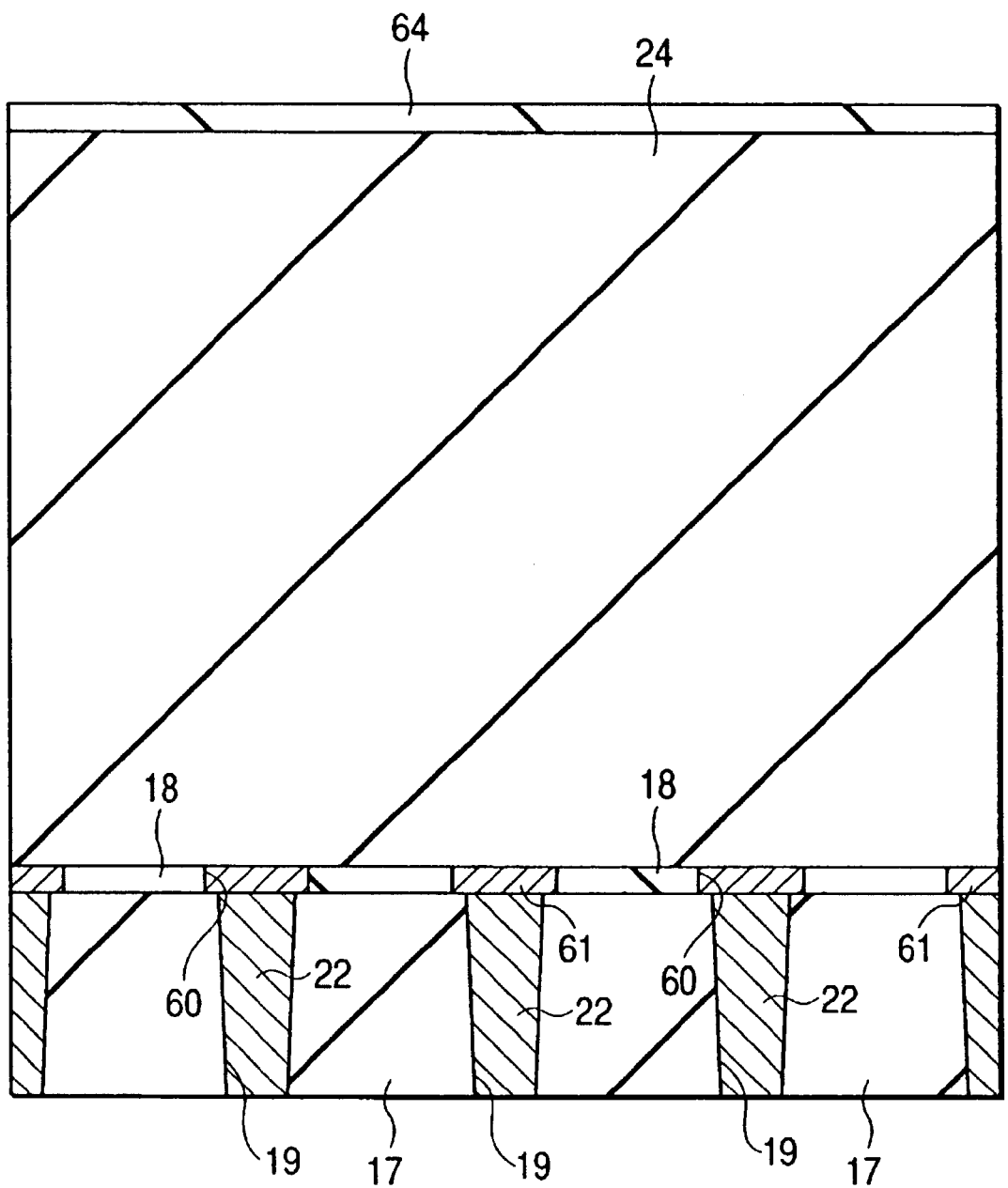

At first, succeeding to the steps shown in 107, after depositing a silicon oxide film 24 over a silicon nitride film 18 as shown in FIG. 120 by a CVD method and, optionally, flattening the surface by a chemical mechanical polishing method, a tantalum oxide film 64 of about 50 nm thickness is deposited by a CVD method over the silicon oxide film 24.

Figure 121:
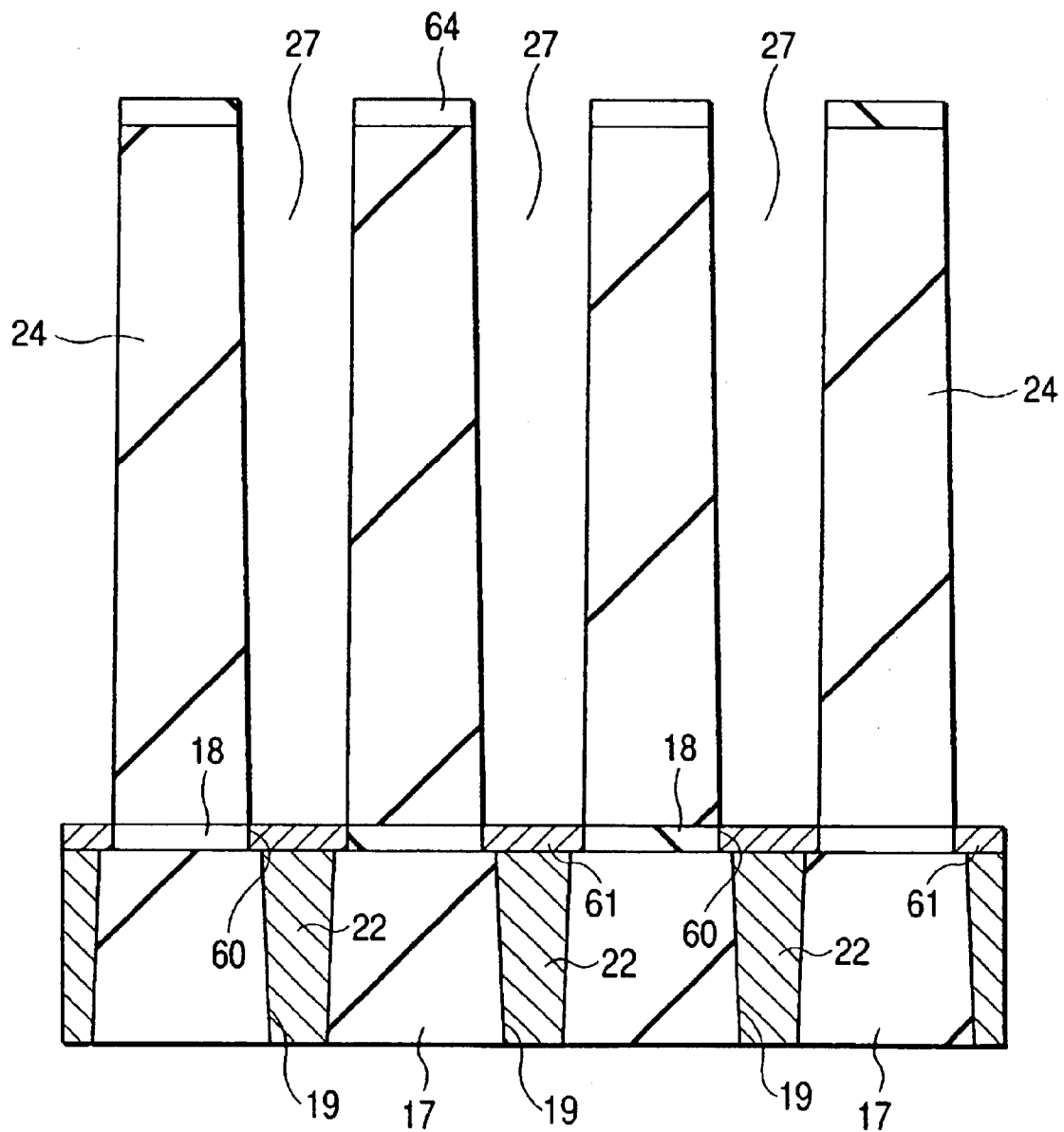

Then, as shown in FIG. 121, the tantalum oxide film 64 and the silicon oxide film 24 are dry etched by using a photoresist film as a mask (not illustrated) to form a groove 27 in which the surface of the TiN layer 61 in the through hole 60 is exposed at the bottom thereof.

Figure 122:
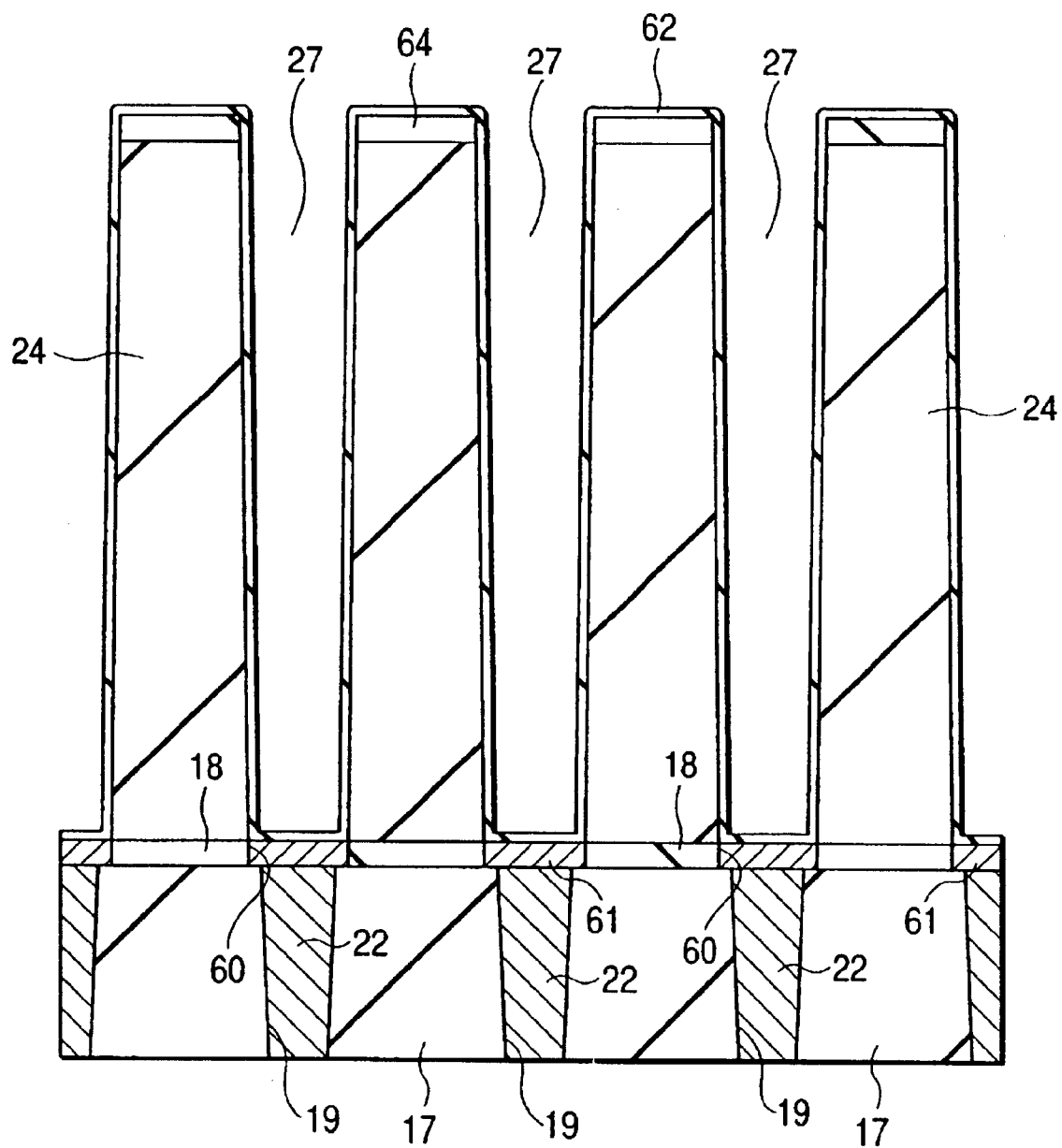

Then, as shown in FIG. 122, a tantalum oxide film 62 of about 10 nm thickness is deposited on the inner wall of the groove 27 and on the surface of the tantalum oxide film 64 by a CVD method. The tantalum oxide film is deposited, like that in the Embodiment 8, for example, by using pentaethoxy tantalum and oxygen as the starting gas and under the condition at a temperature of 400° C. to 450° C.

Figure 123:
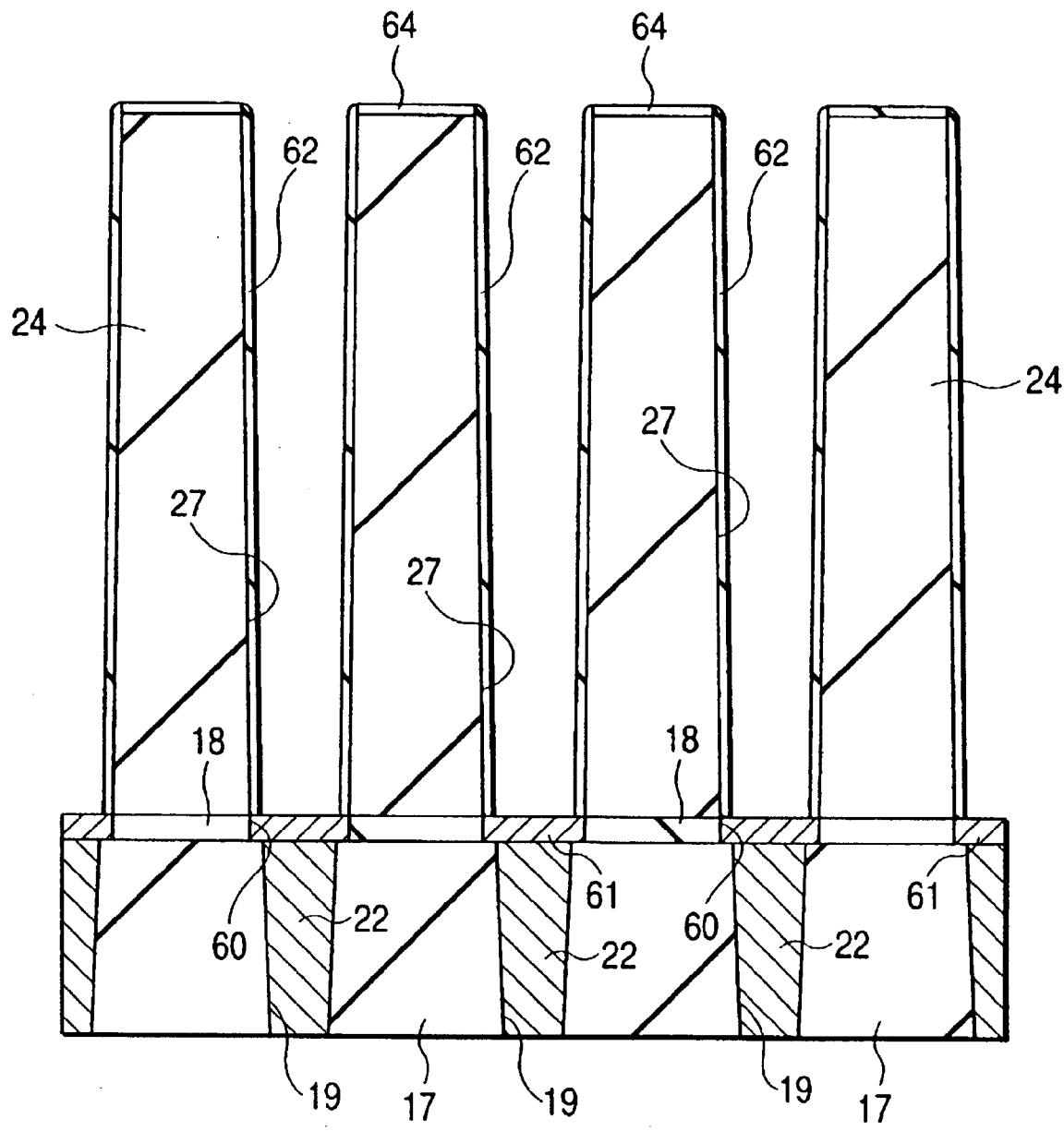

Then, as shown in FIG. 123, the tantalum oxide film 62 at the bottom of the groove 27 is removed by anisotropic dry etching to leave the tantalum oxide film 62 on the side wall of the groove 27. In this case, the two layers of the tantalum oxide films 64 and 62 deposited over the silicon oxide film 24 are also dry etched. However, since their film thickness is larger compared with that of the tantalum oxide film 62 at the bottom of the groove 27, a portion thereof is left without being etched.

Figure 124:
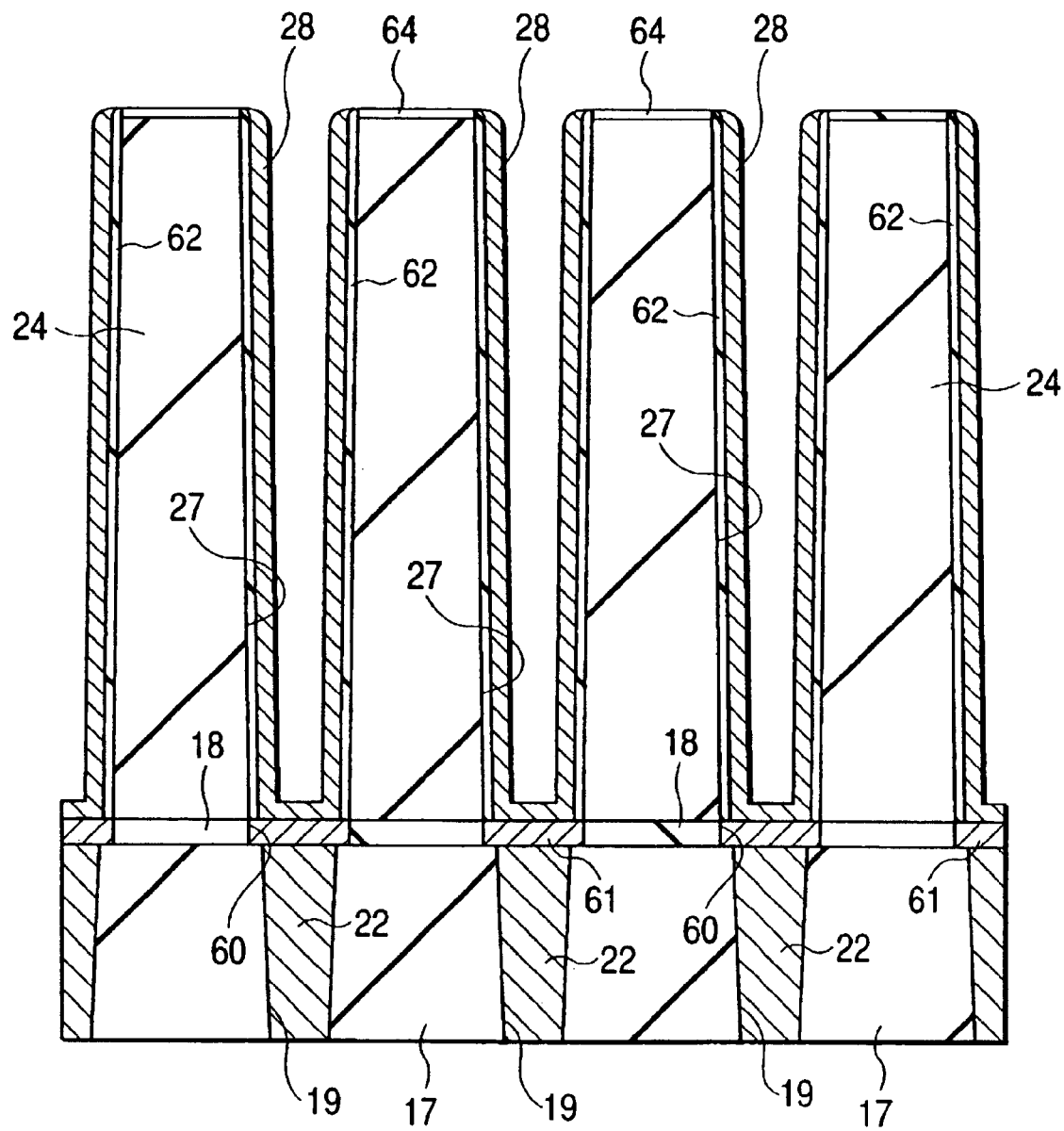

Then, as shown in FIG. 124, a lower electrode 28 comprising Ru is formed on the inner wall of the groove 27. The lower electrode 28 is formed by depositing a thin Ru film of about 20 nm thickness over the tantalum oxide film 64 and in the inside of the groove 27 by using a sputtering method and a CVD method. Then, for densifying the Ru film, a heat treatment is applied at about 700° C. for one min in vacuum and then an insulating film such as a photoresist is buried in the inside of the groove 27 and the Ru film outside of the groove 27 is removed by dry etching.

As described above, in this embodiment, since the lower electrode material (Ru film) is deposited in a state where the tantalum oxide film 64 is deposited on the surface of the silicon oxide film 24, even when a heat treatment is conducted immediately thereafter for densifying the film, there is no worry that the Ru film on the surface of the silicon oxide film 24 is peeled from the underlayer to form obstacles. That is, since it is possible to bury the insulating film such as a photoresist in the inside of the groove 27 after densifying the Ru film, this can avoid the disadvantage that contaminate material in the insulating film buried in the inside of the groove 27 is transferred to the lower electrode material (Ru film).

Figure 125:
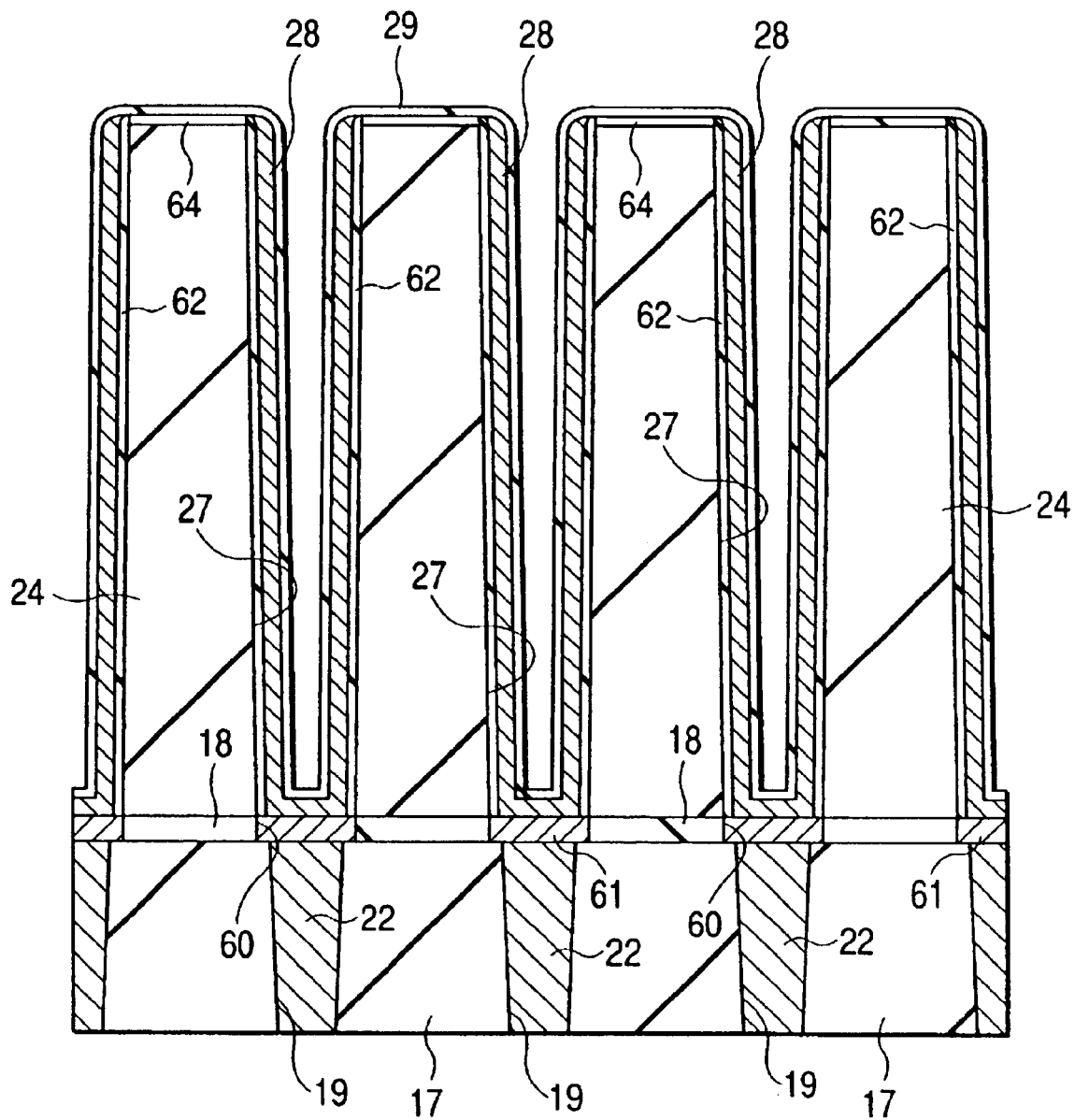
Figure 126:
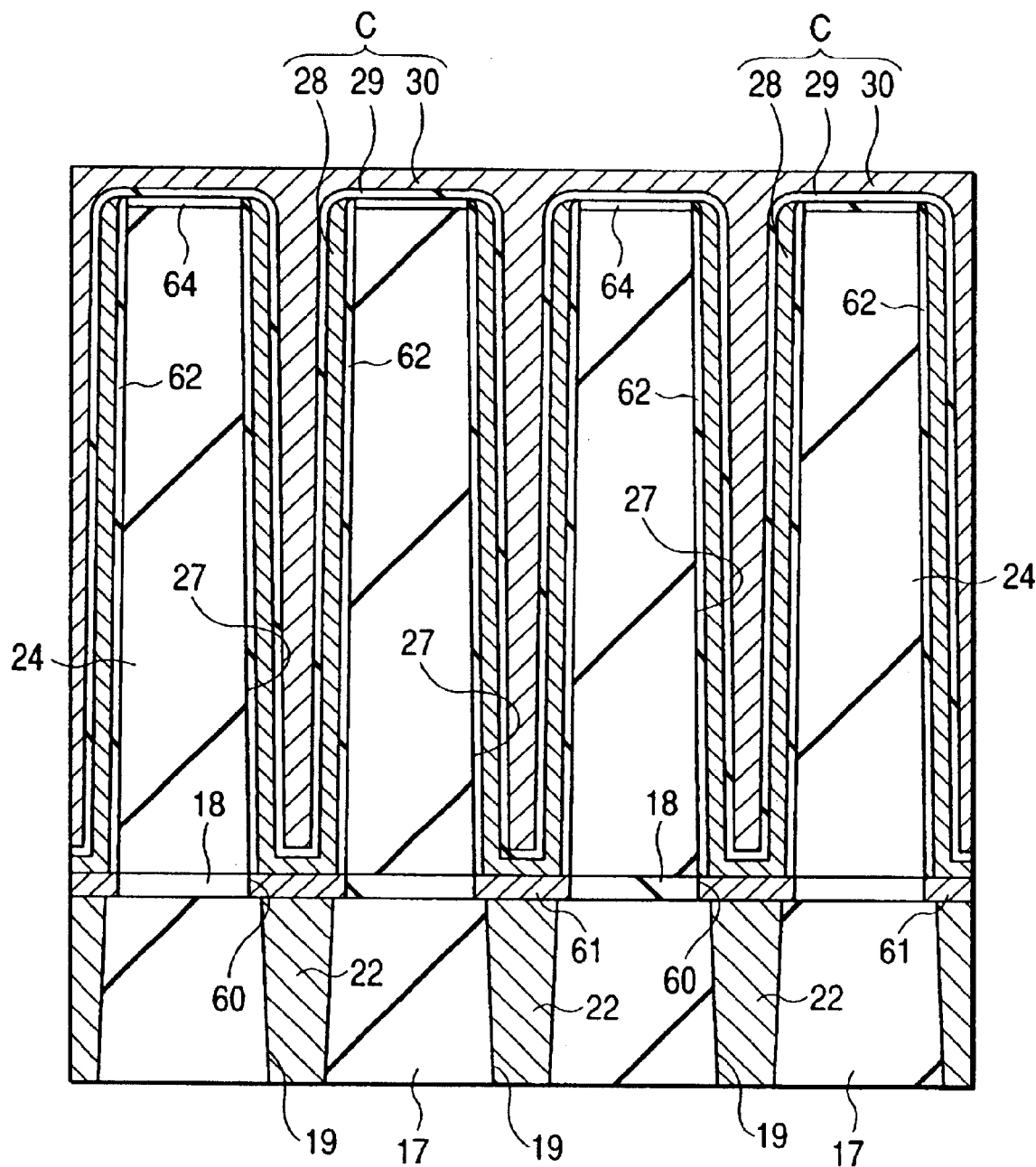

Subsequently, as shown in FIG. 125, a tantalum oxide film is deposited over the lower electrode 28 to form a dielectric film 29 and further, as shown in FIG. 126, an upper electrode 30 is formed over the dielectric film to complete an information storage capacitance device C.

In the Embodiments 1 to 9 described above, the groove 27 has been formed in the silicon oxide film 24 by dry etching using the photoresist film as a mask but, in an Embodiment 10, the groove 27 is formed by using, as a mask, a material having a larger etching selectivity to silicon oxide than that of the photoresist.

Figure 127:
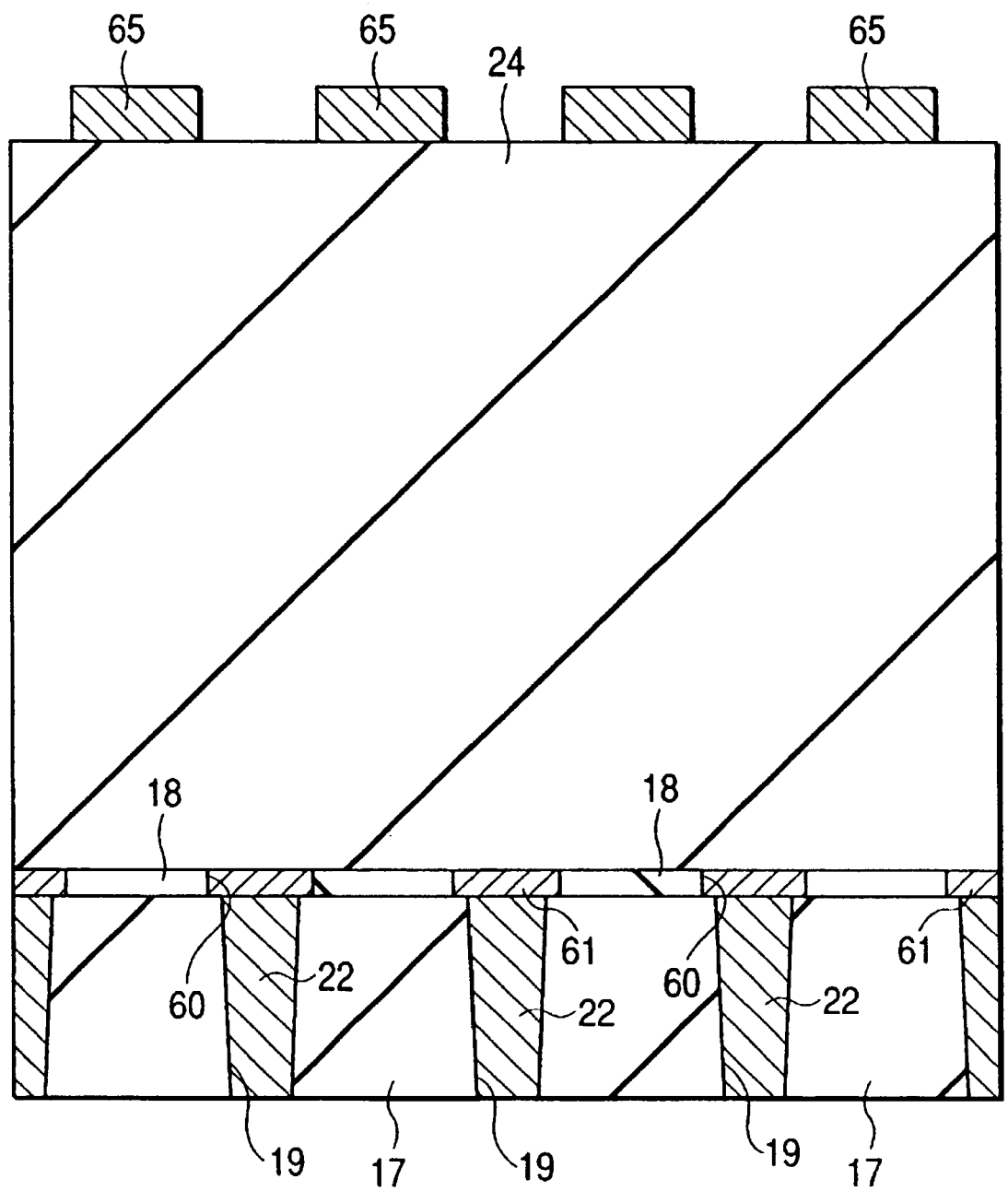

At first, succeeding to the steps shown in FIG. 127, after depositing a silicon oxide film 24 is deposited over a silicon nitride film 18 by a CVD method and optionally flattening the surface thereof by a chemical mechanical polishing method, a W mask 65 is formed over the silicon oxide film 24. The W mask 65 is formed by depositing a W film of about 50 nm thickness over the silicon oxide film 24 by a CVD method and, successively, patterning the W film by dry etching using the photoresist film as a mask.

Figure 128:
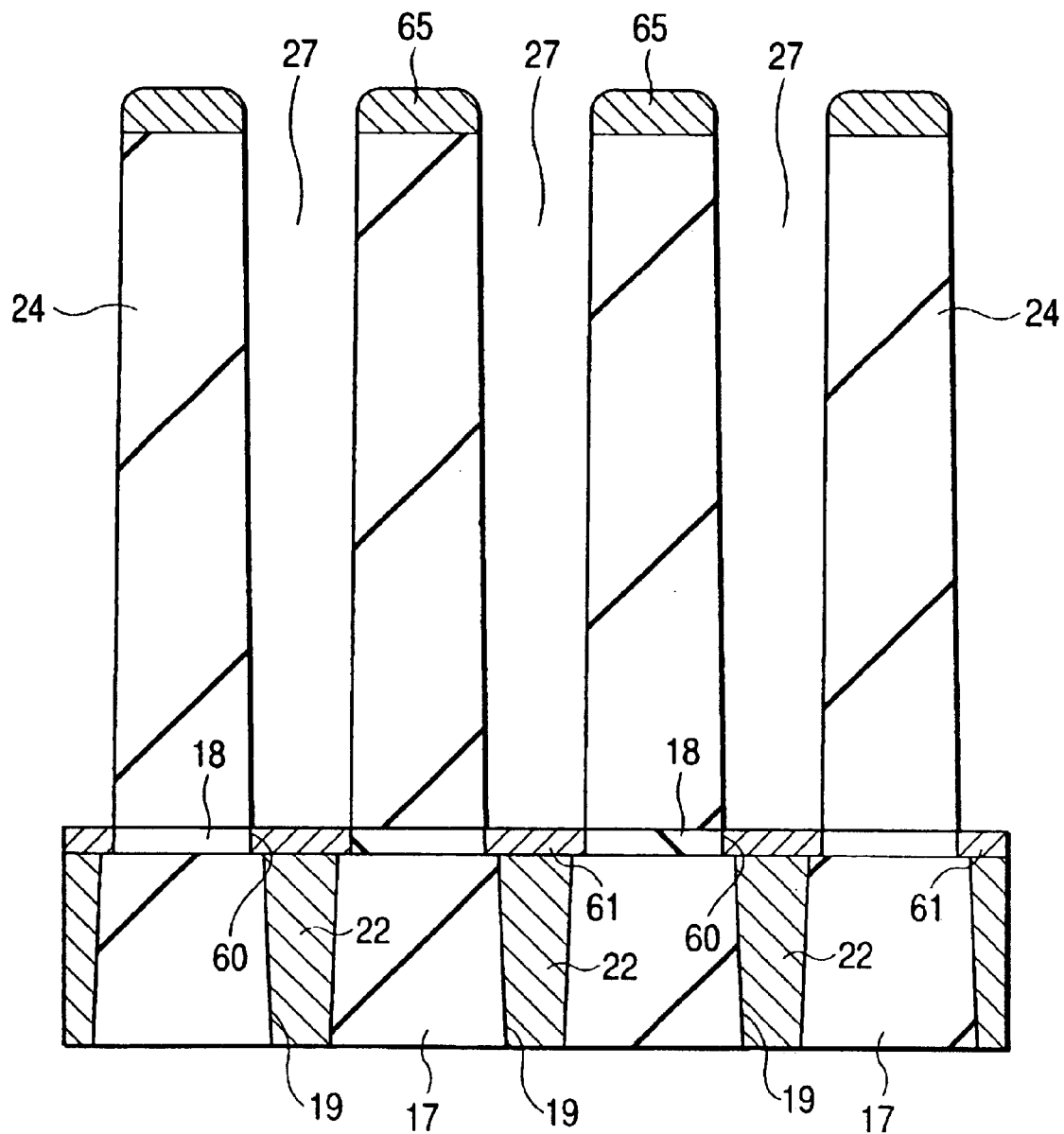

Then, as shown in FIG. 128, the silicon oxide film 24 is dry etched by using the W mask 65 to thereby form a groove 27 in which the surface of a TaN layer 61 in a through hole 60 is deposited at the bottom thereof. W has a higher etching selectivity to silicon oxide than the photoresist. Accordingly, when the silicon oxide film 24 is dry etched by using the W mask 65, since the reduction of the mask is decreased compared with a case of using the photoresist film, the groove 27 at a high aspect ratio relative to the silicon oxide film 24 of large wall thickness can be formed at a high accuracy. In addition to W, Mo (molybdenum) can also be used, for example, as a mask material having a larger etching selectivity to silicon oxide than that of the photoresist.

Figure 129:
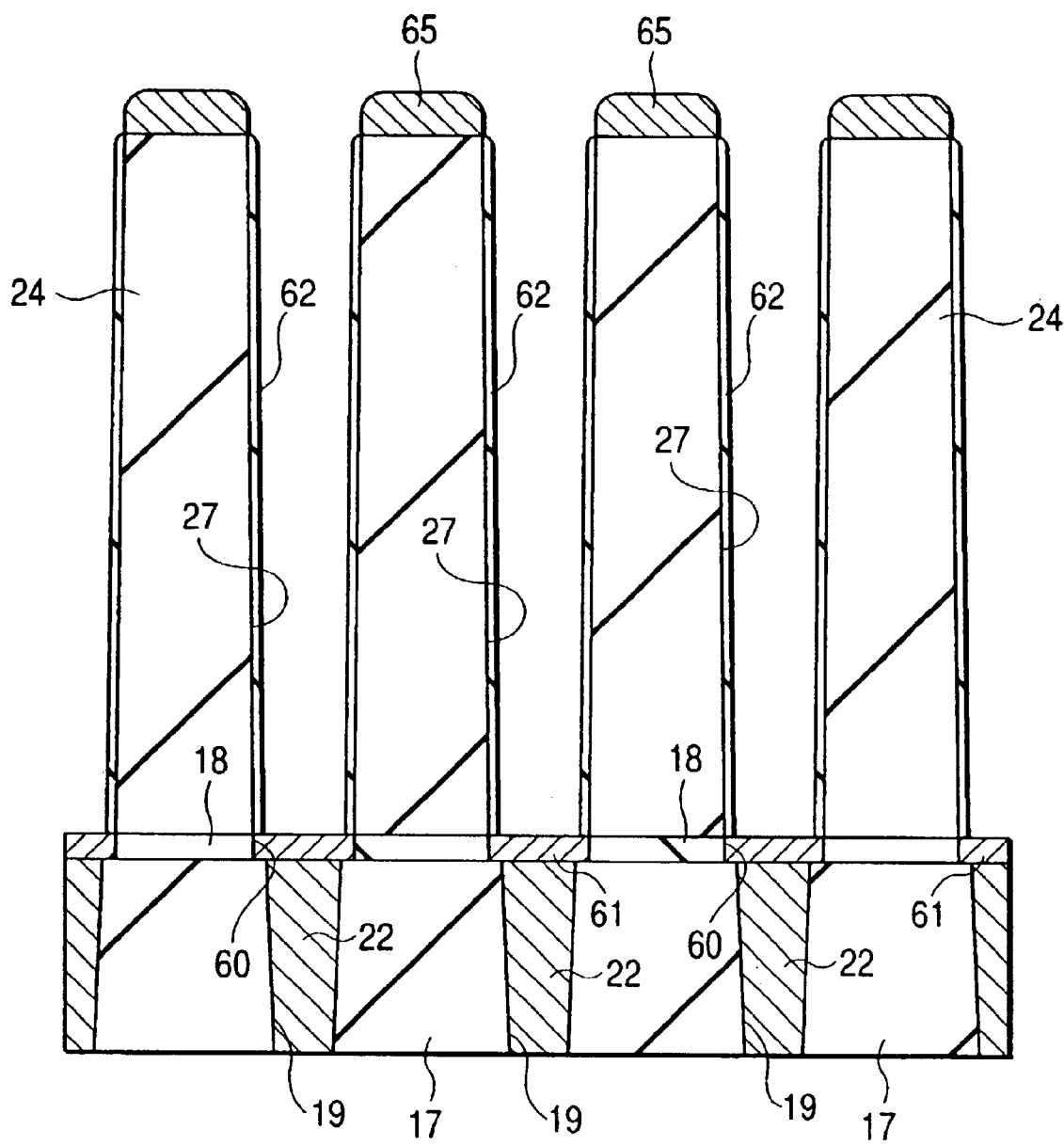

Then, as shown in FIG. 129, a tantalum oxide film 62 is formed on the side wall of the groove 27. The tantalum oxide film 62 is formed by depositing a tantalum oxide film 62 of about 10 nm film thickness on the inner wall of the groove 27 and the surface of the W mask by a CVD method and then removing the tantalum oxide film 62 on the surface of the W mask and at the bottom of the groove 27 by anisotropic dry etching. The tantalum oxide film 62 on the side wall of the groove 27 is formed in order to improve the adhesion strength of the Ru film as the lower electrode material and the underlying layer.

Figure 130:
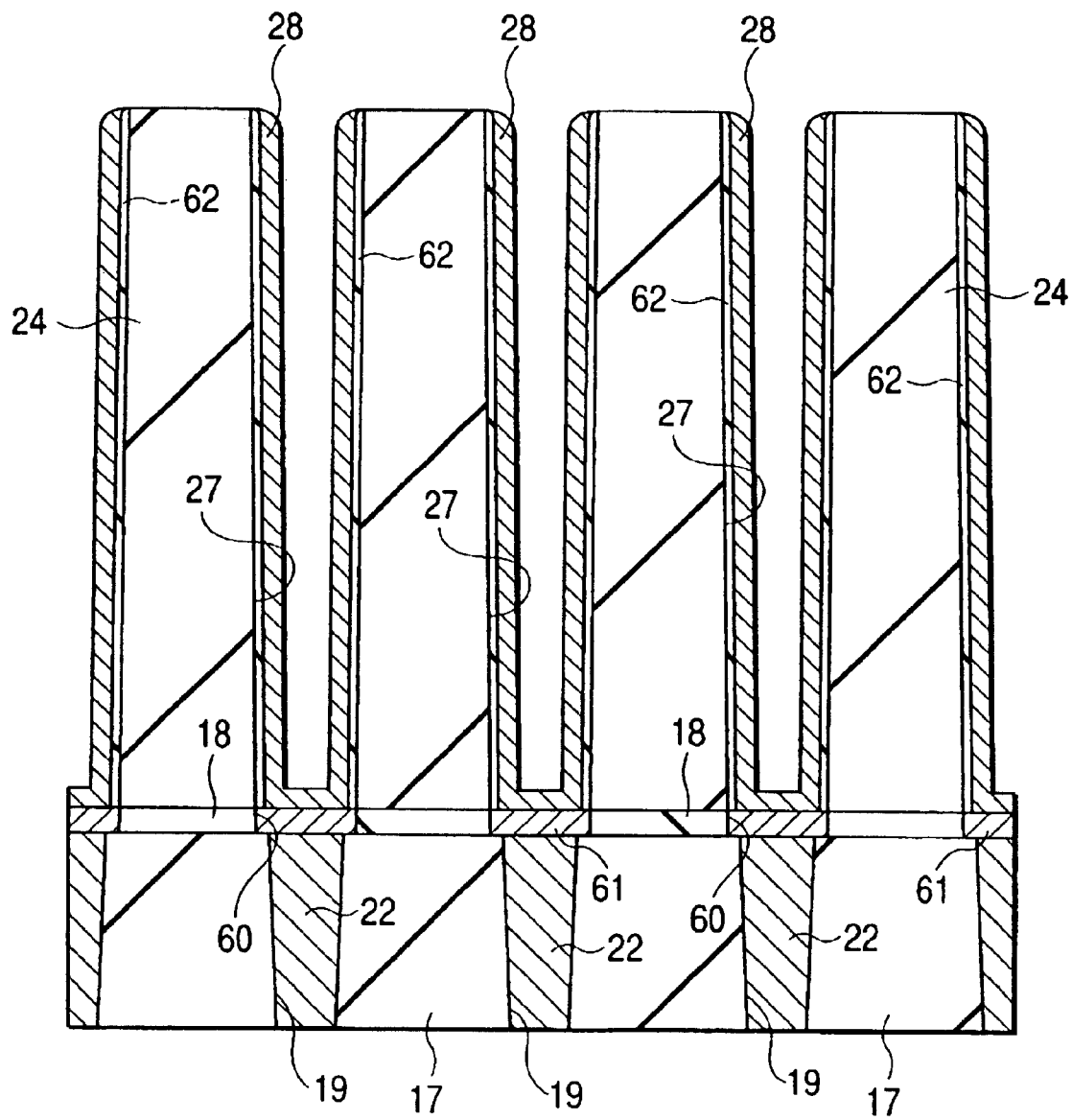

As shown in FIG. 130, a lower electrode 28 comprising Ru is formed on the inner wall of the groove 27. The lower electrode 28 is formed by depositing an Ru film of about 20 nm thickness over the W mask 65 and in the inside of the groove 27 by a sputtering method and a CVD method and then, successively, applying a heat treatment at about 700° C. for one min in vacuum to bury the insulating film such as photoresist to the inside of the groove 27 and the Ru film outside of the groove 27 is removed by dry etching.

As described above in this embodiment, since the lower electrode material (Ru film) is deposited in a state where the W mask 65 having high adhesion with Ru is deposited on the surface of the silicon oxide film 24, even when a heat treatment for densifying the Ru film is applied immediately thereafter, there is not worry that the Ru film on the surface of the silicon oxide film 24 defoliates from the underlayer to form obstacles. That is, since it is possible to bury the insulating film such as a photoresist in the inside of the groove 27 after densifying the Ru film, it can avoid the disadvantage, like that the Embodiment 9, that contaminate material in the insulation material buried in the groove 27 is transferred to the lower electrode material (Ru film).

Figure 131:
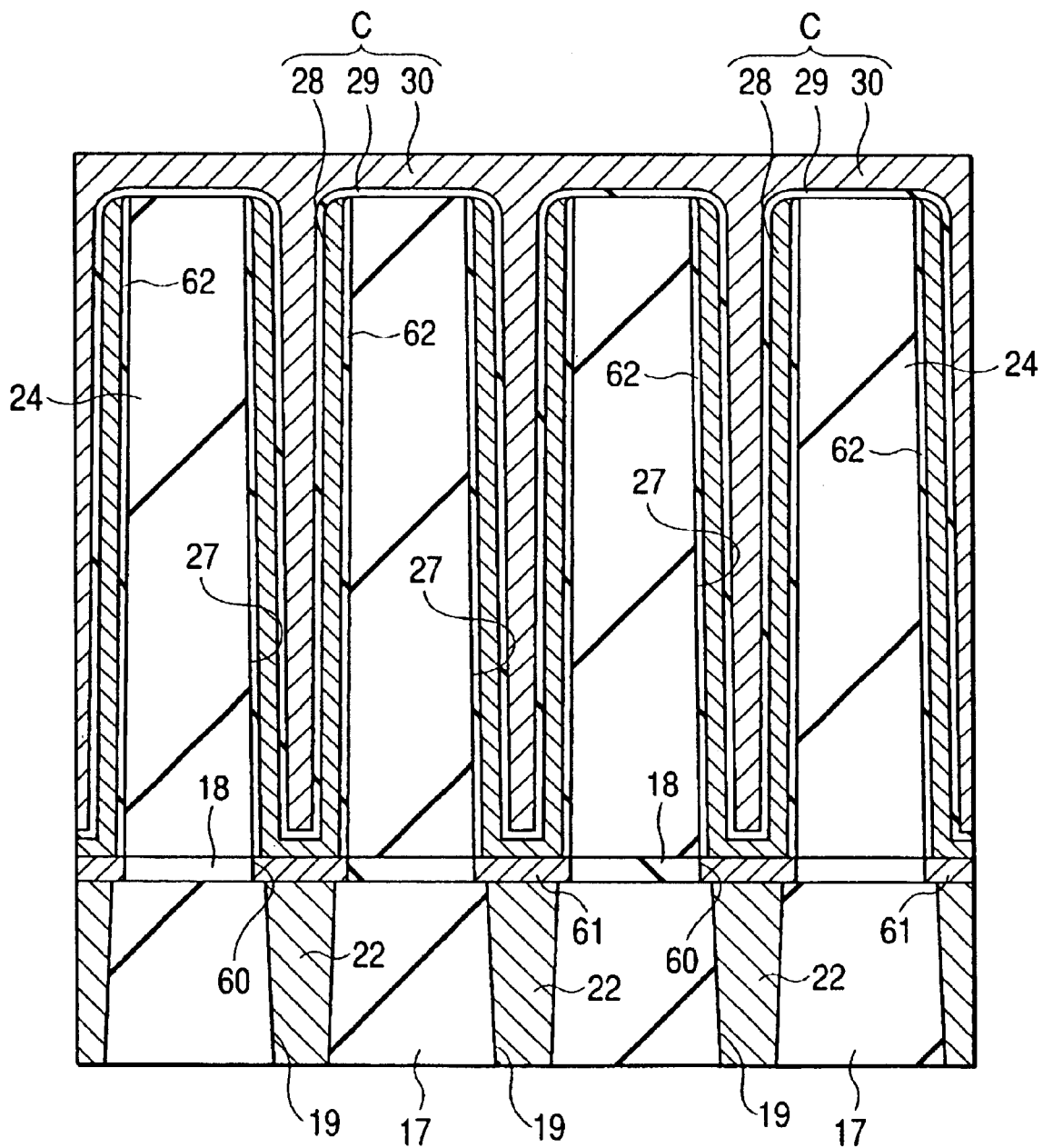

Then, as shown in FIG. 131, a tantalum oxide film is deposited over the lower electrode 28 to form a dielectric film 29 and, successively, an upper electrode 30 is formed over the dielectric film 29 to complete an information storage capacitance device C.

In an Embodiment 11, another method of improving the adhesion between the Ru film as the lower electrode material and the silicon oxide film is to be explained.

At first, succeeding to the step as shown in FIG. 107, a tantalum oxide film 66 is deposited over a silicon nitride film 28 and, successively, a silicon oxide film 24, a tantalum oxide film 67, a silicon oxide film 24 and a tantalum oxide film 68 are deposited alternately as shown in FIG. 132. That is, in this embodiment, three layers of the tantalum oxide films 66, 67 and 68 are deposited below, between and over the silicon oxide films 24 of large film thickness respectively. The tantalum oxide films 66, 67 and 68 are deposited by a CVD method and the film thickness is about 50 nm to 100 nm. Further, one or a plurality of layers of the tantalum oxide films may further be deposited between the silicon oxide films 24.

Then, as shown in FIG. 133, the tantalum oxide films 66, 67 and 68 and the silicon oxide films 24 are dry etched by using photoresist films as a mask (not illustrated) to form a groove 27 in which the surface of the TiN layer 61 in the through hole 60 is exposed at the bottom thereof. The groove 27 may also be formed by dry etching using the W mask 65 like that in the Embodiment 10. The tantalum oxide films 66, 67 and 68 are exposed to the side wall of the groove 27 thus formed.

Then, as shown in FIG. 134, a lower electrode 28 comprising Ru is formed on the inner wall of the groove 27. The lower electrode 28 is formed by depositing an Ru film of about 20 nm thickness over the tantalum oxide film 68 and in the inside of the groove 27 by using a sputtering method and a CVD method and, successively, conducting a heat treatment about at 700° C. for one min for densifying the Ru film, then burying an insulating film such as a photoresist in the inside of the groove 27 and removing the Ru film outside of the groove 27 by dry etching.

In a case where the lower electrode 28 is formed on the inner wall of the groove 27 by the method described above, since the lower electrode 28 and the tantalum oxide film 66, 67 and 68 are in contact with each other on the side wall of the groove 27, the adhesion strength between the Ru film constituting the lower electrode and the underlayer is improved.

Subsequently, as shown in FIG. 135, a tantalum oxide film is deposited over the lower electrode 28 to form a dielectric film 29 and, successively, the upper electrode 30 is formed over the dielectric film 29 to complete an information storage capacitance device C.

In the Embodiments 8 to 11 described above, explanation has been made to a case of forming a barrier layer (TiN film 61) on the surface of the plug 22 in the through hole 19 prior to the step of forming the groove 27 in the silicon oxide film 24. On the contrary, in an Embodiment 12, explanation is to be made to a case of forming a barrier layer on the surface of the plug 22 after forming the groove 27 in the silicon oxide film 24.

At first, succeeding to the steps shown in FIG. 36 and FIG. 37, a silicon oxide film 24 and a silicon nitride film 18 are dry etched to form a groove 27 in which the surface of the plug 22 in the through hole 19 is exposed at the bottom thereof. Dry etching for the silicon oxide film 24 and the silicon nitride film 18 may be conducted by using a photoresist film as a mask but a deep groove 27 can be formed at a high accuracy by using a W mask 65 having a higher etching selectivity to the silicon oxide than that of the photoresist like that in Embodiment 10.

Then, as shown in FIG. 137, a tantalum oxide film 62 is formed on the side wall of the groove 27. The tantalum oxide film 62 is formed by depositing a tantalum oxide film 62 of about 10 nm thickness on the inner wall of the groove 27 and the surface of the W mask 65 by a CVD method and then removing the tantalum oxide film 62 on the surface of the W mask or at the bottom of the groove 27 by anisotropic dry etching. The tantalum oxide 62 on the side wall of the groove 27 is formed for improving the adhesion strength between the Ru film as the lower electrode material and the underlying layer.

Then, as shown in FIG. 138, after depositing an Ru film 70a of about 10 nm thickness over the W mask 65 and in the inside of the groove 27 by a CVD method, an Ru silicide layer 25 is formed on the surface of a plug 22 and, successively, an Ru silicon nitride layer 26 is formed on the surface of the Ru silicide layer 25 as shown in FIG. 139 by using the method explained for the Embodiment 1.

Then, as shown in FIG. 140, after depositing an Ru film 70b of about 10 nm to 20 nm thickness over the W mask 65 and in the inside of the groove 27 by a CVD method, a lower electrode 70 comprising a laminate film of an Ru film 70a and an Ru film 70b is formed on the inner wall of the groove 27 as shown in FIG. 141. The lower electrode 70 is formed by burying an insulating film such as a photoresist in the inside of the groove 27 and removing the Ru films 70a and 70b and the W mask 65 outside of the groove 27 by dry etching.

Subsequently, as shown in FIG. 142, a dielectric film 29 is formed by depositing a tantalum oxide film over the lower electrode 70 and, successively, an upper electrode 30 is formed over the dielectric film 29 to complete an information storage capacitance device C constituted with the lower electrode 70, the dielectric film 29 and the upper electrode 30.

The invention made by the present inventors have been described above specifically with reference to preferred embodiments but it will be apparent that the invention is not restricted only to the embodiments described above but can be modified variously within a range not departing the scope thereof.

In this invention, the structures and manufacturing methods explained with reference to the Embodiments 1 to 12 can be combined variously. For example, in a memory cell structure shown in FIG. 143, like that the Embodiment 4, an Ru silicide layer 46 and an Ru silicon nitride layer 36 formed on the surface of a plug 13 are isolated from a dielectric film 29 of an information storage capacitance device C by a plug 37 in a through hole 19, and the lower electrode 38 of the information storage capacitance device C is constituted with a columnar body like that in embodiments 5 to 6 described above. Further, in a memory cell structure shown in FIG. 144, an oxygen absorption layer 32 is further formed at the bottom of a lower electrode 38 in the memory cell structure shown in FIG. 143. The oxygen absorption layer may be formed in the entire inside of the lower electrode 38, like that in the Embodiment 7.

In the Embodiments 1 to 12 described above, the dielectric film for the information storage capacitance device C is constituted with tantalum oxide. However, it may be constituted with a high (ferro) dielectric material comprising a perovskite type metal oxide such as titanium oxide, barium titanate, strontium titanate, barium strontium titanate or lead titanate, or a laminate thereof.

In the Embodiments 1 to 12 described above, explanation has been made to a case of applying the invention to the DRAM and the manufacturing process thereof, the invention is applicable not only to general purpose DRAM but also logic hybrid DRAM or FeRAM.

Advantageous effects obtained by typical inventions among those described above in this application are briefly explained as below.

(1) According to this invention, even when the size of the memory cell is refined further to cause inevitable misalignment between the lower electrode and the contact hole therebelow of a capacitance device, it can prevent a disadvantage upon patterning of the lower electrode that the barrier layer in the contact hole is etched to expose the silicon plug.

(2) According to this invention, when a dielectric film formed on the lower electrode of the capacitance device is heat treated in an oxygen atmosphere, it can prevent the disadvantage that the oxygen permeating the lower electrode oxidizes the barrier layer itself to form an oxide layer of high resistivity and low dielectric constant.

(3) According to this invention, adhesion between a platinum group metal film and a silicon oxide film constituting the lower electrode for the capacitance device can be improved.

(4) According to this invention, desired stored charge amount can be ensured even when the memory cell is refined, by increasing the surface area of the capacitance device and making the dielectric constant higher.

(5) According to this invention, since a groove for forming the lower electrode for the information storage capacitance device is formed to a thick silicon oxide film and then a film as a barrier for diffusion of silicon is formed on the surface of a plug exposed to the bottom of the groove, the diffusion barrier layer can be formed on the lateral surface of the plug even when the lateral surface of the plug is exposed to the bottom of the groove by overetching of an interlayer insulating film upon forming the groove. This can prevent occurrence of shape abnormality caused by reaction between the metal film constituting the lower electrode and the plug constituted, for example, with a conductor film containing silicon a polycrystal silicon film, or prevent a disadvantage that a film of a low dielectric constant such as silicon oxide is formed at the boundary between the dielectric film and the lower electrode by the diffusion of silicon.

What is claimed is:

1. A semiconductor integrated circuit device having a capacitor of a DRAM comprising:
   a memory cell selecting MISFET of the DRAM, including a source region, a drain region, and a gate electrode;
   a silicon plug electrically connected to the source region or the drain region;
   a lower metal electrode of the capacitor, electrically connected to the silicon plug;
   a dielectric film of the capacitor formed over the lower metal electrode; and
   an upper metal electrode formed over the dielectric film;
   wherein a first metal silicide layer is formed on the surface of the silicon plug;
   a metal silicon nitride layer or a metal silicon oxynitride layer is formed on the surface of the first metal silicide layer; and
   the lower metal electrode further comprises a first metal layer, a second metal silicide layer formed over the first metal layer, and a second metal layer formed over the second metal silicide layer.

2. A semiconductor integrated circuit device according to claim 1, wherein the lower metal electrode of the capacitor is formed inside a groove formed in an interlayer insulating layer formed over the silicon plug; and
   the first metal layer and the second metal layer of the lower metal electrode are formed over a side surface and a bottom surface of the groove.

3. A semiconductor integrated circuit device according to claim 2, wherein the first metal layer and the second metal layer comprise ruthenium.

4. A semiconductor integrated circuit device according to claim 3, wherein the first metal silicide layer is ruthenium silicide, the metal silicon nitride lay r is ruthenium silicon nitride, and the metal silicon oxynitride layer is ruthenium silicon oxynitride.

5. A semiconductor integrated circuit device according to claim 3, wherein the second metal silicide layer of the lower metal electrode comprises tungsten silicide.

6. A semiconductor integrated circuit device according to claim 5, wherein the second metal silicide layer of the lower metal electrode serves as an oxygen-absorption layer.

7. A semiconductor integrated circuit device according to claim 3, wherein the dielectric film of the capacitor comprises tantalum oxide film.

8. A semiconductor integrated circuit device according to claim 3, wherein the first metal layer and the second metal layer are formed by a CVD method.

9. A semiconductor integrated circuit device according to claim 2, wherein the second metal silicide layer of the lower metal electrode is formed over a side surface and a bottom surface of the groove.

10. A semiconductor integrated circuit device according to claim 9, wherein the first metal layer and the second metal of the lower metal electrode comprise ruthenium, and the second metal silicide layer of the lower metal electrode comprises tungsten silicide.

11. A semiconductor integrated circuit device having a capacitor of a DRAM comprising:
    a memory cell selecting MISFET of the DRAM, including a source region, a drain region, and a gate electrode;
    a silicon plug electrically connected to the source region or the drain region;
    a lower metal electrode of the capacitor electrically connected to the silicon plug;
    a dielectric film of the capacitor formed over the lower metal electrode; and
    an upper metal electrode formed over the dielectric film;
    wherein a first metal silicide layer is formed on the surface of the silicon plug;
    a metal silicon nitrid layer or a metal silicon oxynitride layer is formed on the surface of the first metal silicide layer; and
    the lower metal electrode further comprises a first metal layer, an oxide-absorption layer formed over the first metal layer, and a second metal layer formed over the oxide-absorption layer.

12. A semiconductor integrated circuit device according to claim 11, wherein the lower metal electrode of the capacitor is formed inside a groove formed in an interlayer insulating layer formed over the silicon plug; and
    the first metal layer and the second metal layer of the lower metal electrode are formed over a side surface and a bottom surface of the groove.

13. A semiconductor integrated circuit device having a capacitor of a DRAM comprising:
    a memory cell selecting MISFET of the DRAM, including a source region, a drain region, and a gate electrode;
    a silicon plug electrically connected to the source region or the drain region;
    an interlayer insulating layer formed over the silicon plug;
    a groove formed in the interlayer insulating layer;
    a lower metal electrode of the capacitor formed inside the groove, which is electrically connected to the silicon plug;

a dielectric film of the capacitor formed over the lower metal electrode; and an upper metal electrode formed over the dielectric film;

wherein the lower metal electrode of the capacitor is formed over an inner side surface and a bottom surface of the groove; and a silicide layer is formed between the bottom surface of the groove and the lower metal electrode; and the silicide layer is formed between the inner side surface of the groove and the lower metal electrode.

14. A semiconductor integrated circuit device according to claim 13, wherein the lower metal electrode comprises ruthenium.

15. A semiconductor integrated circuit device according to claim 14, wherein the silicide layer comprises titanium silicide.

16. A semiconductor integrated circuit device according to claim 15, wherein the dielectric film of the capacitor comprises tantalum oxide film.

* * * * *